(12) United States Patent
Anand et al.

(10) Patent No.: US 6,306,753 B1
(45) Date of Patent: Oct. 23, 2001

(54) FEASIBLE, GAS-DIELECTRIC INTERCONNECT PROCESS

(75) Inventors: Minakshisundaran Balasubramanian Anand; Hideki Shibata, both of Yokohama; Masaki Yamada, Kawasaki, all of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/525,442

(22) Filed: Mar. 14, 2000

Related U.S. Application Data

(62) Division of application No. 08/698,335, filed on Aug. 15, 1996.

(30) Foreign Application Priority Data

Dec. 28, 1995 (JP) .................................................. 7-352196
Mar. 29, 1996 (JP) .................................................. 8-099529

(51) Int. Cl.[7] ............................................. H01L 21/4763
(52) U.S. Cl. ........................... 438/618; 438/619; 438/421
(58) Field of Search .................... 438/618, 619, 438/421, 422

(56) References Cited

U.S. PATENT DOCUMENTS

| | | |
|---|---|---|
| 4,975,144 | 12/1990 | Yamakazi et al. . |
| 4,987,101 * | 1/1991 | Kaanta et al. . |
| 5,102,498 | 4/1992 | Itoh et al. . |
| 5,119,164 | 6/1992 | Sliwa, Jr. et al. . |
| 5,144,411 | 9/1992 | Kaanta et al. . |
| 5,240,554 | 8/1993 | Hori et al. . |
| 5,413,962 | 5/1995 | Lur et al. . |
| 5,444,015 * | 8/1995 | Aitken et al. . |
| 5,461,003 | 10/1995 | Havemann et al. . |
| 5,494,859 | 2/1996 | Kapoor . |
| 5,527,737 | 6/1996 | Jeng . |
| 5,530,290 | 6/1996 | Aitken et al. . |
| 5,670,828 | 9/1997 | Cheung et al. ....................... 257/773 |
| 5,750,316 | 5/1998 | Kawamura et al. . |
| 5,936,295 * | 8/1999 | Havemann et al. .................. 257/522 |
| 6,071,805 * | 8/1999 | Liu ....................................... 438/619 |

FOREIGN PATENT DOCUMENTS

| | | | |
|---|---|---|---|
| 0043014 | 1/1982 | (EP) | ............................. H01L/21/90 |
| 0343269 | 5/1988 | (EP) . | |
| 0373360 | 11/1989 | (EP) . | |
| 745701 | 2/1995 | (JP) . | |

OTHER PUBLICATIONS

M. B. Anand, M. Yamada and H. Shibata, "NURA: A Feasible, Gas–Dielectric Interconnect Process," Symposium on VLSI Technology Digest of Technical Papers, 1996, pp. 82–83.

* cited by examiner

*Primary Examiner*—Caridad Everhart
(74) *Attorney, Agent, or Firm*—Hogan & Hartson, L.L.P.

(57) ABSTRACT

Wires are provided on an insulating layer, reaching the source region and drain region of a MOS transistor. Each wire is composed of a conductor and a barrier layer covering the surfaces of the conductor. An insulating layer is mounted on the wires, an insulating layer on the insulating layer, and an insulating layer on the insulating layer. Cavities are provided among the wires. The cavities are filled with air or a mixture gas of oxygen and carbon dioxide. Wires are provided on the insulating layer. Cavities are provided among the wires. These cavities are filled with air or a mixture gas of oxygen and carbon dioxide.

82 Claims, 108 Drawing Sheets

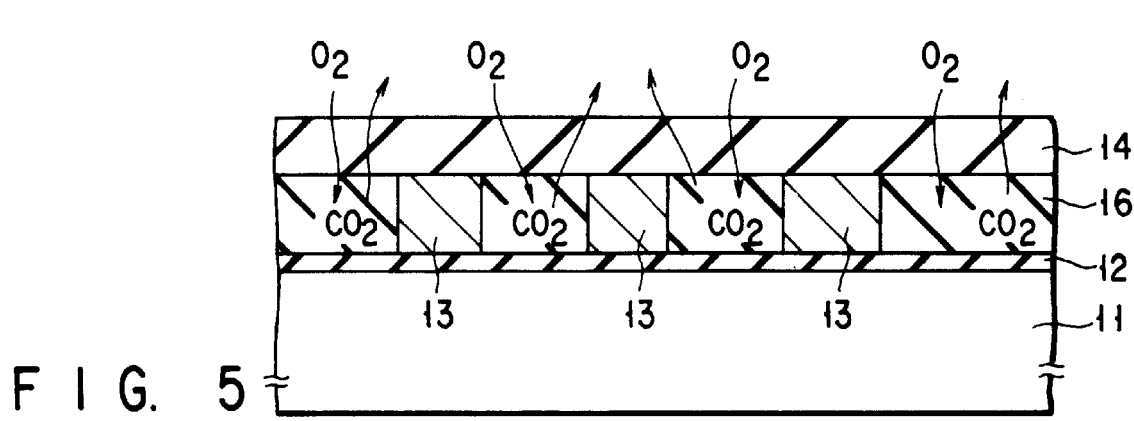
F I G. 5
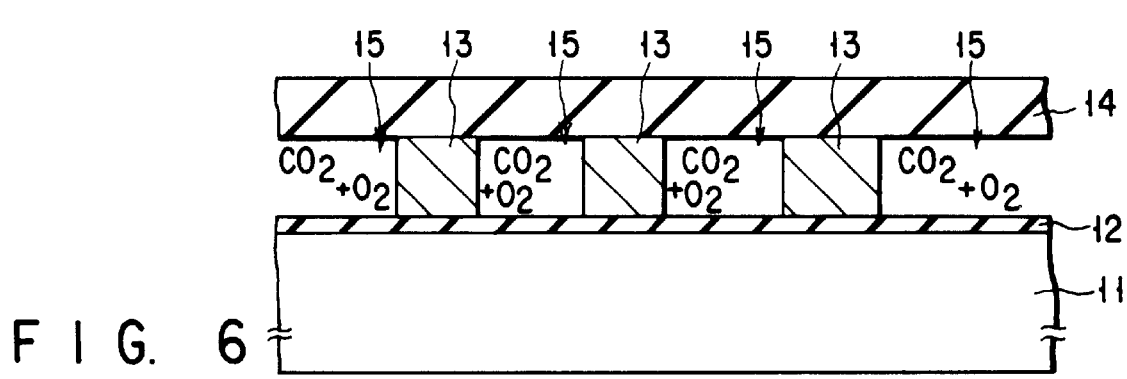
F I G. 6
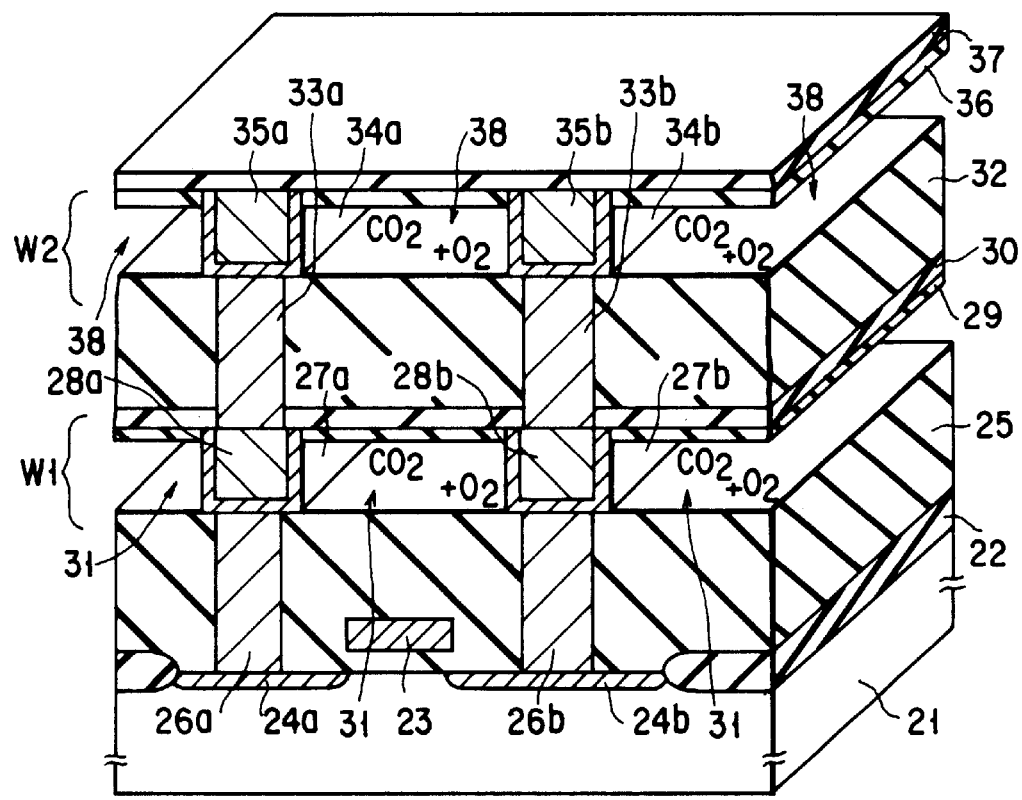
F I G. 7

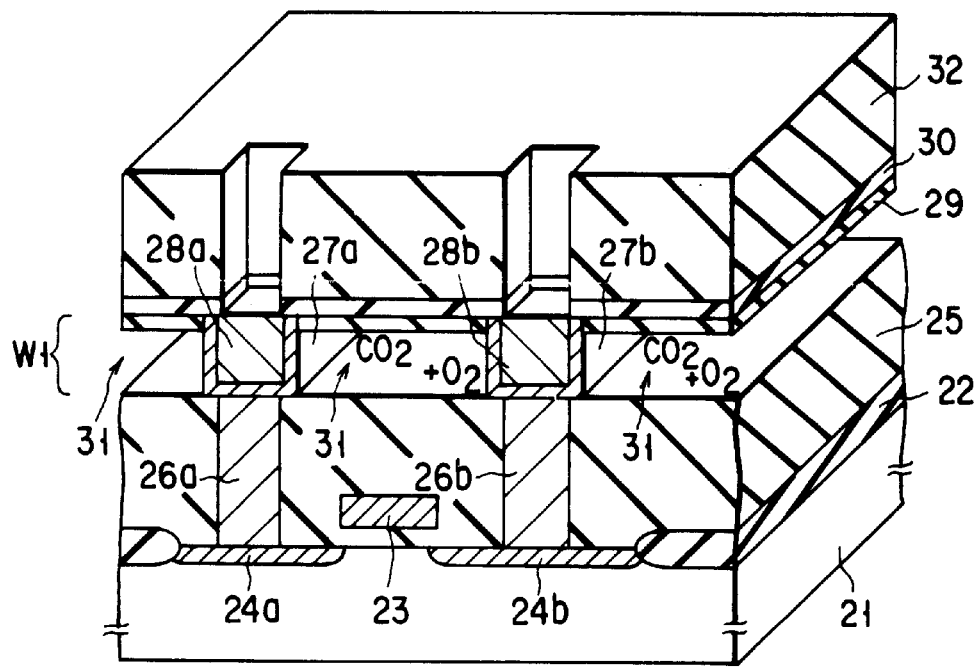
F I G. 20
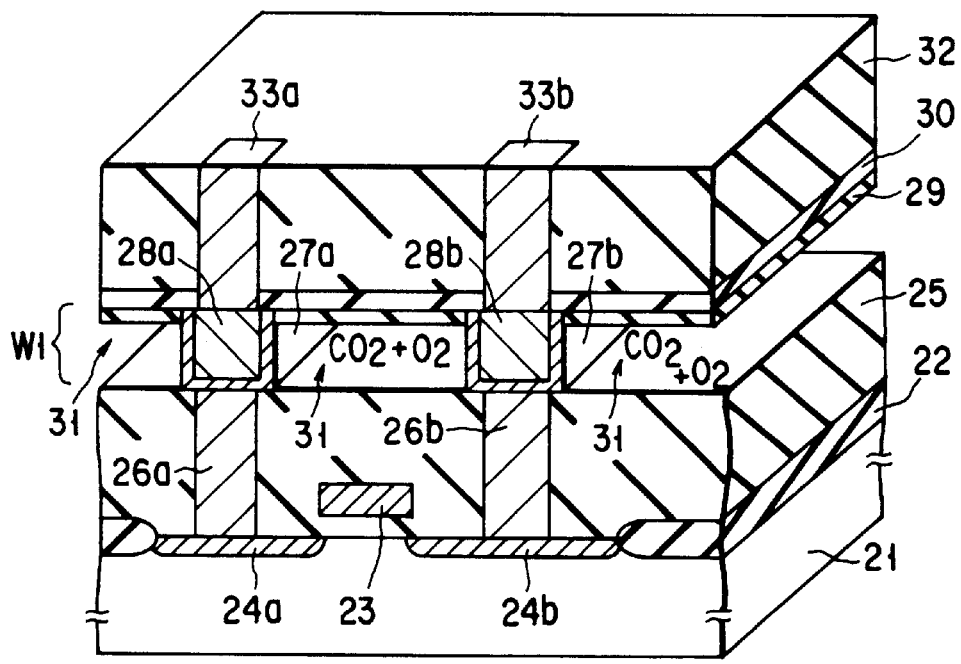
F I G. 21

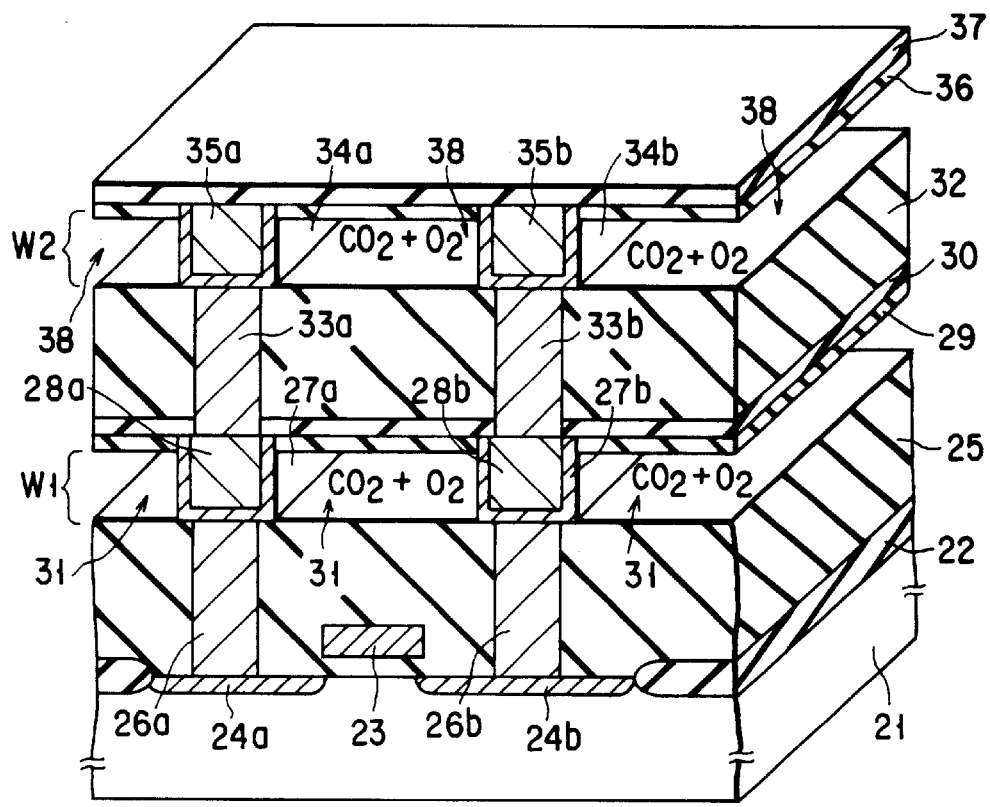
F I G. 22
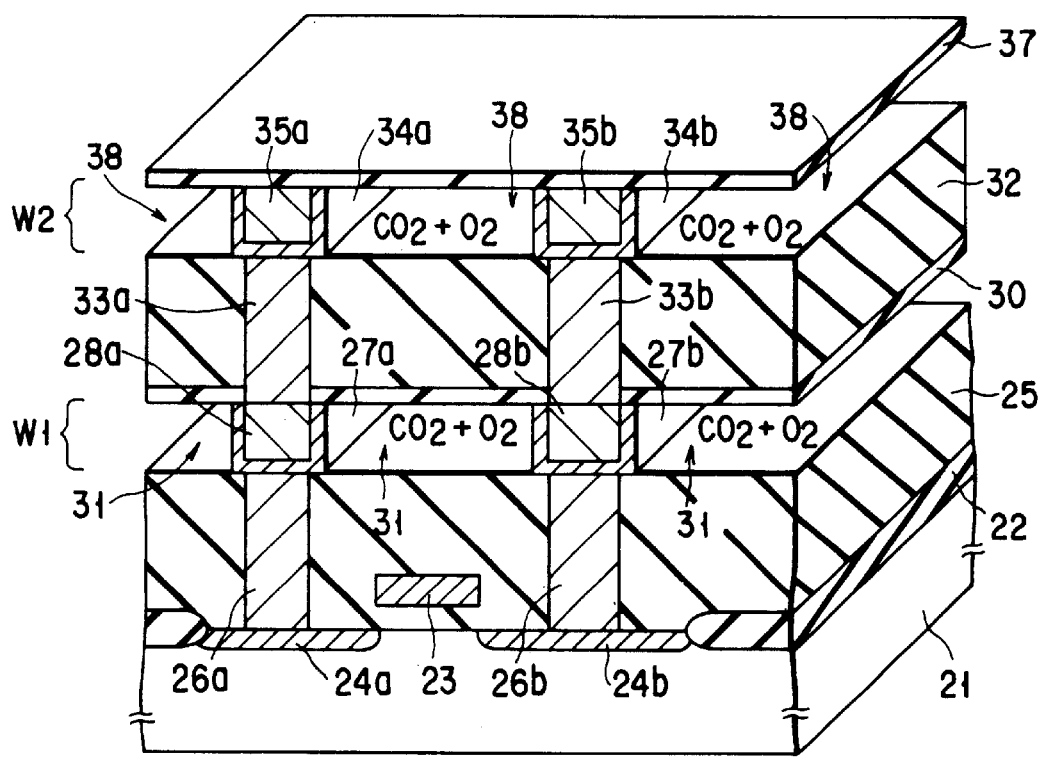
F I G. 23

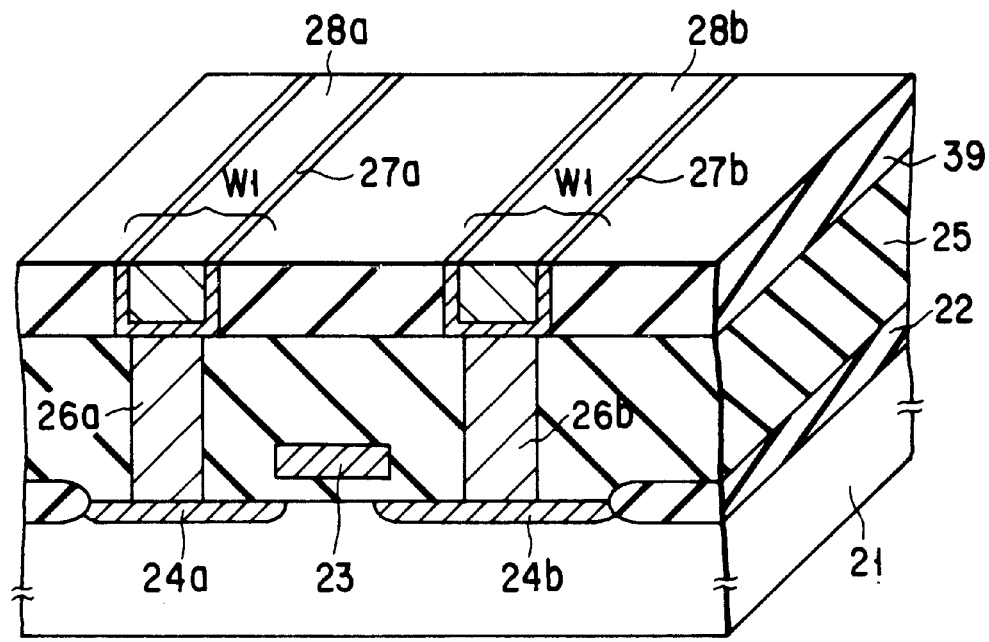
F I G. 26
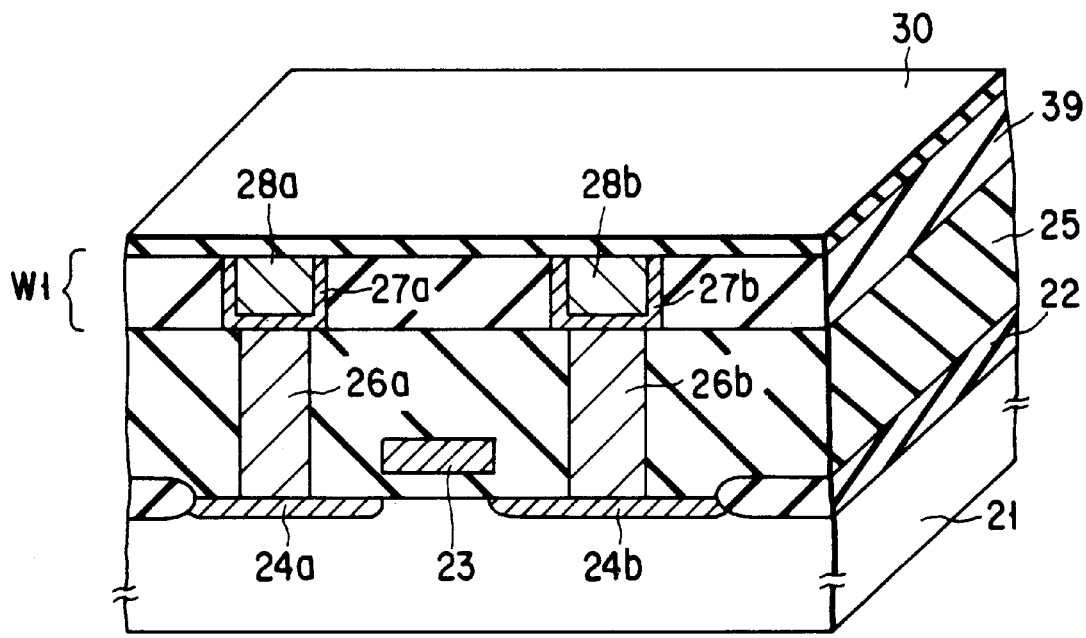
F I G. 27

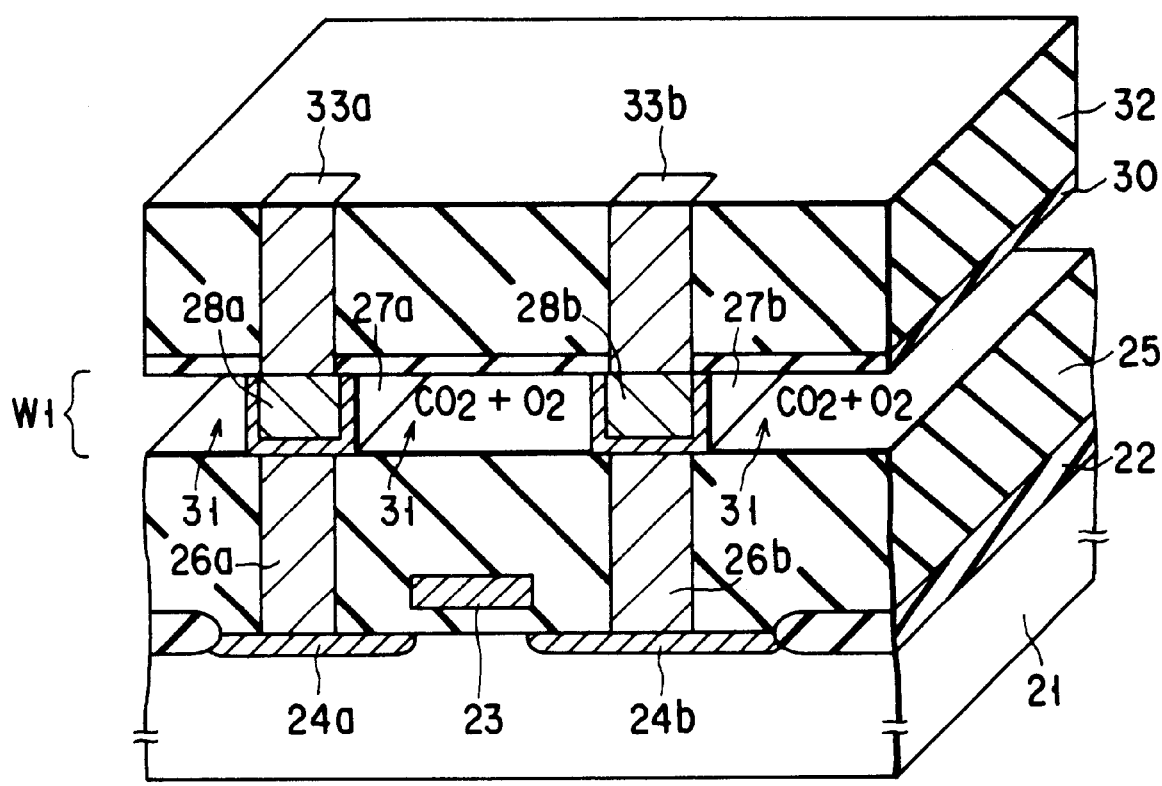
F I G. 32

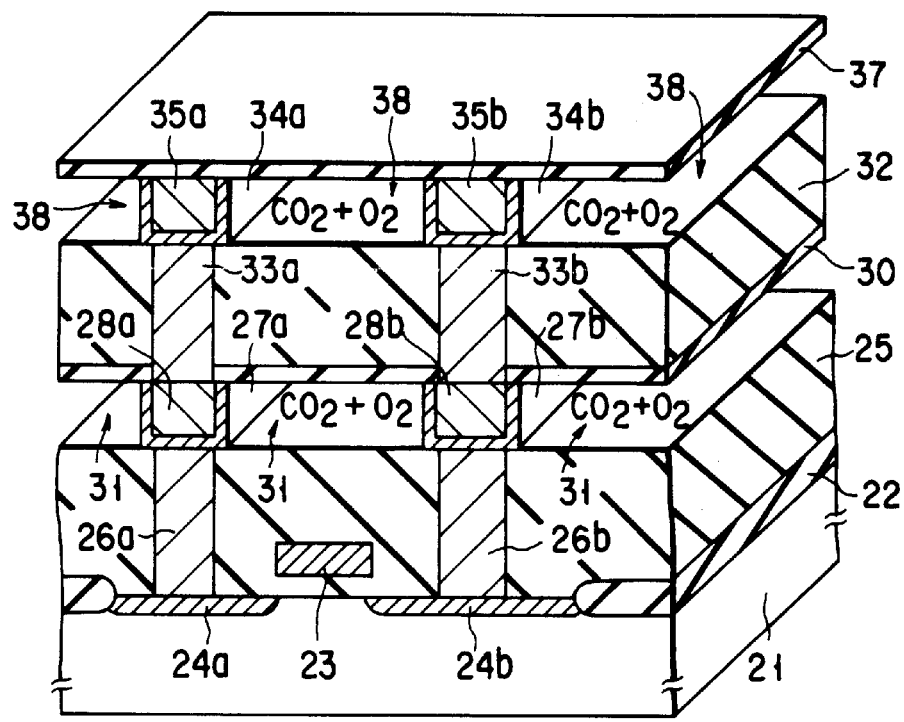
F I G. 33
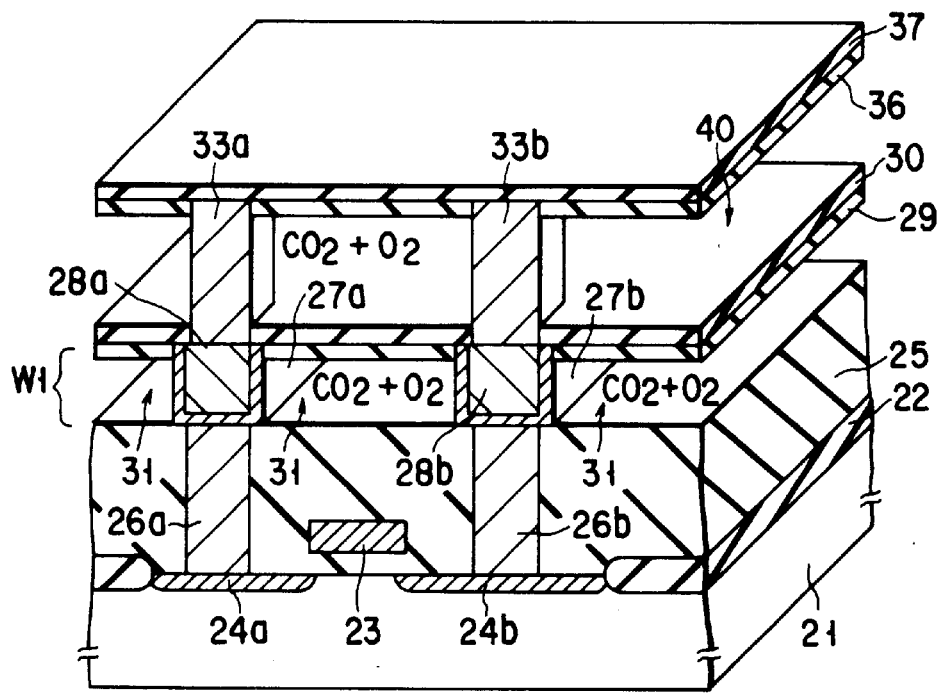
F I G. 34

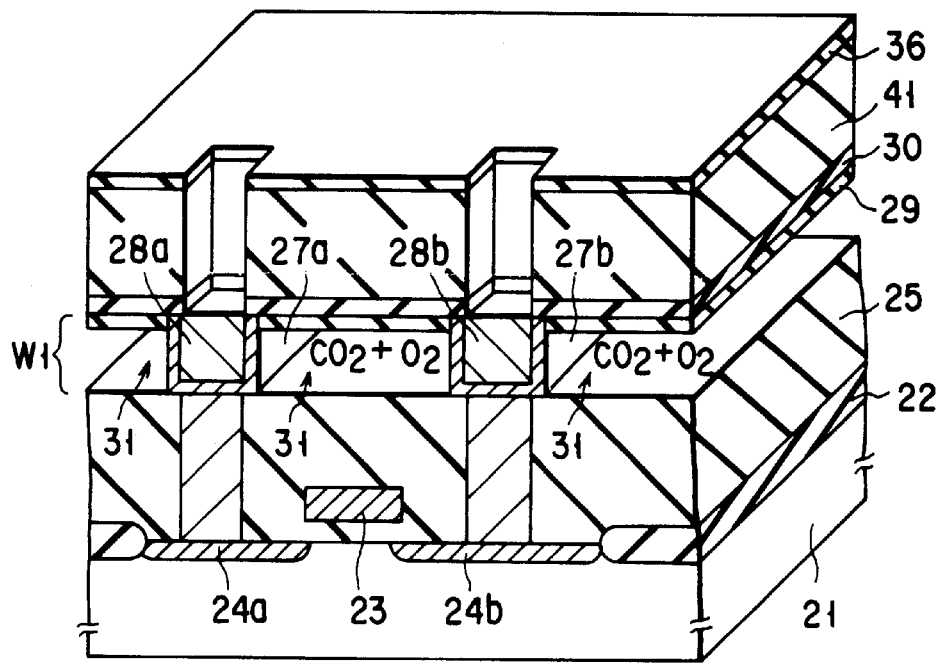
F I G. 35
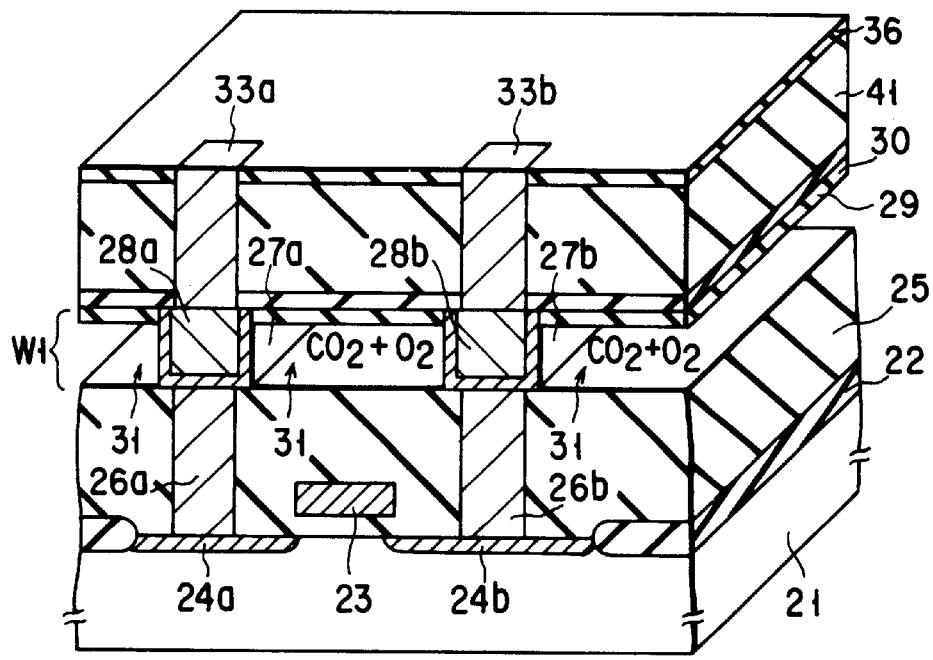
F I G. 36

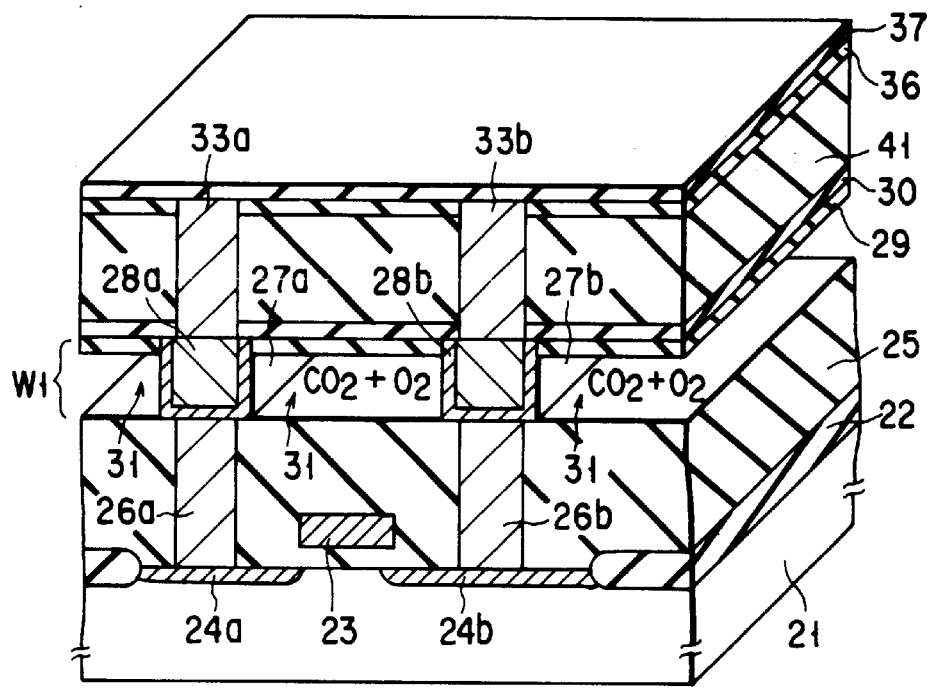
F I G. 37
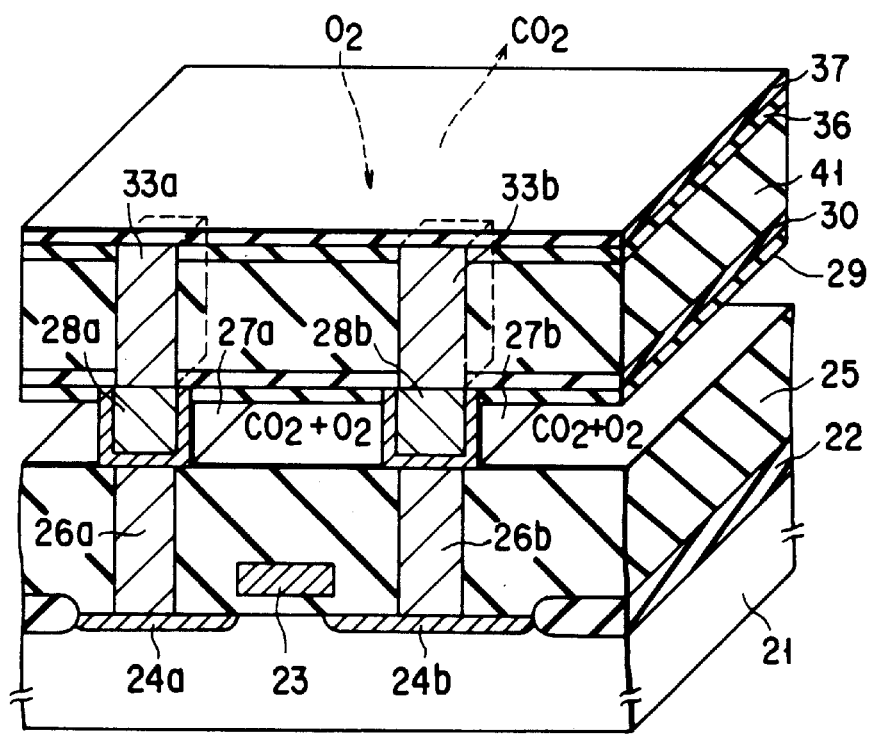
F I G. 38

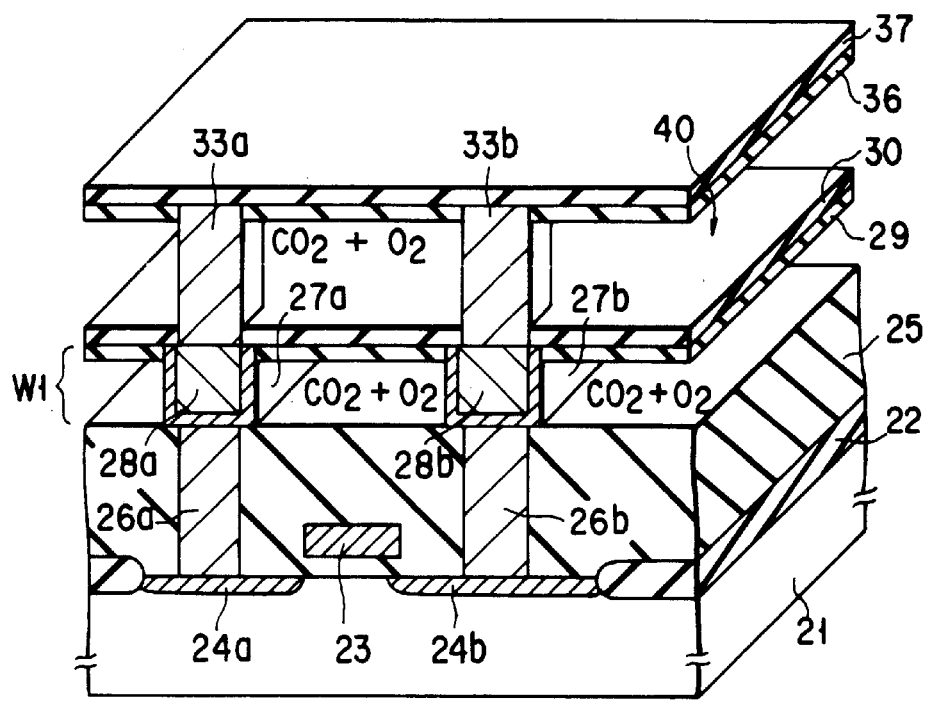
F I G. 39
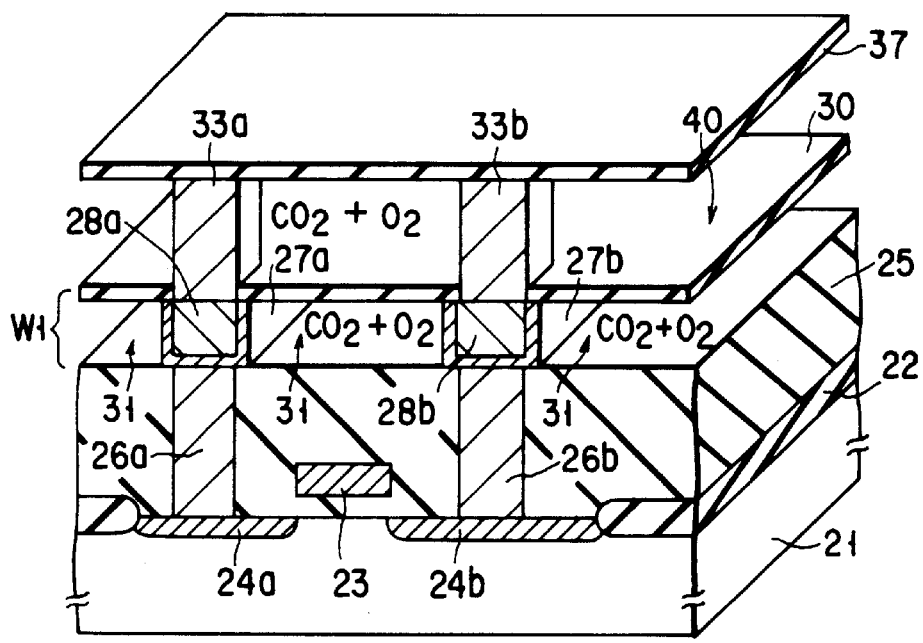
F I G. 40

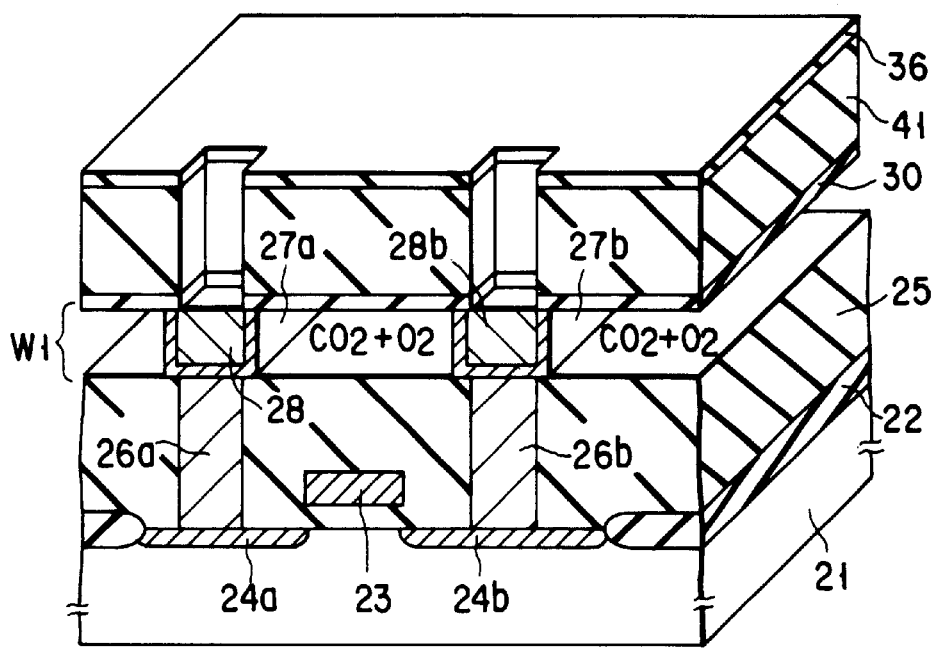
F I G. 41
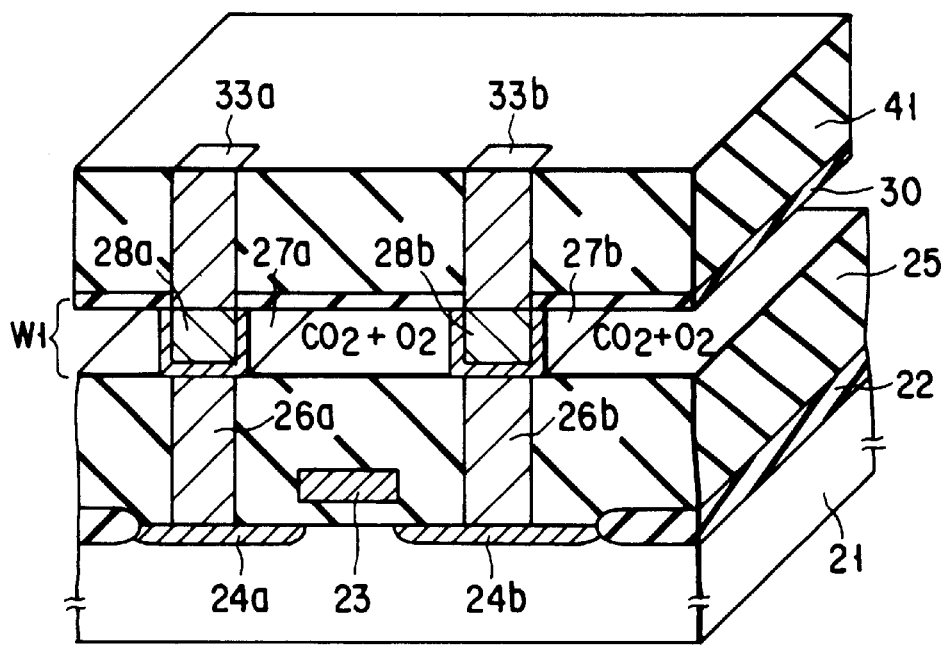
F I G. 42

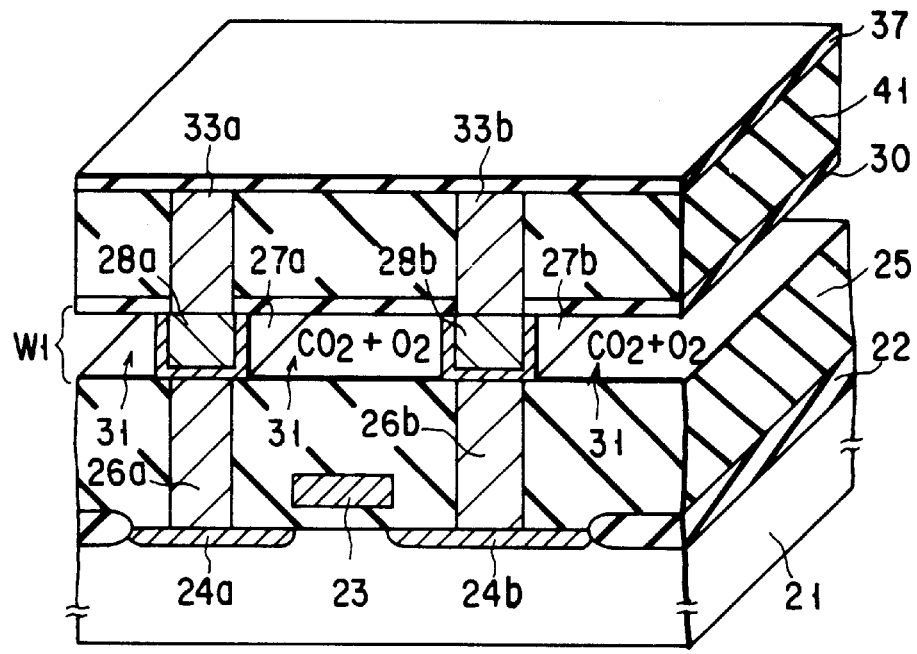
F I G. 43
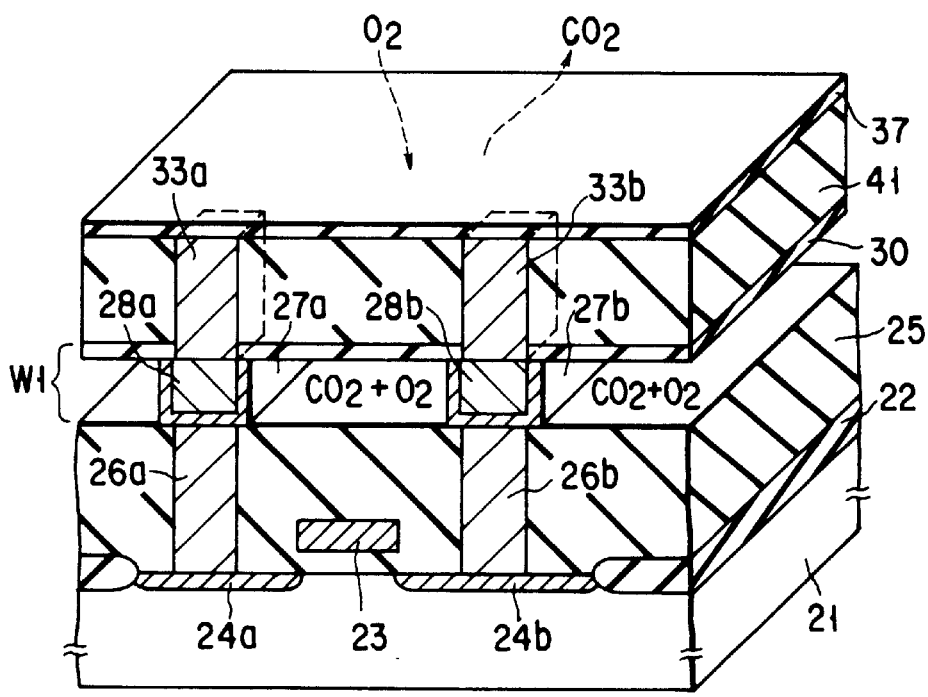
F I G. 44

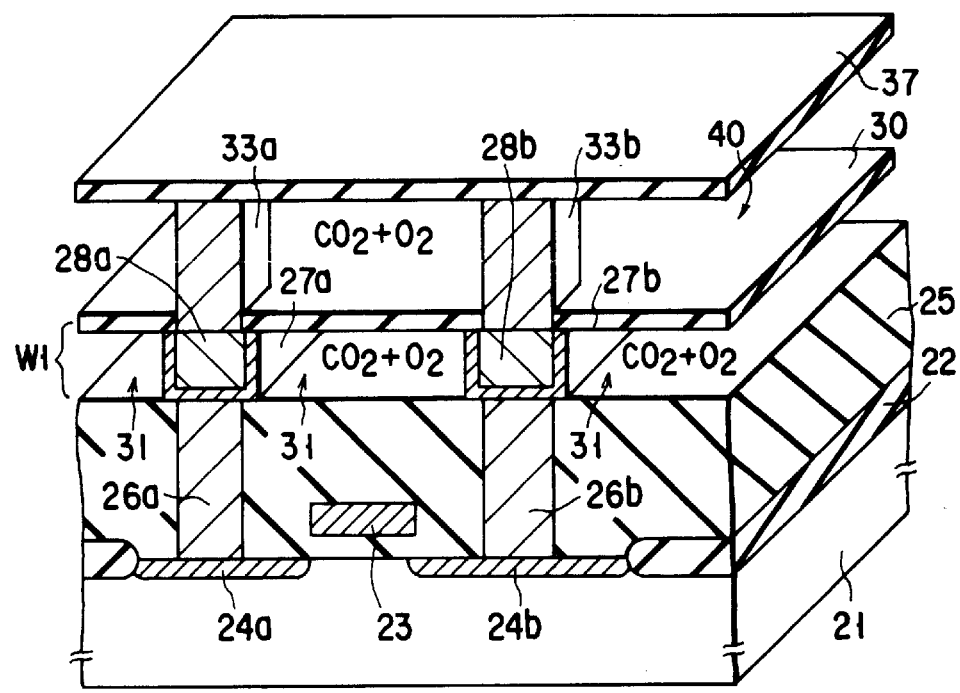
F I G. 45
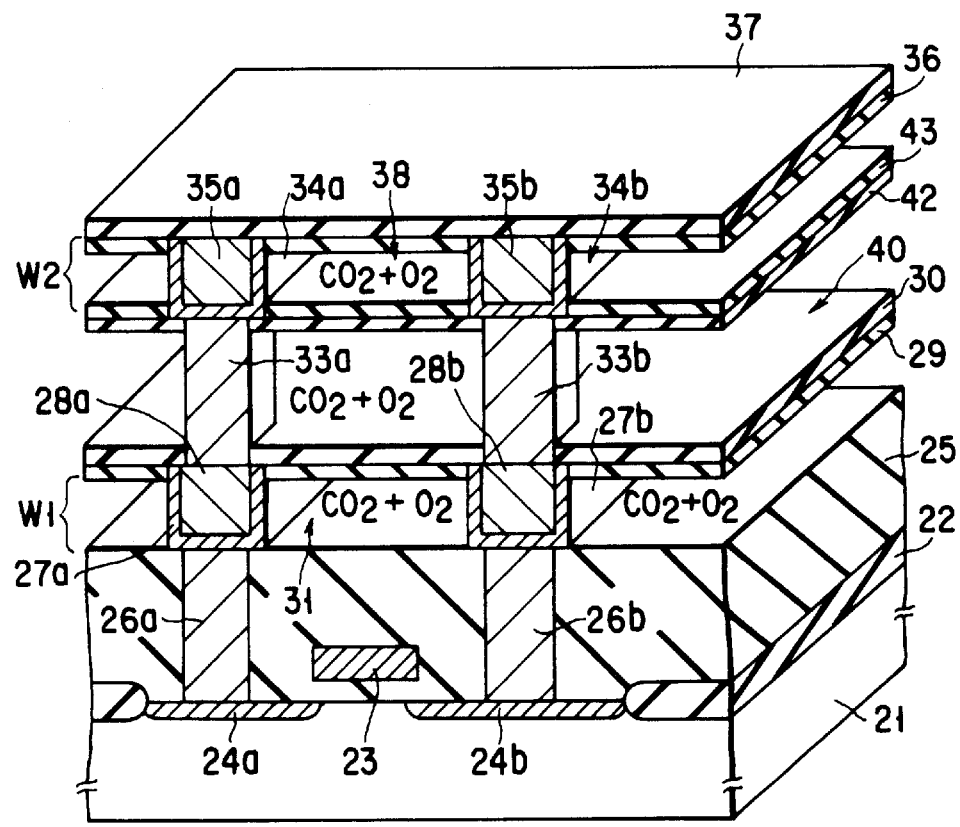
F I G. 46

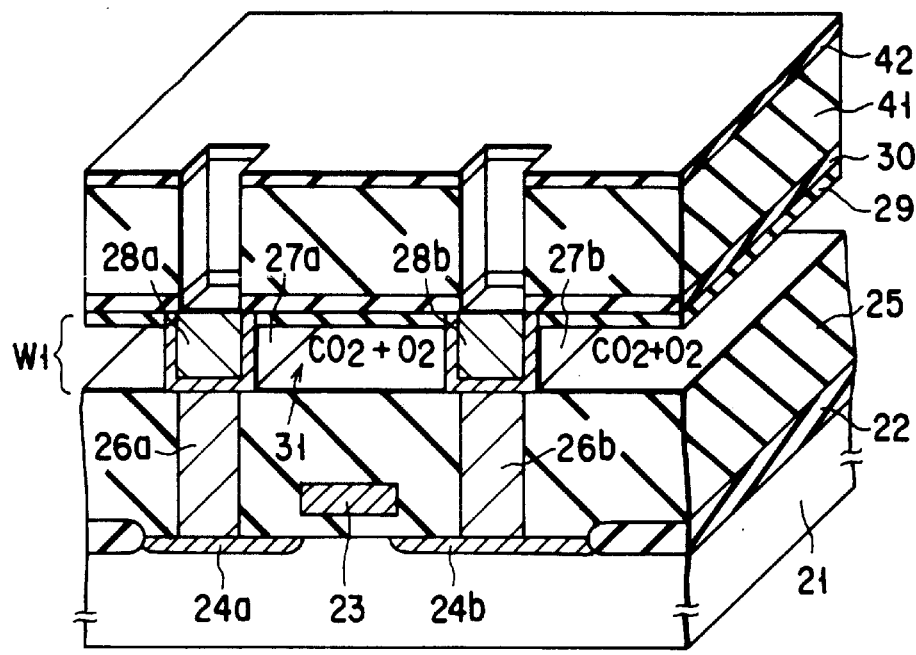
F I G. 47
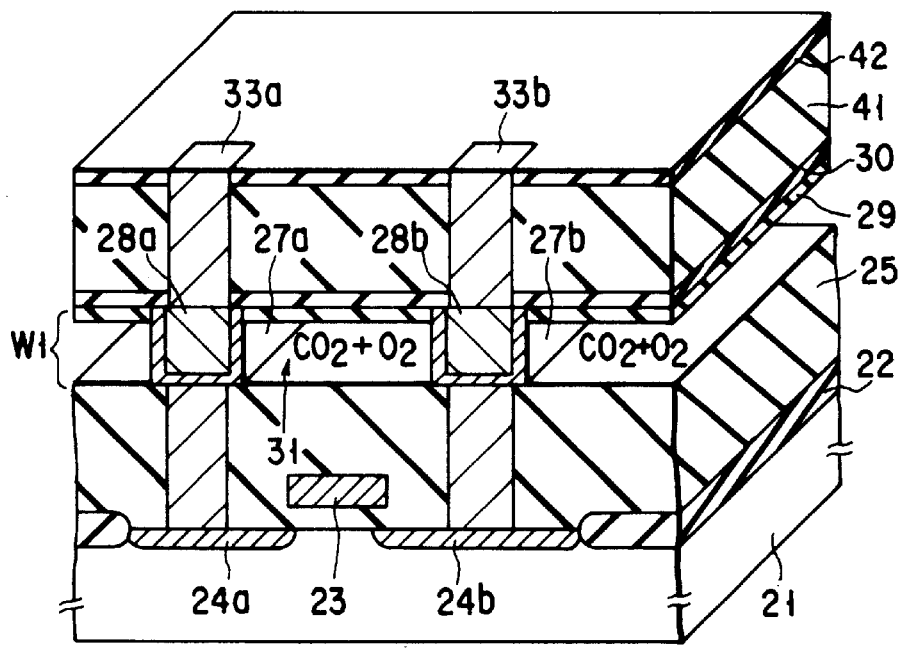
F I G. 48

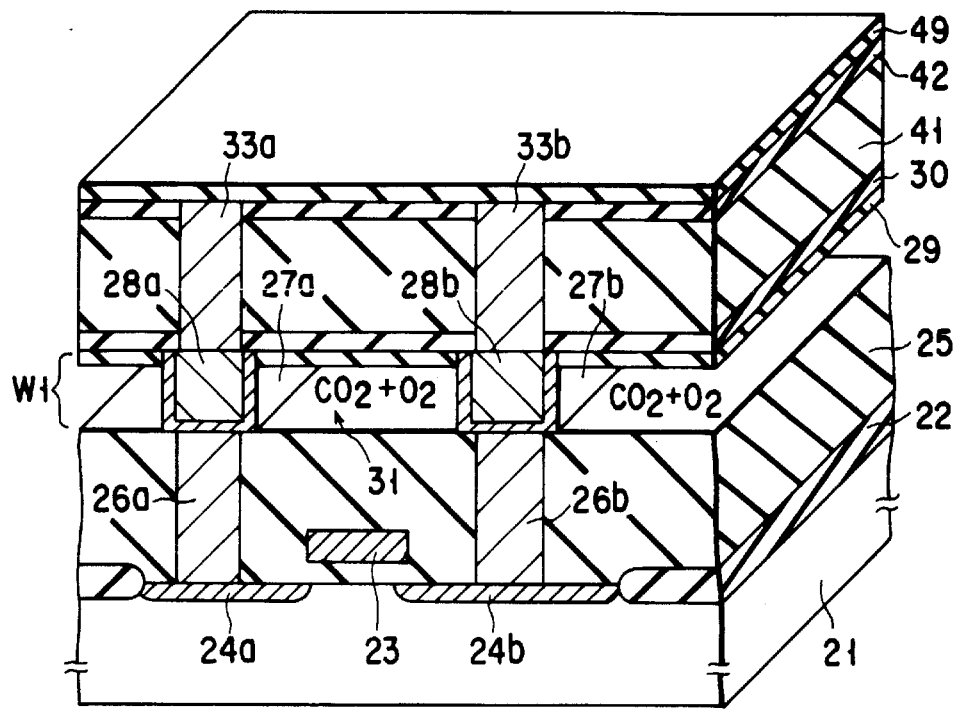
F I G. 49
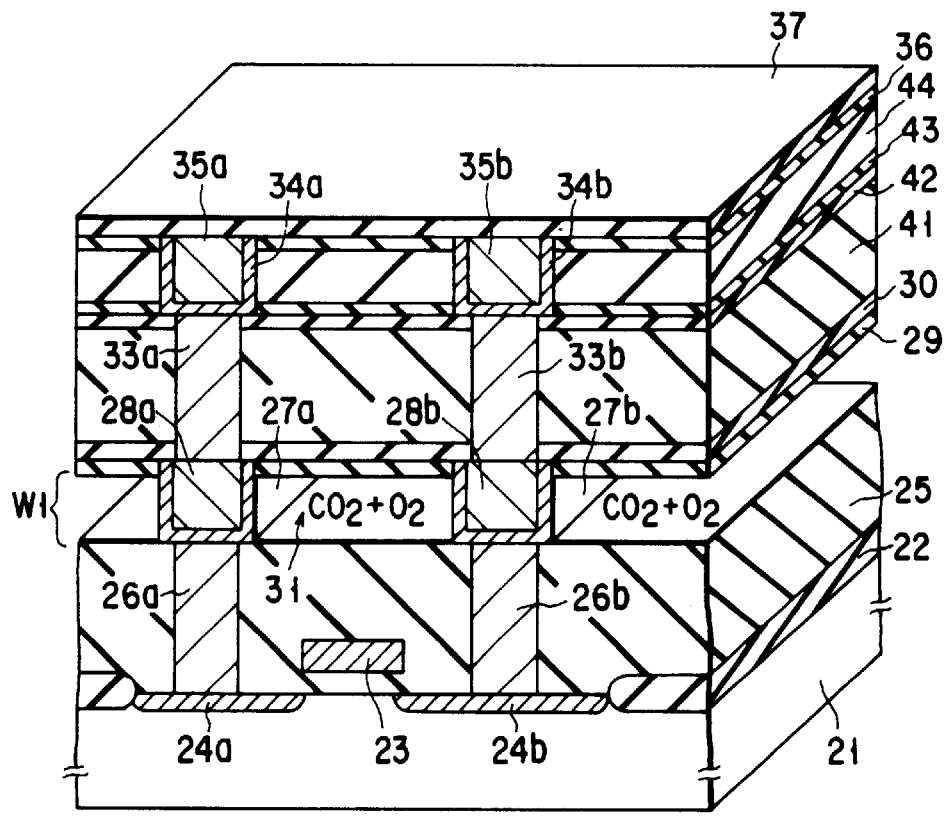
F I G. 50

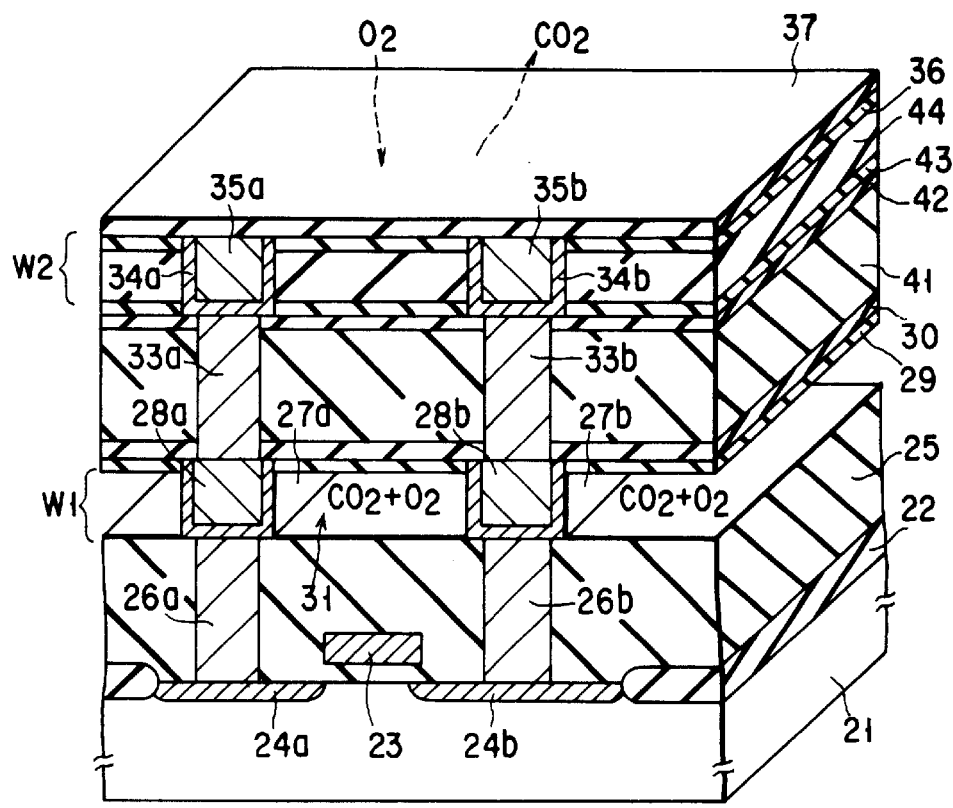
F I G. 51
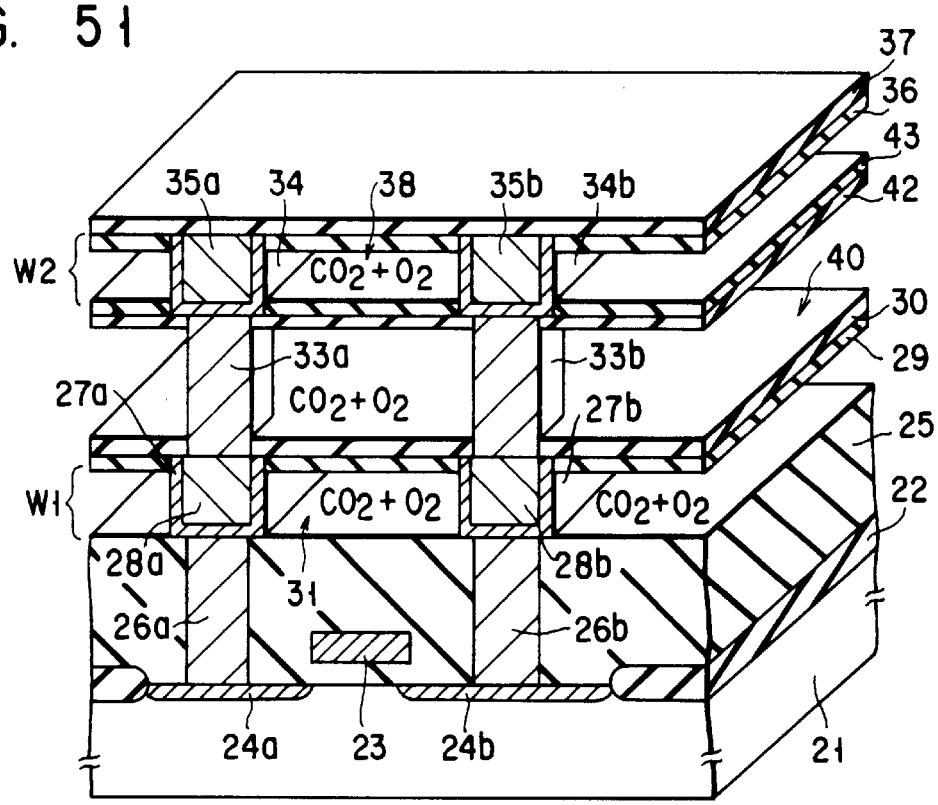
F I G. 52

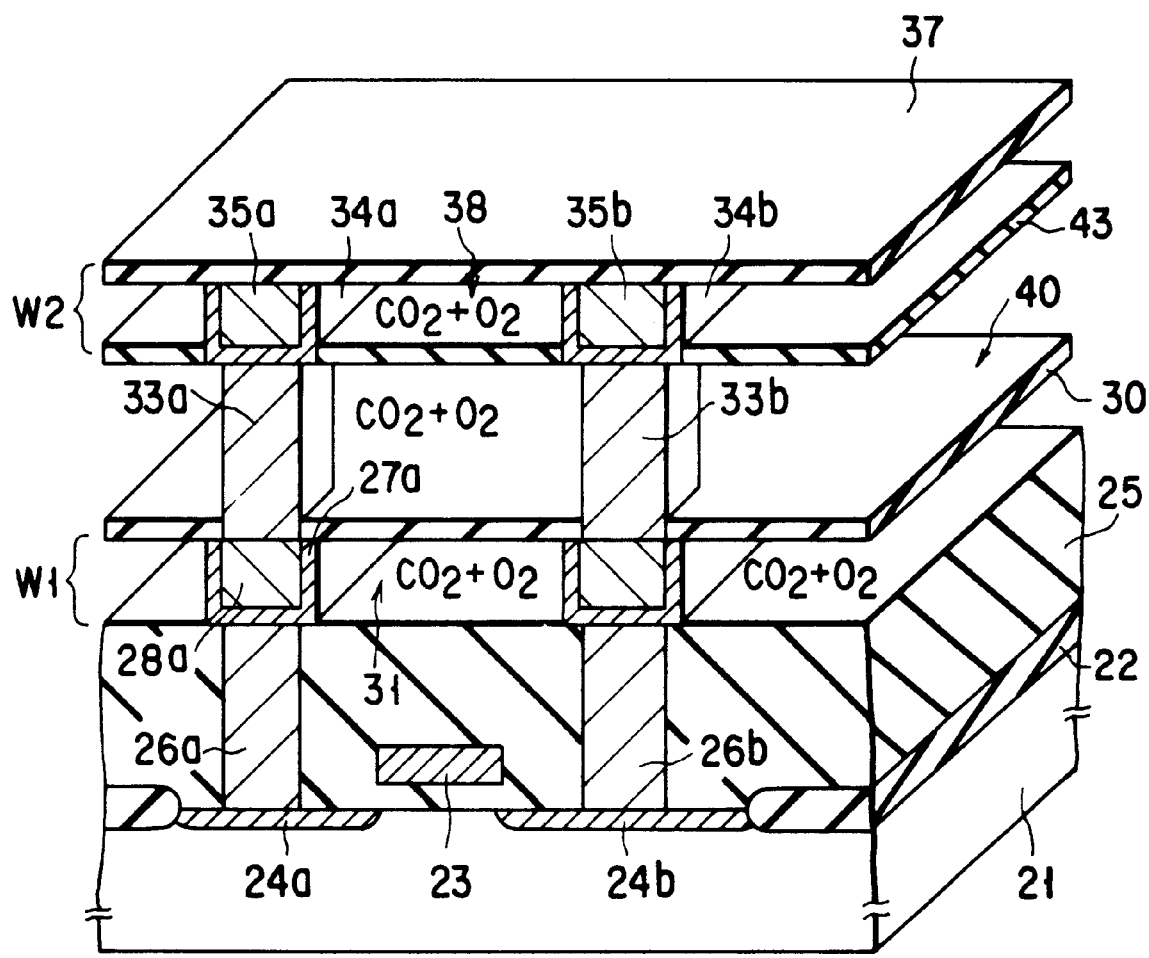
F I G. 53

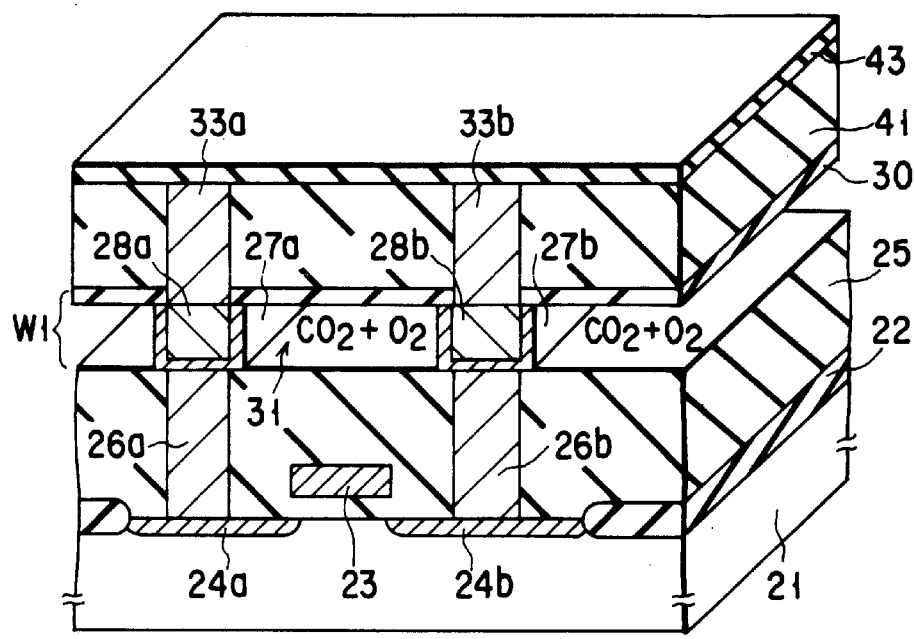
F I G. 56
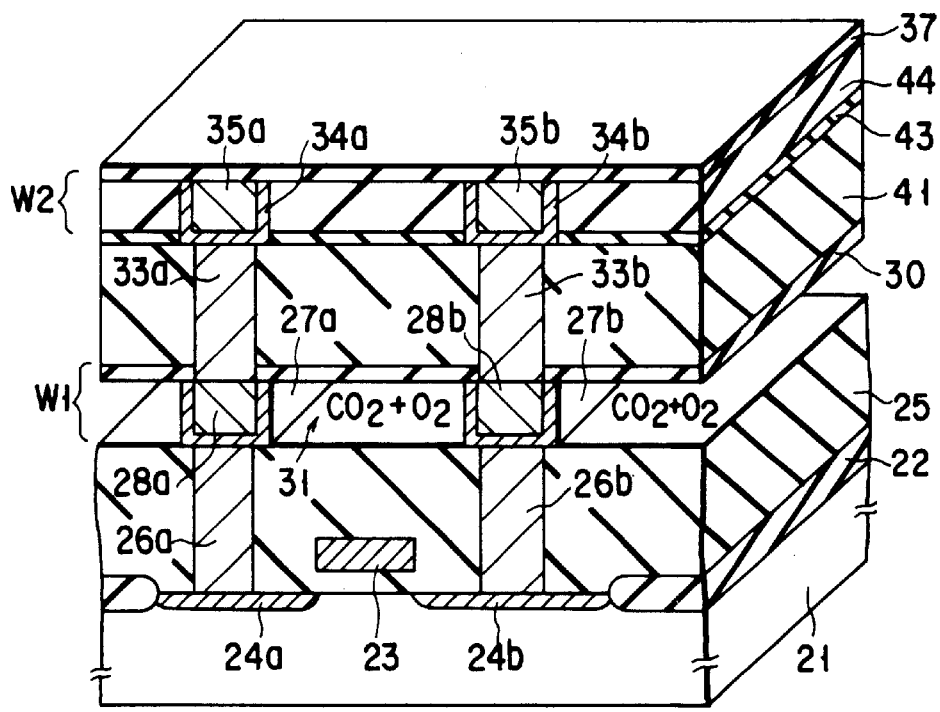
F I G. 57

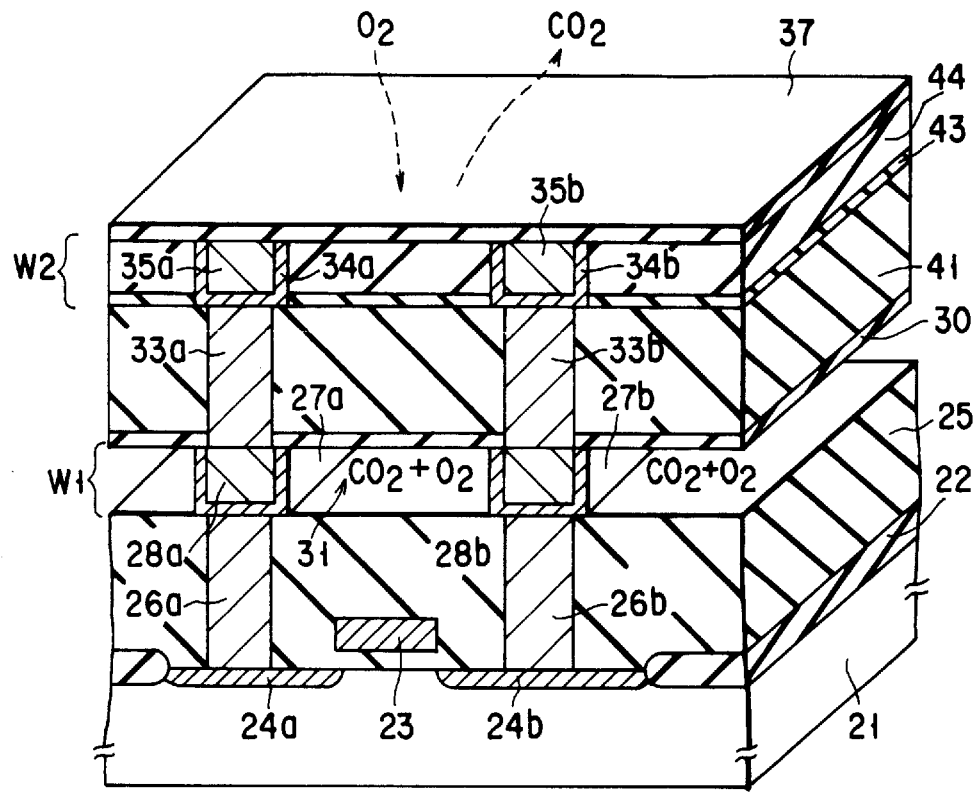
F I G. 58
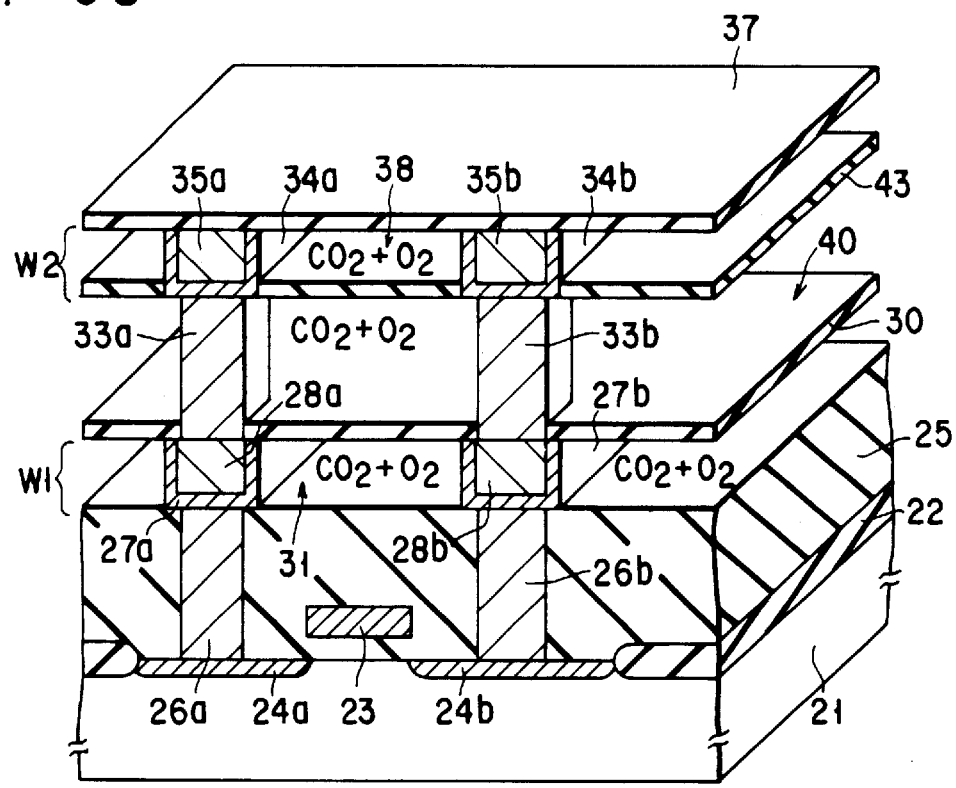
F I G. 59

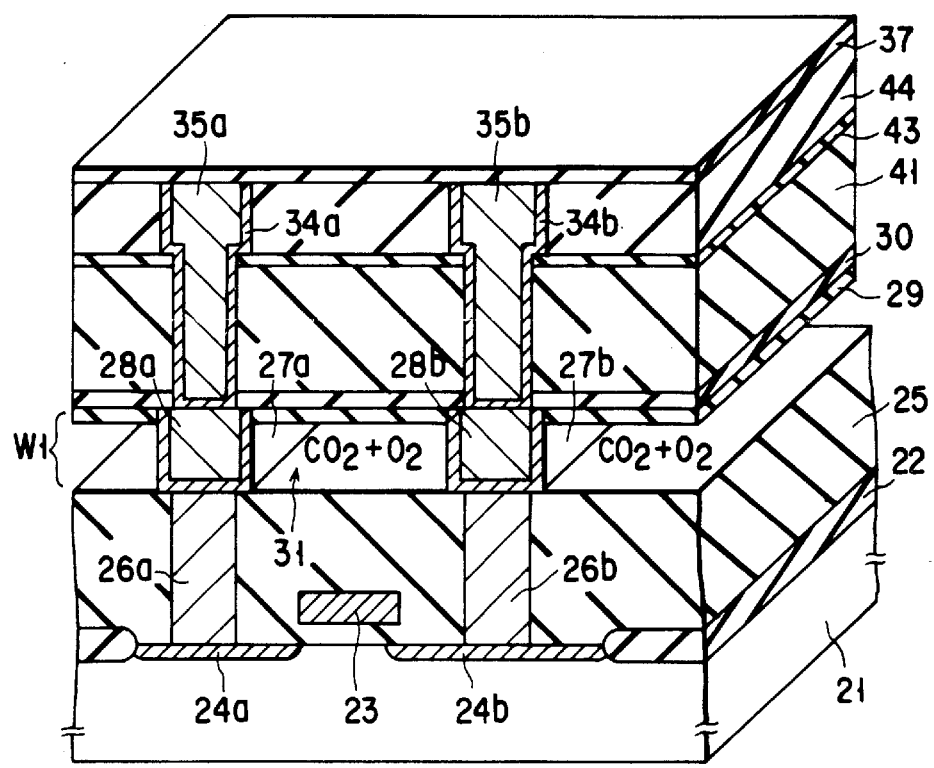
F I G. 64
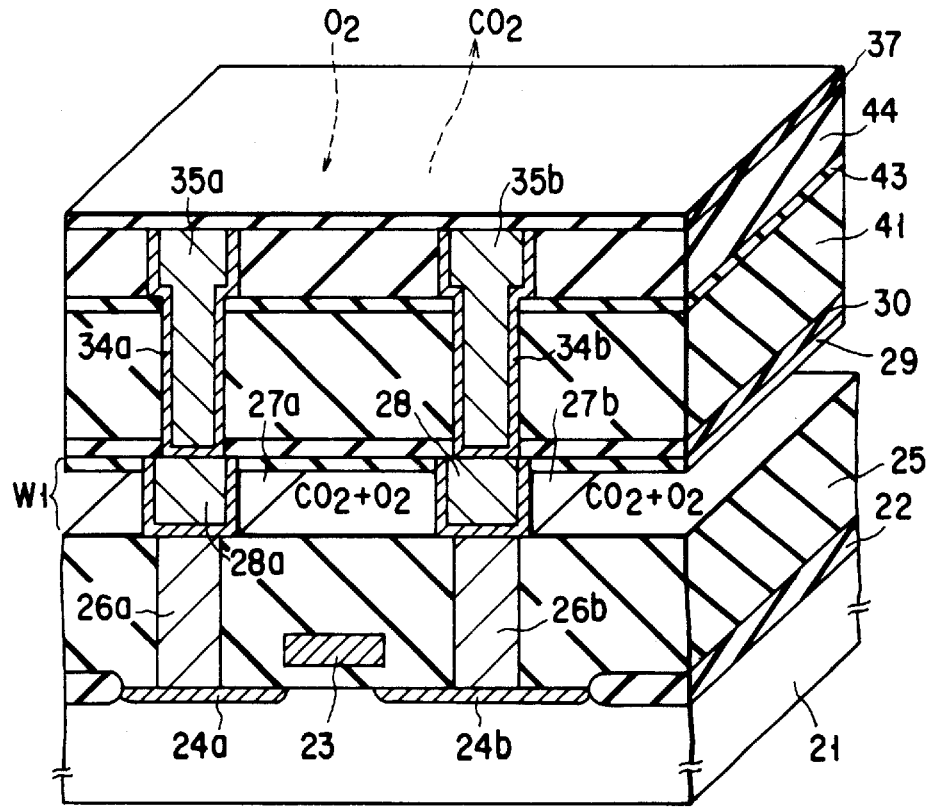
F I G. 65

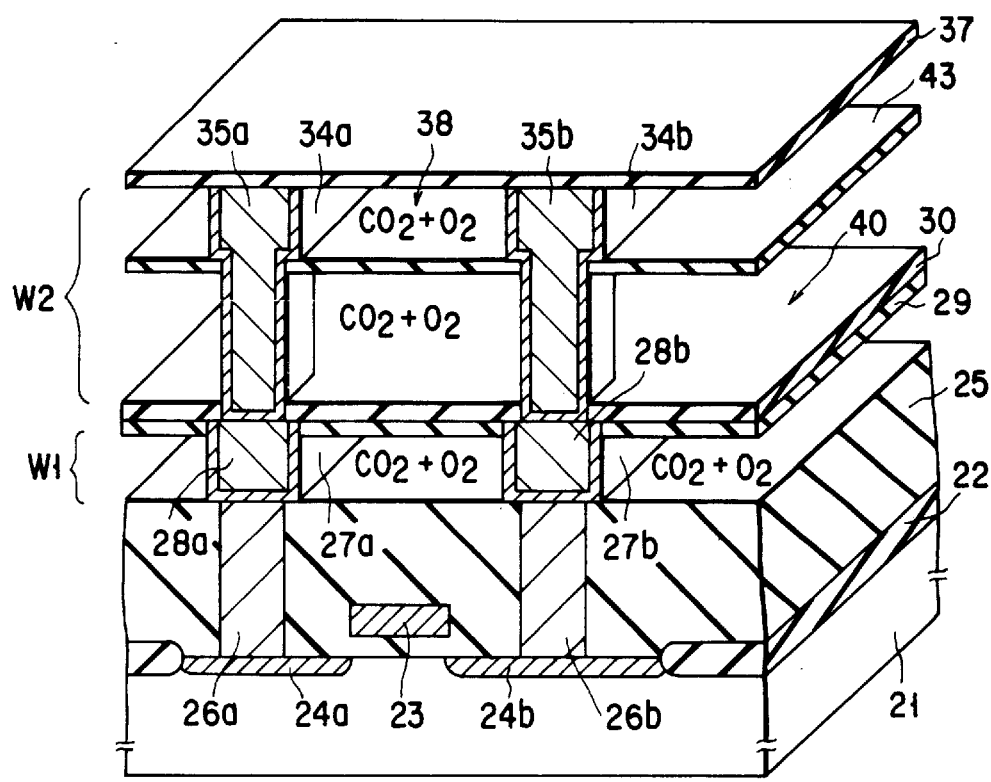
F I G. 66
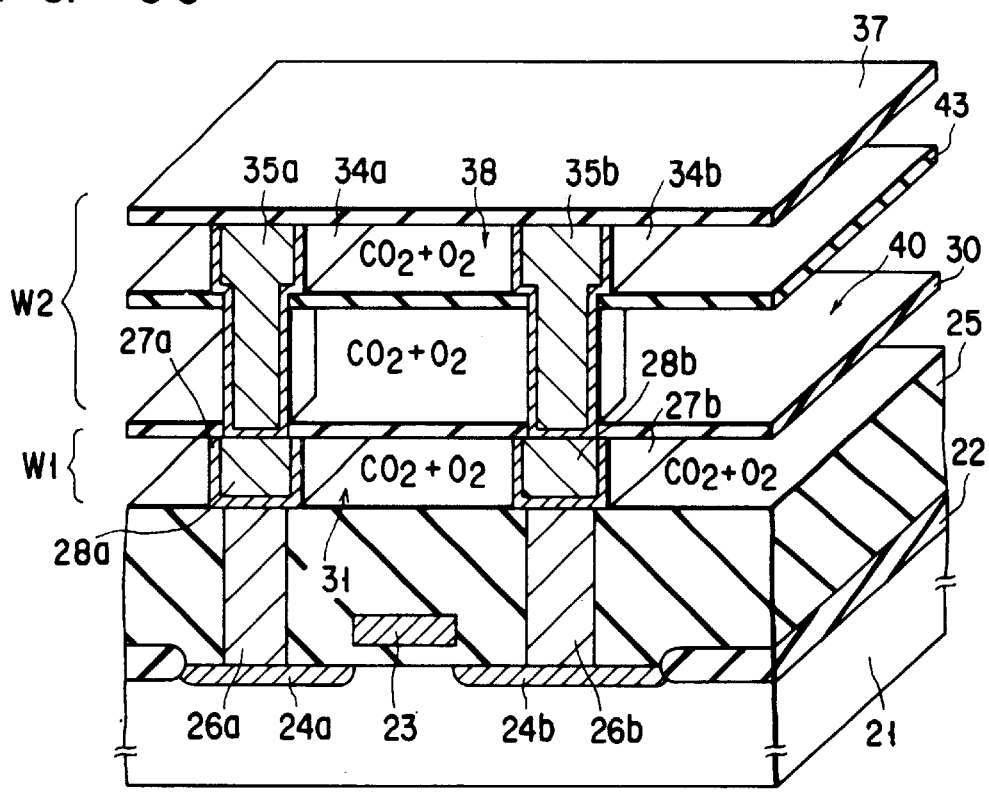
F I G. 67

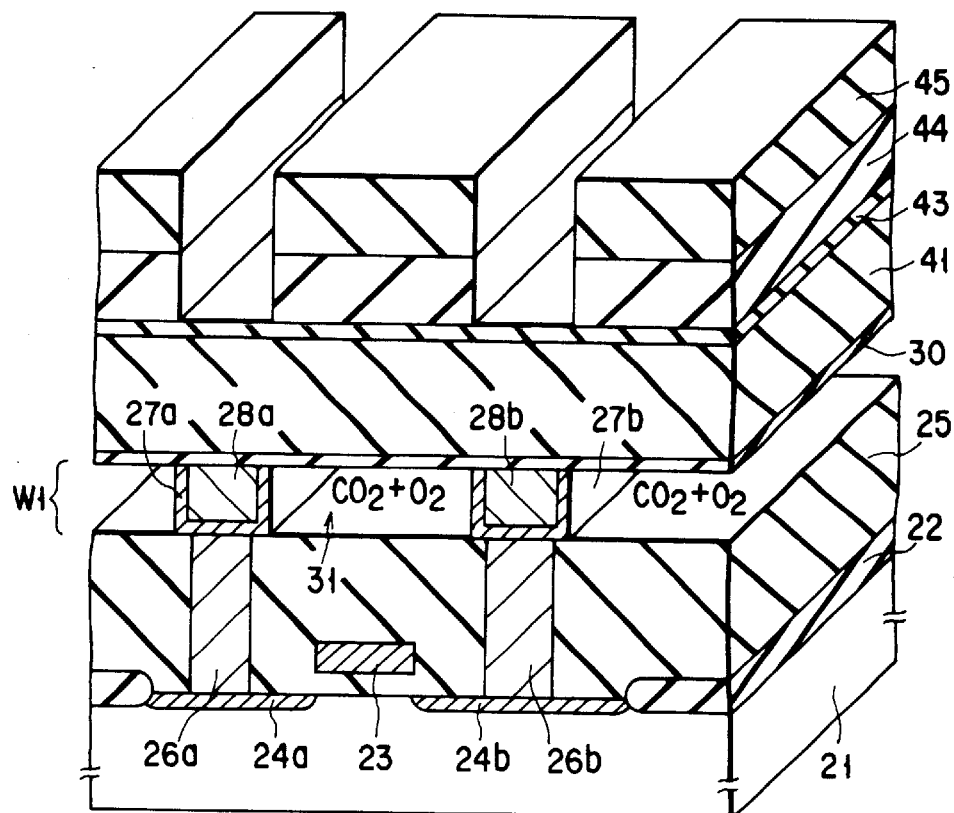
F I G. 68
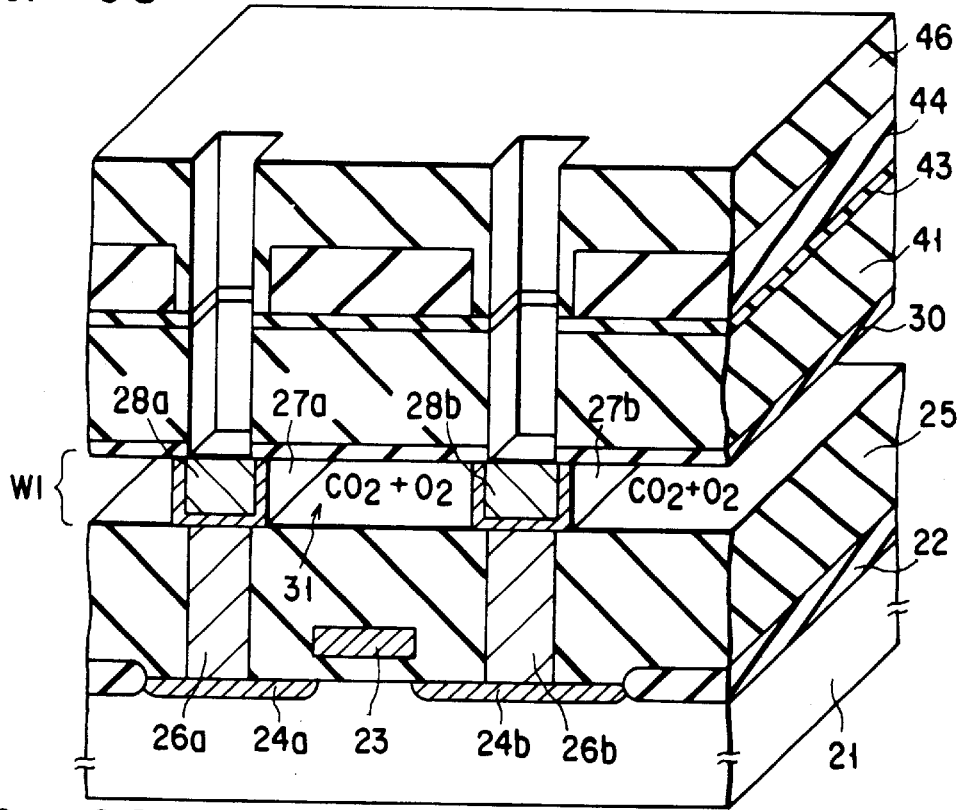
F I G. 69

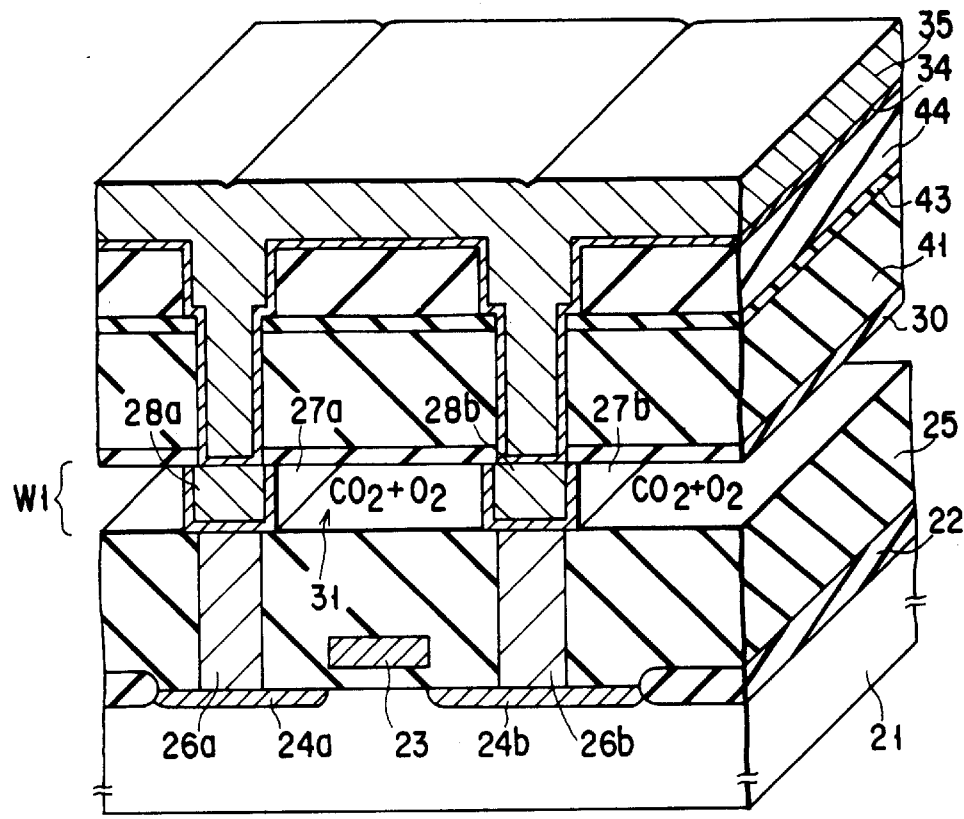
F I G. 70
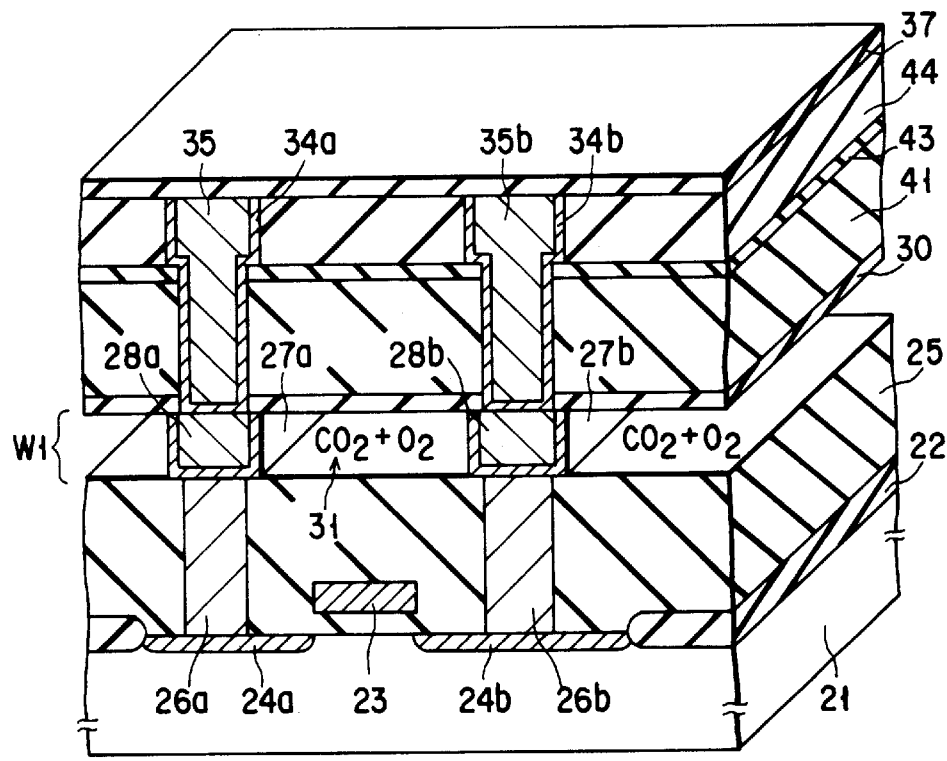
F I G. 71

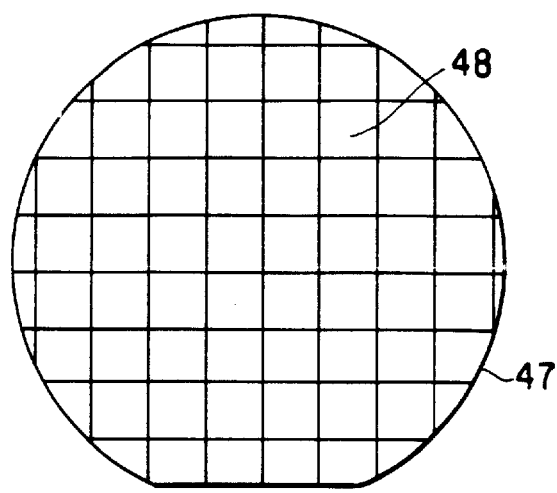
F I G. 74
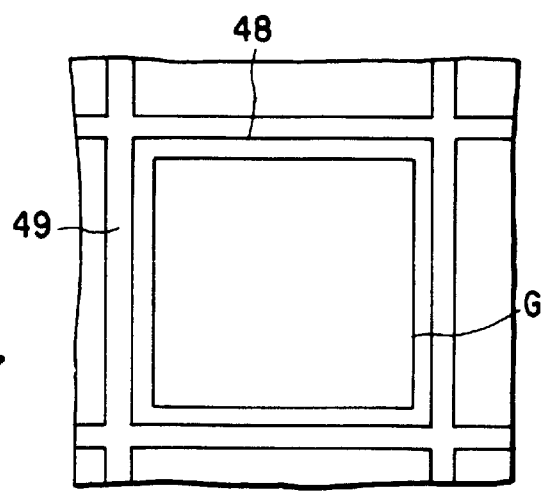
F I G. 75
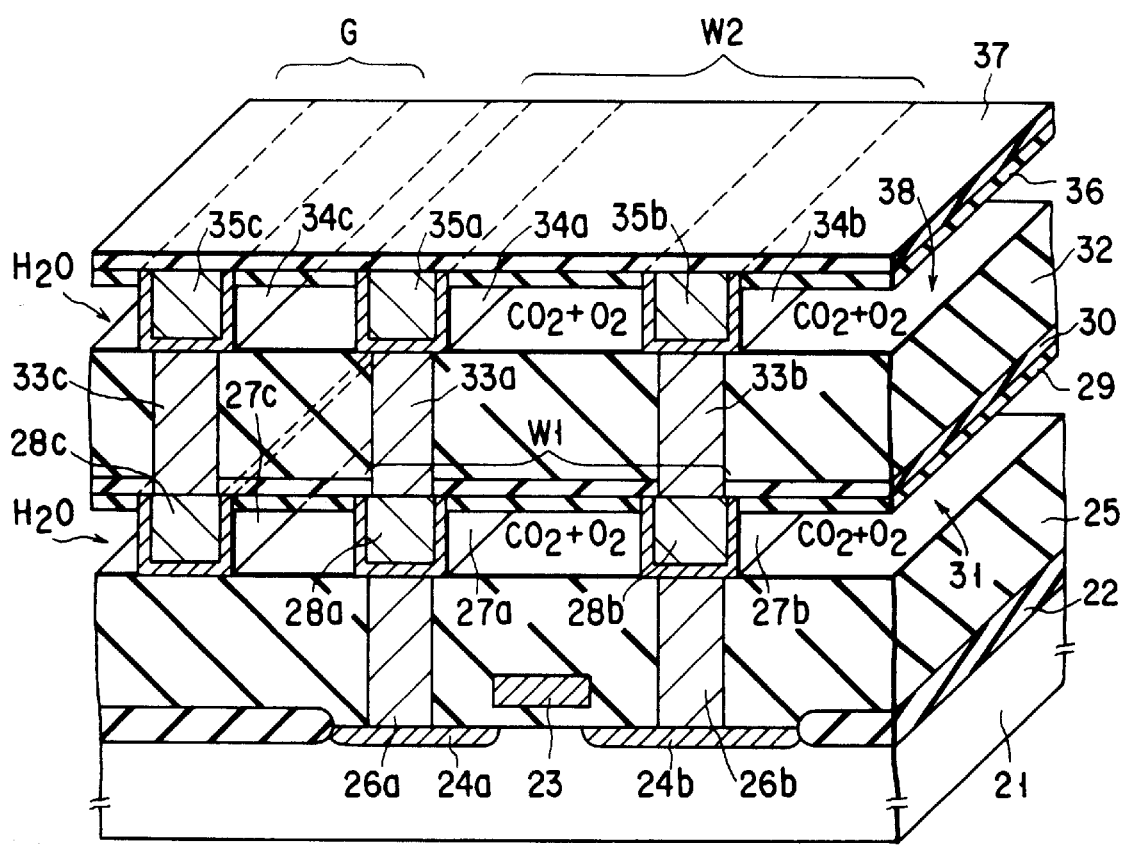
F I G. 76

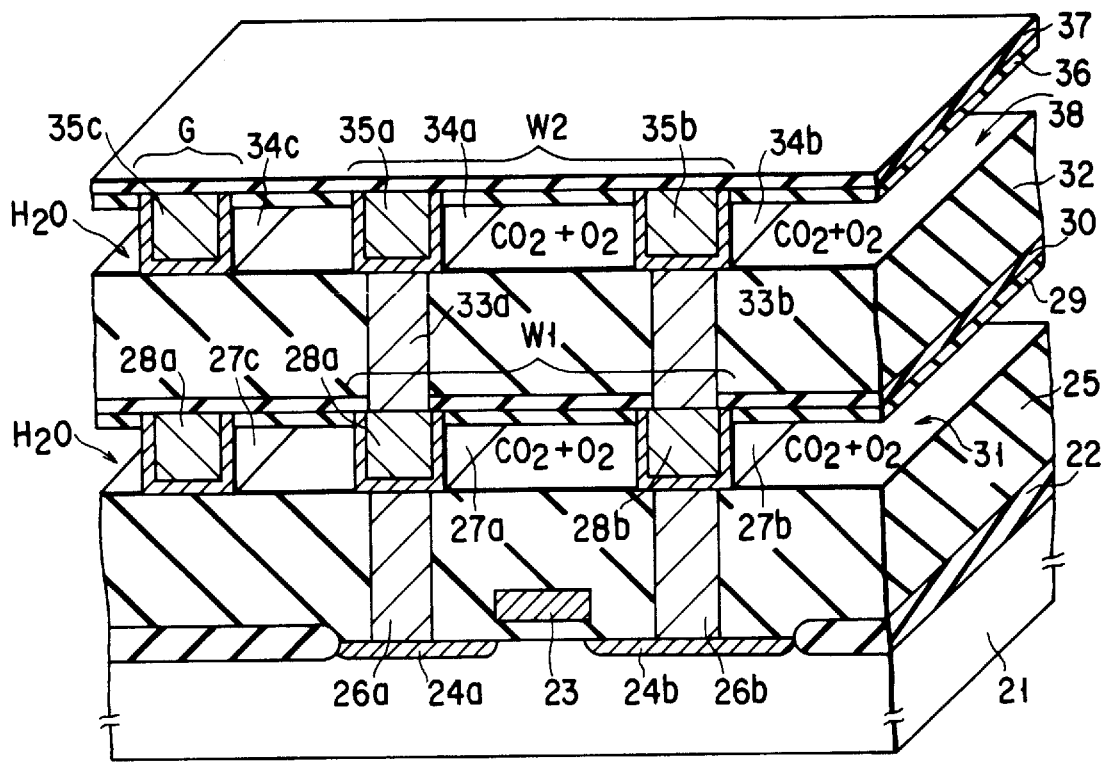
F I G. 77
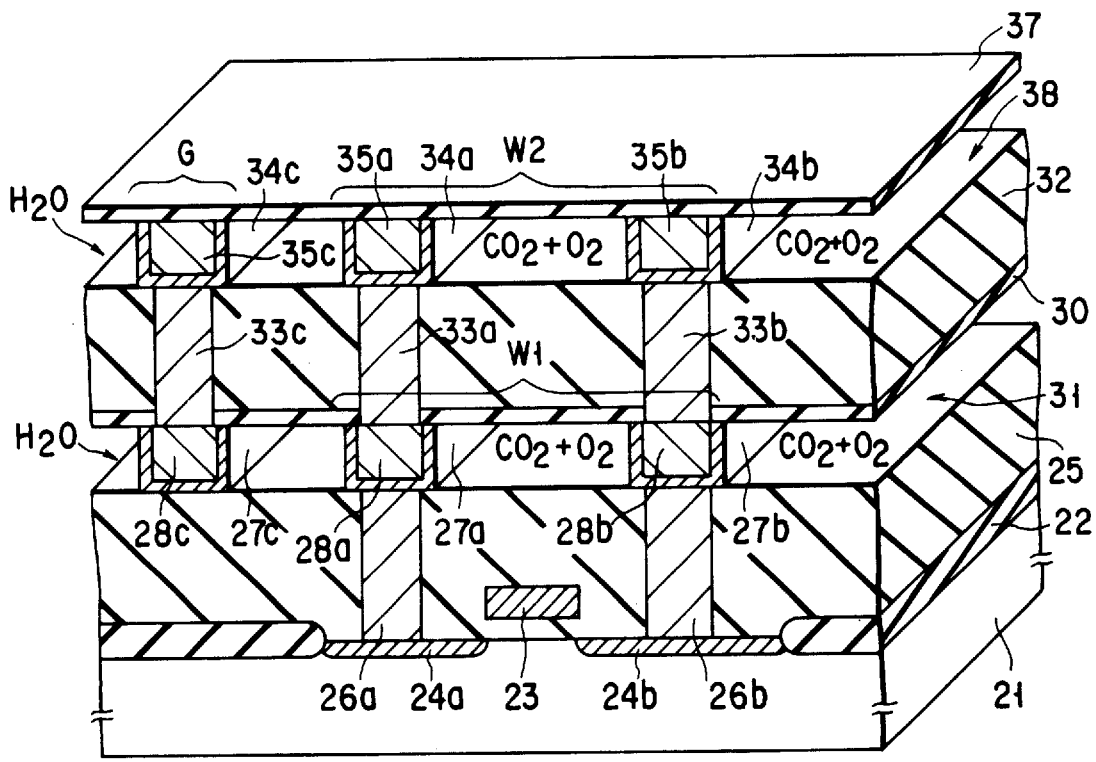
F I G. 78

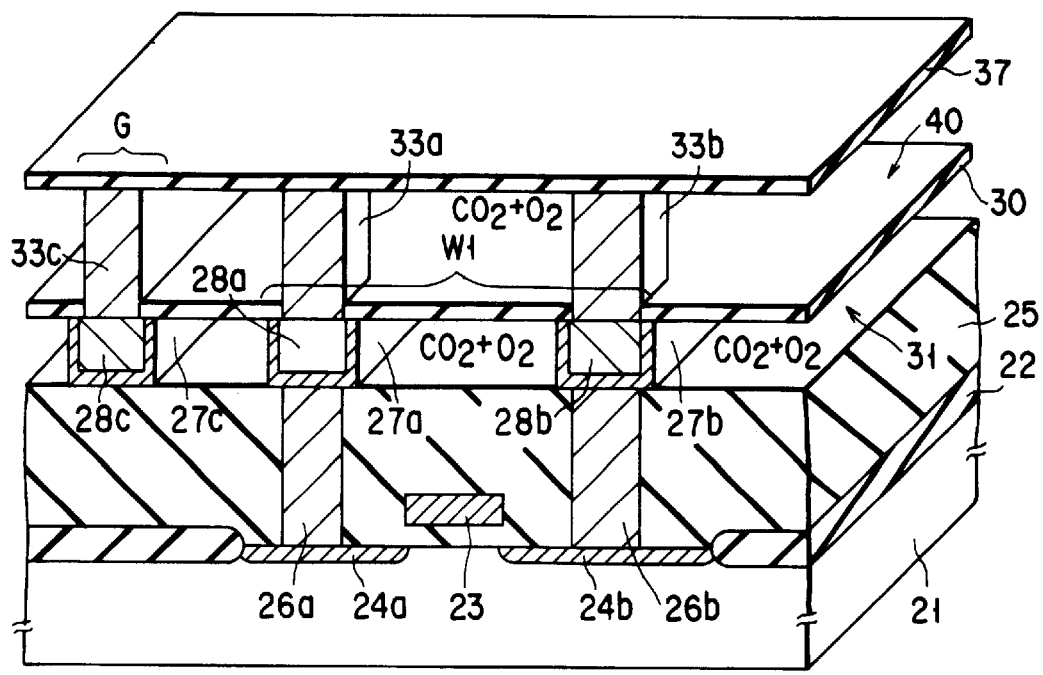
F I G. 81
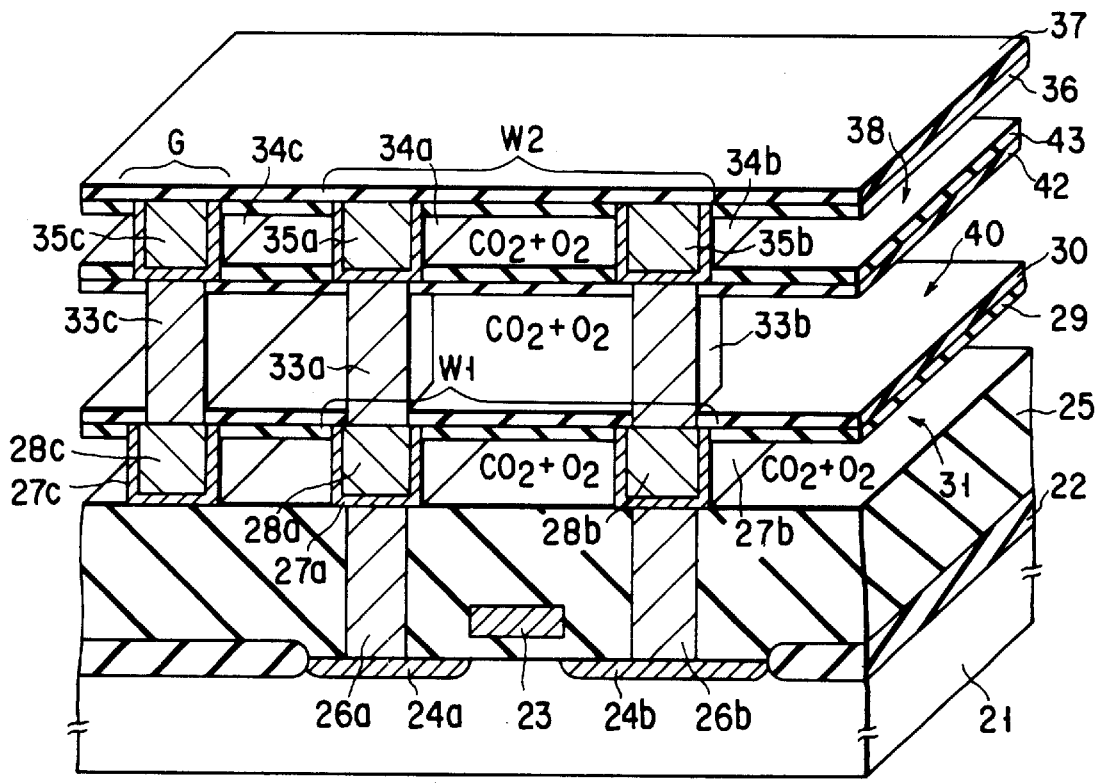
F I G. 82

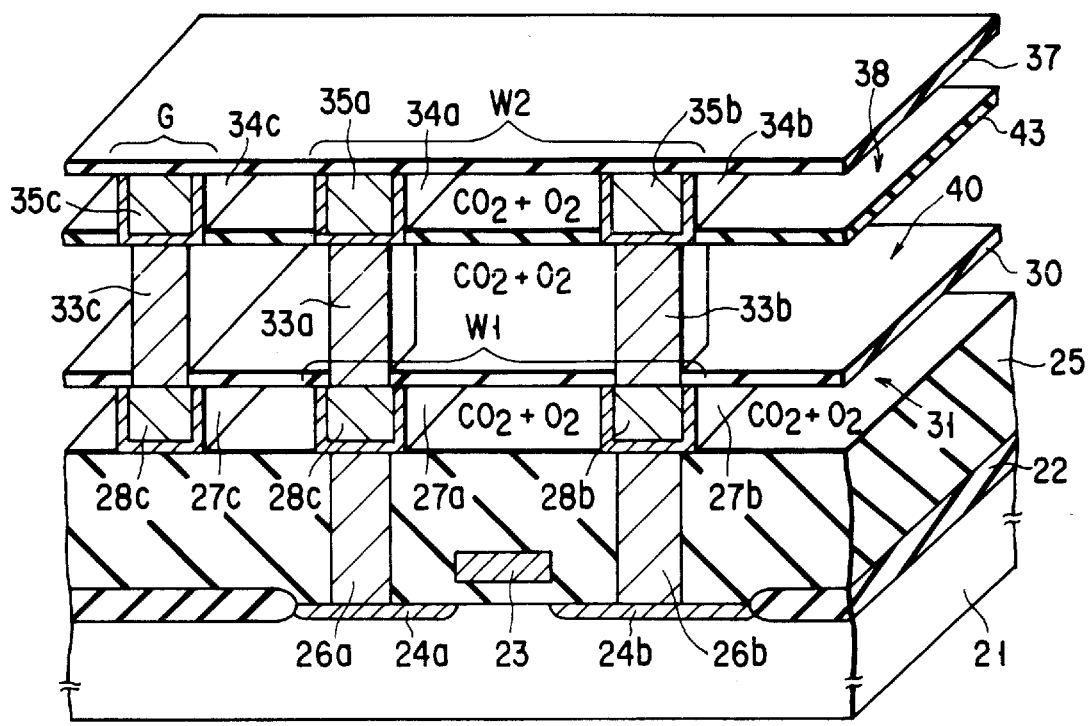
F I G. 83
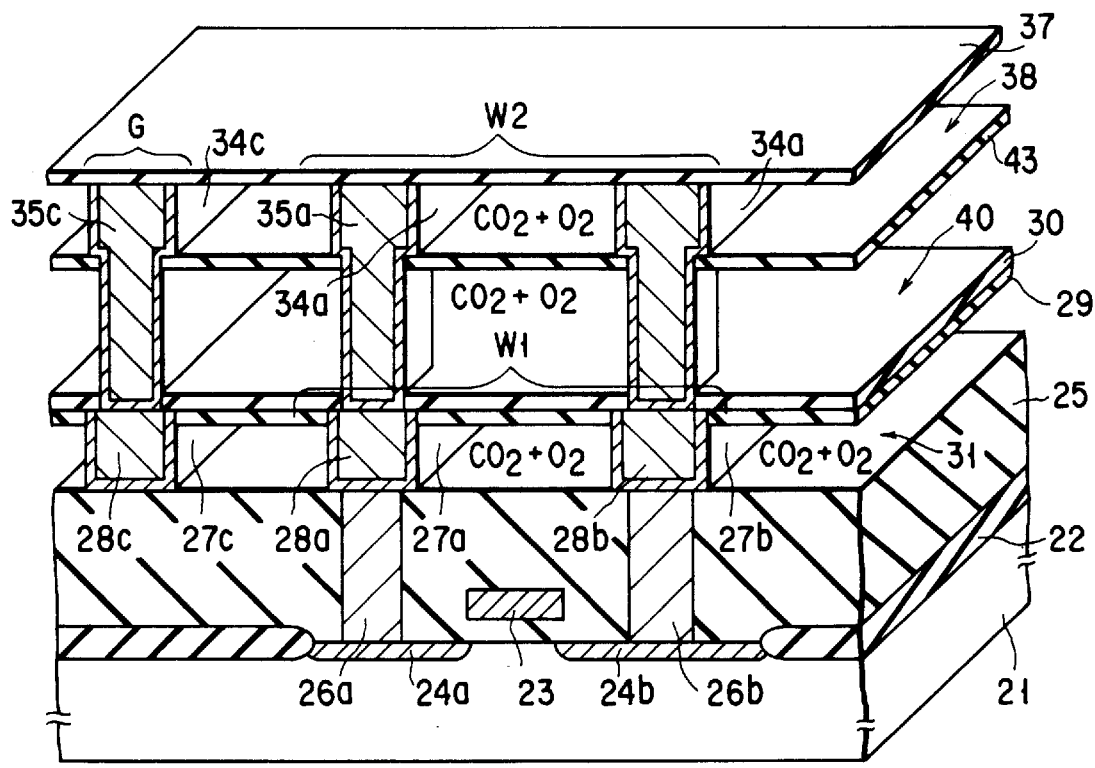
F I G. 84

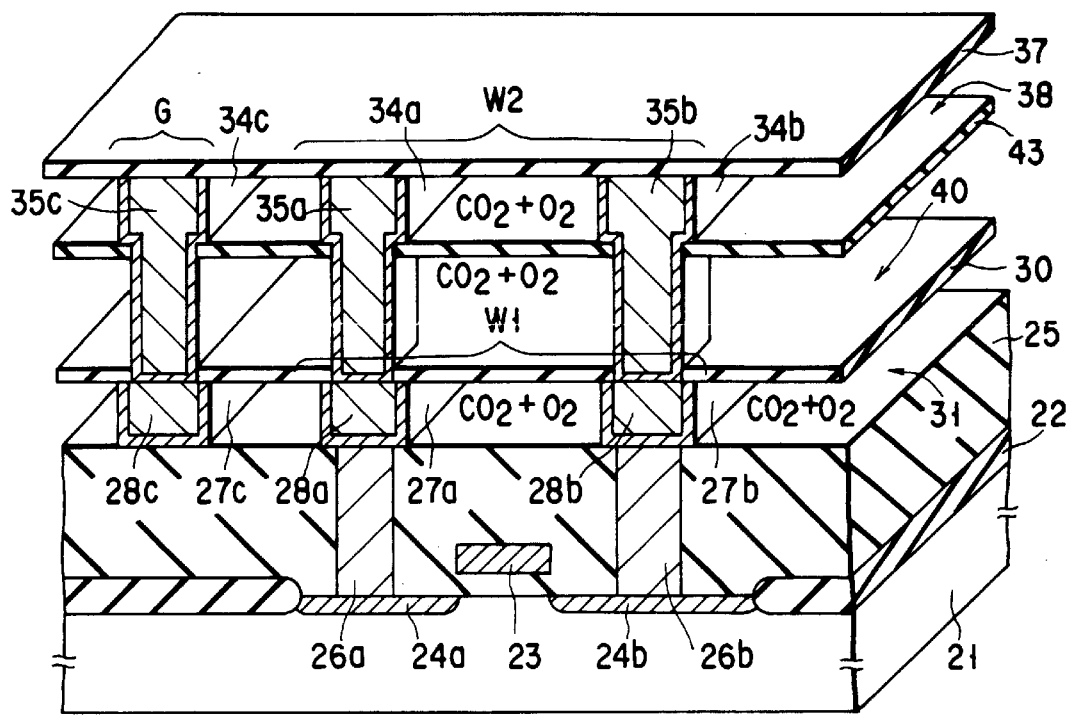
F I G. 85
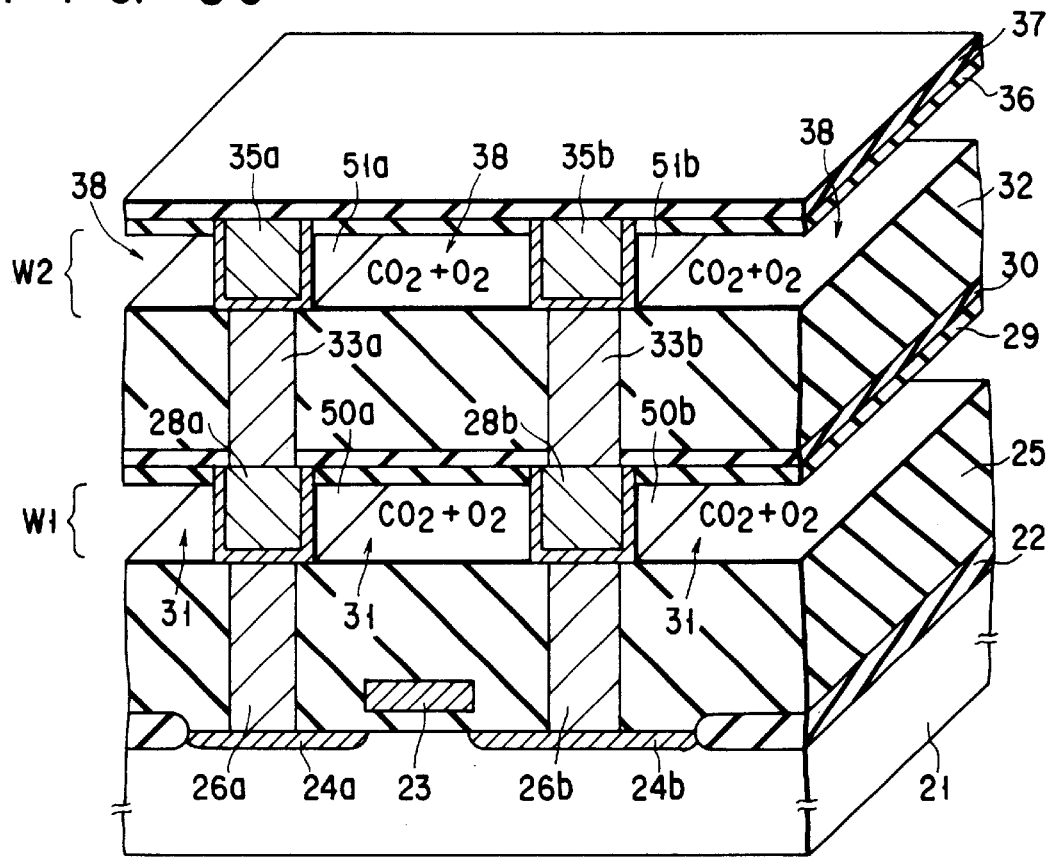
F I G. 86

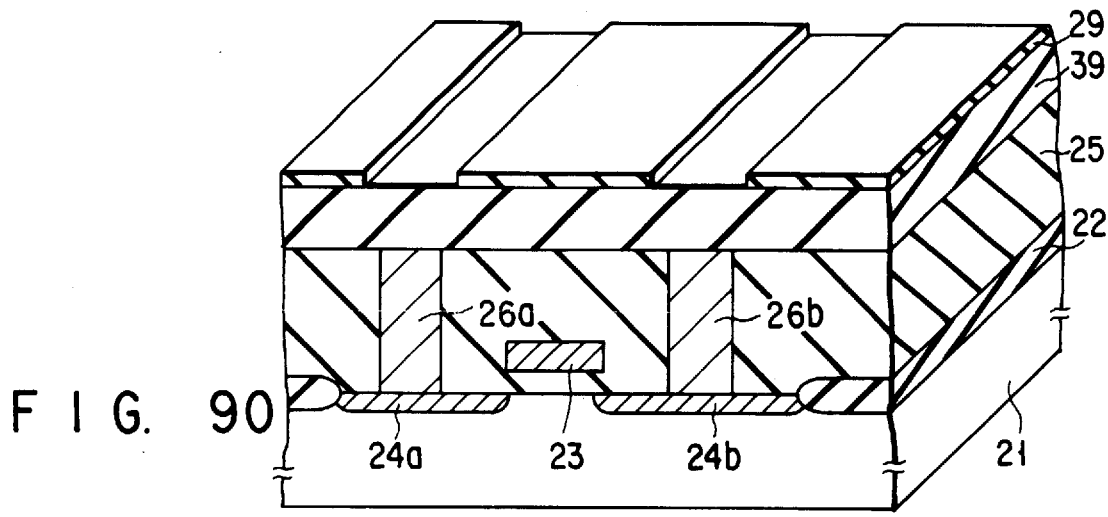
F I G. 90
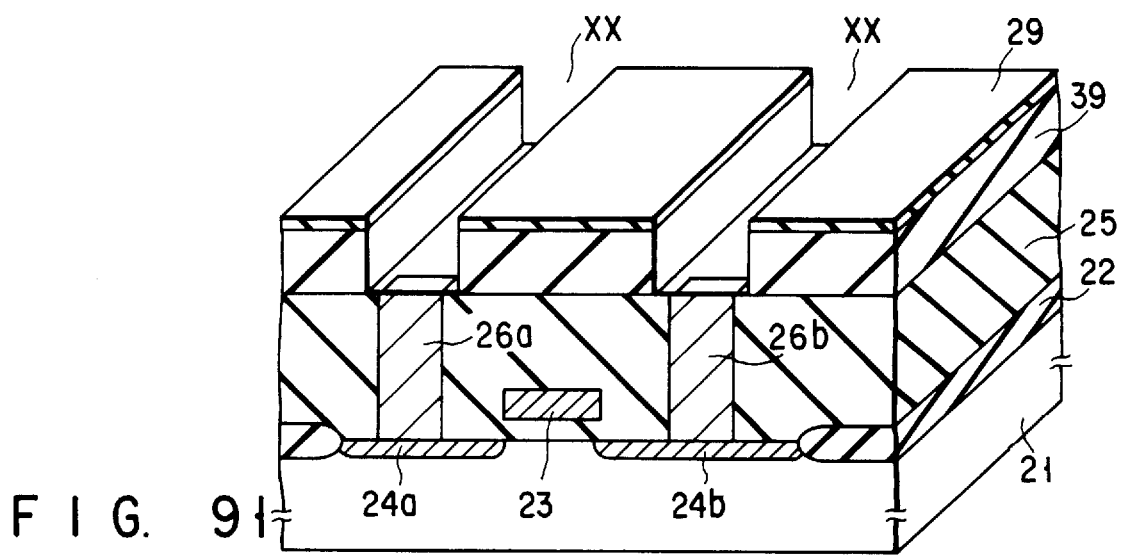
F I G. 91
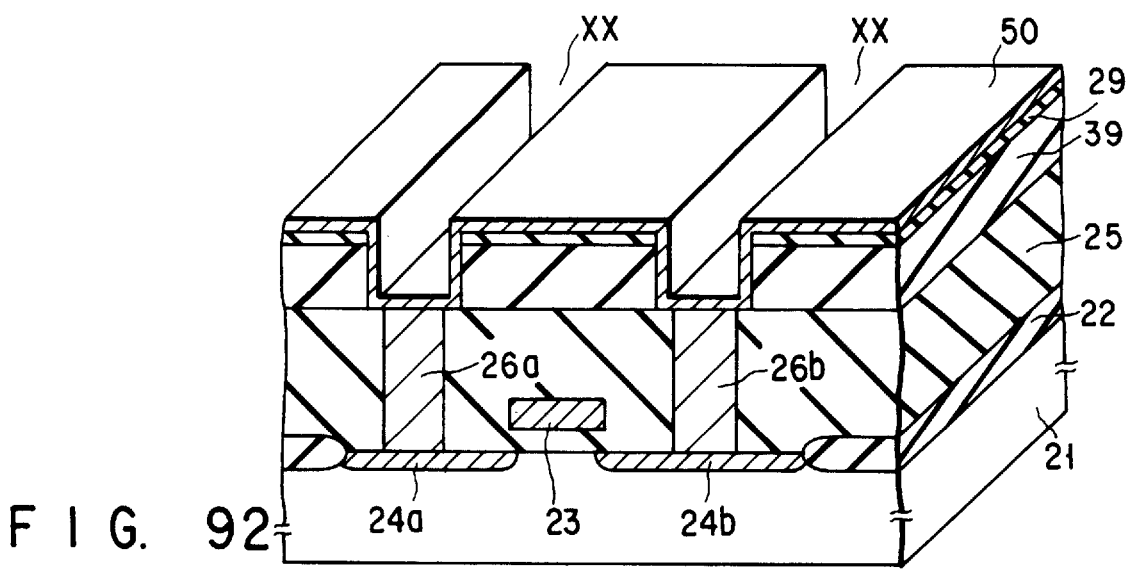
F I G. 92

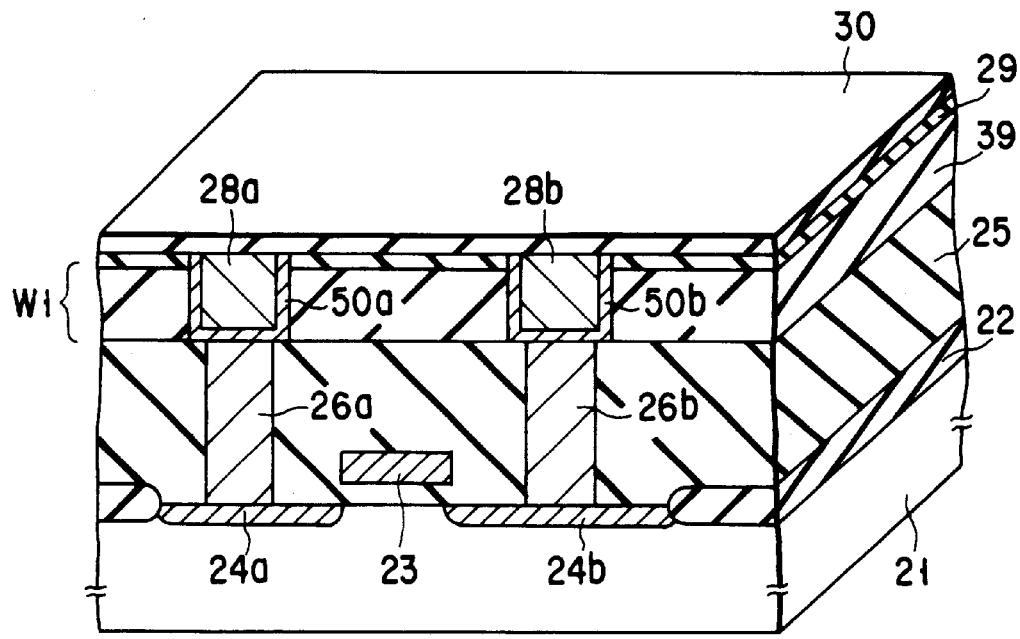
F I G. 95
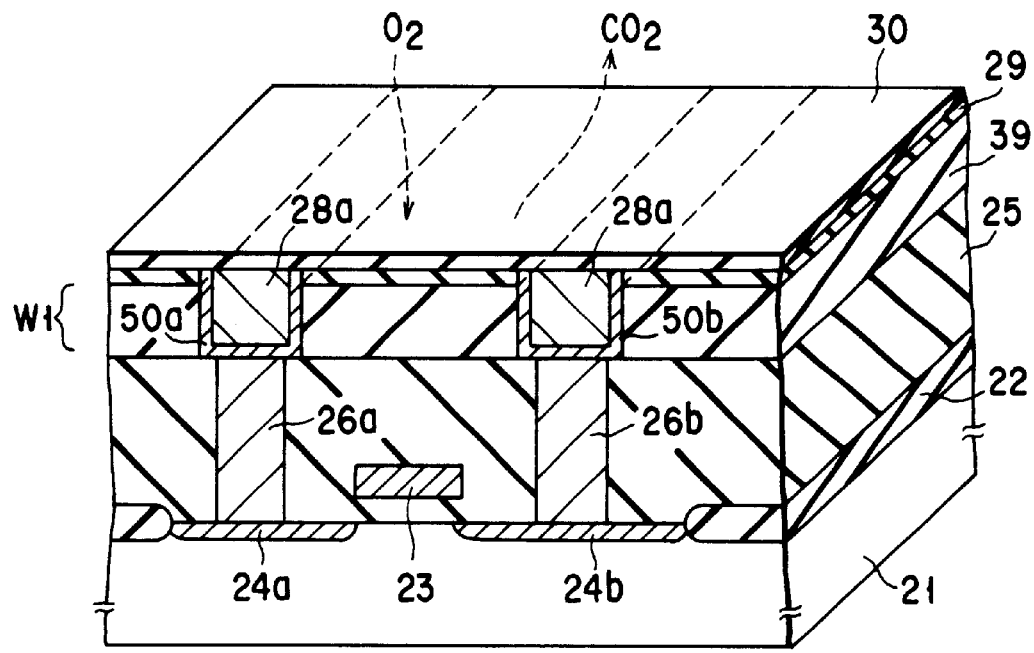
F I G. 96

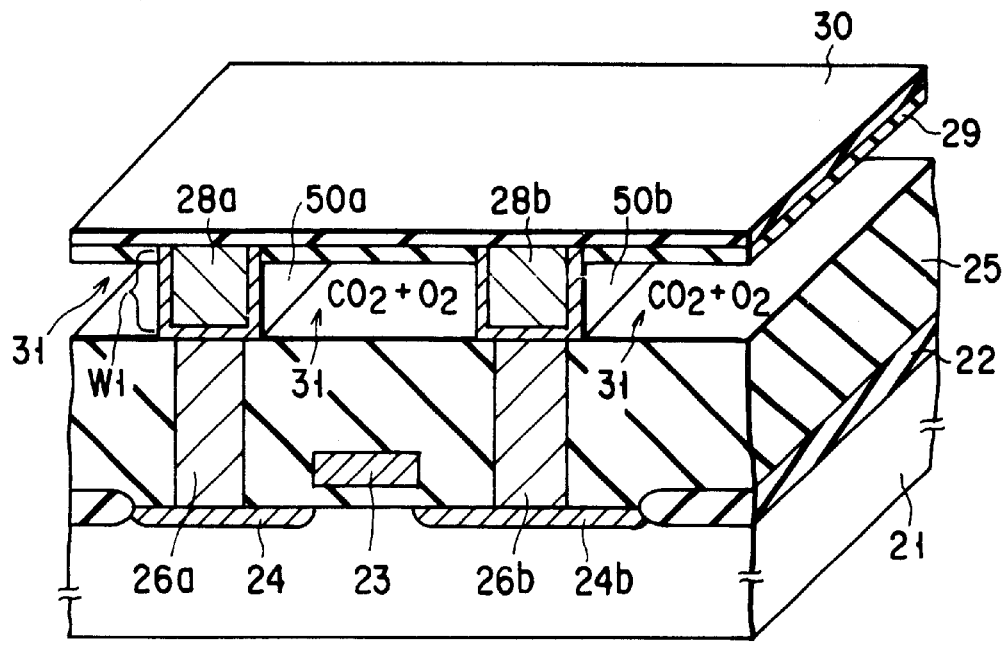
F I G. 97
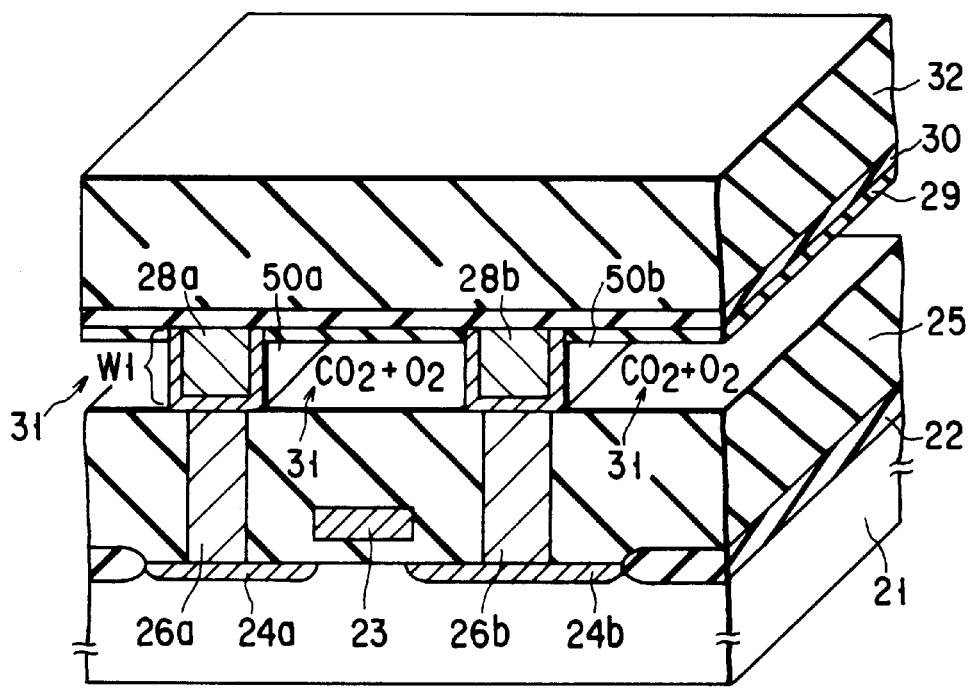
F I G. 98

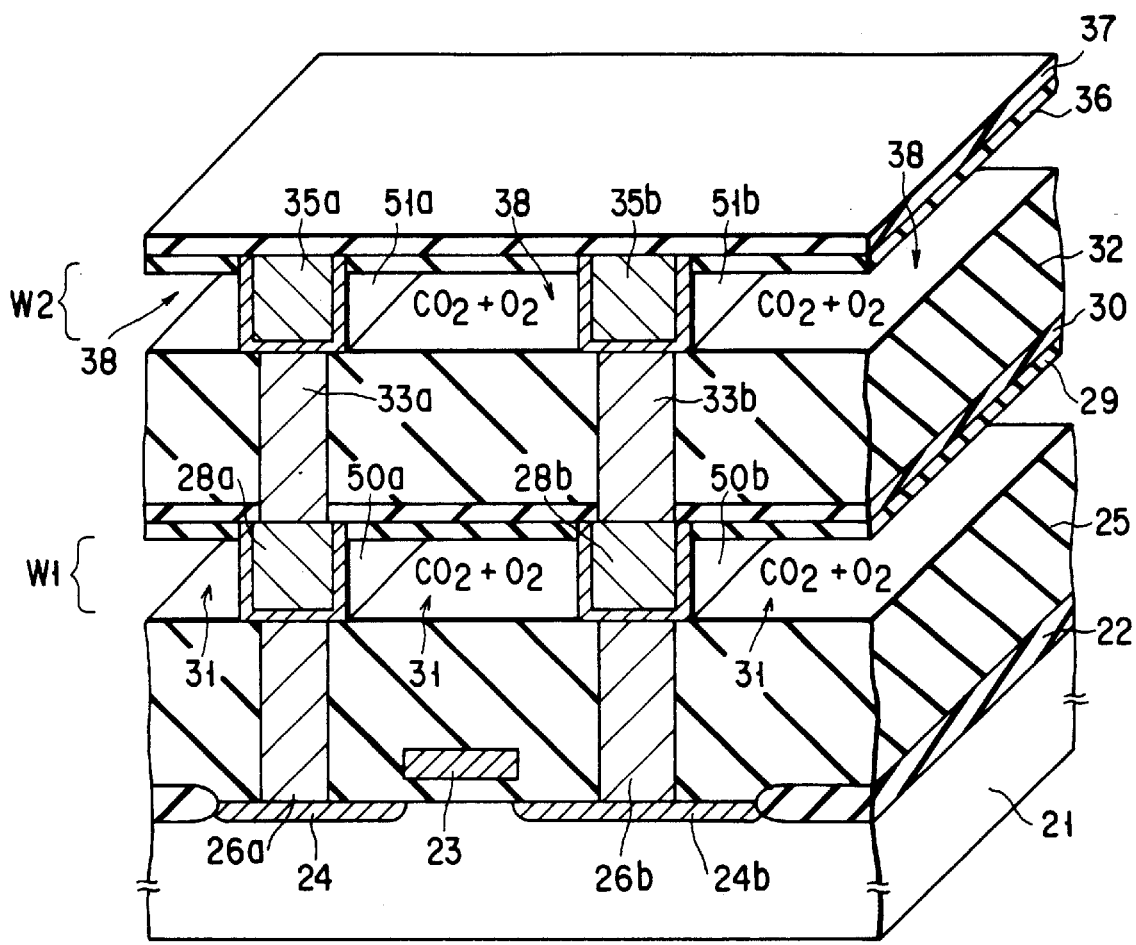
F I G. 101

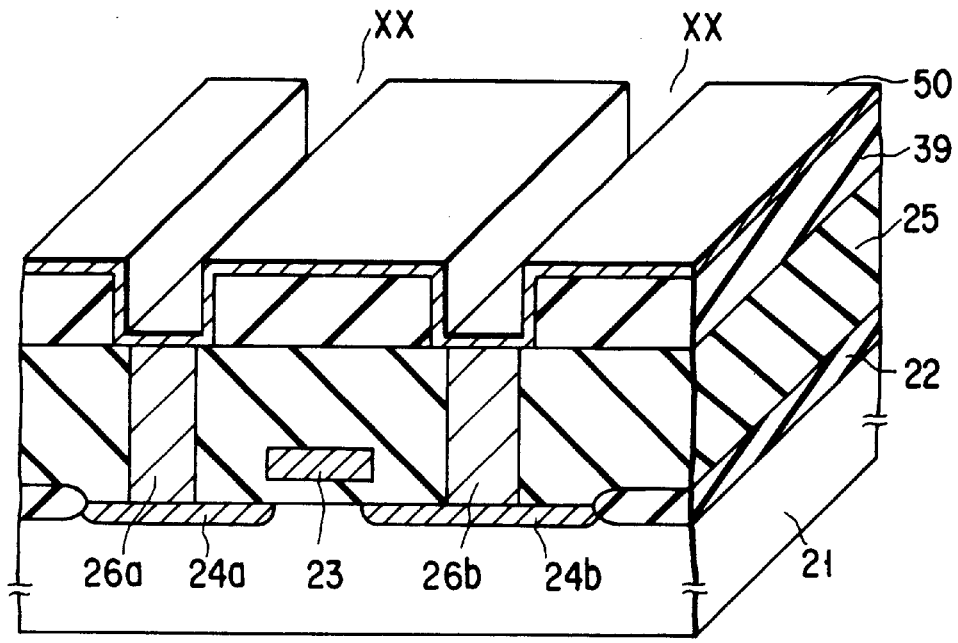
F I G. 103
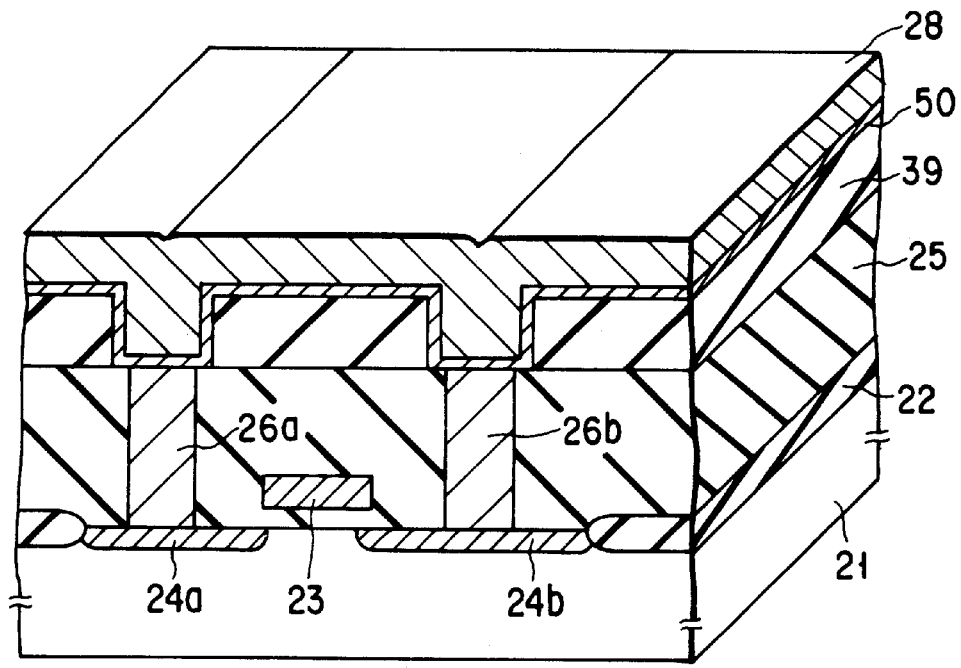
F I G. 104

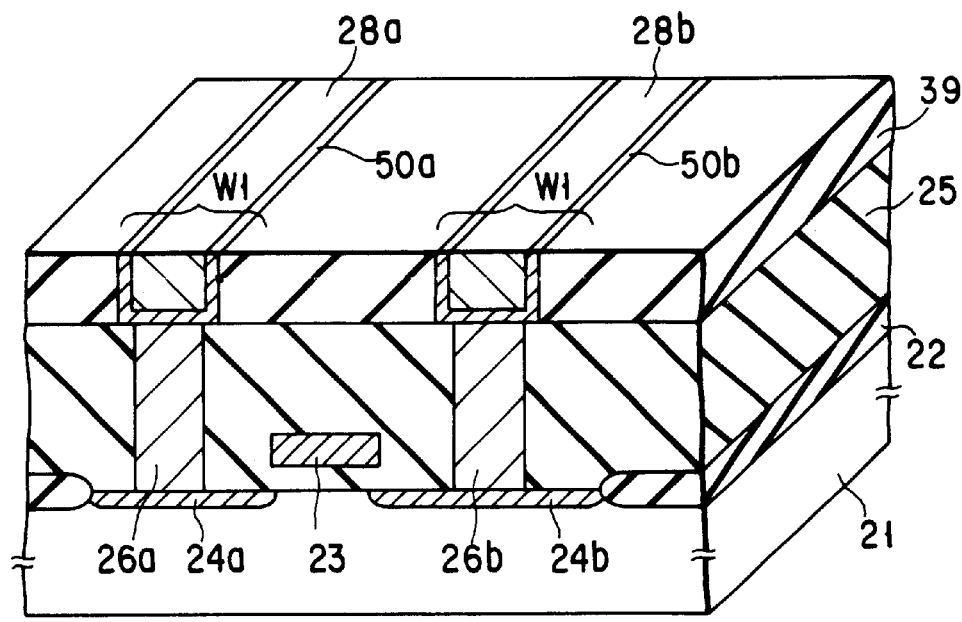
F I G. 105
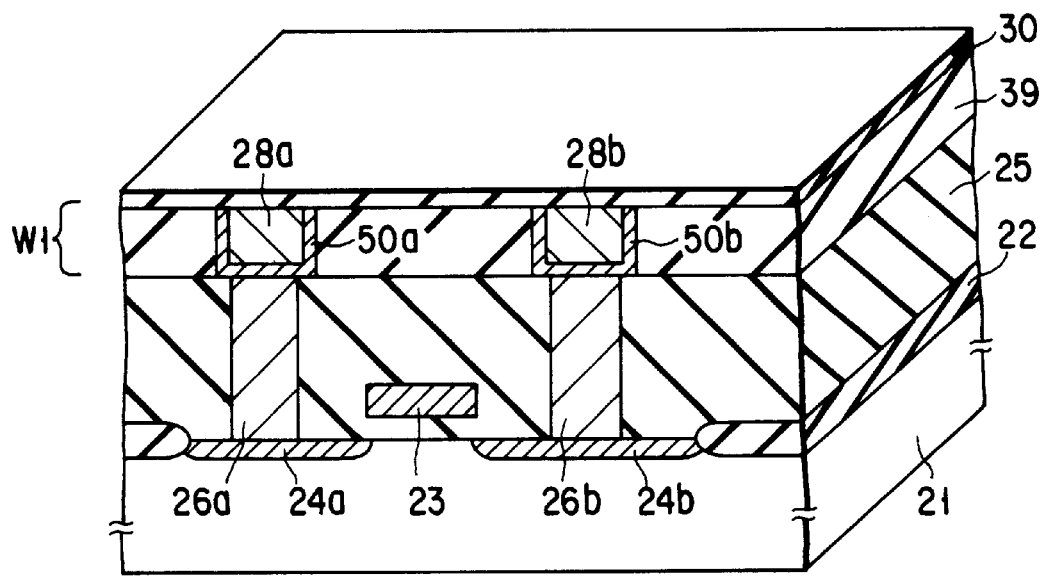
F I G. 106

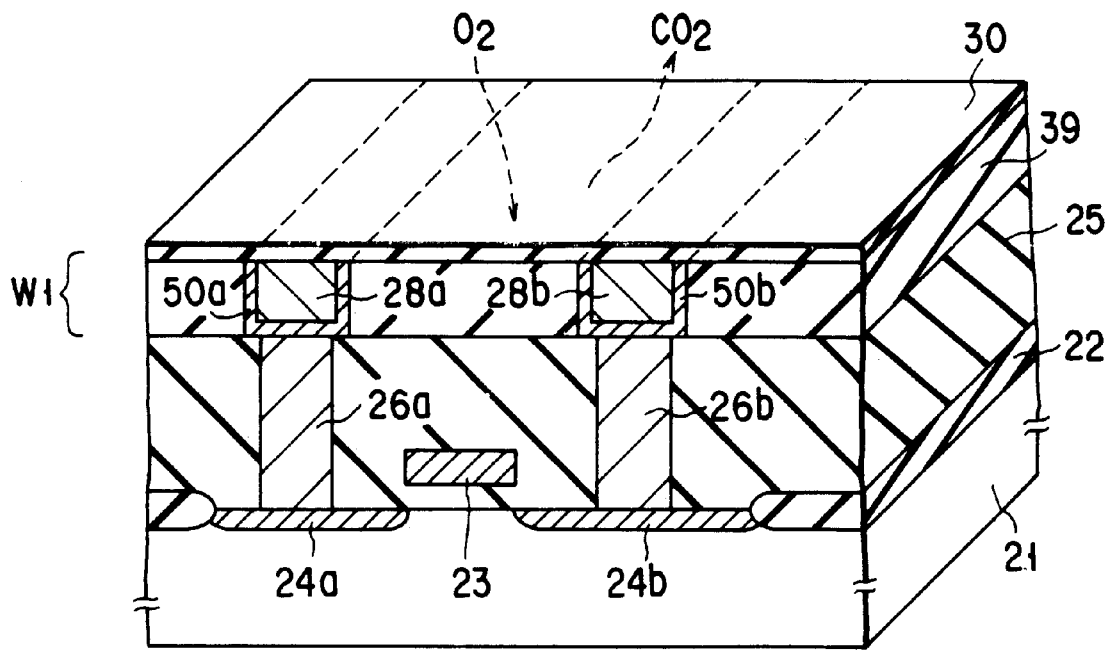
F I G. 107
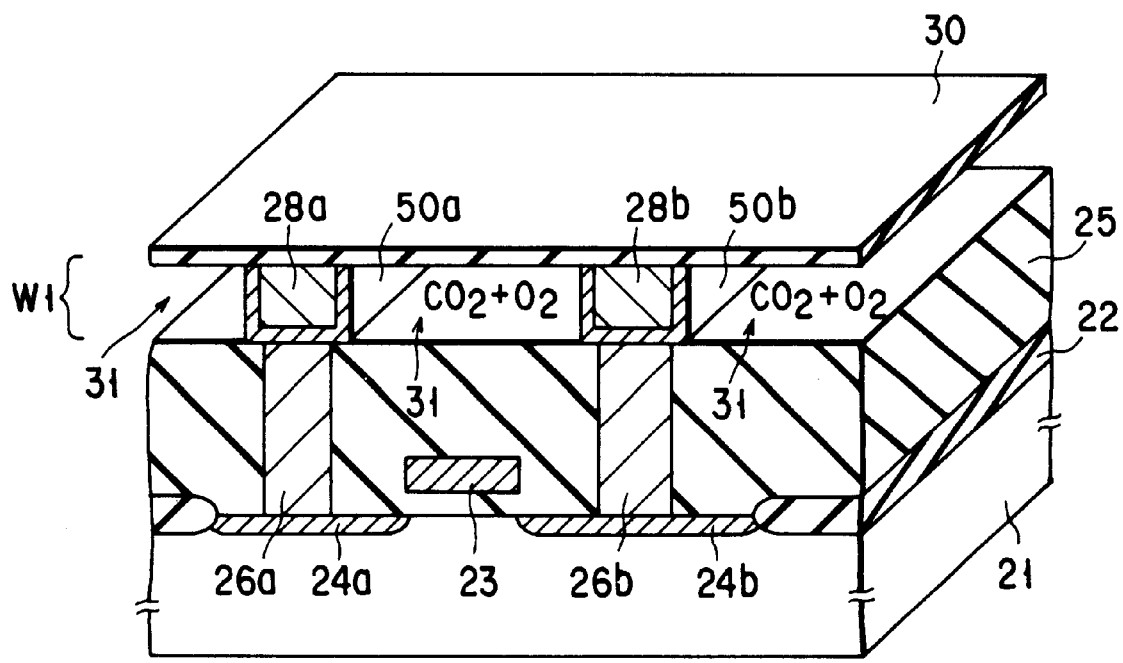
F I G. 108

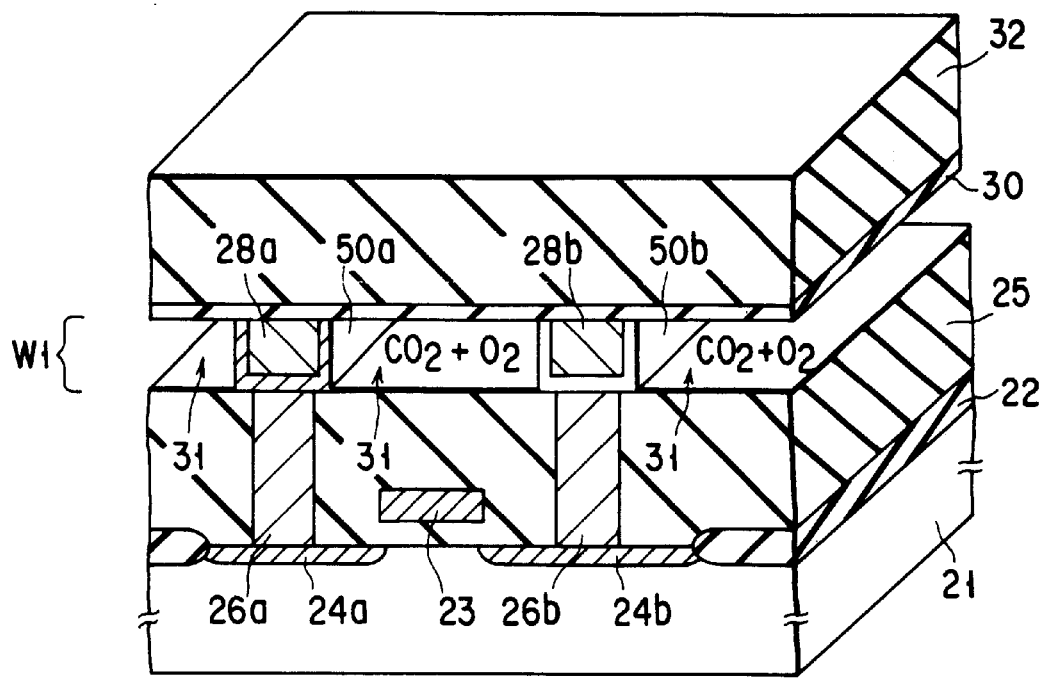
F I G. 109
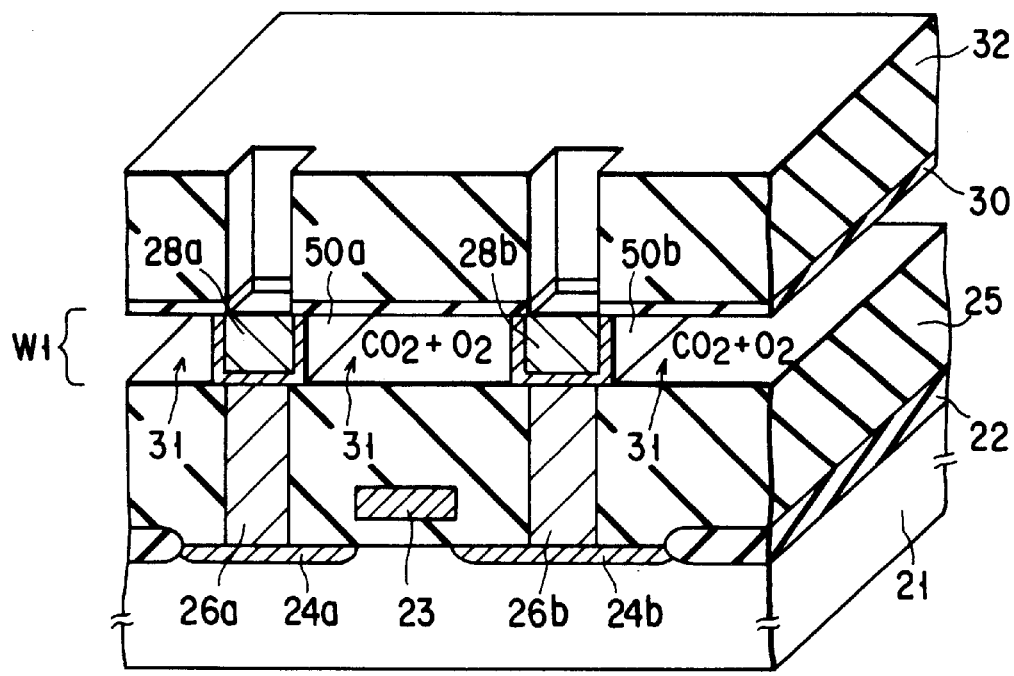
F I G. 110

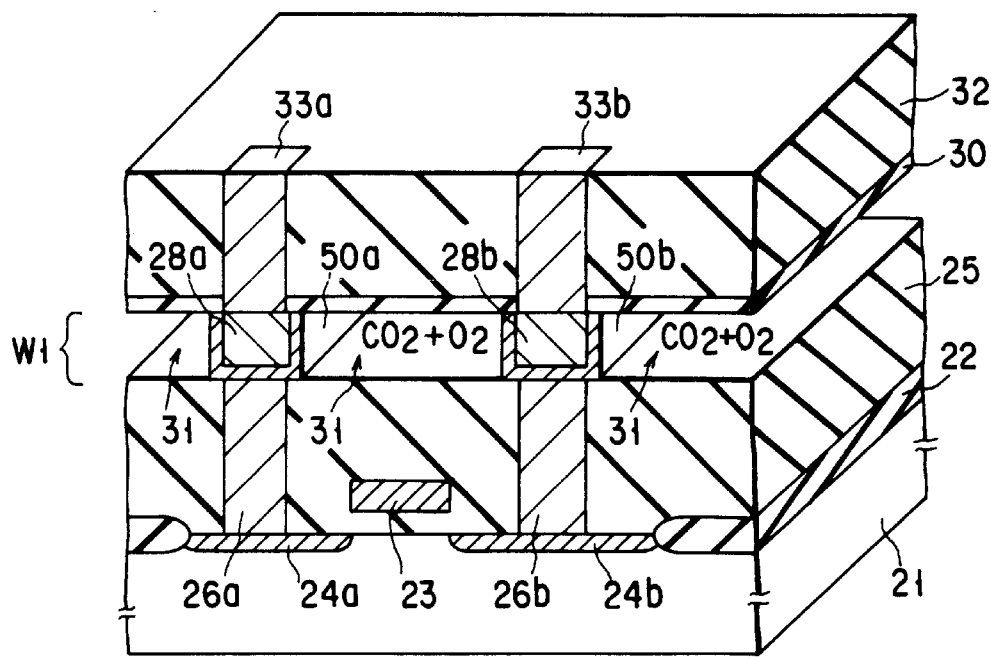
F I G. 111
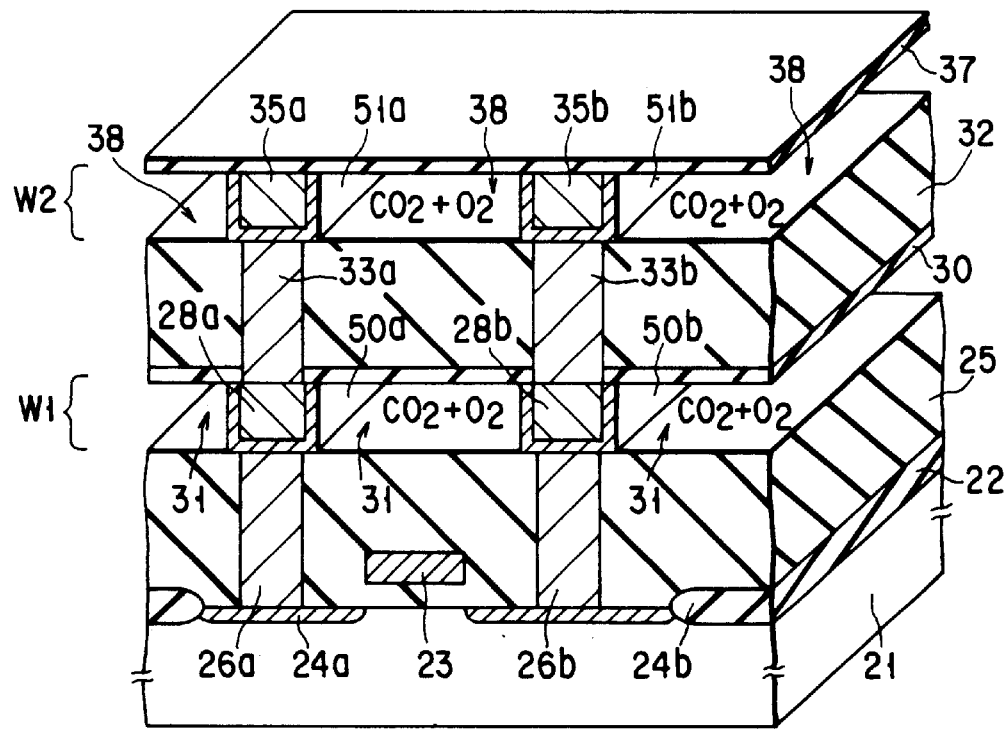
F I G. 112

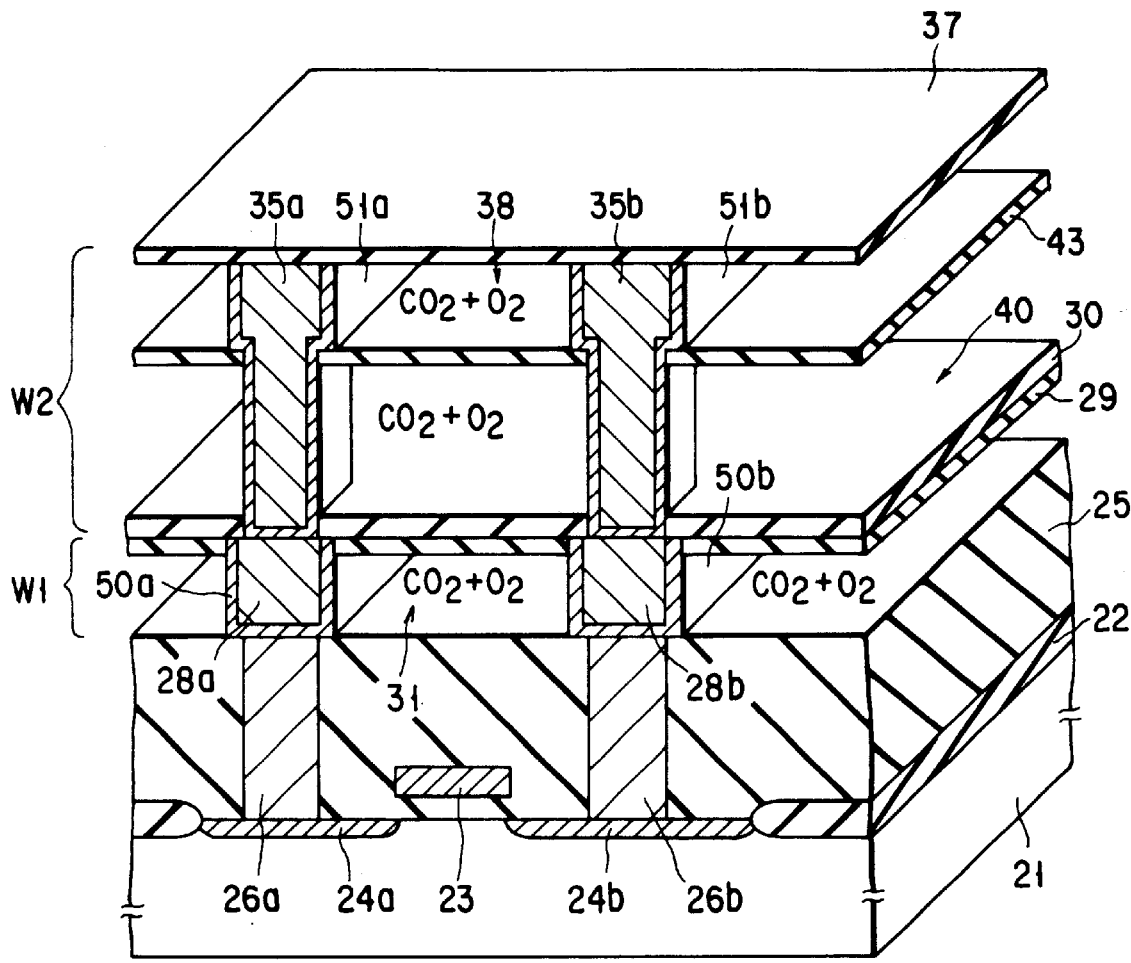
F I G. 113

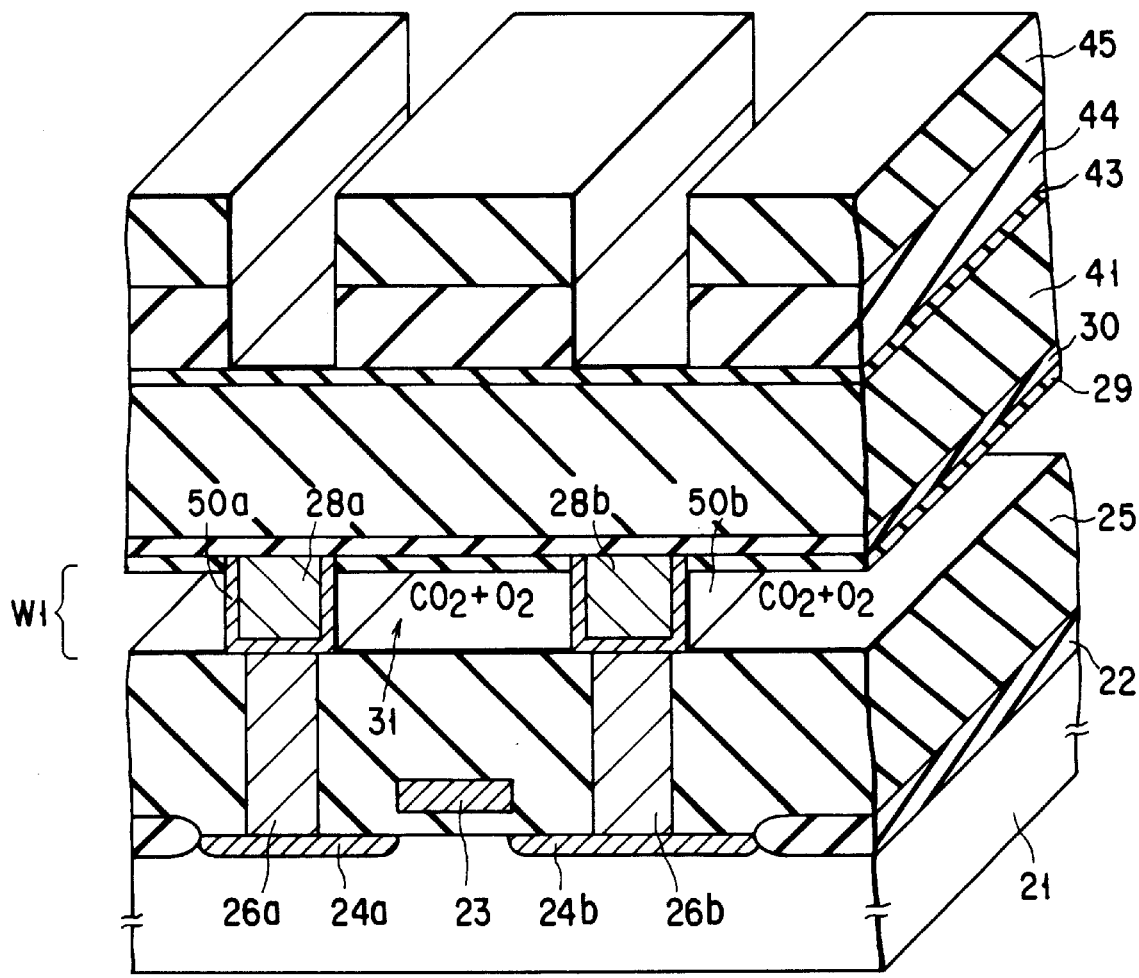
F I G. 114

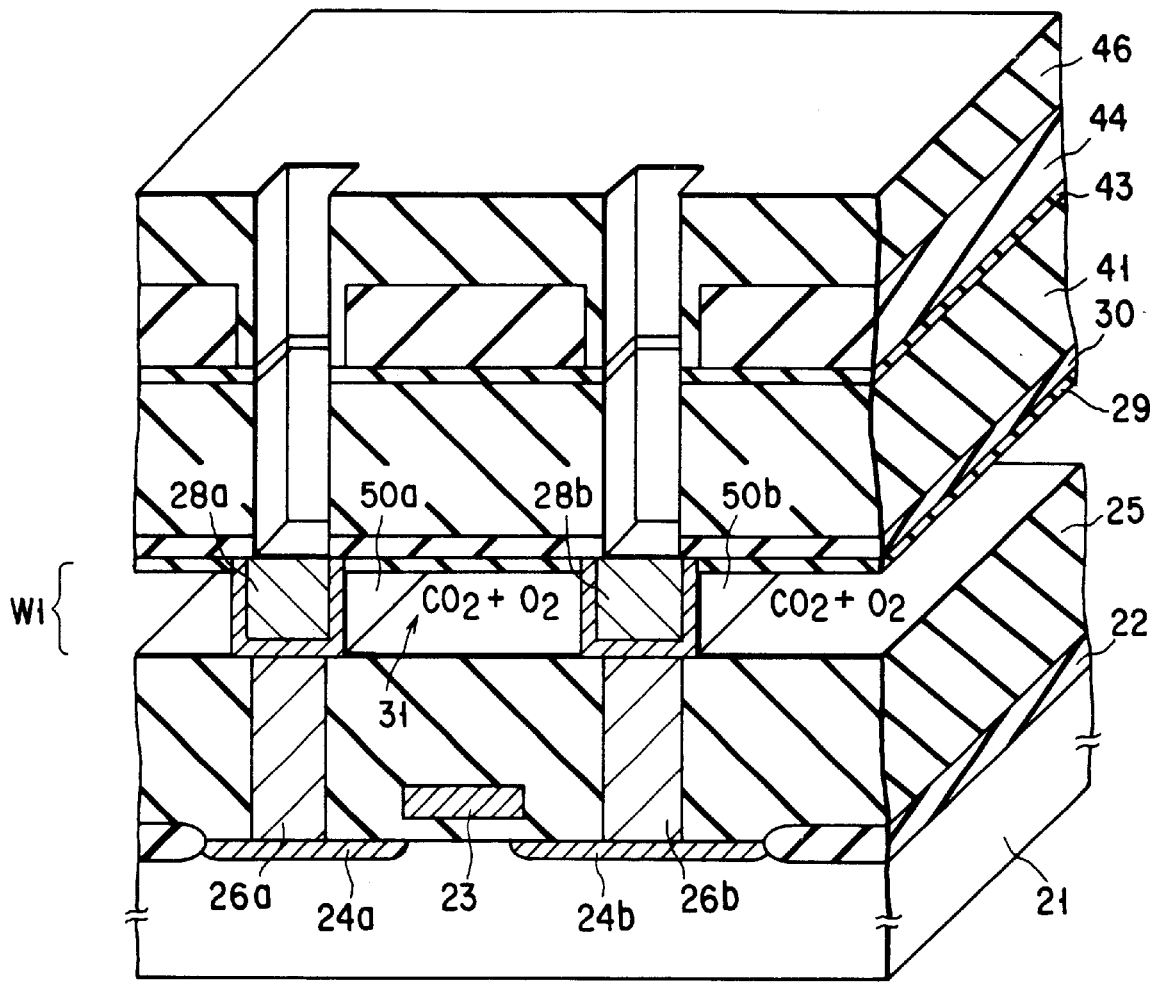
F I G. 115

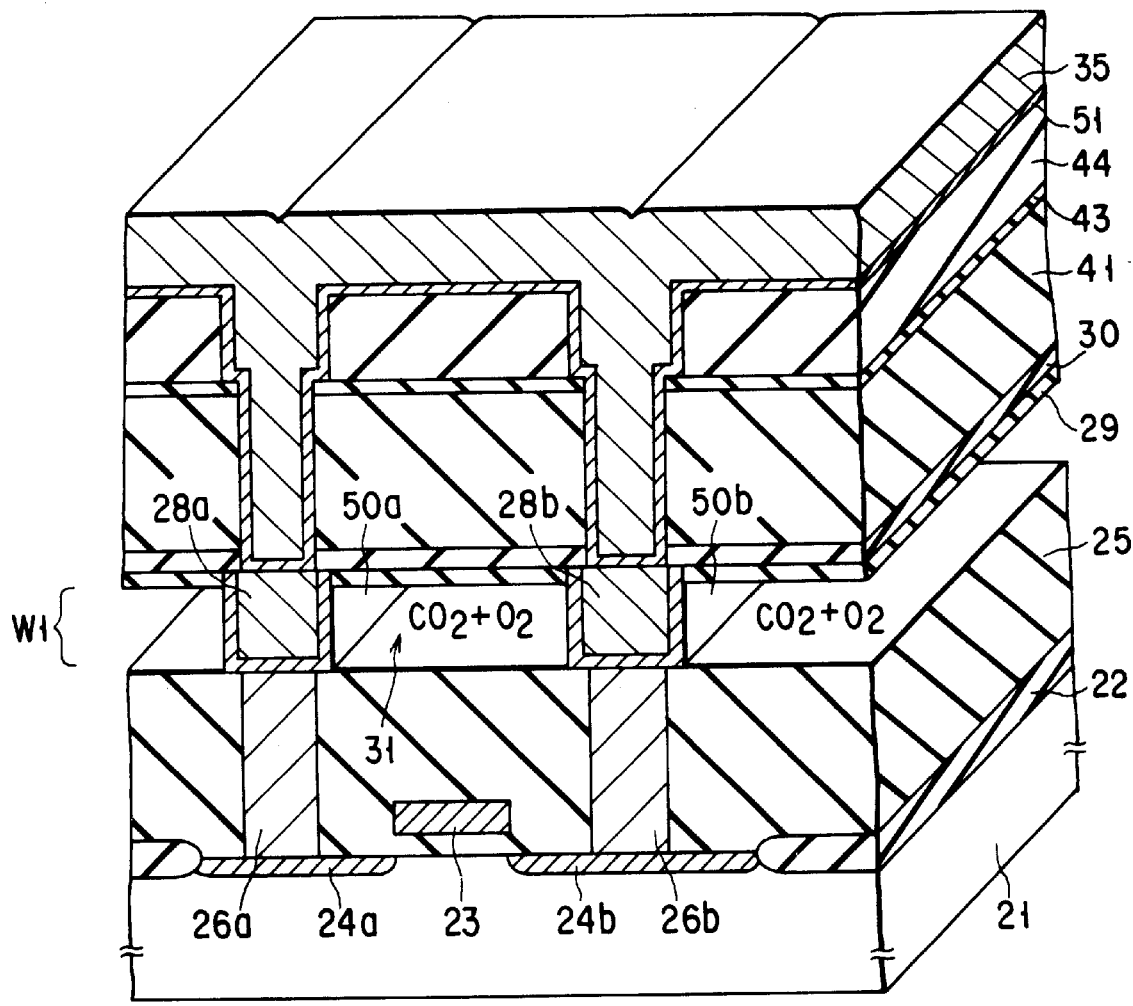
F I G. 116

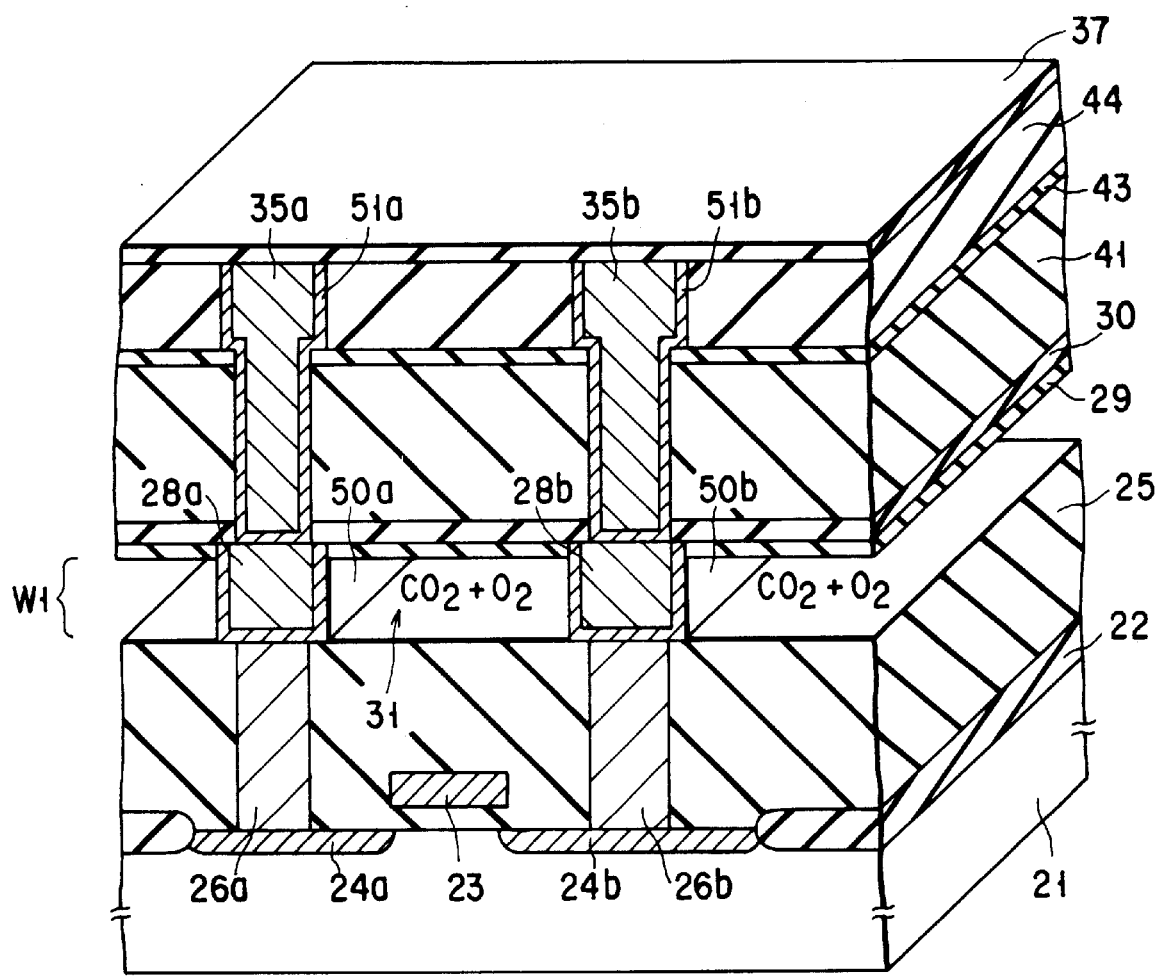
F I G. 117

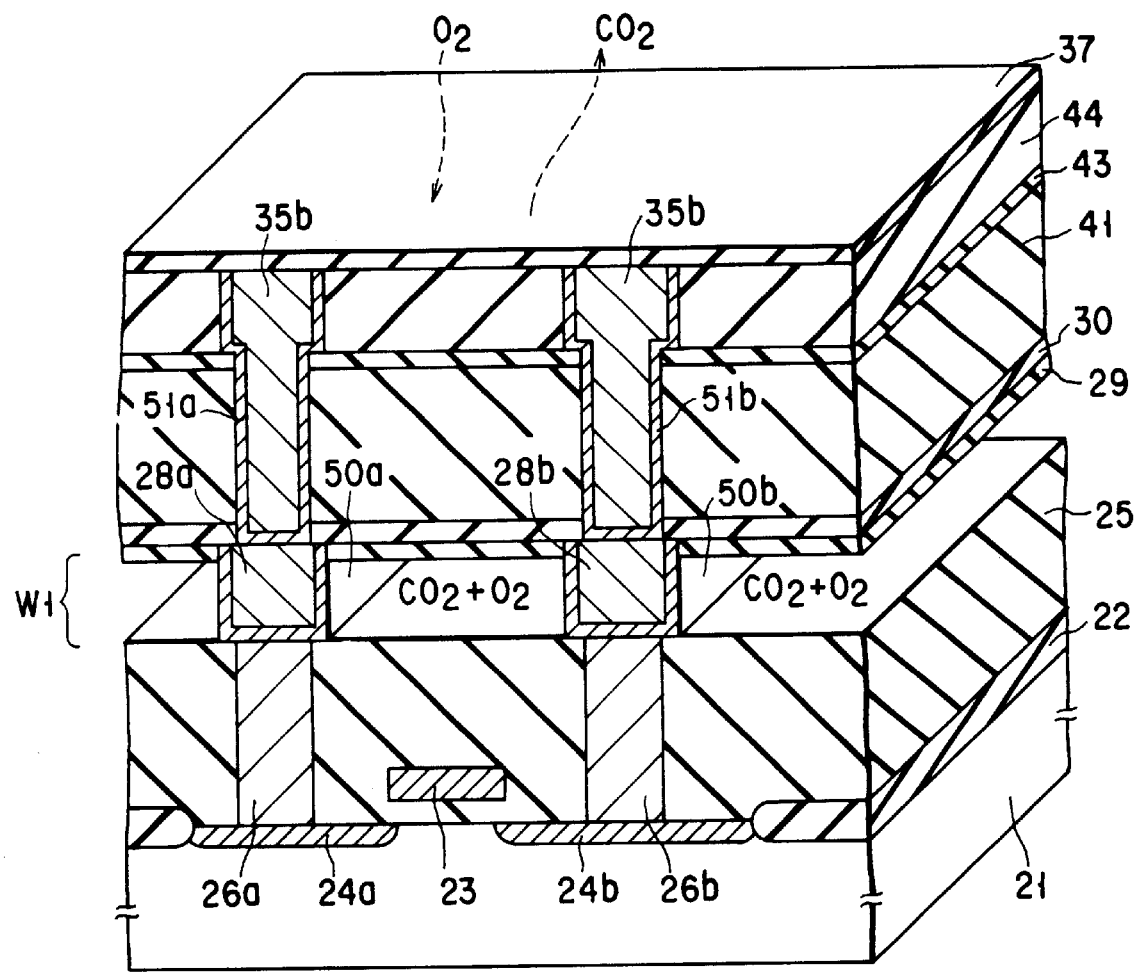
F I G. 118

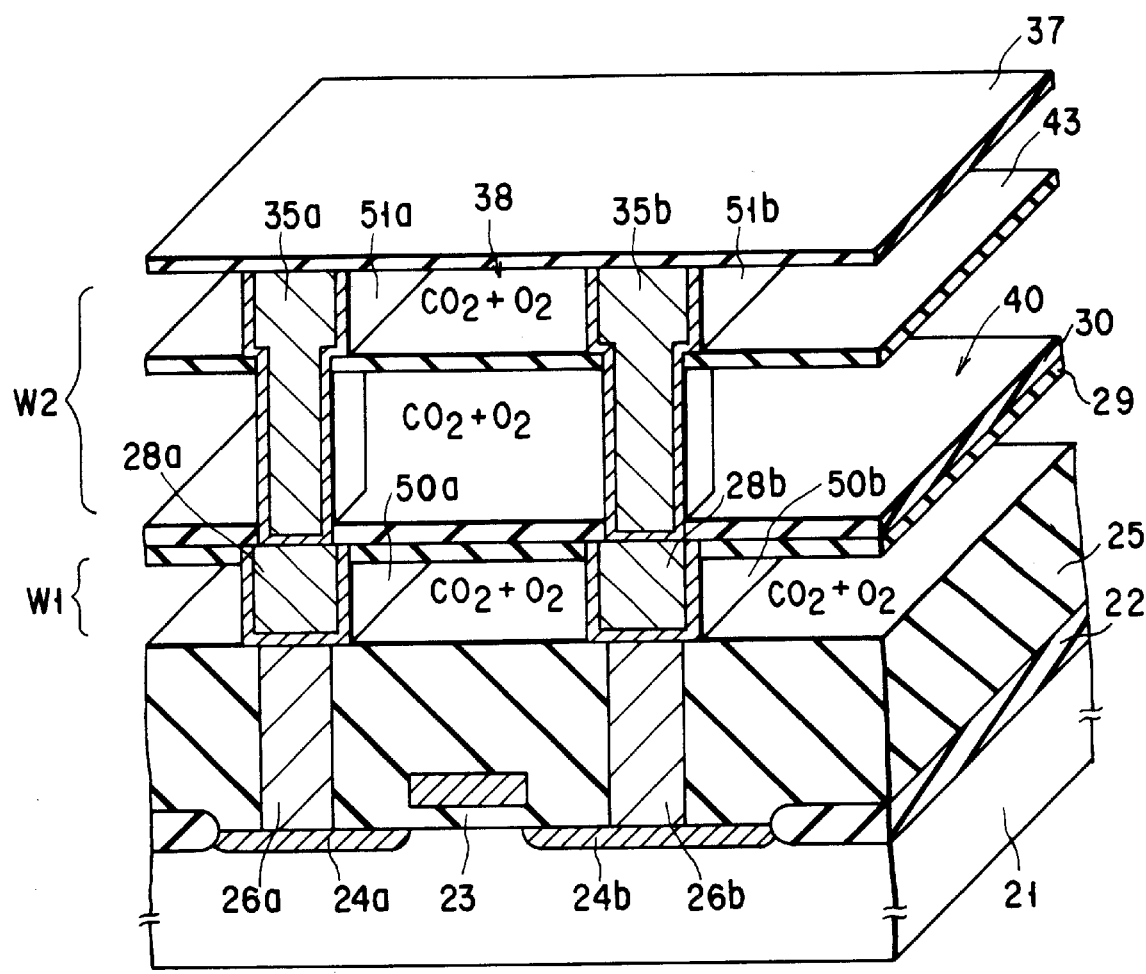
F I G. 119

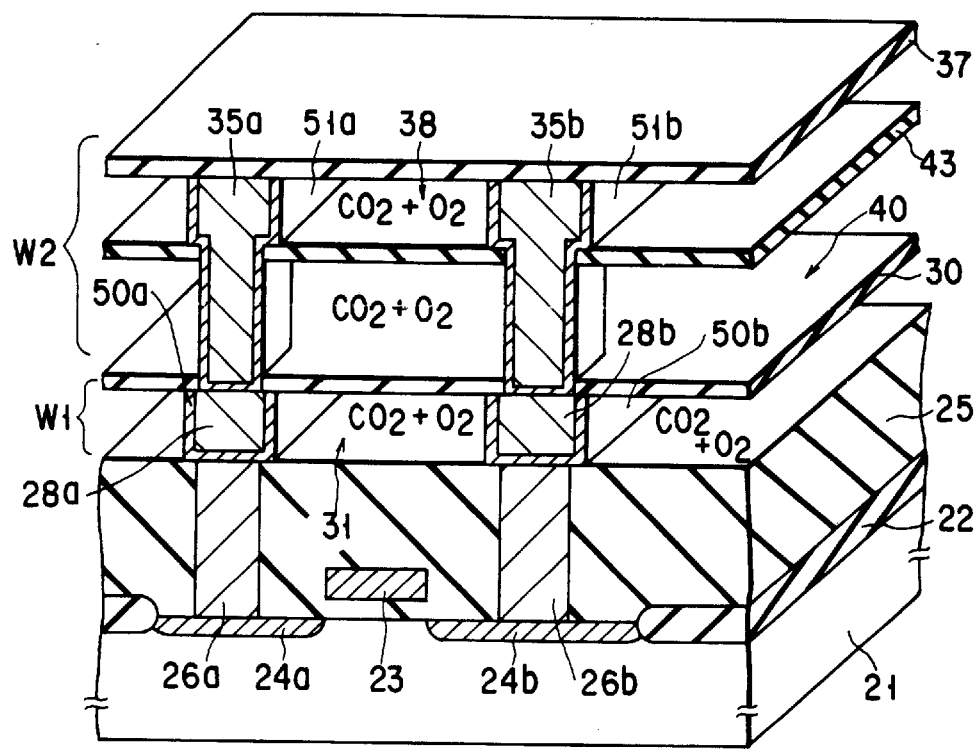
F I G. 120
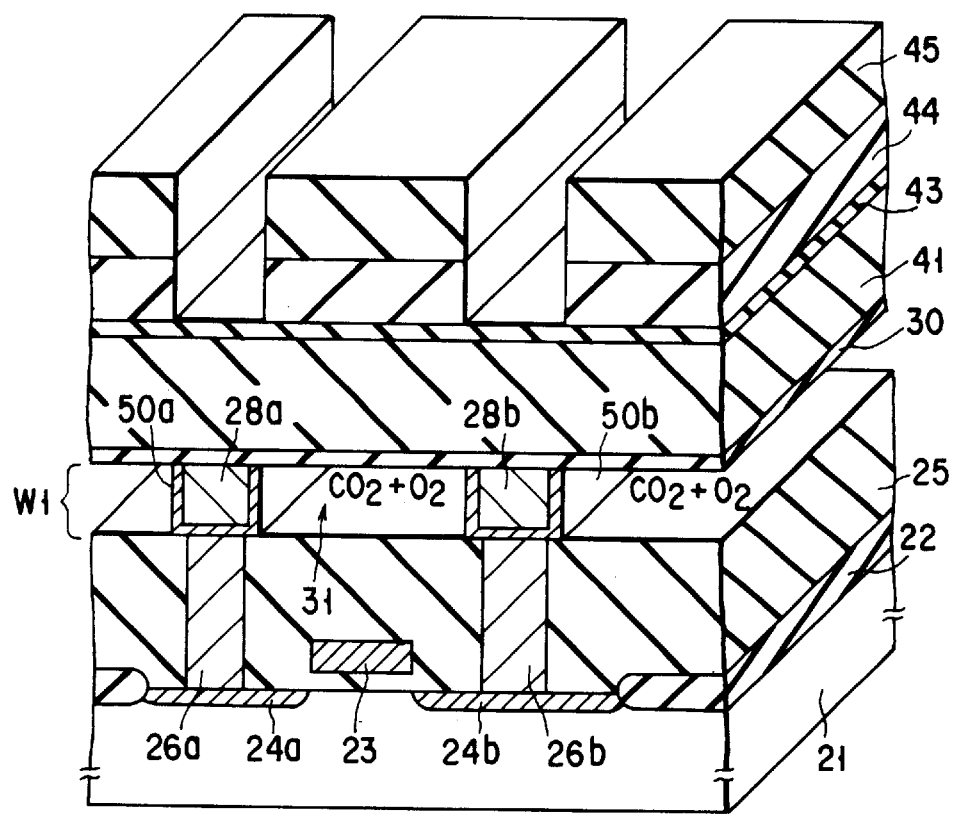
F I G. 121

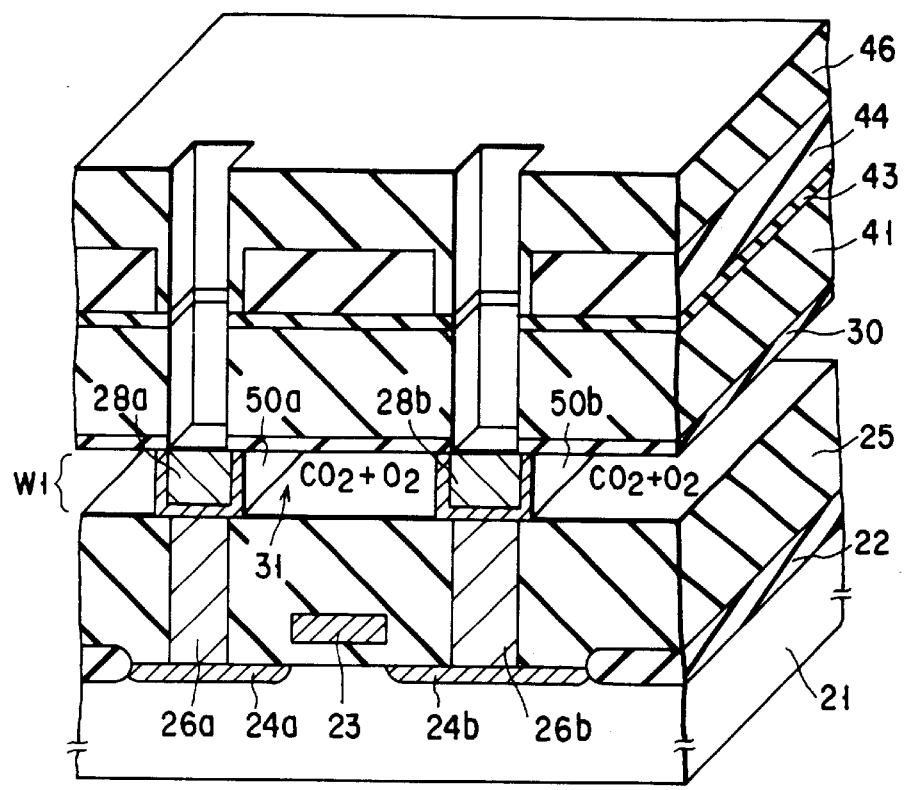
F I G. 122
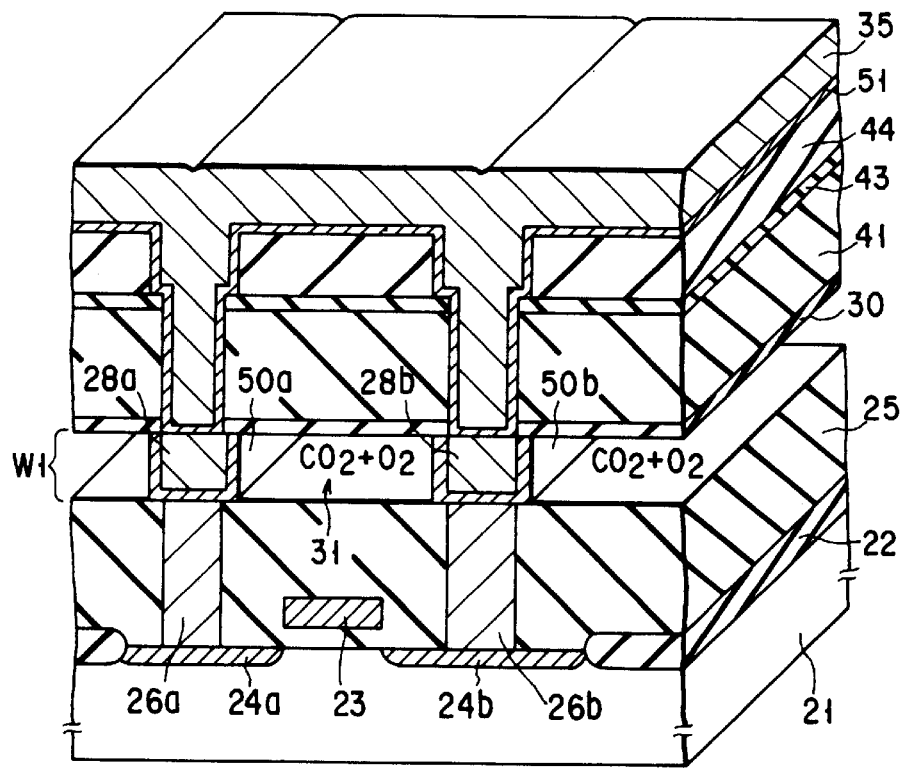
F I G. 123

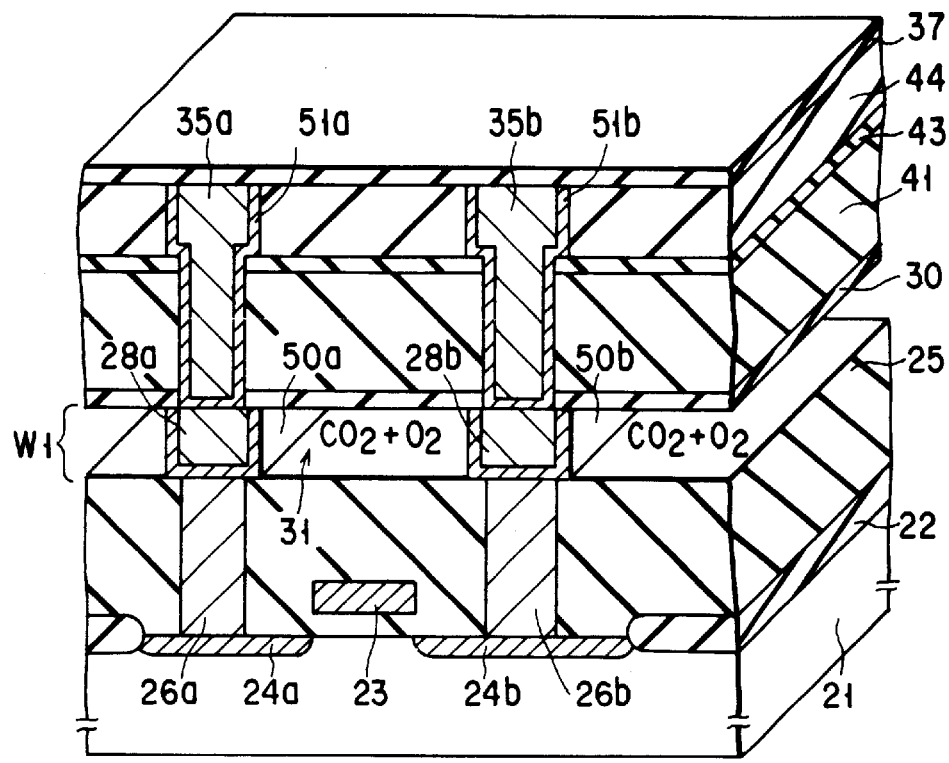
F I G. 124
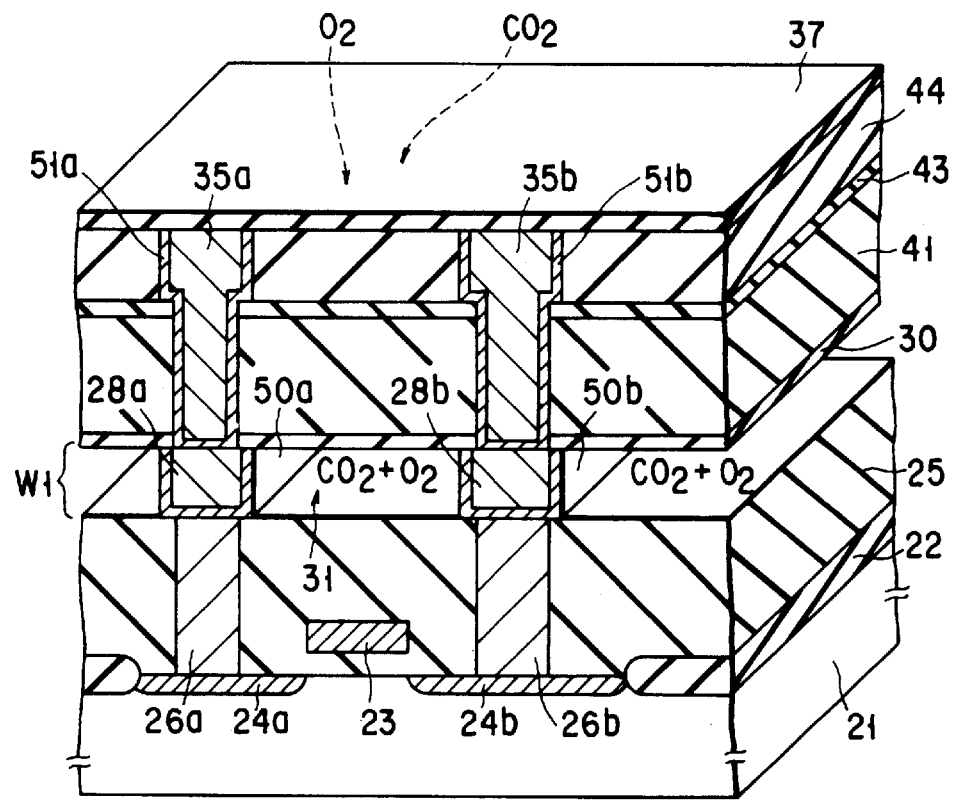
F I G. 125

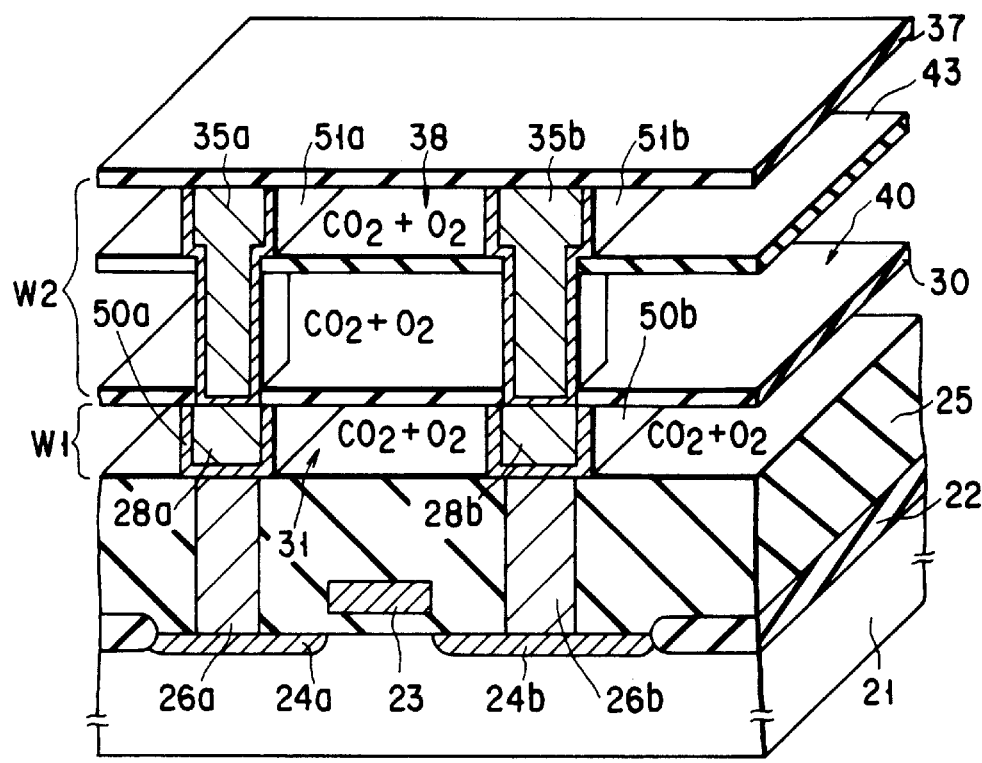
F I G. 126
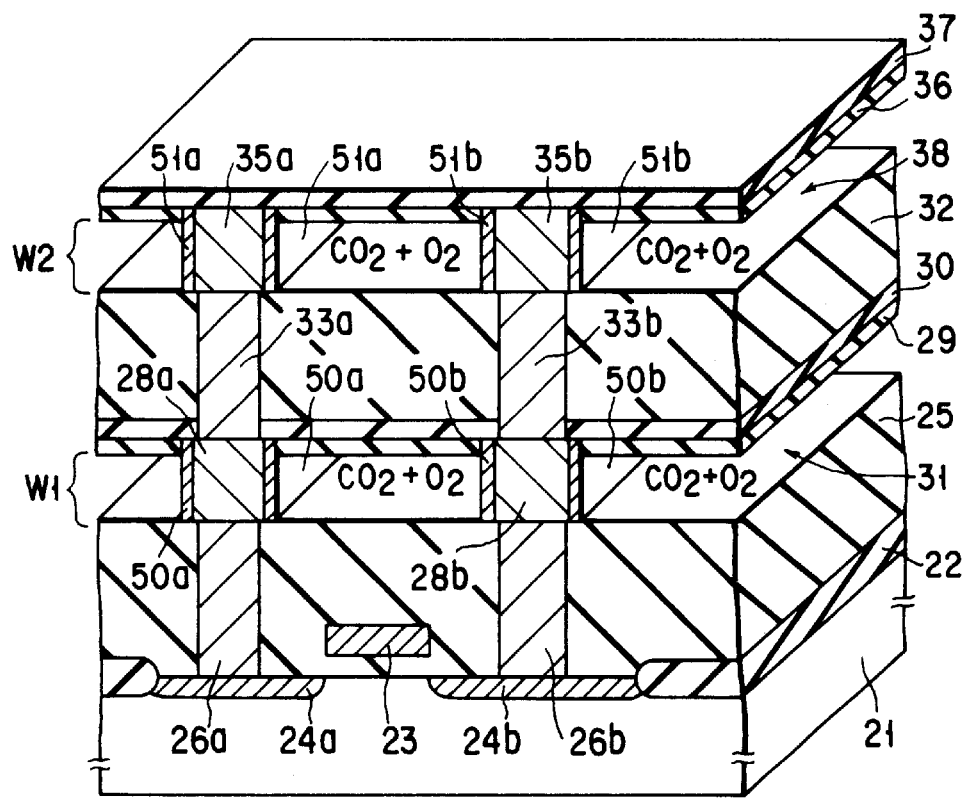
F I G. 127

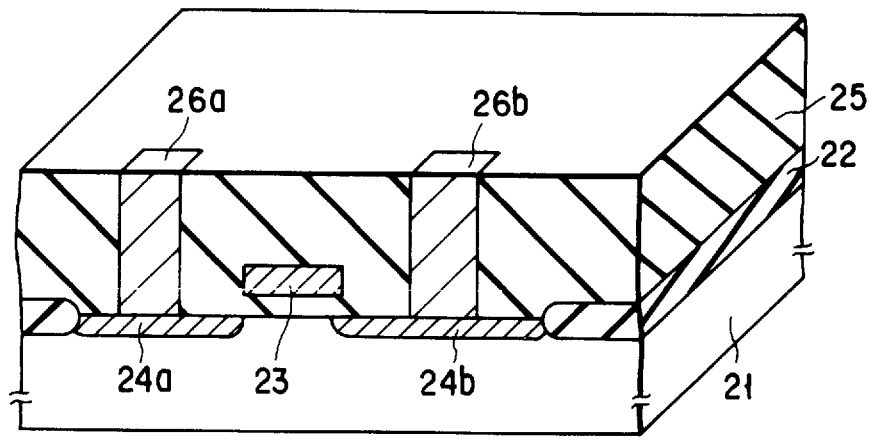
F I G. 128
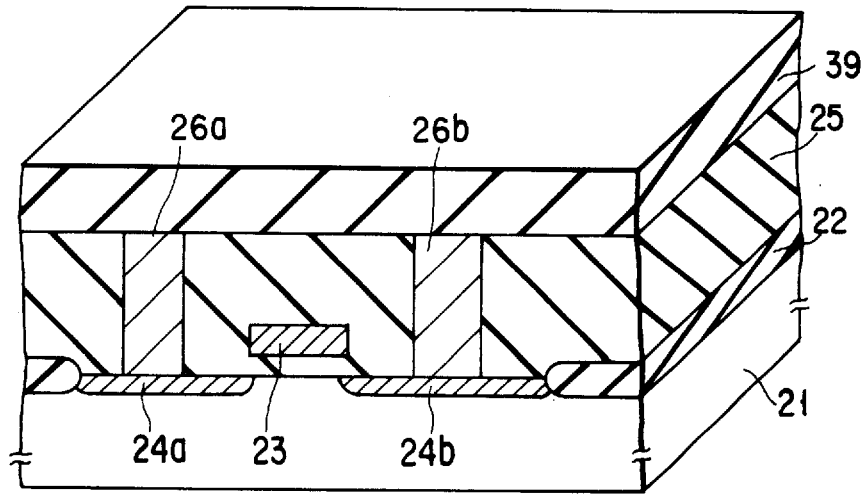
F I G. 129
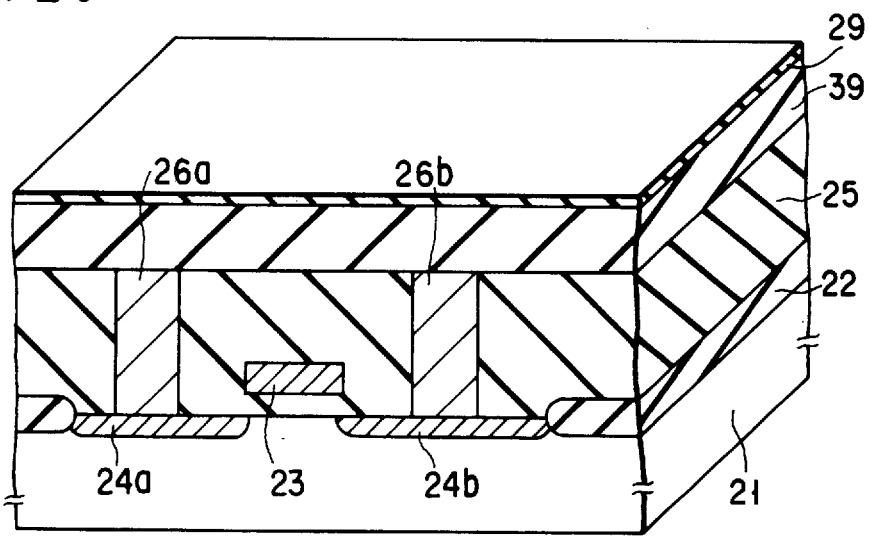
F I G. 130

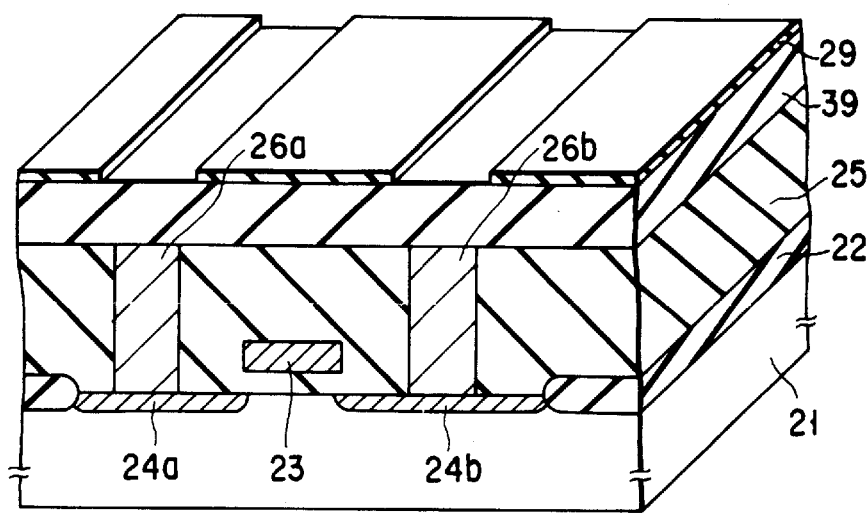
F I G. 131
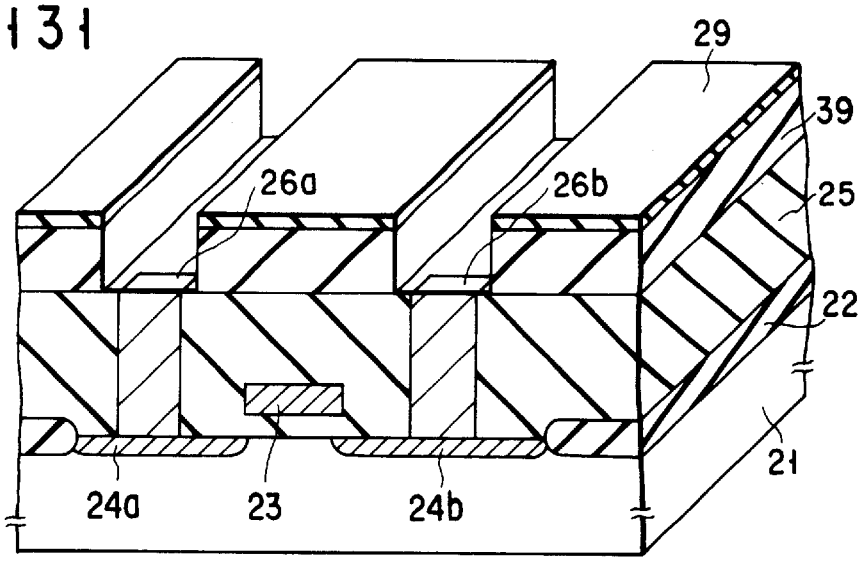
F I G. 132
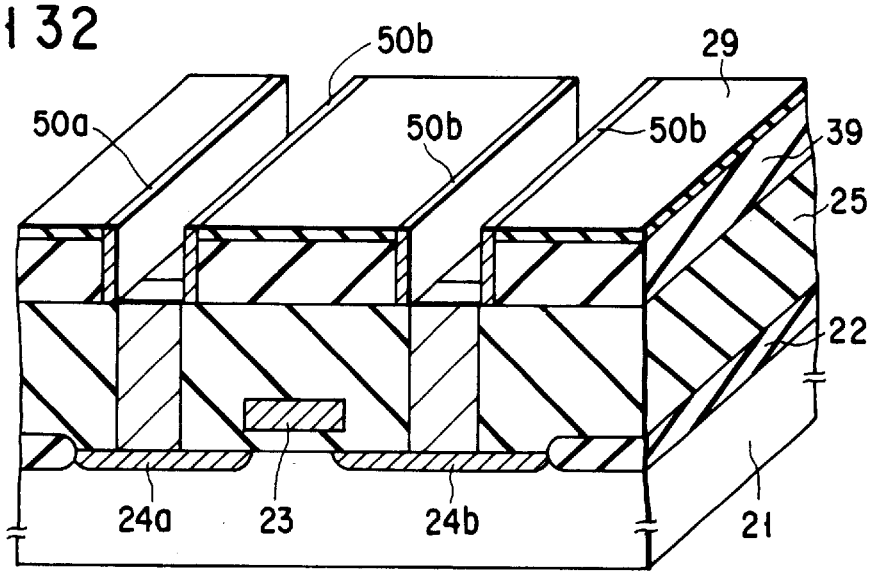
F I G. 133

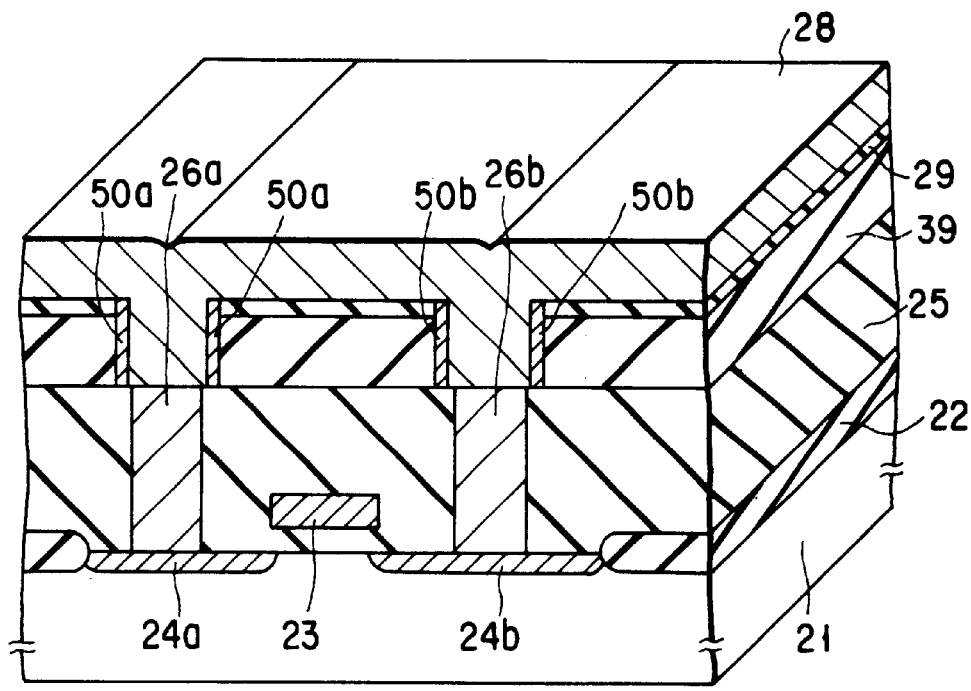
F I G. 134
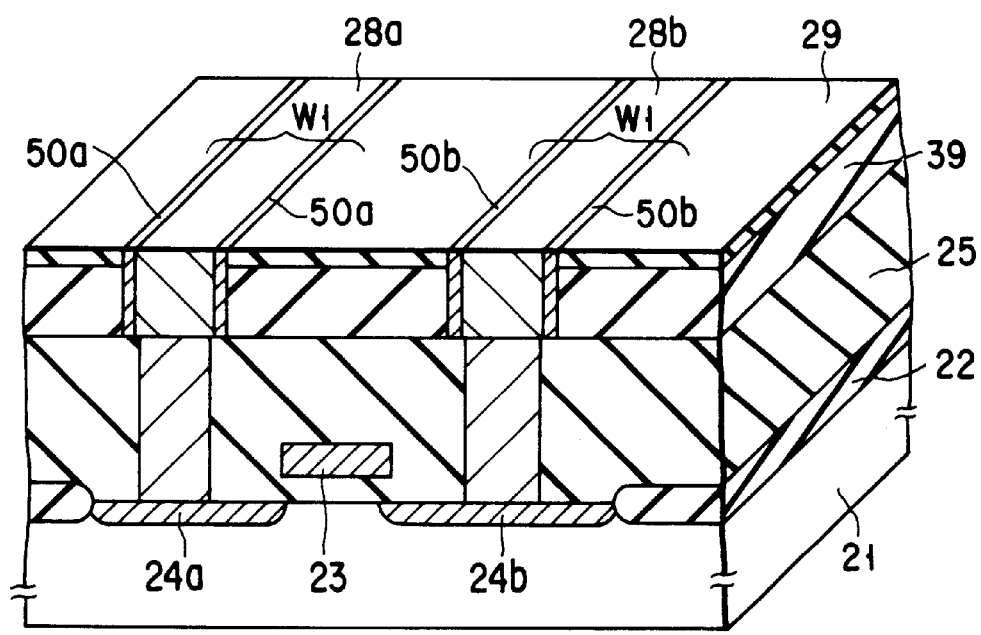
F I G. 135

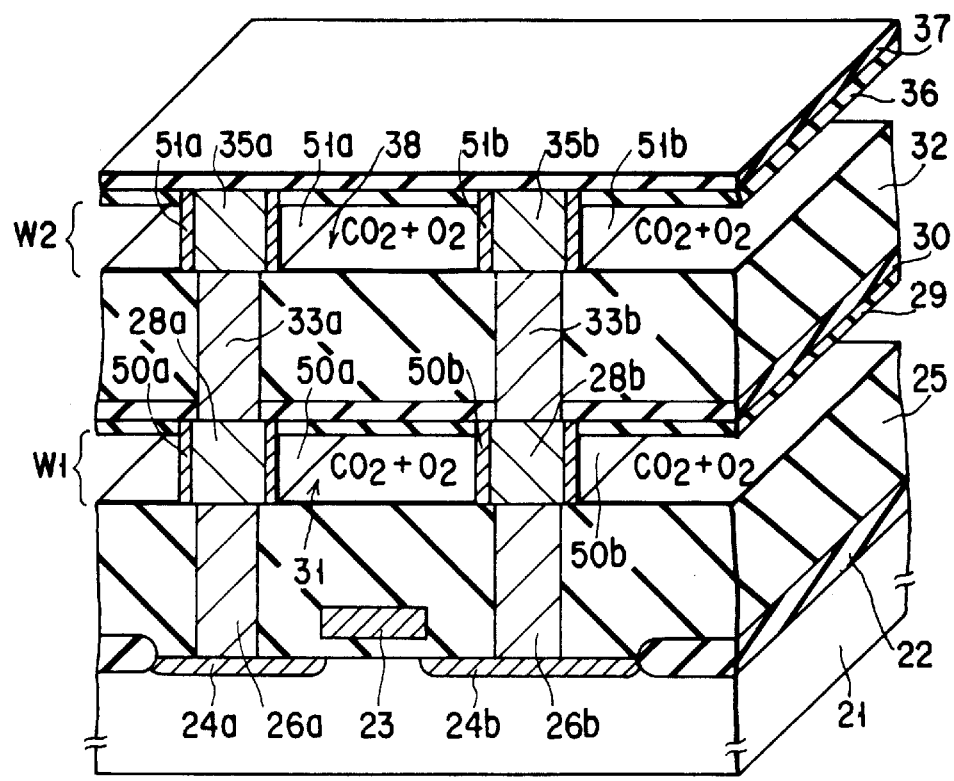
F I G. 142
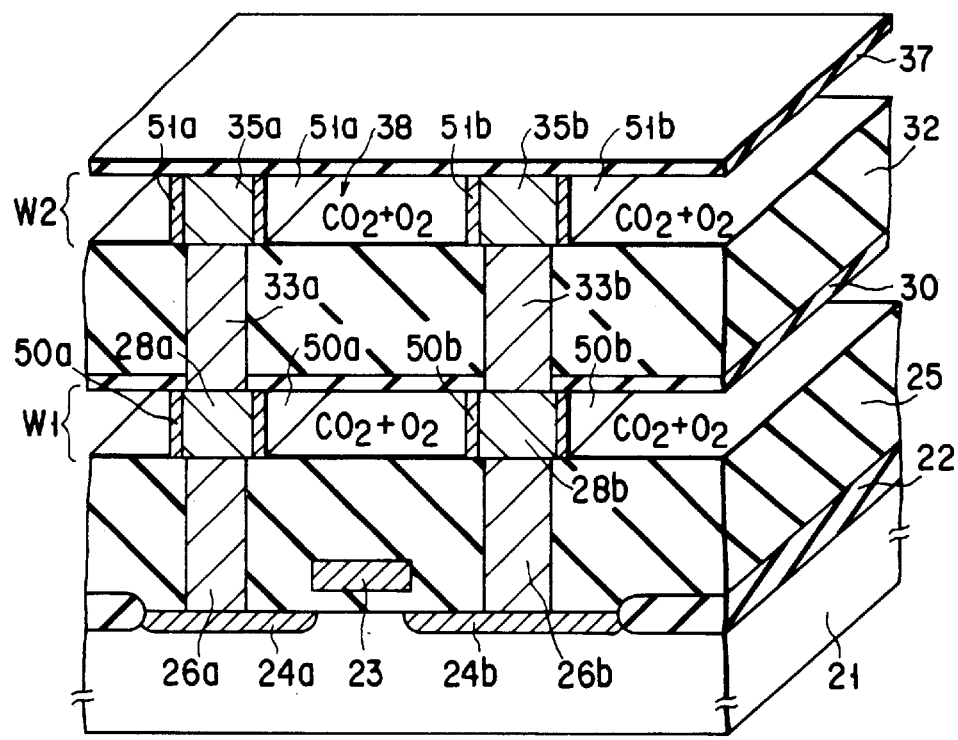
F I G. 143

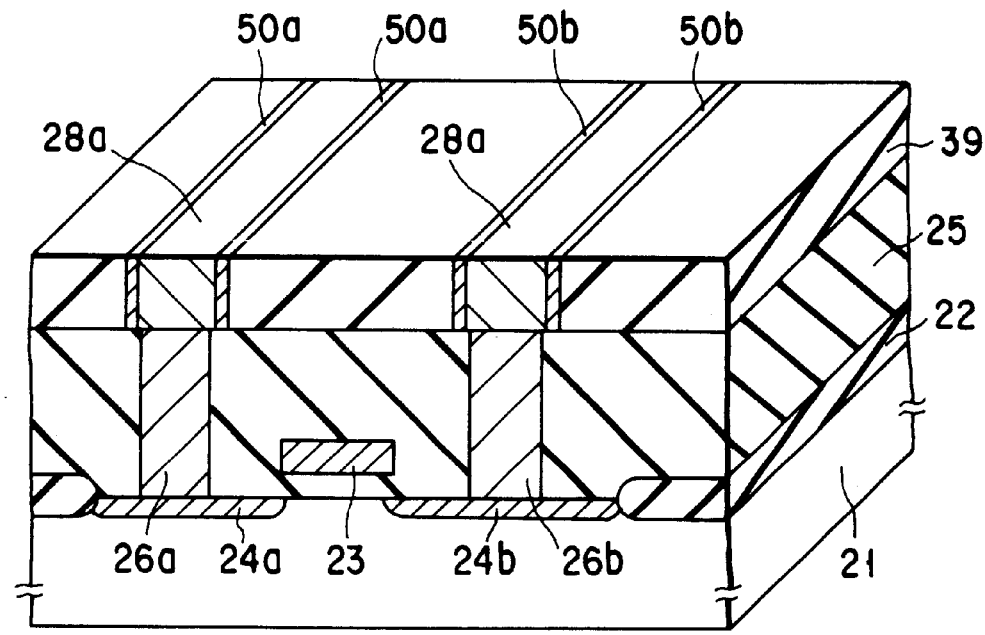
F I G. 146
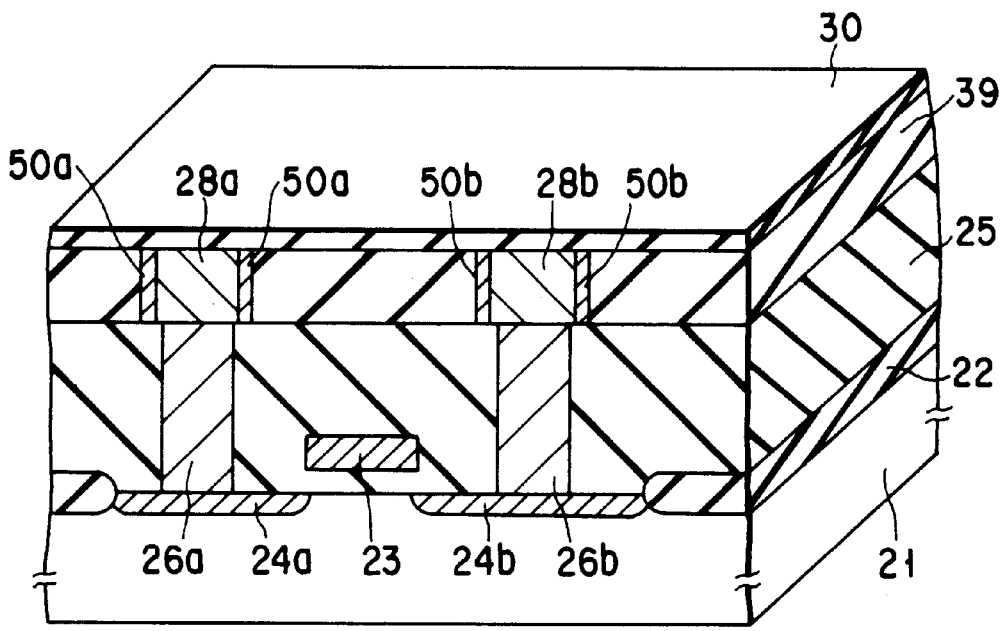
F I G. 147

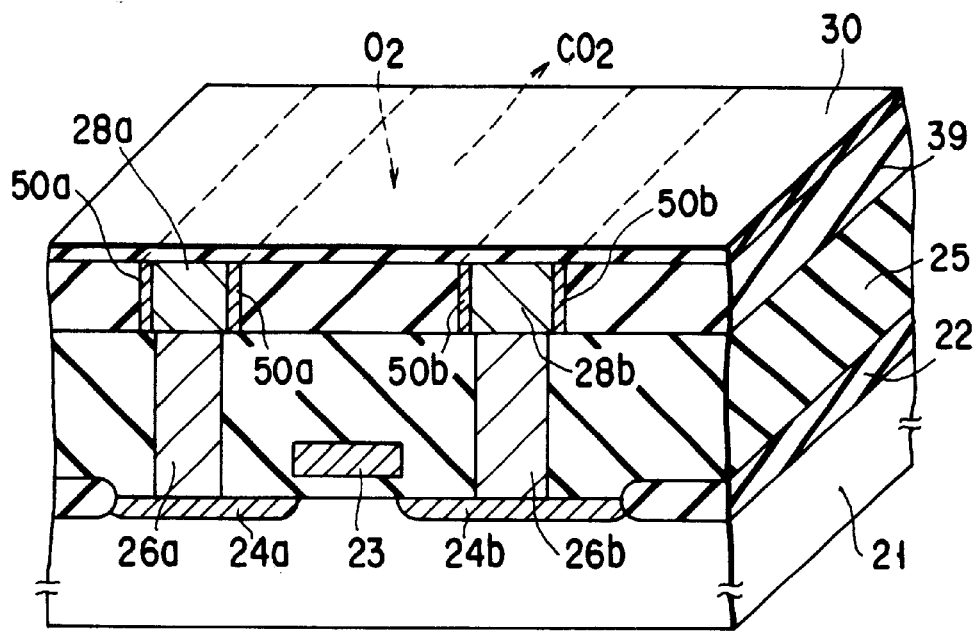
F I G. 148
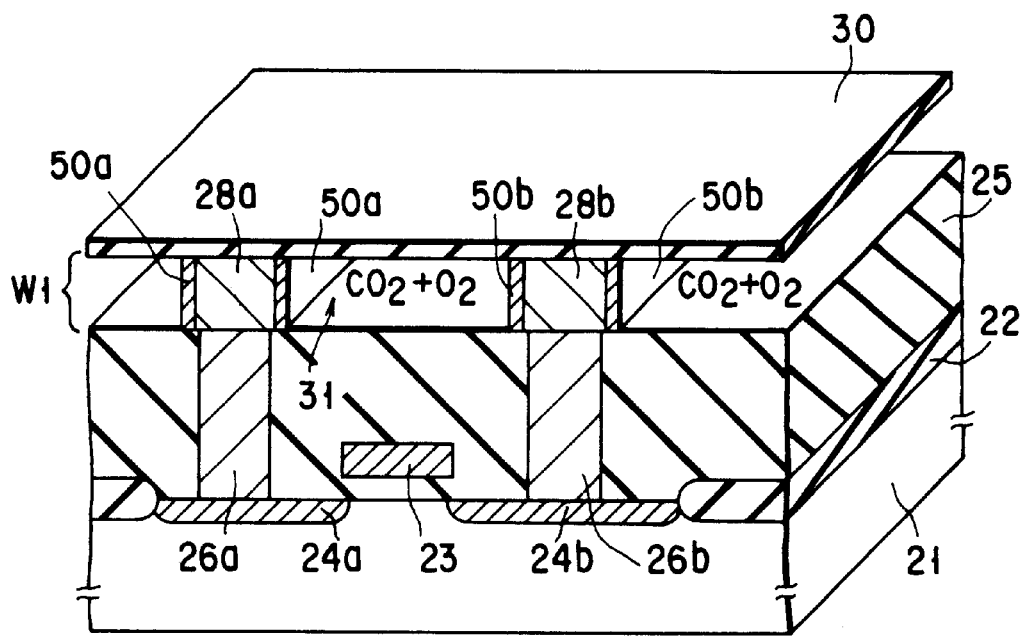
F I G. 149

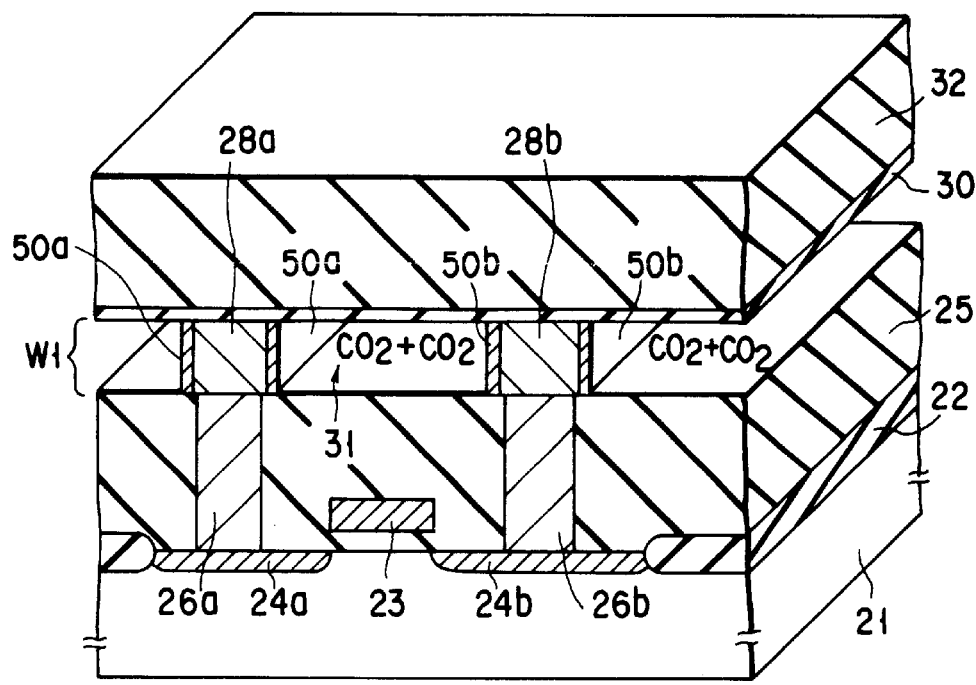
F I G. 150
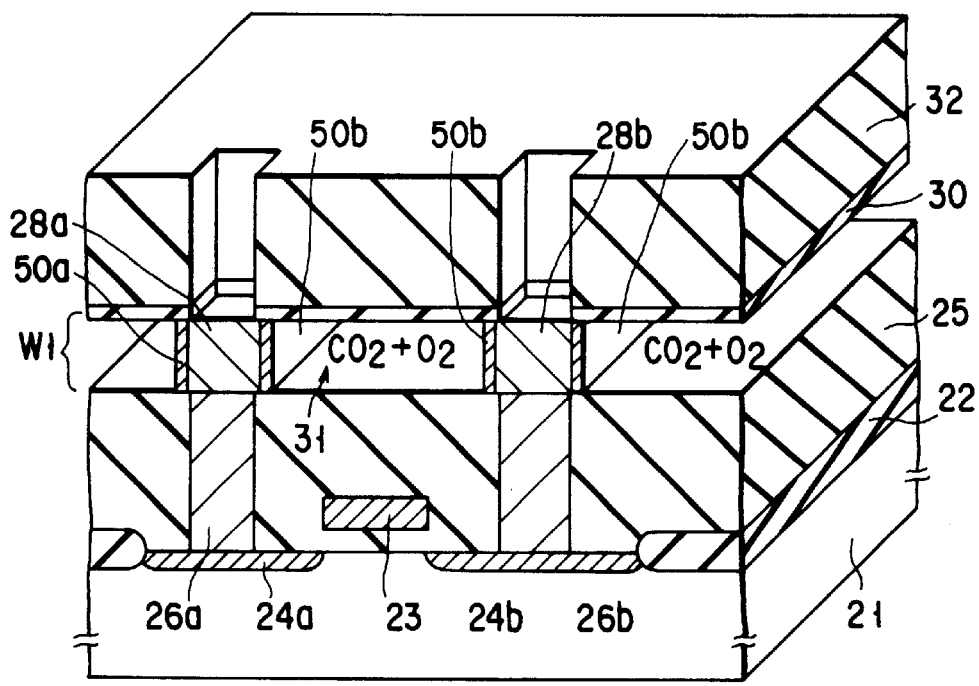
F I G. 151

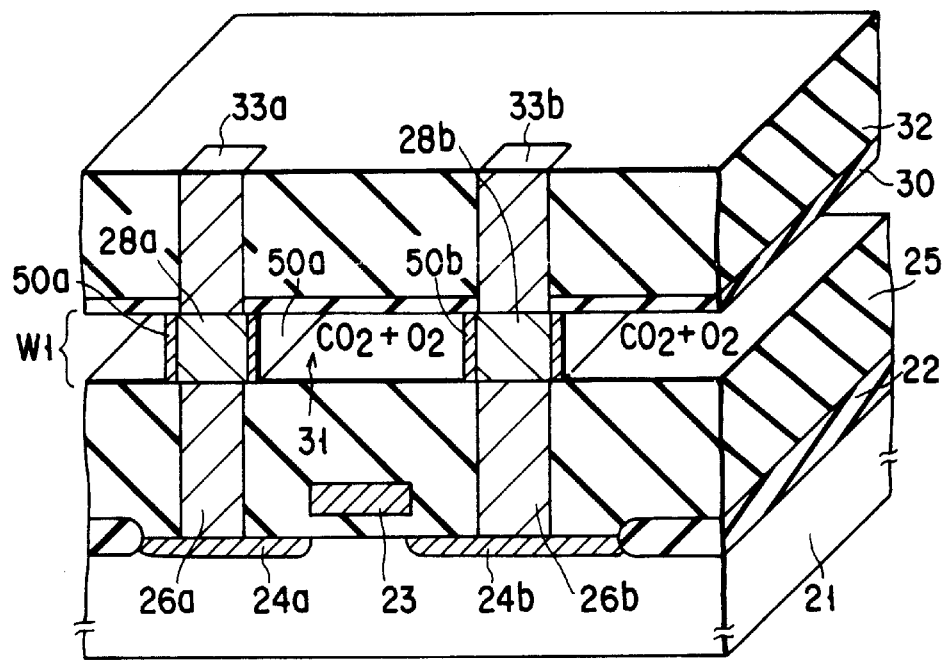
F I G. 152
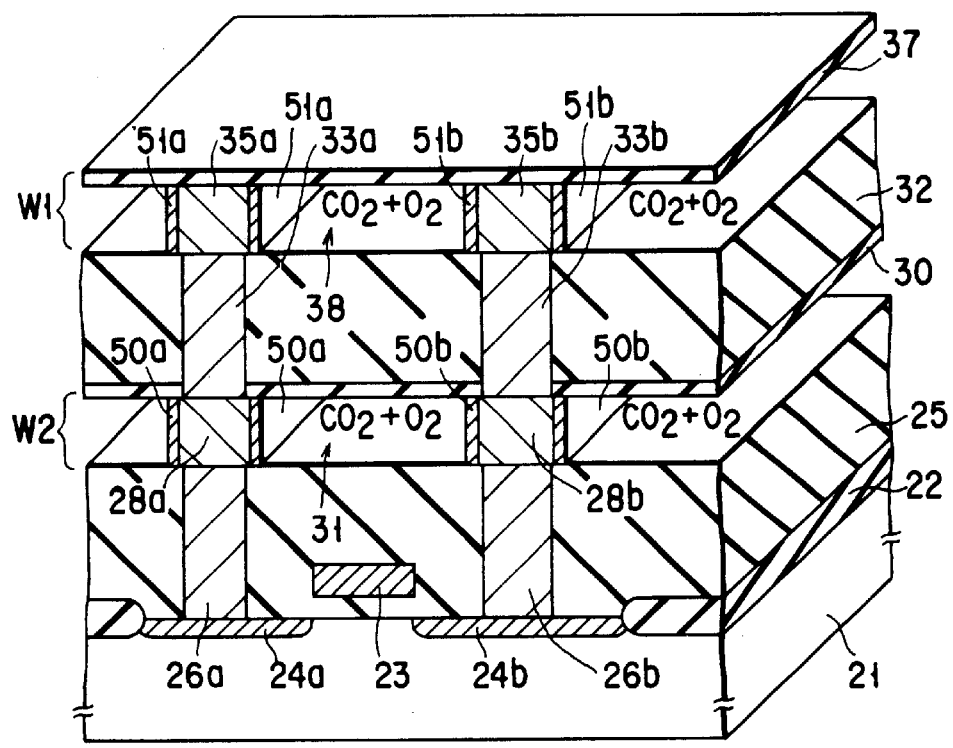
F I G. 153

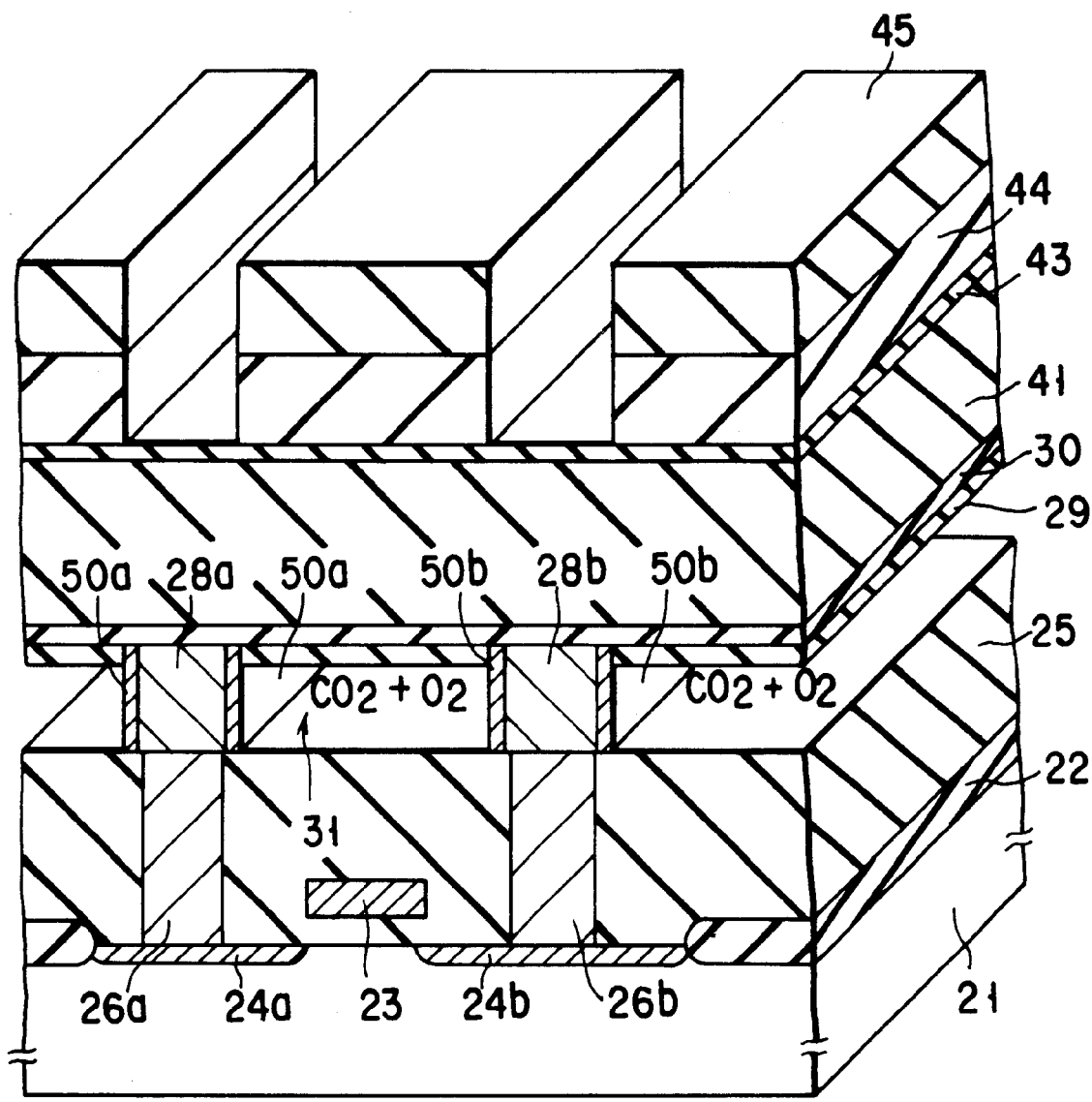
F I G. 155

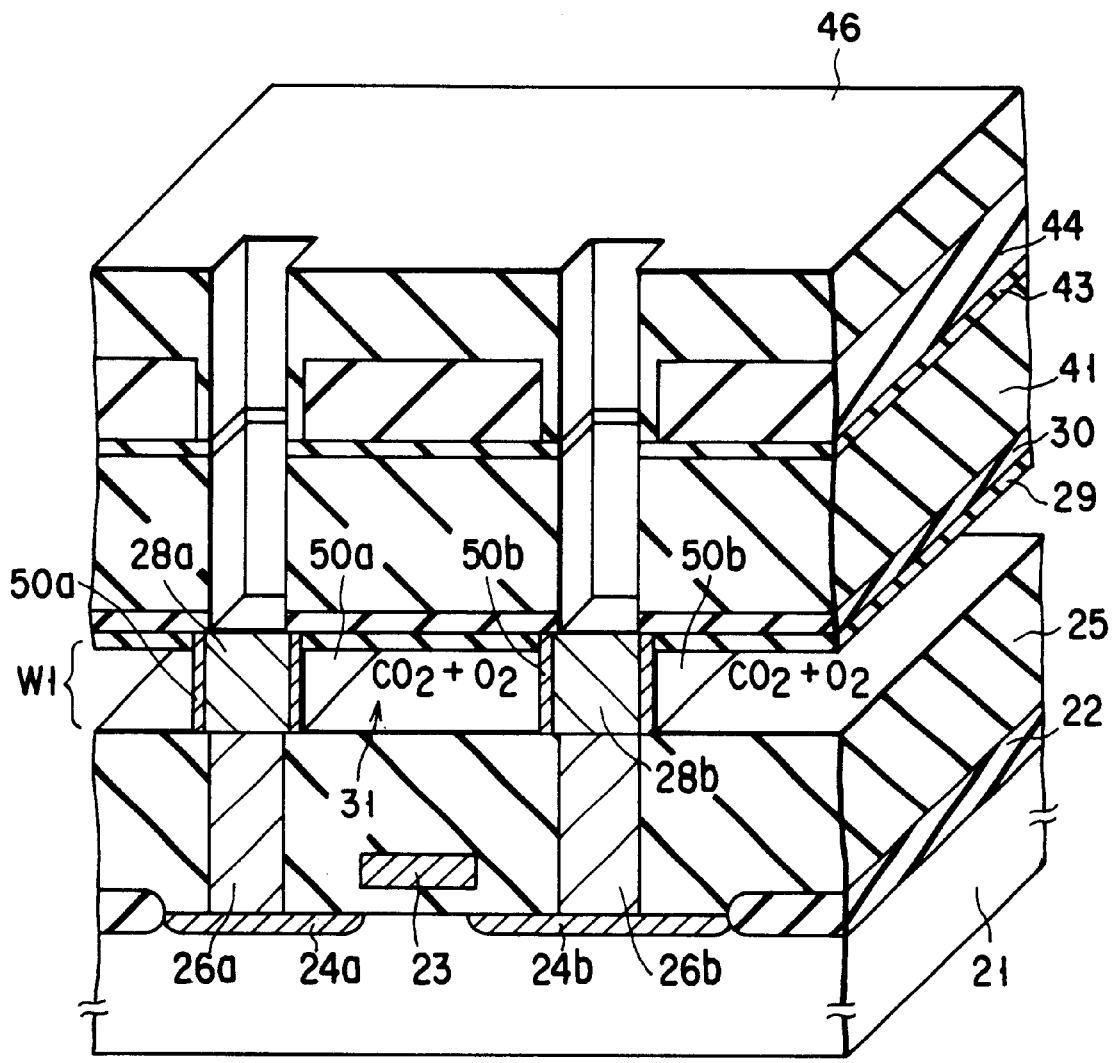
F I G. 156

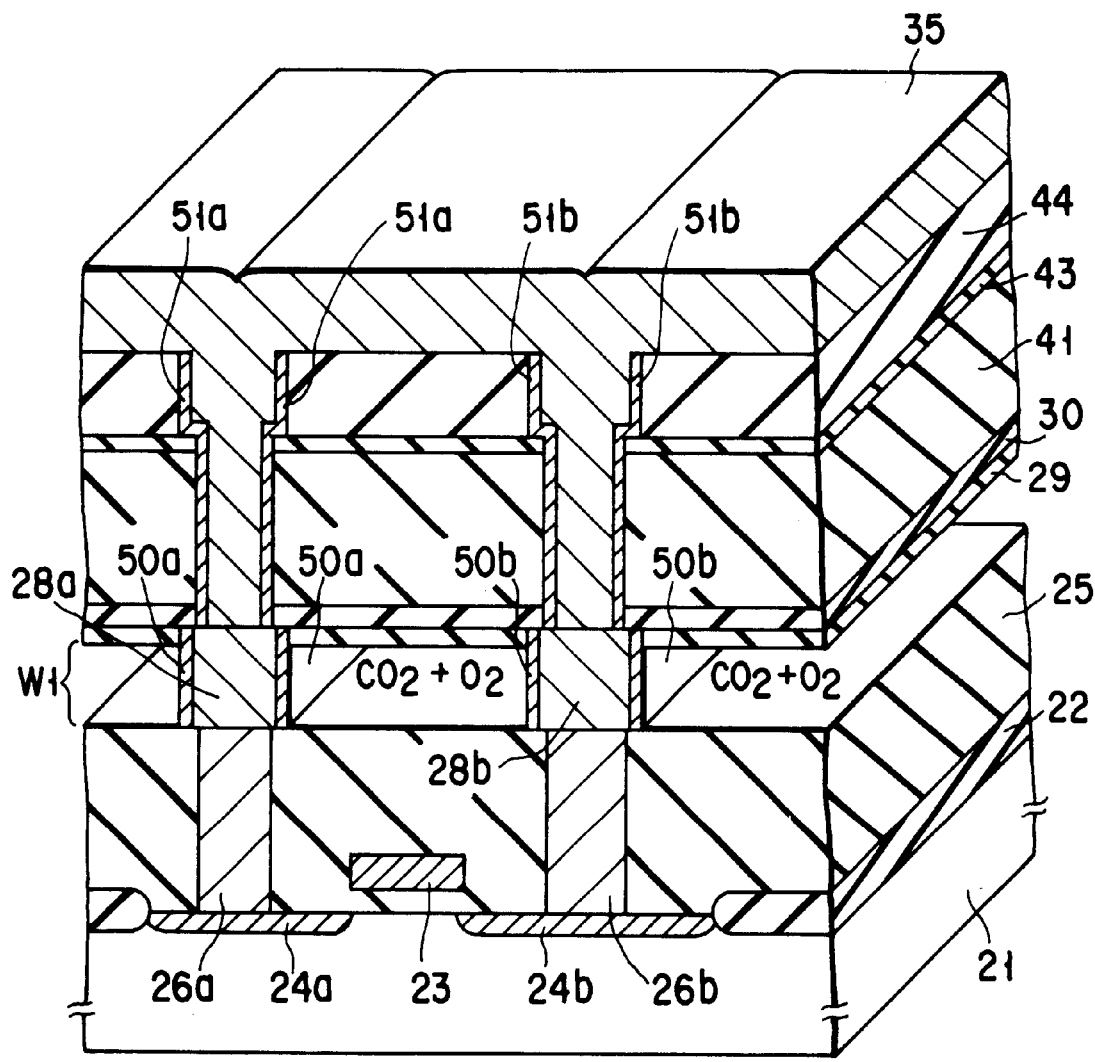
F I G. 157

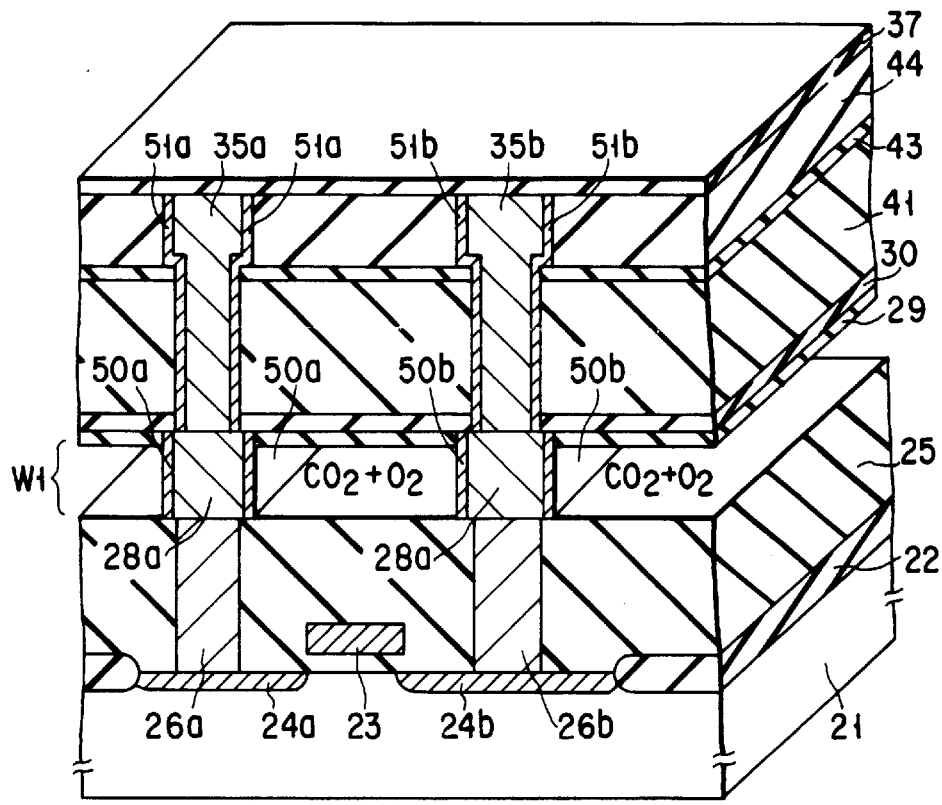
F I G. 158
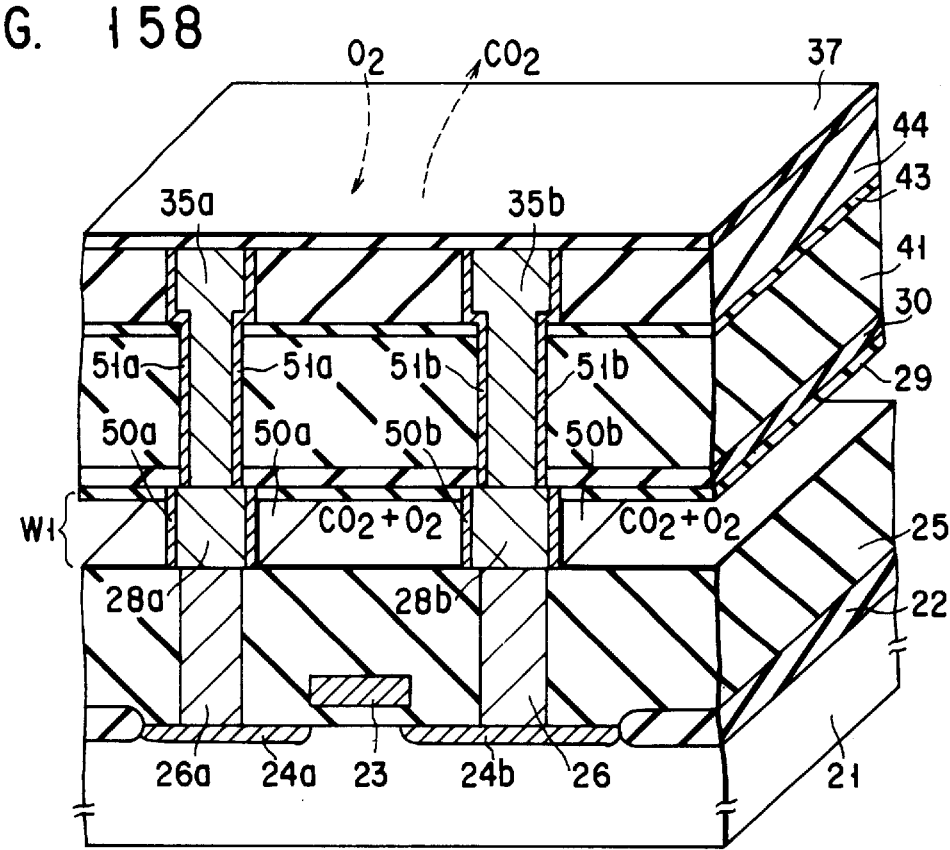
F I G. 159

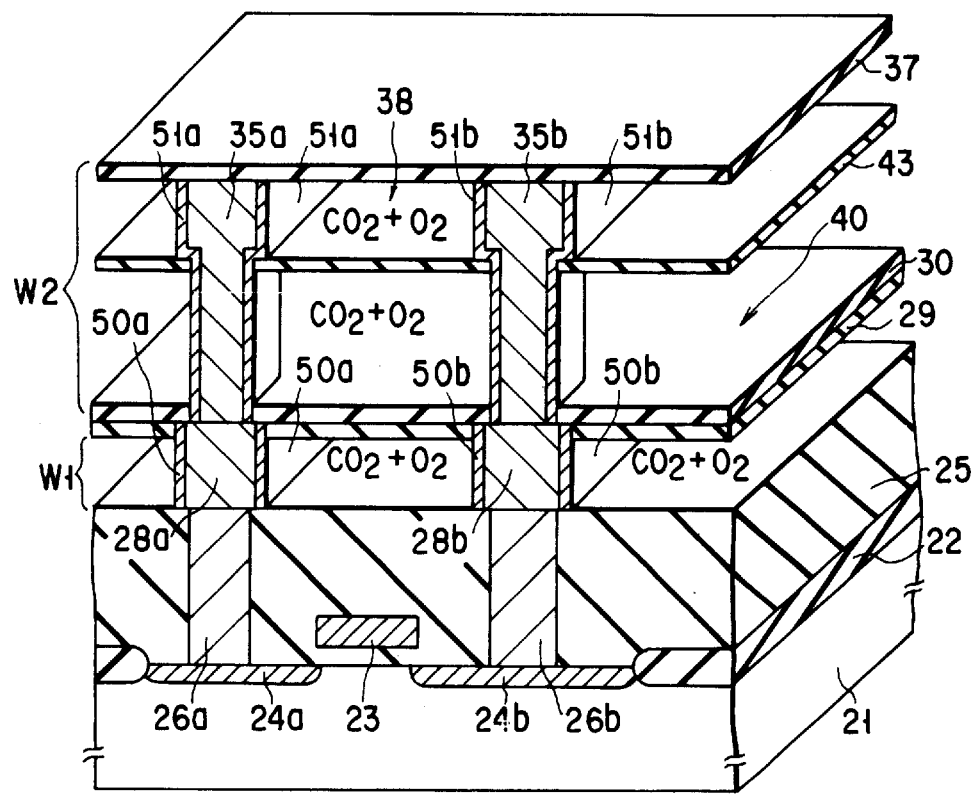
F I G. 160
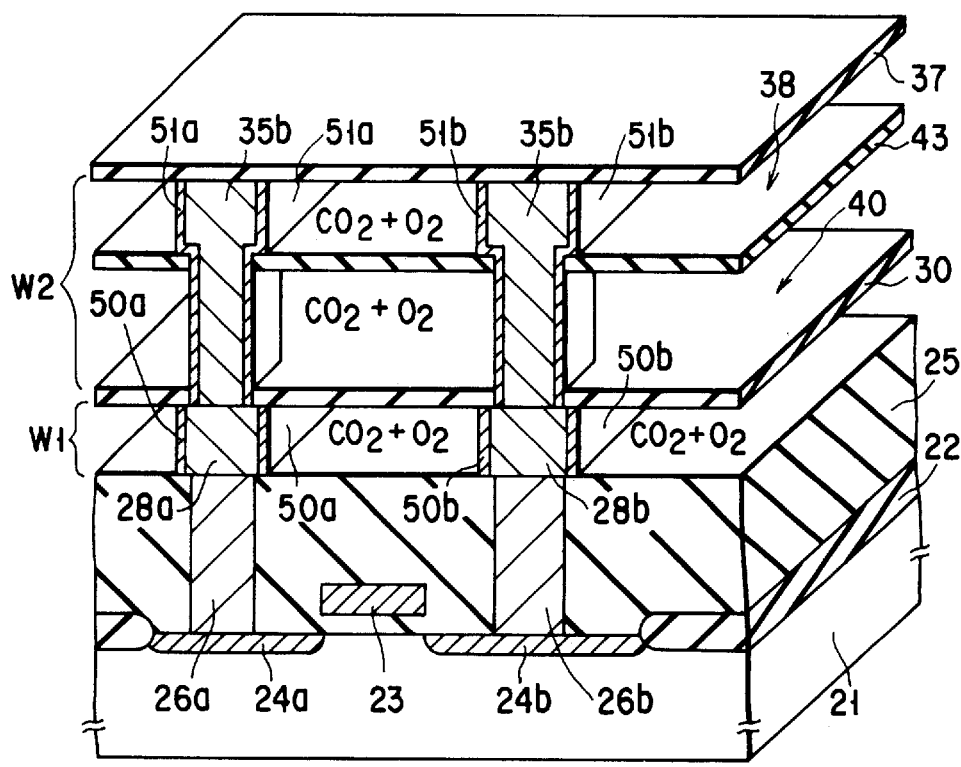
F I G. 161

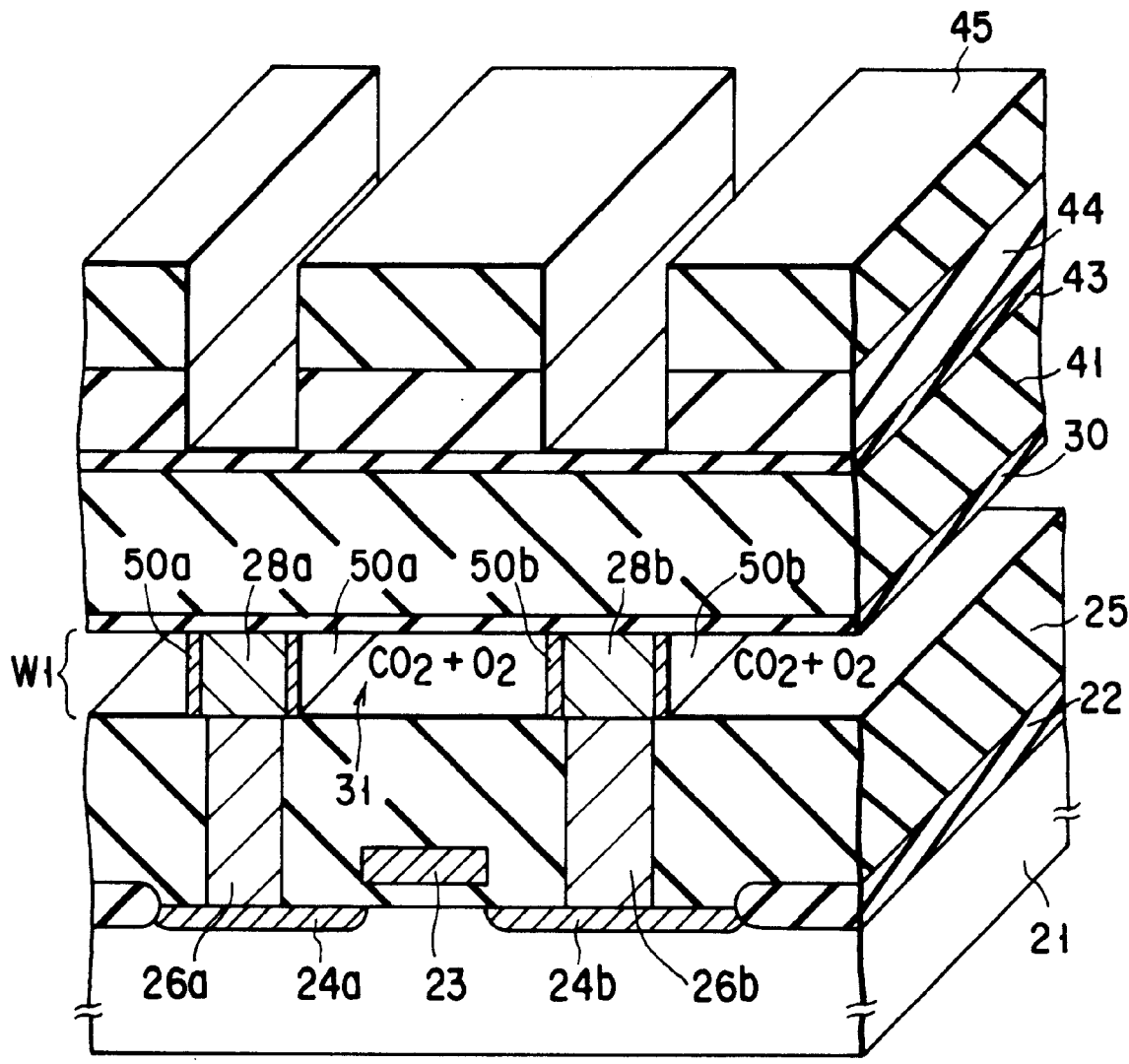
F I G. 162

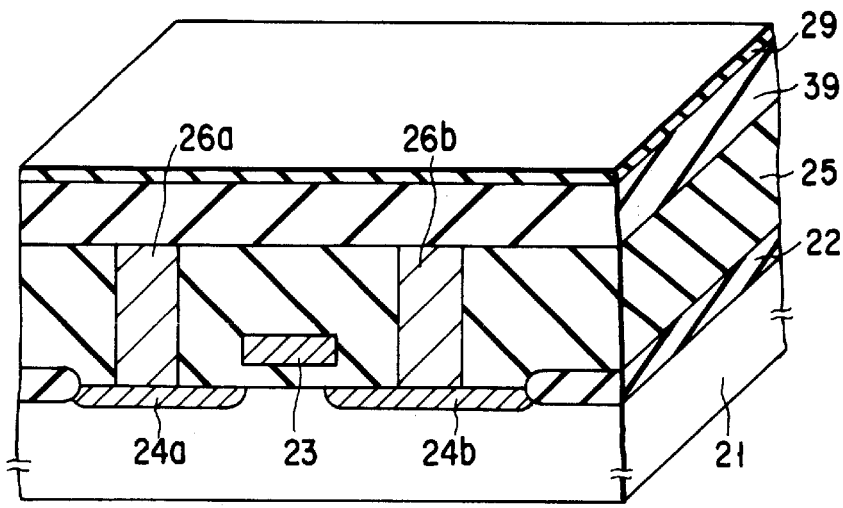
F I G. 187
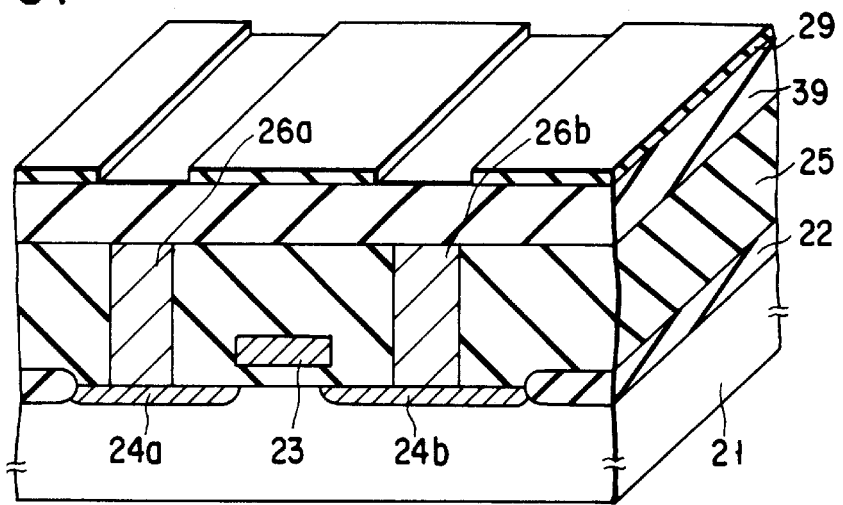
F I G. 188
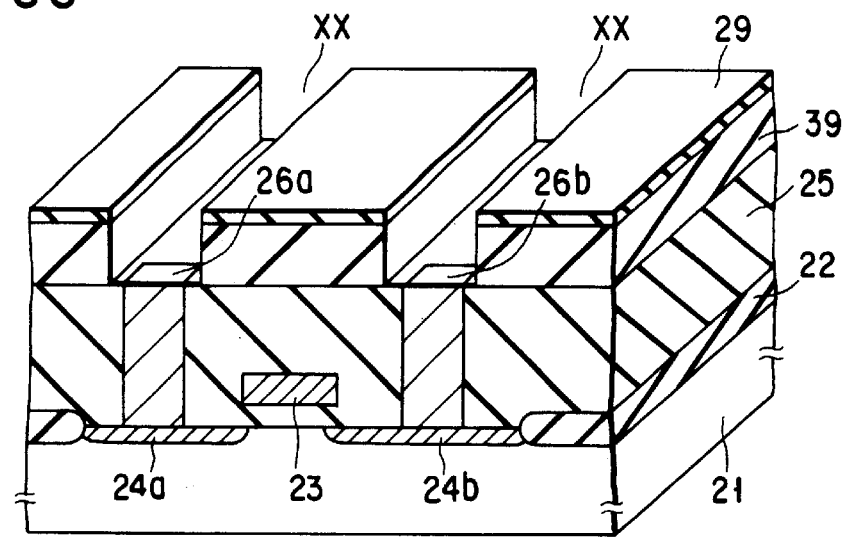
F I G. 189

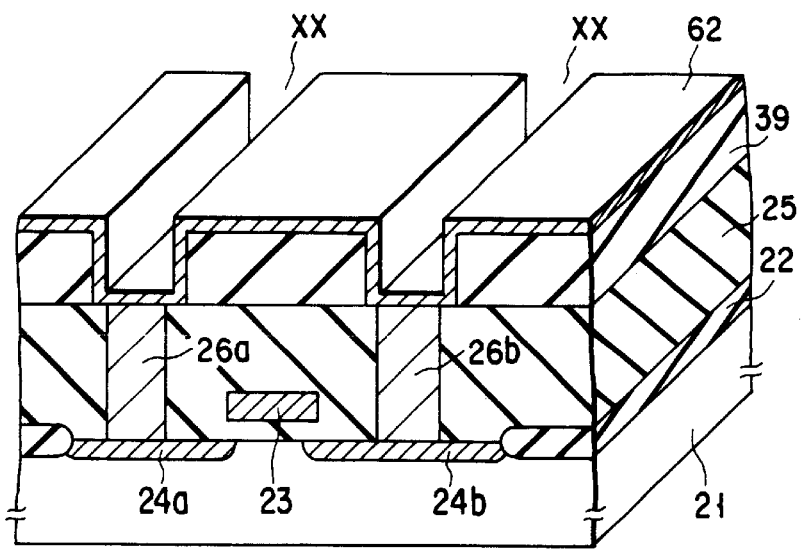
F I G. 190
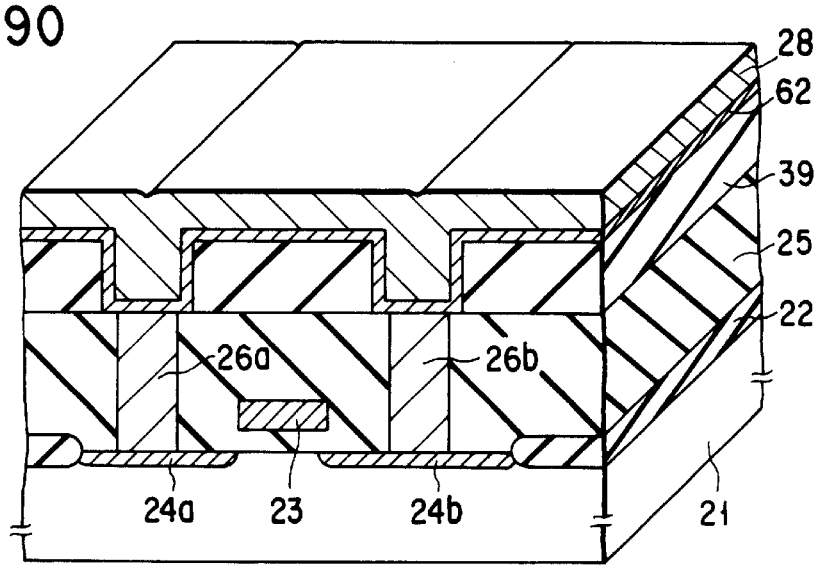
F I G. 191
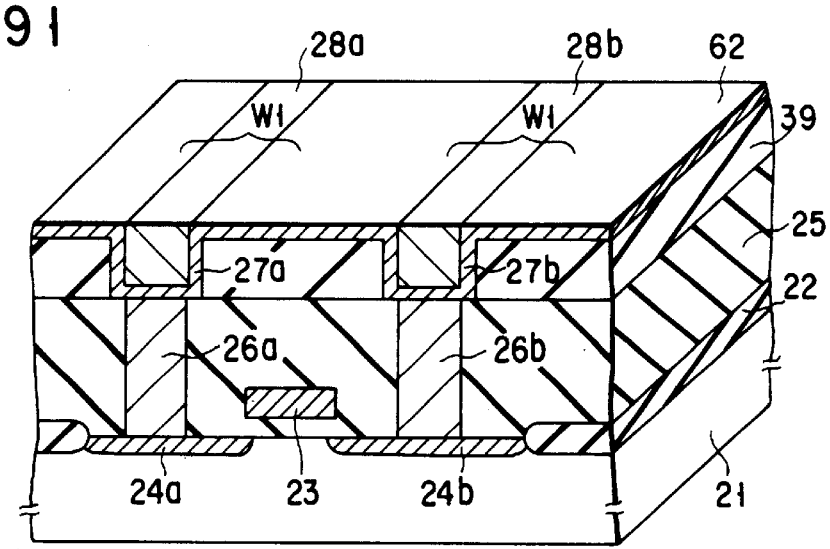
F I G. 192

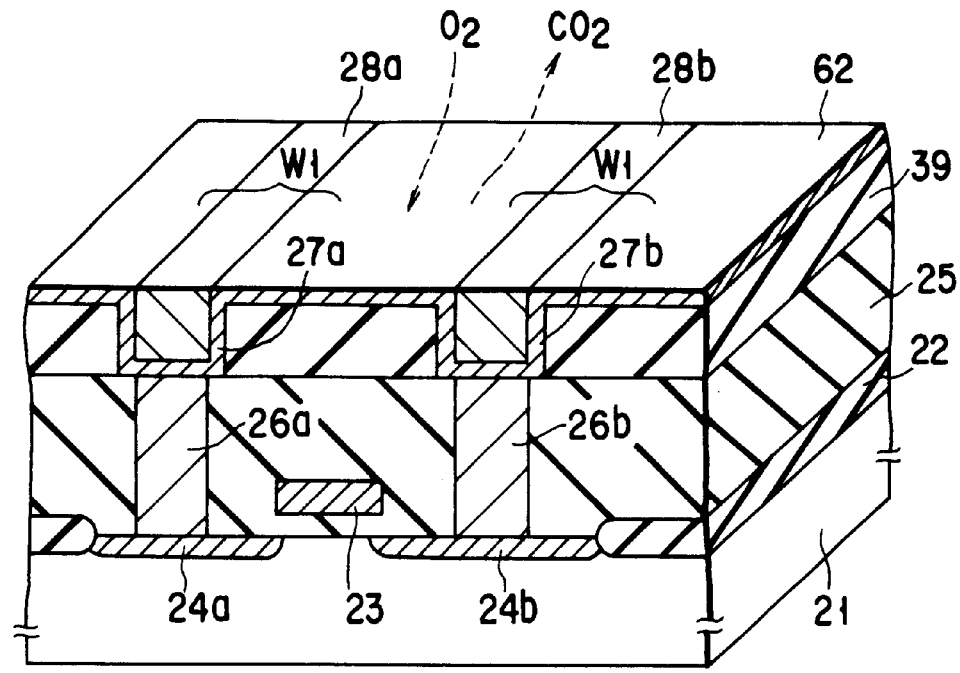
F I G. 193
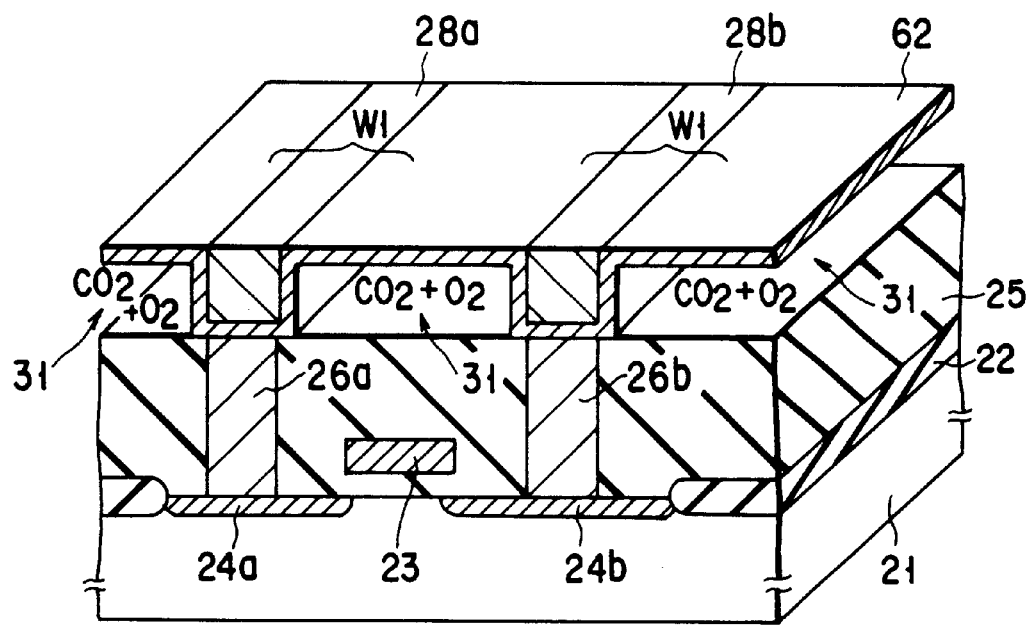
F I G. 194

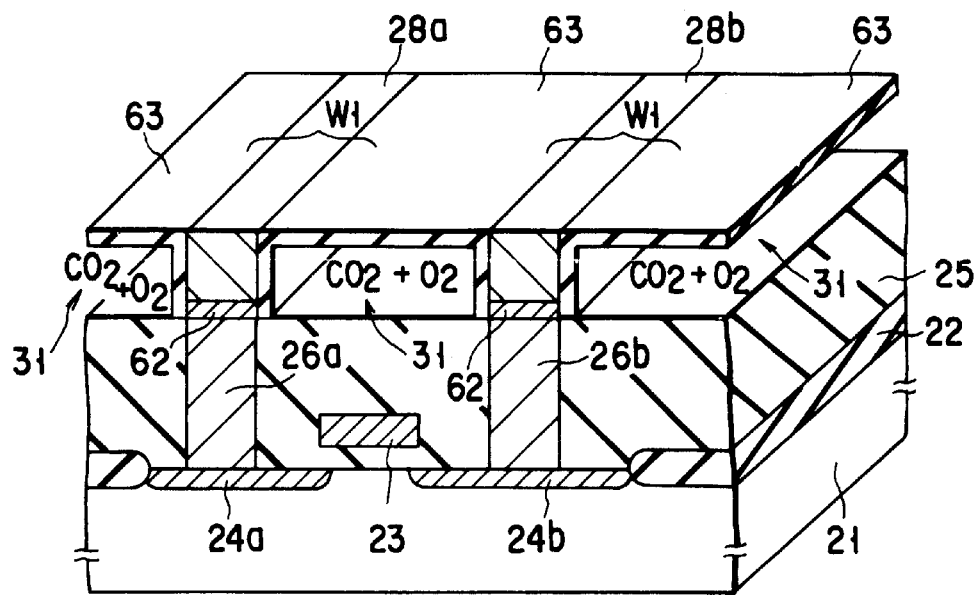
F I G. 195
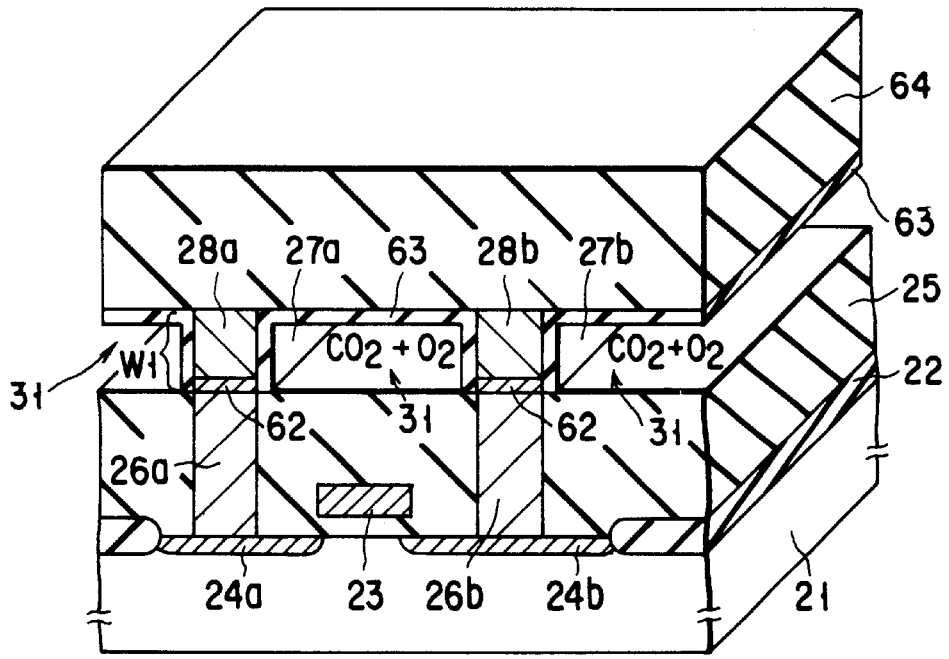
F I G. 196

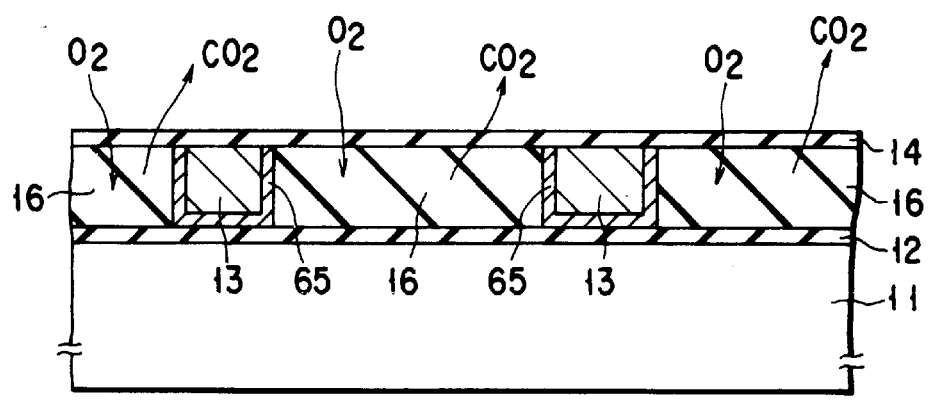
F I G. 197
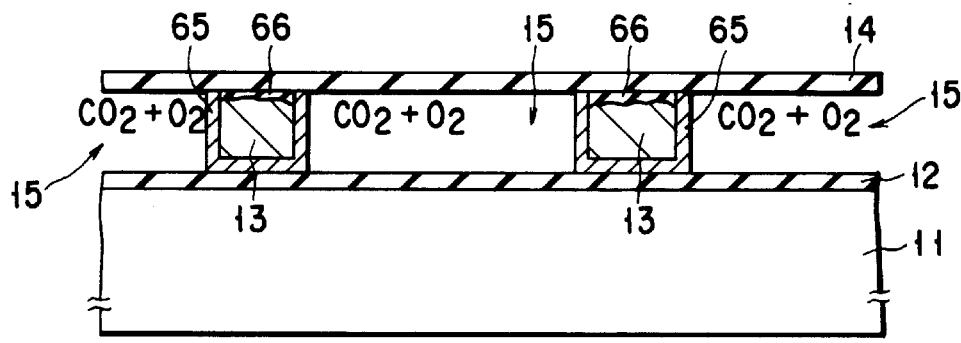
F I G. 198
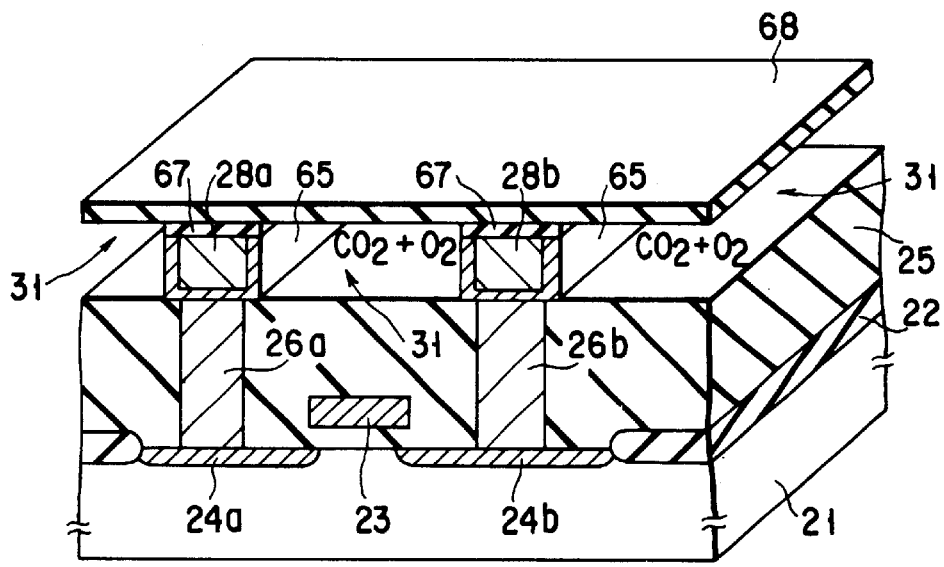
F I G. 199

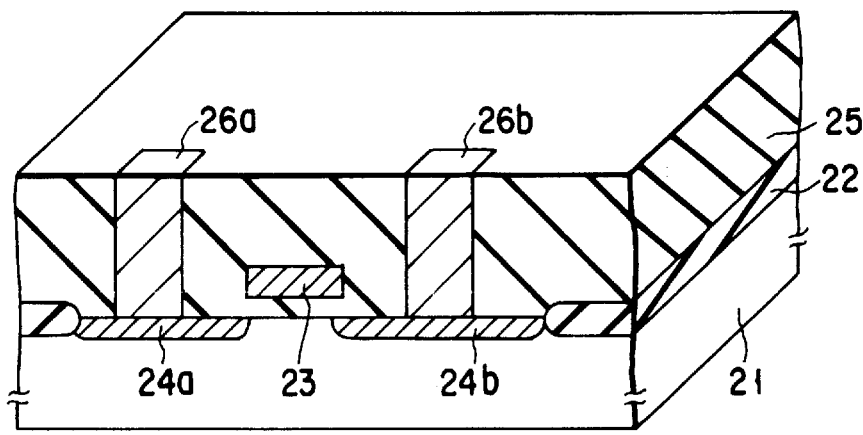
F I G. 200
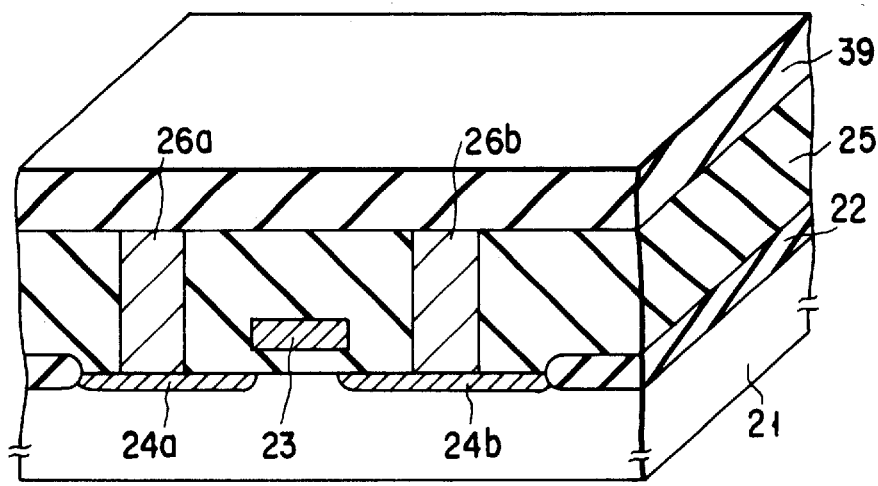
F I G. 201
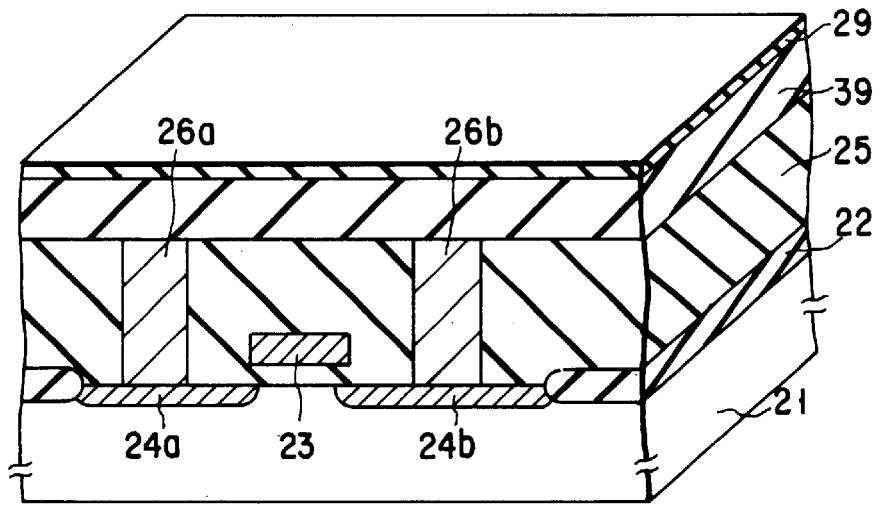
F I G. 202

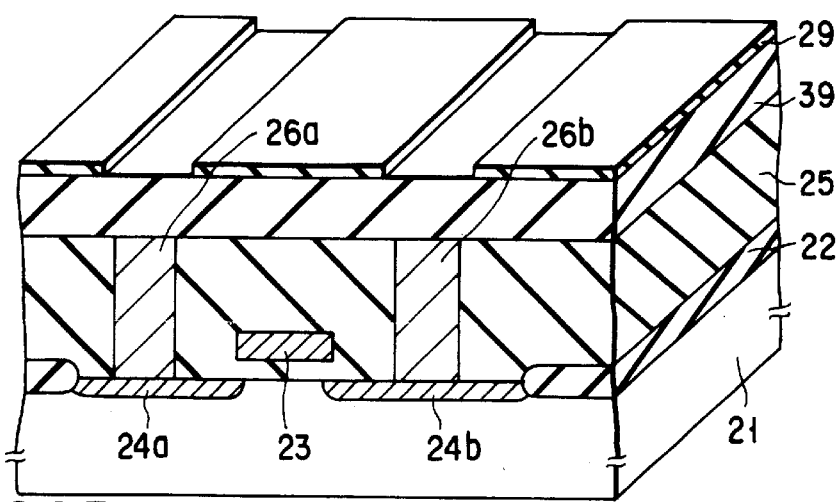
F I G. 203
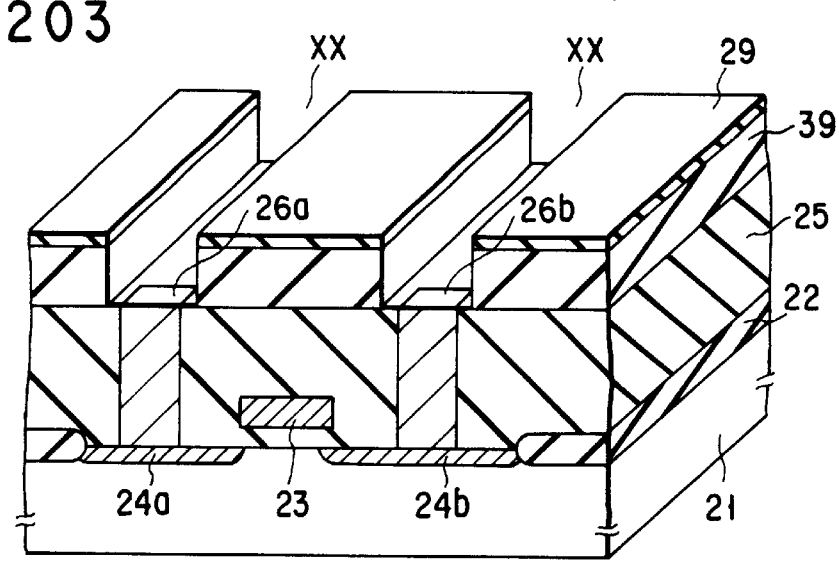
F I G. 204
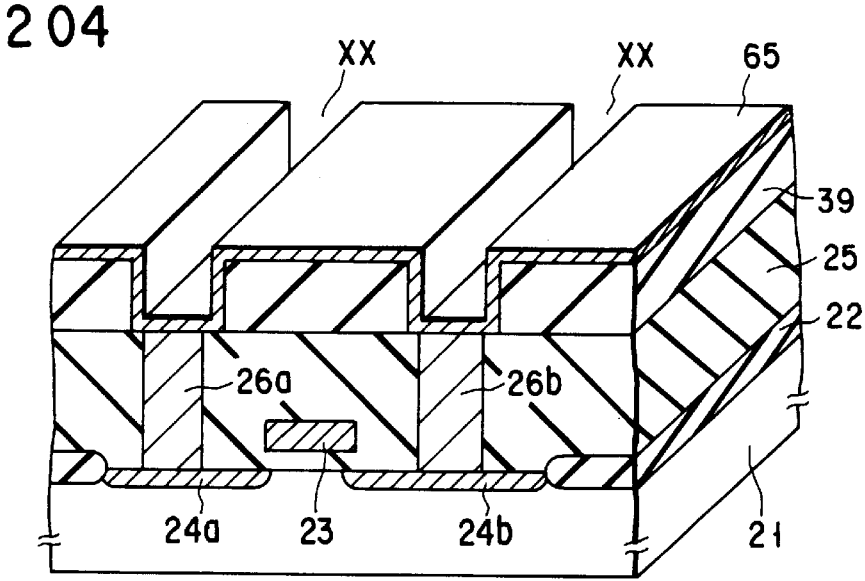
F I G. 205

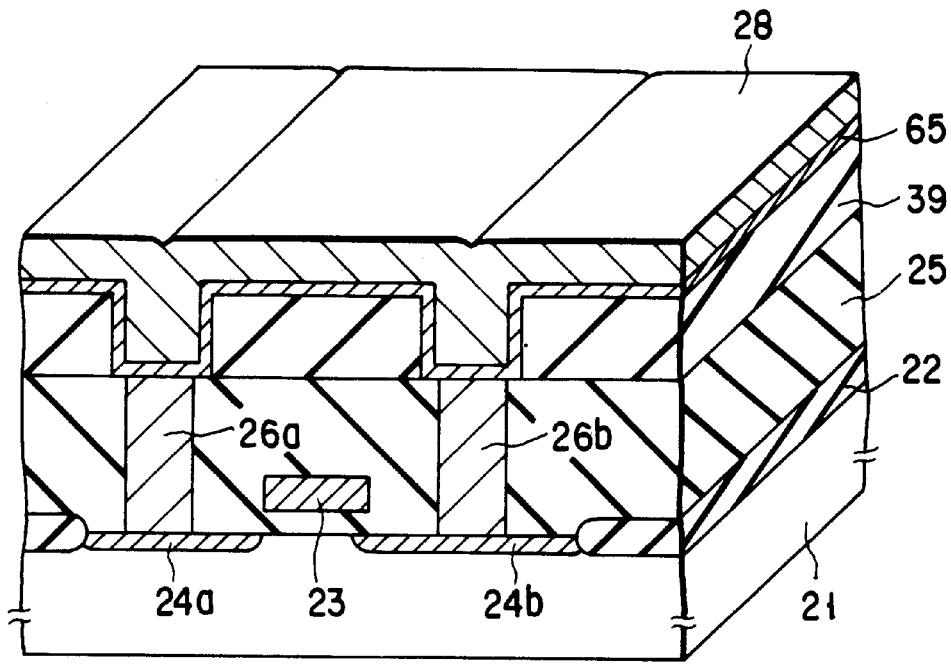
F I G. 206
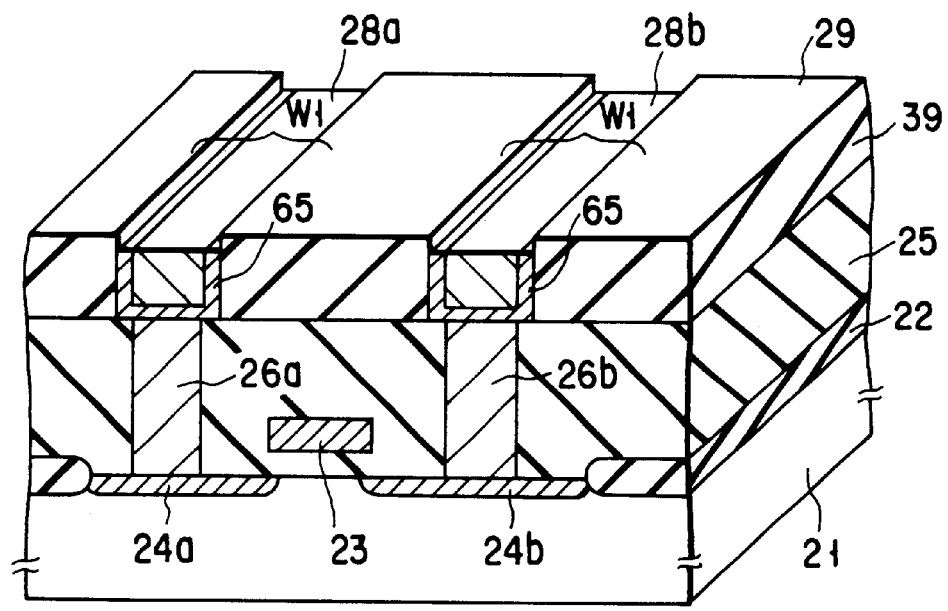
F I G. 207

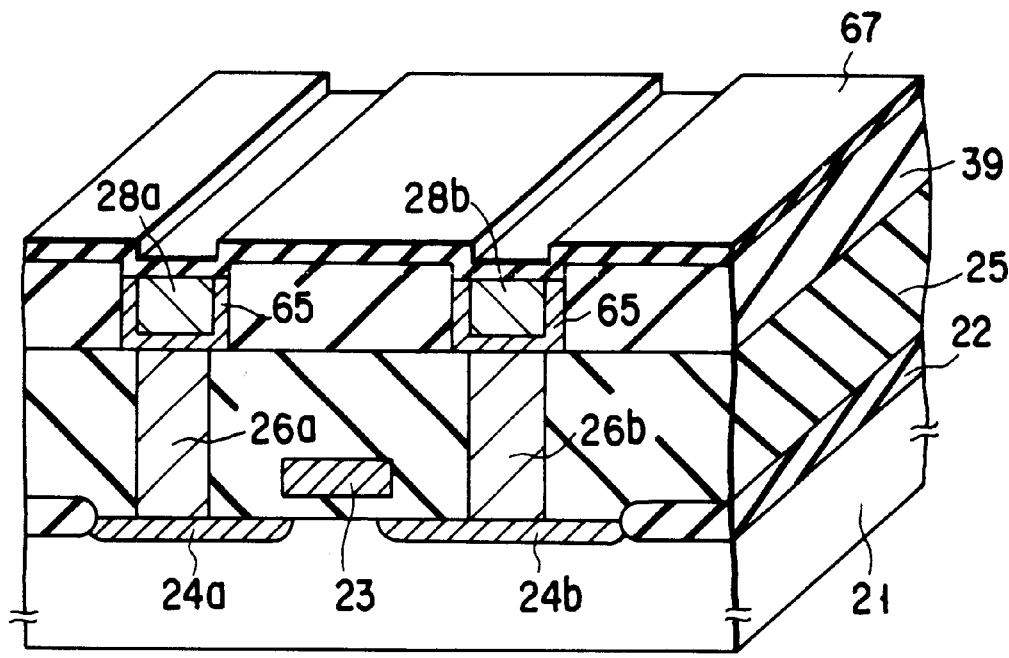
F I G. 208
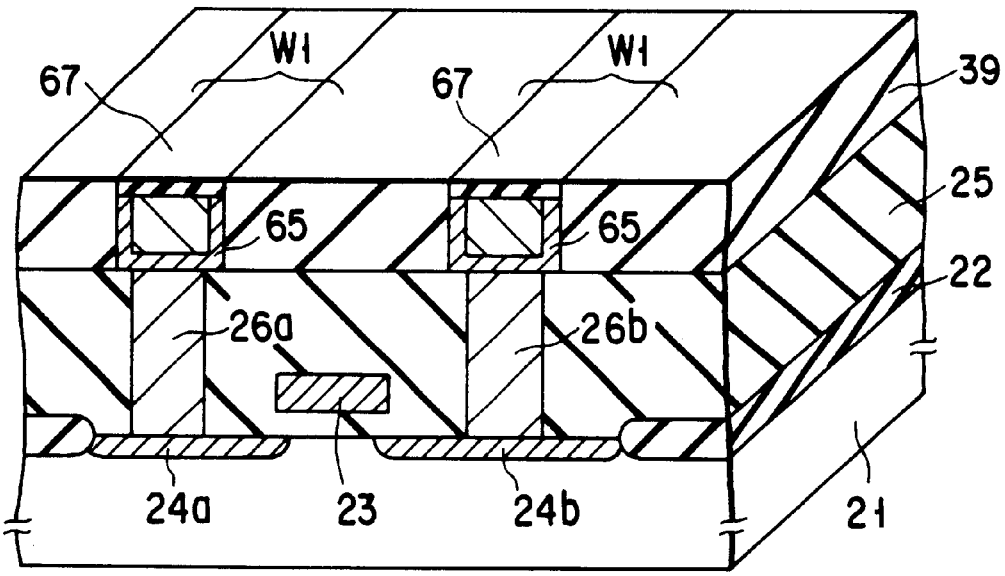
F I G. 209

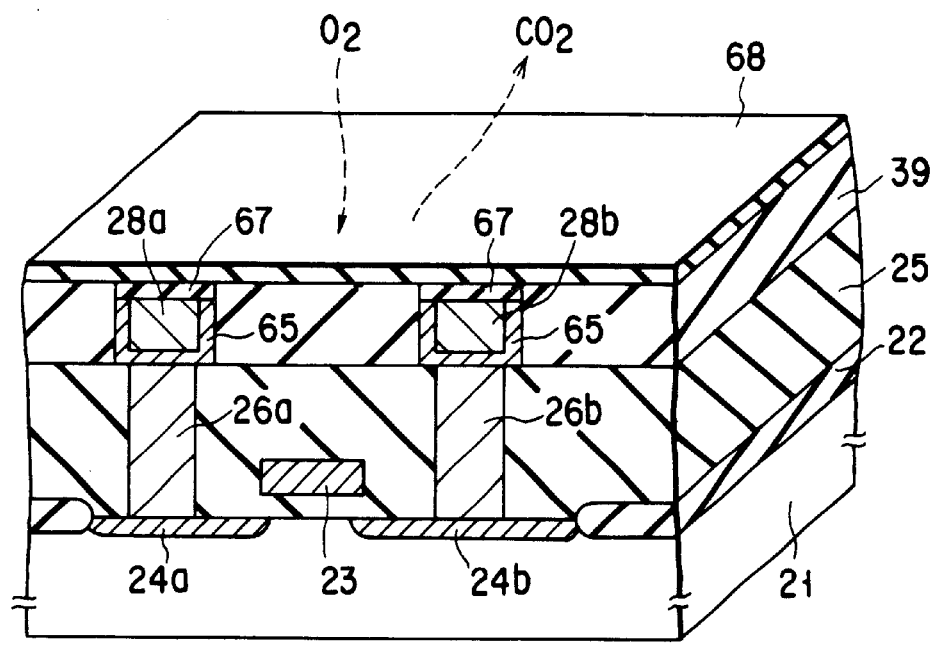
F I G. 210
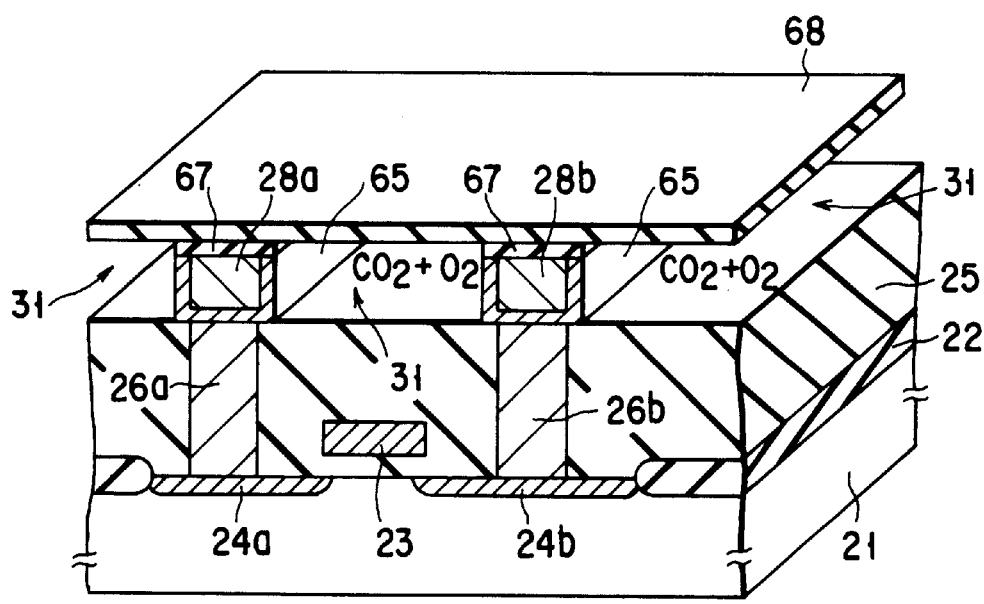
F I G. 211

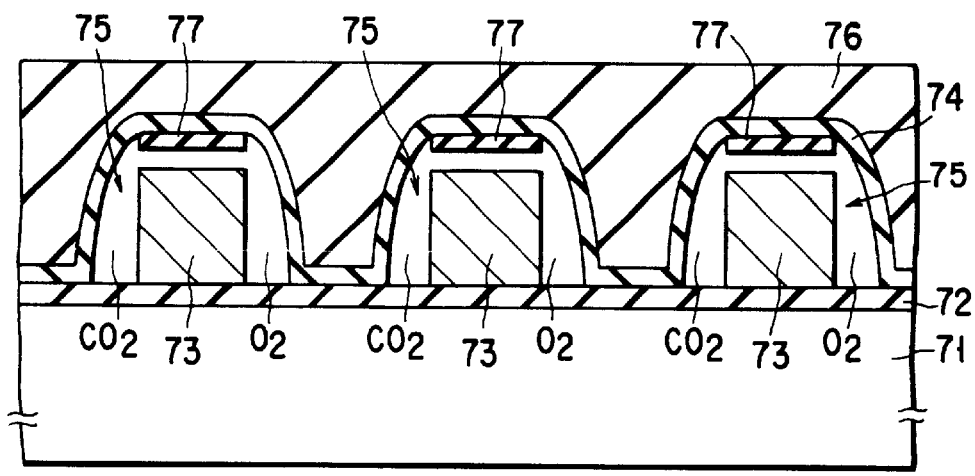
F I G. 212
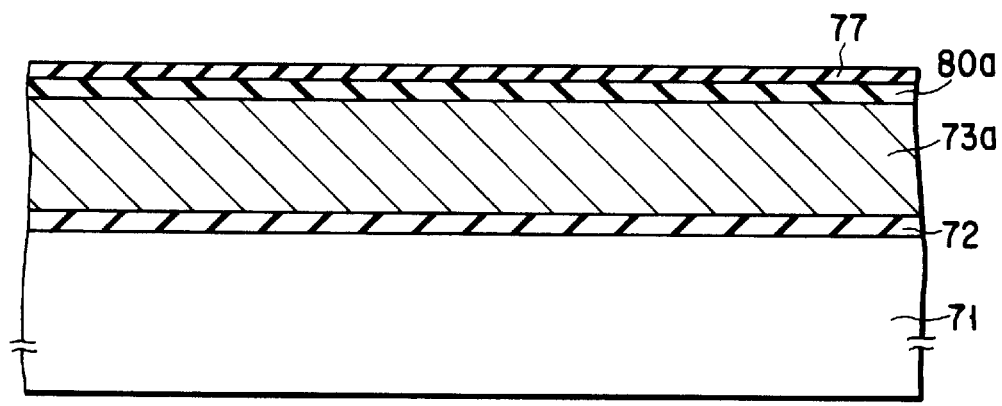
F I G. 213
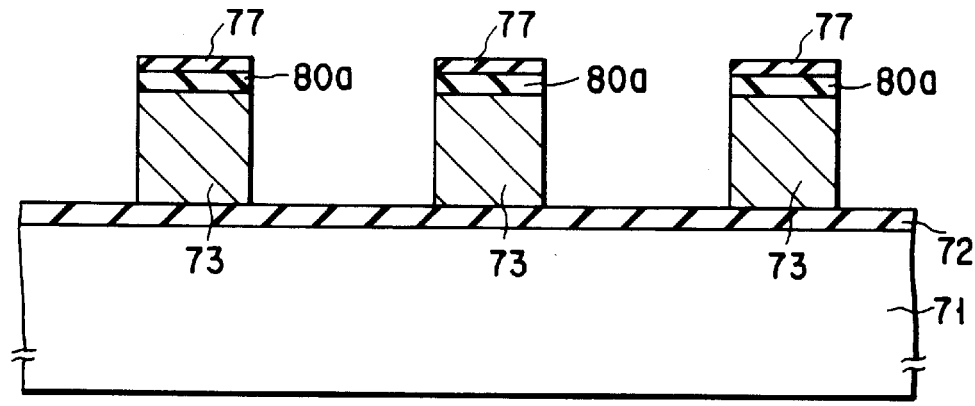
F I G. 214

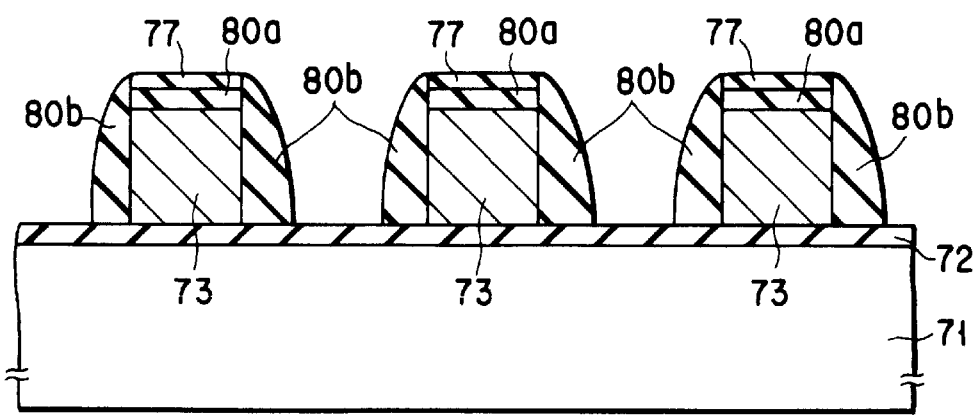
F I G. 215
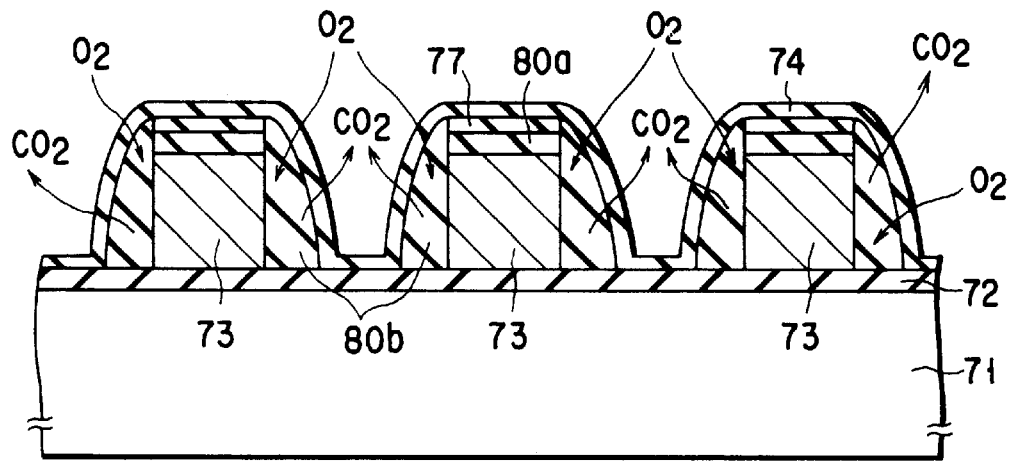
F I G. 216
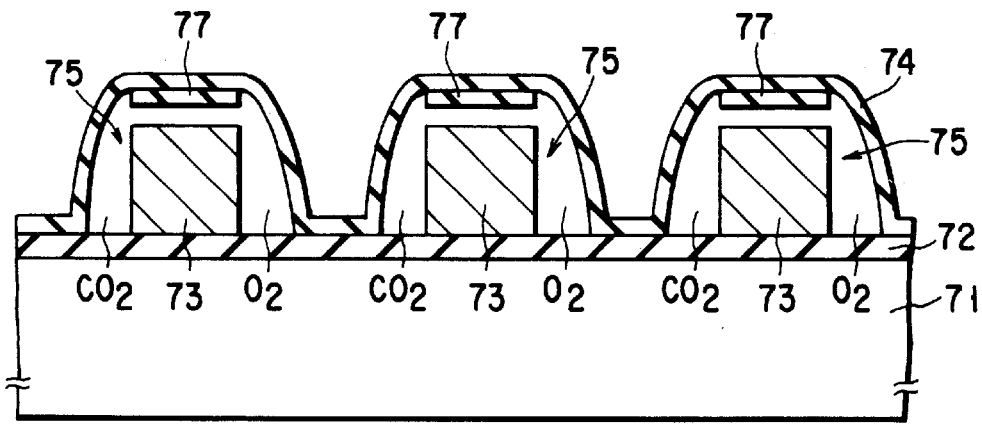
F I G. 217

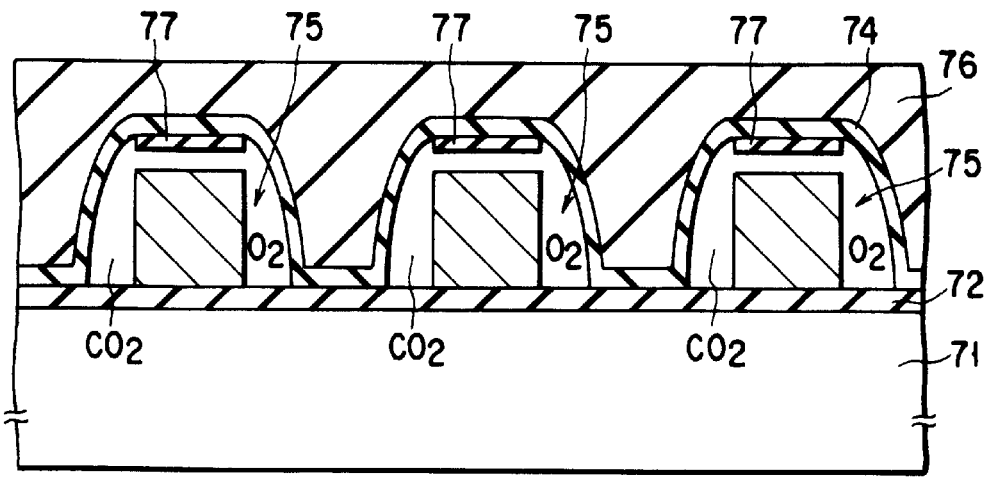
F I G. 218
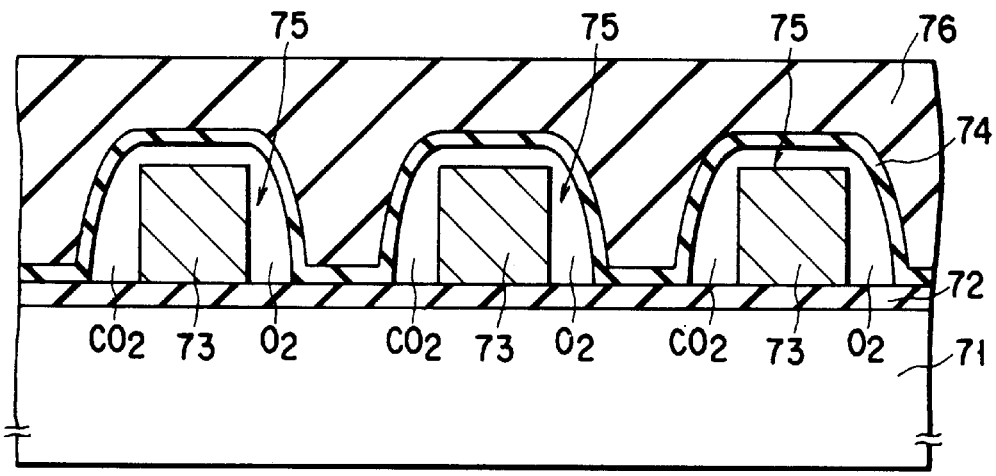
F I G. 219
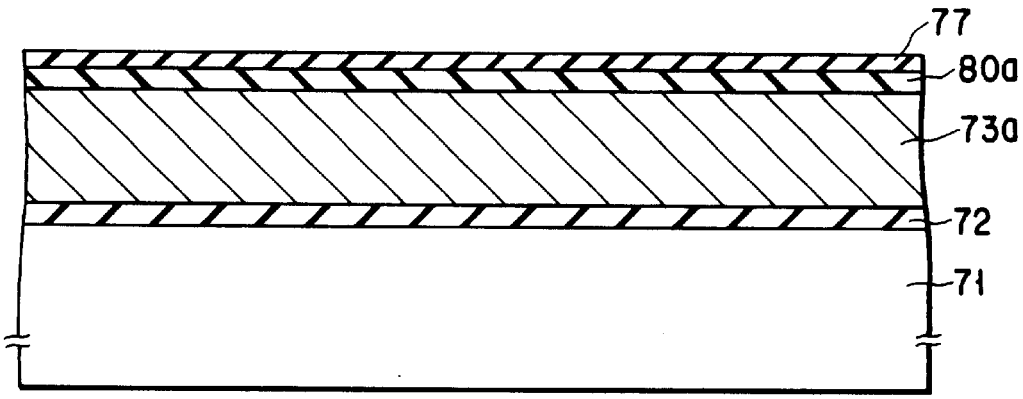
F I G. 220

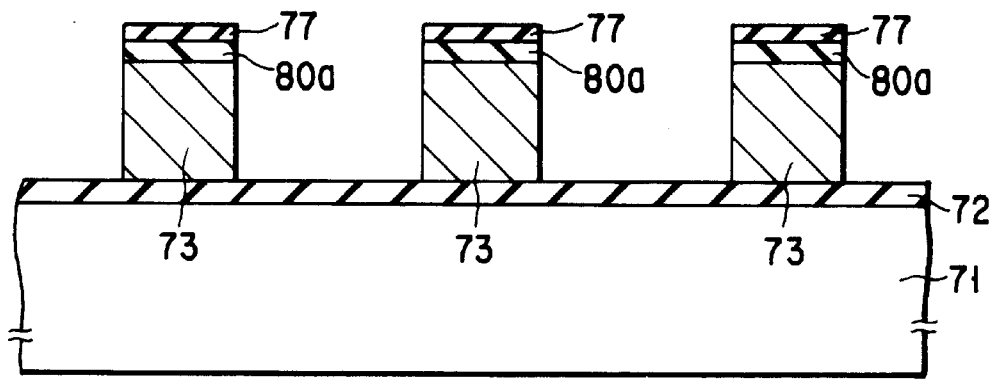
F I G. 221
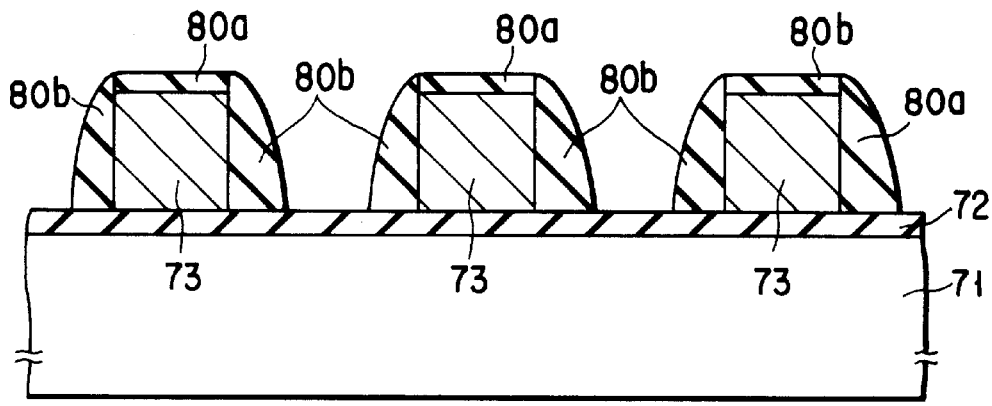
F I G. 222
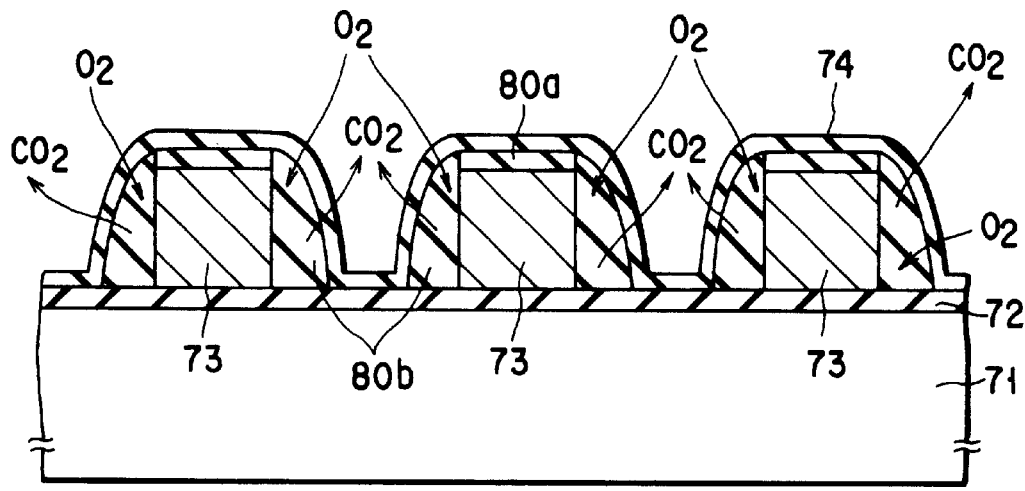
F I G. 223

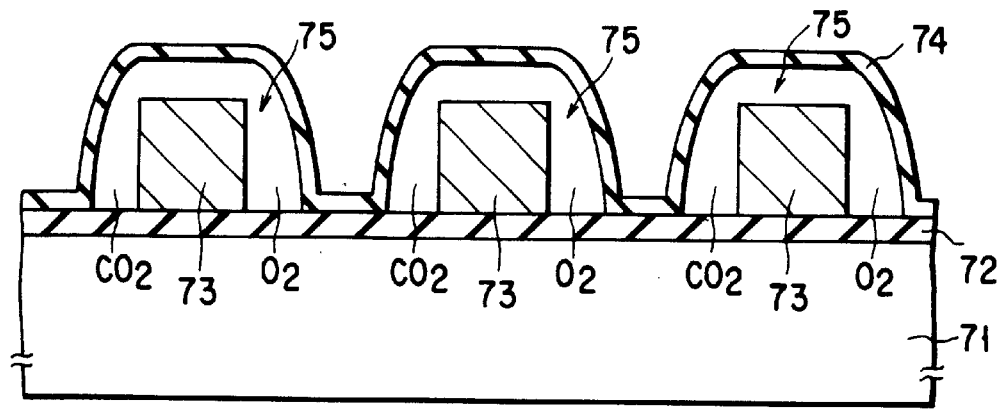
F I G. 224
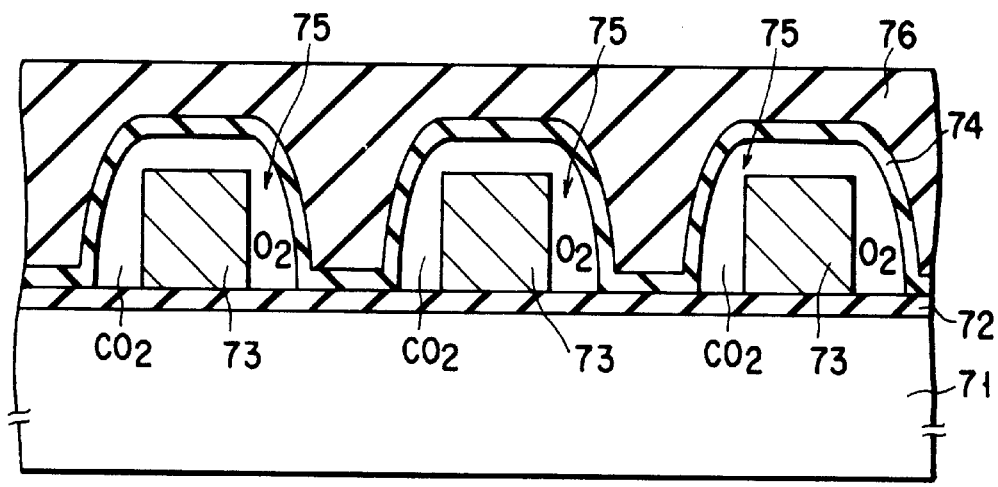
F I G. 225
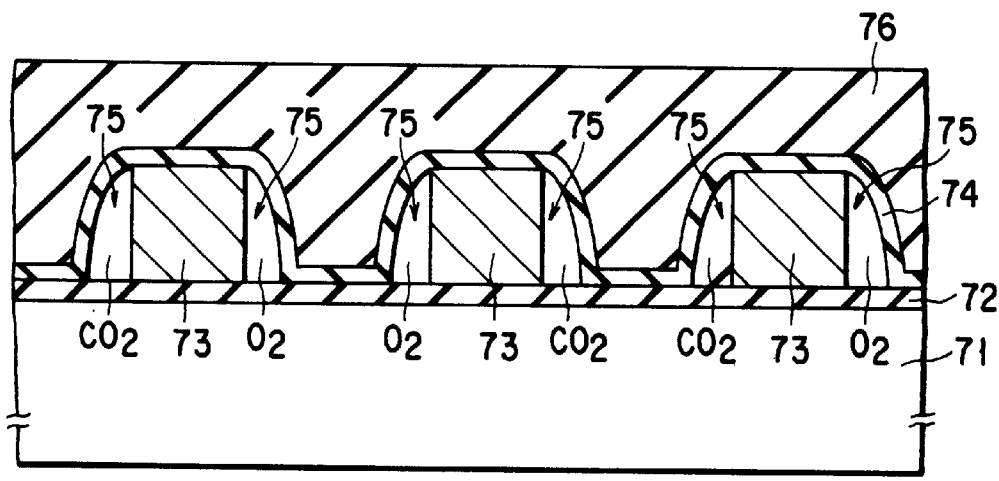
F I G. 226

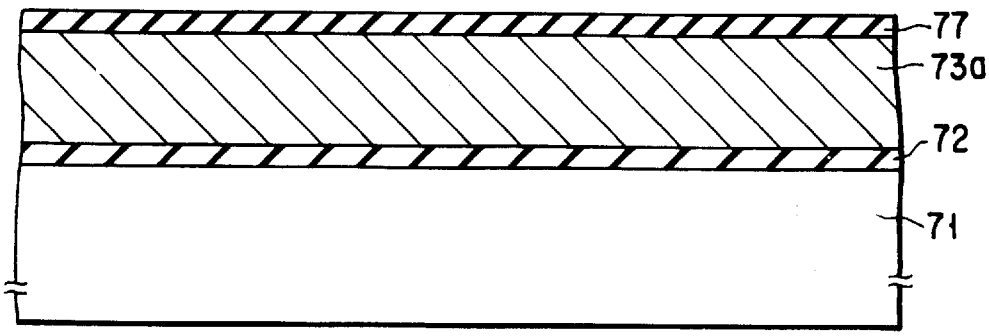
F I G. 227
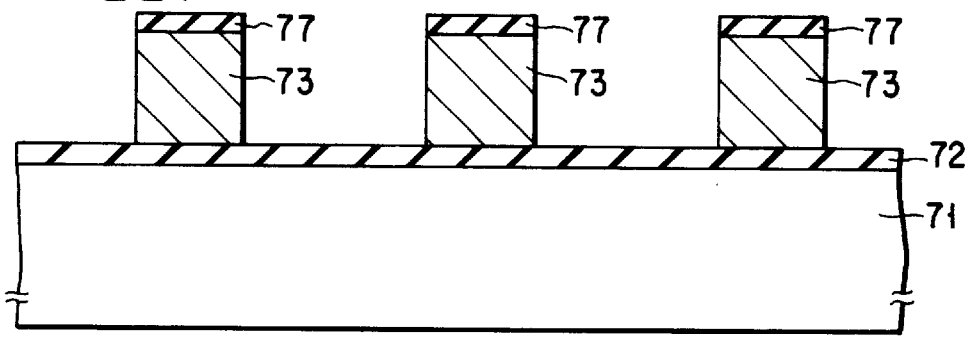
F I G. 228
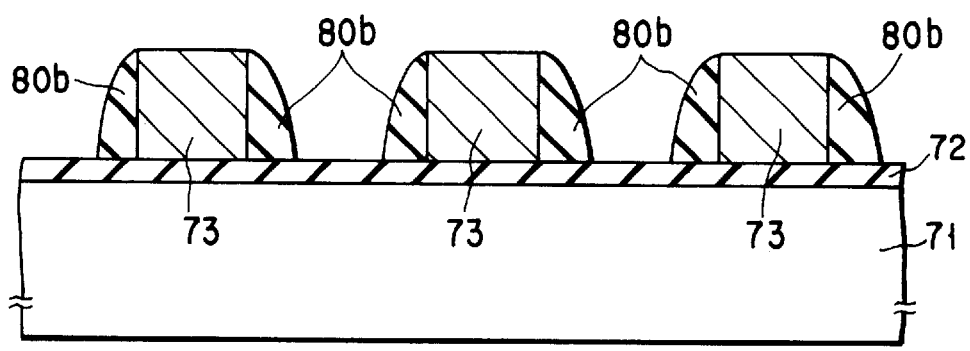
F I G. 229
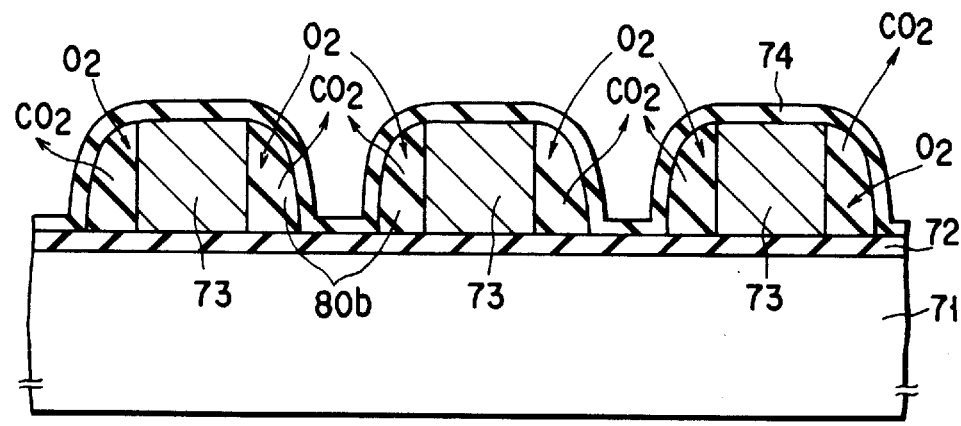
F I G. 230

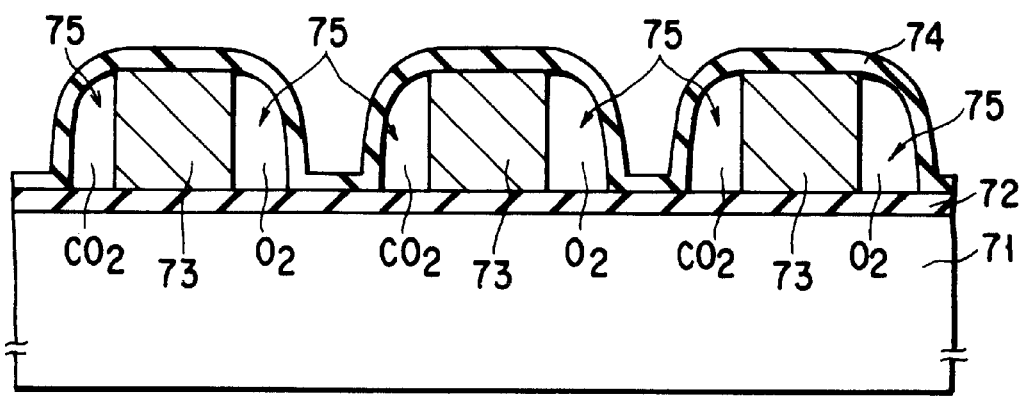
F I G. 231
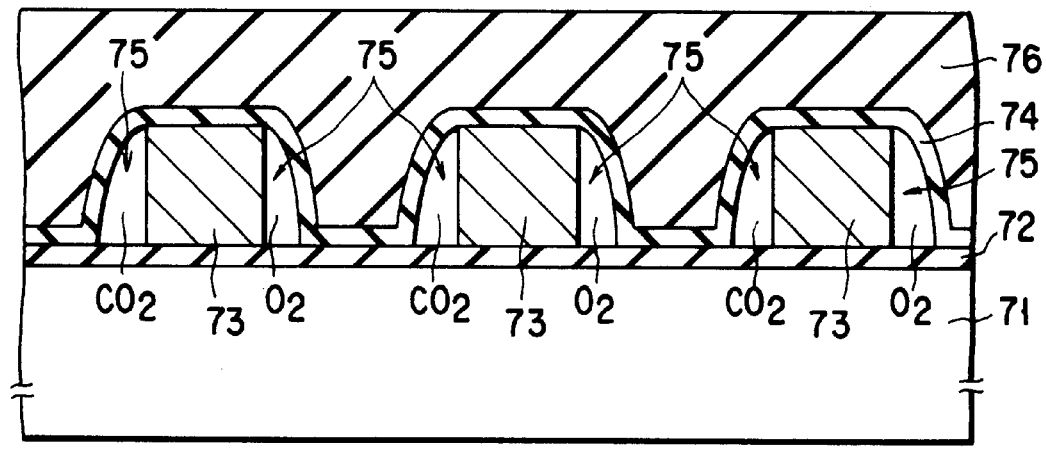
F I G. 232
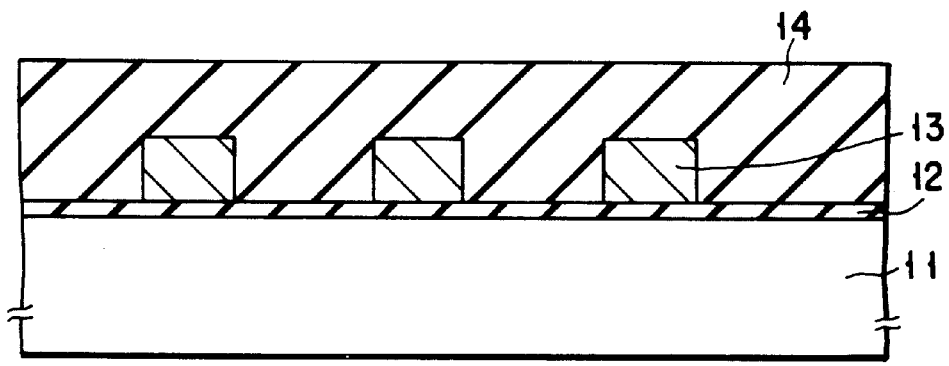
F I G. 233

FEASIBLE, GAS-DIELECTRIC INTERCONNECT PROCESS

This is a division of application Ser. No. 08/698,335 filed Aug. 15, 1996, pending which application is hereby incorporated by reference in its entirety.

BACKGROUND OF THE INVENTION

1. Field of the Invention

The present invention relates to a semiconductor device having a special interconnection insulating structure and also to a method of manufacturing the semiconductor device.

2. Description of the Related Art

Improvement of an LSI (Large Scale Integrated Circuit) essentially resides in an increase in the density at which elements are packed in the LSI, namely in a decrease in the size of the elements. If the packing density of elements is increased, however, the inter-wire capacitance will increase. The greater the inter-wire capacitance, the more difficult it will be to enhance the performance of the LSI (e.g., the operating speed).

To enhance the performance of an ultra-large scale integrated circuit (ULSIC) such as a microprocessor, it is absolutely necessary to reduce the parasitic resistance and parasitic capacitance of the wires used in the ULSIC. The parasitic resistance of the wires can be decreased by using a low-resistivity material for the wires. At present, it is proposed that the wires be made of copper, instead of aluminum alloy.

This is because the resistivity of copper is 30% or more lower than that of aluminum alloy.

The parasitic capacitance of the wires has two components. The first component is the capacitance among wires located at different levels. This capacitance can be reduced by increasing the thickness of the inter-layer insulating films used. The second component is the capacitance among wires located at the same level. This capacitance can be reduced by increasing the space between the wires and by decreasing the thickness of the wires.

To increase the space between the wires is to lower the packing density of elements, and to decrease the thickness of the wires is to increase the resistance of the wires. Hence, if the wires are spaced farther apart and made thicker, the performance of the LSI can no longer be enhanced. In order to reduce the parasitic capacitance among the wires, it is proposed that the insulating layers interposed between the wires be made of material having a small dielectric constant $\in$.

FIG. 233 shows a semiconductor device in which insulating layers having a small dielectric constant $\in$ are interposed between the wires. AS shown in FIG. 233, an insulating layer 12 is provided on a semiconductor substrate 11. Lines 13 are formed on the insulating layer 12. Formed on the layer 12 and on the wires 13 is a plasma TEOS layer 14 which contains fluorine. The plasma TEOS layer 14 containing fluorine has a dielectric constant $\in$ of about 3.3, which is about 15% less than the dielectric constant of plasma TEOS which does not contain fluorine.

As the packing density of elements has been increasing steadily, the performance of LSIs cannot be enhanced unless the inter-wire insulating layers have a dielectric constant $\in$ of less than 3.3. Thus, the dielectric constant of inter-wire insulating layers must be decreased by any means to improve the performance of LSIs. It is, however, extremely difficult to reduce the constant to a value less than 3.3. The inter-wire insulating layers used at present, which has a dielectric constant of 3.3 or more, is a bar to the improvement of LSIs in terms of their performance.

In recent years, an attempt has been made to void the spaces between the wires arranged at the same level so as to reduce the parasitic capacitance among these wires. This technique is disclosed in, for example, Jpn. Pat. Appln. KOKAI Publication 7-45701. More specifically, water is filled in the inter-wire spaces, cooled to solidify, turning into ice layers, and the ice layers are evaporated, rendering the spaces void.

This technique is disadvantageous in three respects because a change in phase of the material is utilized. First, the water filled in the inter-wire spaces adversely influences the wires as it solidifies and expands. This holds true of any other material that is disclosed in the above-identified publication and that can be used in place of water. Second, the ice layers in the inter-wire spaces may melt away in some cases, due to the heat generated as they are polished by CMP (Chemical Mechanical Polishing). Third, the wafer must be cooled to a low temperature (below 0° C. when water is used) until the ice layers are evaporated. This inevitably makes it difficult to handle the semiconductor wafer.

Moreover, the water vapor which fills the inter-wire spaces for some time after the ice layers have been evaporated may cause short-circuiting of the wires or corrosion of the wires, or both. The water vapor may therefore impair the reliability of the wires.

Further, this technique cannot make void the spaces between wires which are arranged at different levels. Therefore, it does not serve to reduce this parasitic capacitance among all wires, including those located at the same level, as much as is desired.

SUMMARY OF THE INVENTION

The present invention has been made to solve the problems described above. Its object is to provide an LSI which has an increased packing density of elements and an enhanced performance.

According to a first aspect of this invention there is provided a semiconductor device which comprises: a semiconductor substrate; a first insulating layer provided on the semiconductor substrate; wires of a first set provided on the first insulating layer; a second insulating layer having via holes and formed on the wires of the first set, providing complete cavities between the wires of the first set; wires of a second set provided on the second insulating layer; conductors of a first set filled in the via holes of the second insulating layer and connecting the wires of the first set to the wires of the second set; and a third insulating layer provided the wires of the second set, providing complete cavities among the wires of the second set.

The cavities provided among the wires of the first set and the cavities provided among the wires of the second set are filled with either air or a mixture gas consisting of at least oxygen and carbon dioxide.

The first insulating layer has a flat surface.

According to a second aspect of the invention there is provided a method of manufacturing a semiconductor device, which comprises the steps of: forming a first insulating layer on a semiconductor substrate; forming a solid layer on the first insulating layer; forming slits in the solid layer; forming conductors in the slits of the solid layer, thereby forming wires; forming a second insulating layer on the solid layer and the wires; and oxidizing the solid layer, changing the same into gas layers.

The solid layer is a carbon layer. The carbon layer is ashed, thereby providing complete cavities among the wires, which are filled with a mixture gas consisting of at least oxygen and oxygen dioxide.

The solid layer is made of material which remains solid at a temperature equal to or lower than a temperature at which the conductors are formed, and which can be processed to have slits, and which cart easily change into gas when oxidized.

The slits are formed by a series of steps of: forming a mask layer on the solid layer; performing photo engraving process on the mask layer; performing anisotropic etching on the solid layer, while using the mask layer as a mask; and removing the mask layer.

The mask layer is formed by sputtering if it is made of oxide.

The slits are formed by a series of steps of: forming a resist on the solid layer, patterning the resist, performing anisotropic etching on the solid layer, while using the resist as a mask; and removing the resist. The resist is removed by applying a solution of $H_2SO_4$ and $H_2O_2$.

The second insulating layer is formed by sputtering if it is made of oxide.

The solid layer is oxidized by heat treatment in an oxygen atmosphere or by treatment in $O_2$-plasma.

The gas layer can be layers of air.

According to a third embodiment of the present invention, there is provided a semiconductor device which comprises: a semiconductor substrate having a surface region; a semiconductor element provided in the surface region of the semiconductor substrate; a first insulating layer provided on the semiconductor substrate, covering the semiconductor element and having contact holes; wires of a first set provided on the first insulating layer; conductors of a first set provided in the contact holes of the first insulating layer and connecting the semiconductor element to the wires of the first set; and a second insulating layer having via holes and formed on the wires of the first set, providing complete cavities among the wires of the first set.

This semiconductor device further comprises: wires of a second set provided on the second insulating layer; conductors of a second set provided in via holes of the second insulating layer and connecting the wires of the first set to the wires of the second set; and a third insulating layer provided on the second insulating layer, providing complete cavities among the wires of the second set.

The cavities provided among the wires of the first set and the cavities provided among the wires of the second set are filled with air or a mixture gas consisting of at least oxygen and carbon dioxide.

The first and second insulating layers have a flat surface each.

According to a fourth aspect of the invention there is provided a method of manufacturing a semiconductor device, which comprises the steps of: forming a semiconductor element in a surface region of a semiconductor substrate; forming a first insulating layer on the semiconductor substrate, covering the semiconductor element; forming contact holes in the first insulating layer, said contact holes reaching the semiconductor element; forming conductors of a first type in the contact holes of the first insulating layer; forming a first solid layer on the first insulating layer and the conductors of the first set; forming slits of a first set in the first solid layer; forming conductors in the slits of the first set, thereby forming wires of a first set; forming a second insulating layer on the first solid layer and the wires of the first set; and oxidizing the first solid layer, thereby changing the same into gas layers.

This method further comprises the steps of: forming a third insulating layer on the second insulating layer; forming via holes in the first and second insulating layers, said via holes reaching the wires of the first set; forming conductors of a second set in the via holes of the second and third solid layers on the third insulating layers; forming a second solid layer on the third insulating layer and the conductors of the second set; forming slits of a second set in the second solid layer; forming conductors in the slits of the second set, thereby forming wires of a second set; forming a fourth insulating layer on the second solid layer and an the wires of the second set; and oxidizing the second solid layer, thereby changing the same into gas layers.

The first and second solid layers are carbon layers. The carbon layers are ashed, thereby providing complete cavities among the wires of the first set and cavities among the wires of the second set. The cavities are filled with a mixture gas consisting of at least oxygen and carbon dioxide.

The first and second solid layers are made of material which remain solid at a temperature equal to or lower than a temperature at which the conductors are formed in the slits of the first and second sets, and which can be processed to have slits, and which can easily change into gas when oxidized.

The slits of the first set are formed by forming a mask layer on the first solid layer, subjecting the mask layer to photo engraving process, and subjecting the first solid layer to anisotropic etching, while using the mask layer as a mask.

Alternatively, the slits of the first set are formed by a method comprising the steps of: forming a mask layer on the first solid layer; subjecting the mask layer to photo engraving process; subjecting the first solid layer to anisotropic etching, while using the mask layer as a mask; and removing the mask layer.

The slits of the second set are formed by forming a mask layer on the second solid layer, subjecting the mask layer to photo engraving process, and subjecting the second solid layer to anisotropic etching, while using the mask layer as a mask.

Alternatively, the slits of the second set are formed by a method comprising the steps of: forming a mask layer on the second solid layer; subjecting the mask layer to photo engraving process; subjecting the second solid layer to anisotropic etching, while using the mask layer as a mask; and removing the mask layer.

The mask layer is formed by sputtering if it made of oxide, and the second insulating layer is formed by sputtering if it is made of oxide.

The fourth insulating layer is formed by sputtering if it is made of oxide.

The first and second solid layers are oxidized by heat treatment in an oxygen atmosphere or by treatment in $O_2$-plasma.

The first and second gas layers can be layers o:E air.

According to a fifth aspect of the invention there is provided a semiconductor device which comprises: a semiconductor substrate; a first insulating layer provided on the semiconductor layer; wires of the first set provided on the first insulating layer; a second insulating layer having contact holes and provided on the wires of the first set, providing complete cavities among the wires of the first set; a plurality of columnar conductors provided on the second insulating layer and in the contact holes of the second insulating layer and connected to the wires of the first set; a third insulating layer having contact holes and provided on the columnar conductors, providing complete cavities among the columnar conductors; wires of a second set provided on the third insulating layer, extending through the contact holes of the third insulating layer and connected to the columnar conductors; and a fourth insulating layer provided on the wires of the second set, providing complete cavities among the wires of the second set.

The cavities provided among the wires of the first set, the cavities among the columnar conductors and the cavities provided among the wires of the second set are filled with air or a mixture gas consisting of at least oxygen and carbon dioxide.

The second, third and fourth insulating layers have a flat surface each.

According to a sixth aspect of this invention, there is provided a method of manufacturing a semiconductor device, which comprises the steps of: forming a first set insulating layer on a semiconductor substrate; forming a first solid layer on the first insulating layer; forming slits of a first set in the first solid layer; forming conductors of a first set in the slits of the first set, thereby forming wires of a first set; forming a second insulating layer on the first solid layer and the wires of the first set; oxidizing the first solid layer, changing the same into gas layers of a first set; forming a second solid layer on the second insulating layer; forming contact holes of a first in the second solid layer and the second insulating layer, said contact holes of the first set reaching the wires of the first set; forming columnar conductors in the contact holes of the first set; forming a third insulating layer on the second solid layer and the columnar conductors; forming a third solid layer on the third insulating layer; forming slits of a second set in the third insulating layer; forming contact holes of a second set in the third insulating layer, said contact holes of the second set reaching the columnar conductors; forming conductors in the slits of the second set, thereby forming wires of a second set; forming a fourth insulating layer on the third solid layer and the wires of the second set; and oxidizing the secondhand third solid layers, changing the same into gas layers of a second set and gas layers of a third set.

The first, second and third solid layers are carbon layers. The carbon layers are ashed, thereby providing complete cavities among the wires of the first set, cavities among the wires of the second set and cavities among the columnar conductors. All the cavities are filled with a mixture gas consisting of at least oxygen and carbon dioxide.

The first, second and third solid layers are made of material which remain solid at a temperature equal to or lower than a temperature at which the conductors are formed in the slits of the first and second sets and in the contact holes of the first and second sets, and which can be processed to have the slits of the first set, the slits of the second set or the contact holes of the first set, and which can easily change into gas when oxidized.

The slits of the first set are formed by forming a mask layer on the first solid layer, subjecting the mask layer to photo engraving process, and subjecting the first solid layer to anisotropic etching, while using the mask layer as a mask.

Alternatively, the slits of the first set are formed in steps of: forming a mask layer on the first solid layer; subjecting the mask layer to photo engraving process; subjecting the first solid layer to anisotropic etching, while using the mask layer as a mask; and removing the mask layer.

The contact holes of the first set are formed by forming a mask layer on the second solid layer, subjecting the mask layer to photo engraving process, and subjecting the second solid layer to anisotropic etching, while using the mask layer as a mask.

Alternatively, the contact holes of the first set are formed by a method comprising the steps of: forming a mask layer on the second solid layer; subjecting the mask layer to photo engraving process; subjecting the second solid layer to anisotropic etching, while using the mask layer as a mask; and removing the mask layer.

The slits of the second set are formed by a method comprising the steps of: forming a mask layer on the third solid layer; subjecting the mask layer to photo engraving process; and subjecting the third solid layer to anisotropic etching, while using the mask layer as a mask.

Alternatively, the slits of the second set are formed by a method comprising the steps of: forming a mask layer on the third solid layer; subjecting the mask layer to photo engraving process; subjecting the third solid layer to anisotropic etching, while using the mask layer as a mask; and removing the mask layer.

The mask layer is formed by sputtering if it is made of oxide, and the second, third and fourth insulating layers are formed by sputtering if they are made of oxide.

The first, second and third solid layers are oxidized by heat treatment in an oxygen atmosphere or by treatment in $O_2$-plasma.

The first, second and third gas layers can be layers of air.

According to a seventh aspect of the invention, there is provided a semiconductor device comprising: a semiconductor substrate; a first insulating layer provided on the semiconductor layer; wires of a first set provided on the first insulating layer; a second insulating layer having contact holes and provided on the wires of the first set, providing complete cavities among the wires of the first set; wires of a second set connected to the wires of the first set, each consisting of an upper part shaped like a strip and a columnar lower part having a lower end formed in one contact of the second insulating layer; a third insulating layer provided at a junction between the upper parts, on one hand, and lower parts, on the other, of the wires of the second set, providing; and a fourth insulating layer provided on the wires of the second set, providing complete cavities among the upper parts of the wires of the second set.

The cavities provided among the wires of the first set and the cavities among the wires of the second set are filled with air or a mixture gas consisting of at least oxygen and carbon dioxide.

The second, third and fourth insulating layers have a flat surface each.

According to an eighth aspect of the present invention, there is provided a method of manufacturing a semiconductor device, which comprises the steps of: forming a first insulating layer on a semiconductor substrate; forming a first solid layer on the first insulating layer; forming slits of a first set in the first insulating layer; forming conductors of a first set in the slits of the first set, thereby forming wires of a first set; forming a second insulating layer on the first solid layer and the wires of the first set; oxidizing the first layer, changing the same into a first gas layer; forming a second solid layer on the second insulating layer; forming a third insulating layer on the second solid layer; forming a third solid layer on the third insulating layer; forming slits of a second set in the third solid layer; forming contact holes in the third insulating layer, the second solid layer and the second insulating layer, said contact holes reaching the wires of the first set; forming conductors of a second set in the slits of the second set and the contact holes of the second set, thereby forming wires of a second set; forming a fourth insulating layer on the third solid layer and the wires of the second set; oxidizing the second and third solid layers, changing the same into a second gas layer and a second gas layer.

The first, second and third solid layers are carbon layers. The carbon layers are ashed, thereby providing complete cavities among the wires of the first set, cavities among the wires of the second set and cavities among the columnar conductors. All the cavities are filled with a mixture gas consisting of at least oxygen and carbon dioxide.

The first, second and third solid layers are made of material which remain solid at a temperature equal to or lower than a temperature at which the conductors are formed in the slits of the first and second sets and in the contact holes of the first and second sets, and which can be processed to have slits and contact holes, and which can easily change into gas when oxidized.

The slits of the first set are formed by a method comprising the steps of: forming a mask layer on the first solid layer; subjecting the mask layer to photo engraving process; and subjecting the first solid layer to anisotropic etching, while using the mask layer as a mask.

Alternatively, the slits of the first set are formed by a method comprising the steps of: forming a mask layer on the first solid layer; subjecting the mask layer to photo engraving process; subjecting the first solid layer to anisotropic etching, while using the mask layer as a mask; and removing the mask layer.

The mask layers is formed by sputtering if it is made of oxide.

The slits of the second set are formed by a method comprising the steps of: forming a resist on the third solid layer; patterning the resist; subjecting the third solid layer to anisotropic etching, while using the resist as a mask; and removing the resist.

The contact holes are formed by a method comprising the steps of: forming a resist on the second solid layer and the third insulating layer; patterning the resist; subjecting the third insulating layer and the second solid layer to anisotropic etching, while using the resist as a mask; removing the resist layer; and etching the second insulating layer.

The second, third and fourth insulating layers are formed by sputtering if they are made of oxide.

The first, second and third solid layers are oxidized by heat treatment in an oxygen atmosphere or by treatment in $O_2$-plasma.

The first, second and third gas layers may be layers of air.

This semiconductor device further comprises a guard ring provided on the first insulating layer, being similar in structure to the wires, and surrounding the wires.

Alternatively, the device further comprises a guard ring comprised of a first portion provided on the first insulating layer, being similar in structure to the wires of the first set and surrounding the wires of the first set, and a second portion provided on the second insulating layer, being similar in structure to the wires of the second set and surrounding the wires of the second set.

Still alternatively, the device further comprises a guard ring comprising a first portion provided on the first insulating layer, being similar in structure to the wires of the first set and surrounding the wires of the first set, a second portion provided on the third insulating layer, being similar in structure to the wires of the second set and surrounding the wires of the second set, and a third portion provided between the wires of the first set on the one hand and the wires of the second set on the other hand, being similar in structure to the conductors and surrounding the conductors.

Alternatively, the device further comprise a guard ring comprising a first portion provided on the fist insulating layer, being similar in structure to the wires of the first set and surrounding the wires of the first set, and a second portion provided on the second insulating layer, being similar in structure to the wires of the second set and surrounding the wires of the second set.

A semiconductor device according to the invention is formed in a chip region of a wafer or in a chip cut from a wafer, and has a guard ring which is provided in the edges of the chip region or the chip.

In the semiconductor device according to the invention, each of the wires described above has its bottom and sides covered with wire-protecting layers which are electrically conductive, which are resistant to chemicals and which are hard to oxidize.

Each of the wires of the first and second sets has its bottom and sides covered with wire-protecting layers which are electrically conductive, which are resistant to chemicals and which are hard to oxidize.

Alternatively, each of the wires of the first and second sets has its sides covered with wire-protecting layers which are electrically conductive, which are resistant to chemicals and which are hard to oxidize.

The device according to this invention can further comprise dummy wires being similar in structure to the wires, provided among the wires and supporting the second insulating layer.

Alternatively, the device according to the present invention further comprises dummy wires of a first set which are similar in structure to the wires of the first set, which are provided among the wires of the first set and which support the second insulating layer, and dummy wires of a second set which are similar in structure to the wires of the second set, which are provided among the wires of the second set and which support the third insulating layer.

According to a ninth aspect of the invention, there is provided a semiconductor device which comprises: a semiconductor substrate; a first insulating layer provided on the semiconductor substrate; a plurality of wires provided on the first insulating layer; a second insulating layer provided above the wires, providing complete cavities among the wires; and coupling layers each interposed between one wire and the second insulating layer and firmly coupling the wire with the second insulating layer.

The second insulating layer is made of silicon oxide, and the coupling layer is made of material obtained by reacting silicon with the material of the wires.

Alternatively, the second insulating layer is a metal oxide layer, and the coupling layers are made of material obtained by reacting the metal of the metal oxide layer with the material of the wires.

The cavities provided among the wires are filled with air or a mixture gas consisting of at least oxygen and carbon dioxide.

The second insulating layer has a flat surface.

According to a tenth aspect of this invention, there is provided a method of manufacturing a semiconductor device, comprising the steps of: forming an insulating layer on a semiconductor substrate; forming a solid layer on the insulating layer; forming a plurality of slits in the solid layer; forming conductors in the slits, thereby forming a plurality of wires; forming a silicon layer on the solid layer and the wires; oxidizing the solid layer, changing the same to gas layers, and the silicon layer into a silicon oxide layer, thereby forming coupling layers which firmly couple the wires with the silicon layer.

According to an eleventh aspect of the present invention, there is provided a method of manufacturing a semiconductor device, which comprises the steps of: forming an insulating layer on a semiconductor substrate; forming a solid layer on the insulating layer; forming a plurality of slits in the solid layer; forming conductors in the slits, thereby forming a plurality of wires; forming a metal layer on the solid layer and the wires; oxidizing the solid layer, changing the same to gas layers, and the metal layer to a metal oxide layer, thereby forming coupling layers which firmly couple the wires with the metal layer.

The solid layer is a carbon layer. The carbon layer is ashed, thereby providing complete cavities among the wires, which are filled with a mixture gas consisting of at least oxygen and carbon dioxide.

The solid layer is made of material which remains solid at a temperature equal to or lower than a temperature at which the conductors are formed, and which can be processed to have slits, and which can easily change into gas when oxidized.

The slits are formed by a series of steps of: forming a mask layer on the solid layer; performing photo engraving process on the mask layer; performing anisotropic etching on the solid layer, while using the mask layer as a mask; and removing the mask layer.

The mask layer is formed by sputtering if it is made of oxide.

The slits are formed by a series of steps of: forming a resist on the solid layer, patterning the resist, performing anisotropic etching on the solid layer, while using the resist as a mask; and removing the resist. The resist is removed by applying a solution of $H_2SO_4$ and $H_2O_2$.

The solid layer is oxidized by heat treatment in an oxygen atmosphere or by treatment in $O_2$-plasma.

The gas layer can be layers of air.

According to a twelfth aspect of the present invention, there is provided a semiconductor device which comprises: a semiconductor substrate; a first insulating layer provided on the semiconductor substrate; a plurality of wires provided on the first insulating layer; metal oxide layers provided the sides of the wires and defining cavities among the wires; metal layers interposed between the first insulating layer and the wires; and a second insulating layer provided on the wires and the metal oxide layers.

The metal oxide layer is made of an oxide of the metal layers. The metal layers are made of one material selected from the group consisting of zirconium, hafnium, beryllium, magnesium, scandium, titanium, manganese, cobalt, nickel, yttrium, indium, barium, lanthanum, cerium, ruthenium, lead, bismuth, thorium and chromium.

The first insulating layer has contact holes, which are filled with conductors. The conductors contact the metal layers.

The cavities provided among the wires are filled with air or a mixture gas consisting of at least oxygen and carbon dioxide.

The second insulating layer has a flat surface.

According to a thirteenth aspect of the present invention, there is provided a method of manufacturing a semiconductor device, which comprises the steps of: forming a first insulating layer on a semiconductor substrate; forming a solid layer on the first insulating layer; forming a plurality of slits in the solid layer; forming a metal layer on the solid layer and the inner surfaces of the slits; forming conductors in the slits, thereby forming a plurality of wires; oxidizing or nitriding the solid layer, thereby changing the same into gas layers; oxidizing those parts of the metal layer which are provided above the cavities and sides of the wires, thereby forming second insulating layers; and forming a third insulating layer on the wires and the second insulating layers.

According to a fourteenth aspect of the present invention, there is provided a method of manufacturing a semiconductor device, which comprises the steps of: forming a first insulating layer on a semiconductor substrate; forming a solid layer on the first insulating layer; forming a plurality of slits in the solid layer; forming a metal layer on the solid layer and the inner surfaces of the slits; forming conductors in the slits, thereby forming a plurality of wires; oxidizing the solid layer, thereby changing the same into gas layers, and simultaneously oxidizing those parts of the metal layer which are provided above the cavities and sides of the wires, thereby forming metal oxide layers; and forming a second insulating layer on the wires and the metal oxide layers.

In the method, the solid layer is a carbon layer. The carbon layer is ashed, thereby providing complete cavities among the wires, which are filled with a mixture gas consisting of at least oxygen and carbon dioxide.

Alternatively, the solid layer is made of material which remain solid at a temperature equal to or lower than a temperature at which the conductors are formed, and which can be processed to have slits, and which can easily change into gas when oxidized.

The slits are formed by forming a mask layer on the solid layer, performing photo engraving process on the mask layer, performing anisotropic etching on the solid layer, while using the mask layer as a mask, and removing the mask layer.

The mask layer is formed by sputtering when it is made of oxide.

The slits can be formed by forming a resist on the solid layer, patterning the resist, performing anisotropic etching on the solid layer, while using the resist as a mask, and removing the resist. The resist is removed by applying a solution of $H_2SO_4$ and $H_2O_2$.

The solid layer is oxidized by heat treatment in an oxygen atmosphere or by treatment in $O_2$-plasma. The metal layer is oxidized or nitrided in an oxygen atmosphere or nitrogen atmosphere.

The gas layer can be layers of air.

According to the fifteenth aspect of the present invention, there is provided a semiconductor device which comprises: a semiconductor substrate; a first insulating layer provided on the semiconductor substrate; a plurality of wires provided on the first insulating layer; wire-protecting metal layers covering sides and bottom of one wire and prohibiting passage of oxygen; wire-protecting layers of, each covering top of one wire and prohibiting passage of oxygen; and a second insulating layer provided on the wire-protecting layers, defining complete cavities among the wires.

The wire-protecting metal layers are two-layered members comprised of a titanium layer and a titanium nitride layer or titanium silicon nitride layers. The wire-protecting layers are two-layered members comprised of a titanium layer and a titanium nitride layer, or titanium silicon nitride layers or silicon nitride layers.

The first insulating layer has contact holes, which are filled with conductors. The conductors contact the metal layers.

The cavities provided among the wires are filled with air or a mixture gas consisting of at least oxygen and carbon dioxide.

The second insulating layer has a flat surface.

According to a sixteenth aspect of the invention, there is provided a method of manufacturing a semiconductor device, which comprises the steps of: forming a first insulating layer on a semiconductor substrate; forming a solid layer on the first insulating layer; forming a plurality of slits in the solid layer; forming a first wire-protecting metal layer on the inner surfaces of the slits and on the solid layer, the first wire-protecting metal layer prohibiting passage of oxygen; forming conductors on the wire-protecting metal layer; polishing or etching the wire-protecting metal layer and the conductors, leaving wire-protecting metal layers and conductors in the slits, thereby forming wires; forming wire-protecting layers on the wires, respectively, the wire-protecting layers prohibiting passage of oxygen; forming a second insulating layer on the solid layer and the wire-protecting layers; and oxidizing the solid layer, changing the same into gas layers.

The wire-protecting metal layer and the conductors are polished or etched until the surfaces of the wire-protecting metal layer and the conductors are located lower than the surface of the solid layer.

The solid layer is a carbon layer. The carbon layer is ashed, thereby providing complete cavities among the wires, which are filled with a mixture gas consisting of at least oxygen and carbon dioxide.

The solid layer is made of material which remain solid at a temperature equal to or lower than a temperature at which the conductors are formed, and which can be processed to have slits, and which can easily change into gas when oxidized.

The slits are formed by forming a mask layer on the solid layer, performing photo engraving process on the mask layer, performing anisotropic etching on the solid layer, while using the mask layer as a mask, and removing the mask layer.

The mask layer is formed by sputtering when it is made of oxide.

The slits can be formed by forming a resist on the solid layer, patterning the resist, performing anisotropic etching on the solid layer, while using the resist as a mask, and removing the resist. The resist is removed by applying a solution of $H_2SO_4$ and $H_2O_2$.

The second insulating layer is formed by sputtering when it is made of oxide.

The solid layer is oxidized by heat treatment in an oxygen atmosphere or by treatment in $O_2$-plasma.

The gas layer can be layers of air.

According to a seventeenth aspect of the present invention, there is provided a semiconductor device which comprises: a semiconductor substrate; a first insulating layer provided on the semiconductor layer; a plurality of wires provided on the first insulating layer; a second insulating layer covering sides and top of the wires and spaced apart from the wires, proving cavities; and a third insulating layer provided on the second insulating layer and having portions located among the wires.

According to an eighteenth aspect of the present invention, there is provided a semiconductor device comprising: a semiconductor substrate; a first insulating layer provided on the semiconductor layer; a plurality of wires provided on the first insulating layer; a second insulating layer covering sides of the wires and spaced apart from the wires, proving cavities; and a third insulating layer provided on the second insulating layer, having portions located among the wires.

The cavities provided among the wires are filled with air or a mixture gas consisting of at least oxygen and oxygen dioxide.

The second insulating layer has a flat surface.

According to a nineteenth aspect of the invention, there is provided a method of manufacturing a semiconductor device, which comprises the steps of: forming a first insulating layer on a semiconductor substrate; forming a conductive layer on the first insulating layer; forming a first solid layer on the conductive layer; etching the first solid layer and the conductive layer, thereby forming a plurality of wires; forming second solid layers on sides of the wires; forming a second insulating layer on the first and second solid layers; oxidizing the first and second solid layers, changing the same into gas layers, whereby the wires are placed in the gas layers.

The first and second solid layers are carbon layers, the carbon layers are ashed, thereby providing complete cavities among the wires of the first set and among the wires of the second set, which are filled with a mixture gas consisting of at least oxygen and carbon dioxide.

Alternatively, the first and second solid layers are made of material which can be processed to have slits and which can easily change into gas when oxidized.

The wires are formed by forming a mask layer on the first solid layer, performing photo engraving process on the mask layer, and performing anisotropic etching on the first solid layer and the conductive layer, while using the mask layer as a mask.

The mask layer is formed by sputtering when it is made of oxide.

The mask layer is removed after the anisotropic etching is performed on the first solid layer and the conductive layer.

Alternatively, the wires are formed by forming a resist on the solid layer, patterning the resist, performing anisotropic etching on the solid layer, while using the resist as a mask, and removing the resist. The resist is removed by applying a solution of $H_2SO_4$ and $H_2O_2$.

The second insulating layer is formed by sputtering when it is made of oxide.

The first and second solid layers are oxidized by heat treatment in an oxygen atmosphere or by treatment in $O_2$-plasma.

The gas layer can be layers of air.

According to a twentieth aspect of this invention, there is provided a method of manufacturing a semiconductor device, which comprises the steps of: forming a first insulating layer on a semiconductor substrate; forming a conductive layer on the first insulating layer; etching the conductive layer, thereby forming a plurality of wires; forming solid layers on sides of the wires; forming a second insulating layer on the solid layers; and oxidizing the solid layers, changing the same to gas layers, whereby the sides of each wire are located in a gas layer.

The solid layers are carbon layers, and the carbon layers are ashed, thereby providing complete cavities among the wires, which are filled with a mixture gas consisting of at least oxygen and carbon dioxide.

The solid layers are oxidized by heat treatment and the solid layers are made of material which can be processed to have slits and which can easily change into gas when oxidized.

The second insulating layer is formed by sputtering in the case the second insulating layer is made of oxide.

The solid layers are oxidized by heat treatment in an oxygen atmosphere or by treatment in $O_2$-plasma.

The gas layer are layers of air.

According to a twenty-first aspect of the present invention, there is provided a method of etching a solid layer, which comprises the steps of: forming a solid layer which is changed into a gas layer when oxidized; forming a mask layer on the solid layer; performing photo engraving process on the mask layer; and performing anisotropic etching on the solid layer, while using the mask layer as a mask.

The mask layer is formed by sputtering in the case the mask layer is made of oxide.

According to a twenty-third aspect of the present invention, there is provided a method of etching a solid layer, comprising the steps of: forming a solid layer which changes into a gas layer when oxidized; forming a resist on the solid layer; patterning the resist; performing anisotropic etching on the solid layer, while using the resist as a mask; and removing the resist by applying a solution of $H_2SO_4$ and $H_2O_2$.

According to a twenty-fourth aspect of the present invention, there is provided a semiconductor device comprising: a semiconductor substrate; a first insulating layer provided on the semiconductor substrate; a plurality of wires provided on the first insulating layer; and a second insulating layer provided on the wires, providing cavities among the wires, which are filled with a mixture gas consisting of at least oxygen and carbon dioxide.

The carbon dioxide in the cavities has a concentration higher than in the atmosphere.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2 to 6 are sectional views for explaining a method of manufacturing the semiconductor device shown in FIG. 1;

FIG. 7 is a perspective, sectional view of a semiconductor device according to a second embodiment of the invention;

FIGS. 8 to 22 are perspective, sectional views for explaining a method of manufacturing the semiconductor device shown in FIG. 7;

FIG. 23 is a perspective, sectional view of a semiconductor device according to a third embodiment of the present invention;

FIGS. 24 to 33 are perspective, sectional views for explaining a method of manufacturing the semiconductor device shown in FIG. 23;

FIG. 34 is a perspective, sectional view of a semiconductor device according to a fourth embodiment of the invention;

FIGS. 35 to 39 are perspective, sectional views for explaining a method of manufacturing the semiconductor device shown in FIG. 34;

FIG. 40 is a perspective, sectional view of a semiconductor device according to a fifth embodiment of the invention;

FIGS. 41 to 45 are perspective, sectional views for explaining a method of manufacturing the semiconductor device shown in FIG. 40;

FIG. 46 is a perspective, sectional view of a semiconductor device according to a sixth embodiment of this invention;

FIGS. 47 to 52 are perspective, sectional views for explaining a method of manufacturing the semiconductor device shown in FIG. 46;

FIG. 53 is a perspective, sectional-view of a semiconductor device according to a seventh embodiment of the invention;

FIGS. 54 to 59, are perspective, sectional views for explaining a method of manufacturing the semiconductor device shown in FIG. 53;

FIGS. 61 to 66 are perspective, sectional views for explaining a method of manufacturing the semiconductor device shown in FIG. 60;

FIG. 67 is a perspective, sectional view of a semiconductor device according to a ninth embodiment of the invention;

FIGS. 68 to 73 are perspective, sectional views for explaining a method of manufacturing the semiconductor device shown in FIG. 67;

FIG. 74 is a plan view of a wafer of the type used to manufacture semiconductor devices which are tenth to seventeenth embodiments of the invention;

FIG. 75 is an enlarged plan view showing a part of the wafer illustrated in FIG. 74;

FIG. 76 is a perspective, sectional view of a semiconductor device according to the tenth embodiment of the invention;

FIG. 77 is another perspective, sectional view of a semiconductor device according to the tenth embodiment of the invention;

FIG. 78 is a perspective, sectional view of a semiconductor device according to the eleventh embodiment of the invention;

FIG. 81 is a perspective, sectional view of a semiconductor device according to the thirteenth embodiment of the invention;

FIG. 82 is another perspective, sectional view of a semiconductor device according to the fourteenth embodiment of the invention;

FIG. 83 is a perspective, sectional view of a semiconductor device according to the fifteenth embodiment of the invention;

FIG. 84 is another perspective, sectional view of a semiconductor device according to the sixteenth embodiment of the present invention;

FIG. 85 is another perspective, sectional view of a semiconductor device according to the seventeenth embodiment of the invention;

FIG. 86 is a perspective, sectional view of a semiconductor device according to an eighteenth embodiment of the invention;

FIGS. 87 to 101 are perspective, sectional views for explaining a method of manufacturing the semiconductor device shown in FIG. 86;

FIGS. 103 to 112 are perspective, sectional views for explaining a method of manufacturing the semiconductor device shown in FIG. 102;

FIG. 113 is a perspective, sectional view of a semiconductor device according to a twentieth embodiment of the present invention;

FIGS. 114 to 119 are perspective, sectional views for explaining a method of manufacturing the semiconductor device shown in FIG. 113;

FIG. 120 is a perspective, sectional view of a semiconductor device according to a twenty-first embodiment of the invention;

FIGS. 121 to 126 are perspective, sectional views for explaining a method of manufacturing the semiconductor device shown in FIG. 120;

FIG. 127 is a perspective, sectional view of a semiconductor device according to a twenty-second embodiment of the invention;

FIGS. 128 to 142 are perspective, sectional views for explaining a method of manufacturing the semiconductor device shown in FIG. 127;

FIG. 143 is a perspective, sectional view of a semiconductor device according to a twenty-third embodiment of the invention;

FIGS. 144 to 153 are perspective, sectional views for explaining a method of manufacturing the semiconductor device shown in FIG. 143;

FIGS. 155 to 160 are perspective, sectional views for explaining a method of manufacturing the semiconductor device shown in FIG. 154;

FIG. 161 is a perspective, sectional view of a semiconductor device according to a twenty-fifth embodiment of the present invention;

FIGS. 162 to 167 are perspective, sectional views for explaining a method of manufacturing the semiconductor device shown in FIG. 161;

FIGS. 185 to 196 are perspective, sectional views for explaining a method of manufacturing the semiconductor device shown in FIG. 184;

FIG. 197 is a sectional view explaining a step of ashing the carbon layer;

FIG. 198 is a sectional view explaining another step of ashing the carbon layer;

FIG. 199 is a perspective, sectional view of a semiconductor device according to a thirty-first embodiment of the invention;

FIGS. 200 to 211 are perspective, sectional views for explaining a method of manufacturing the semiconductor device shown in FIG. 199;

FIG. 212 is a perspective, sectional view of a semiconductor device according to a thirty-second embodiment of this invention;

FIGS. 213 to 218 are perspective, sectional views for explaining a method of manufacturing the semiconductor device shown in FIG. 121;

FIG. 219 is a perspective, sectional view of a semiconductor device according to a thirty-third embodiment of the present invention;

FIGS. 220 to 225 are perspective, sectional views for explaining a method of manufacturing the semiconductor device shown in FIG. 219;

FIG. 226 is a perspective, sectional view of a semiconductor device according to a thirty-fourth embodiment of the invention;

FIGS. 227 to 232 are perspective, sectional views for explaining a method of manufacturing the semiconductor device shown in FIG. 219; and FIG. 233 is a perspective, sectional view of a conventional semiconductor device.

DETAILED DESCRIPTION OF THE PREFERRED EMBODIMENTS

Various embodiment of the present invention will be described in detail, with reference to the accompanying drawings.

Figure 1:
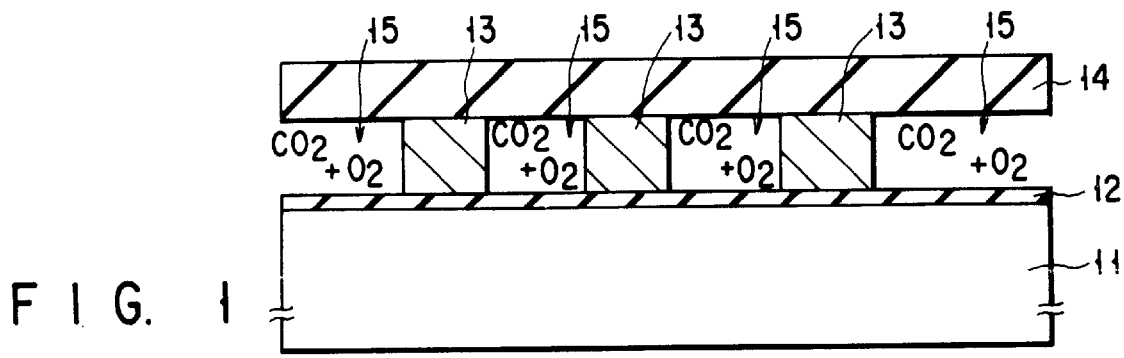
FIG. 1 is a sectional view of a semiconductor device according to a first embodiment of the present invention.

FIG. 1 shows a semiconductor device according to the first embodiment of the invention.

As shown in FIG. 1, the device comprises a semiconductor substrate 11 (e.g., a silicon wafer), an insulating layer 12 (e.g., a silicon oxide layer) provided on the substrate 11, wires 13 provided on the layer 12, and an insulating layer 14 (e.g., a silicon oxide layer) mounted on the wires 13.

The wires 13 are made of metal such as copper or aluminum alloy, semiconductor containing an impurity, such as polysilicon, or high-melting metal such as tungsten. The spaces among the wires 13 are not filled with any part of the lower insulating layer 12 or an upper insulating layer 14, thus defining cavities 15. The cavities 15 are filled with gas having a dielectric constant of about 1.0, comprising mainly a mixture gas of oxygen ($O_2$) and carbon dioxide ($CO_2$).

The carbon dioxide gas ($CO_2$) in the cavities 15 has a concentration higher than at least the carbon dioxide gas contained in air (the atmosphere). The cavities 15 may be filled with air, not the mixture gas. This can be achieved by opening the cavities 15 to the atmosphere or by supplying air into the cavities through holes made in the device package.

As described above, the mixture gas or the air filling the cavities 15, i.e., the spaces among the wires 13, has a dielectric constant of about 0.1, which is far less than that of silicon oxide or the like. Hence, the semiconductor device can be an LSI which has a higher packing density of elements and a better performance than in the case where the inter-wire spaces (i.e., the spaces between wires located at the same level and the spaces between wires located at different levels) are filled with insulating layers made of silicon oxide or the like.

It will be explained how the device shown in FIG. 1 is manufactured, with reference to FIGS. 2 to 6.

Figure 2:
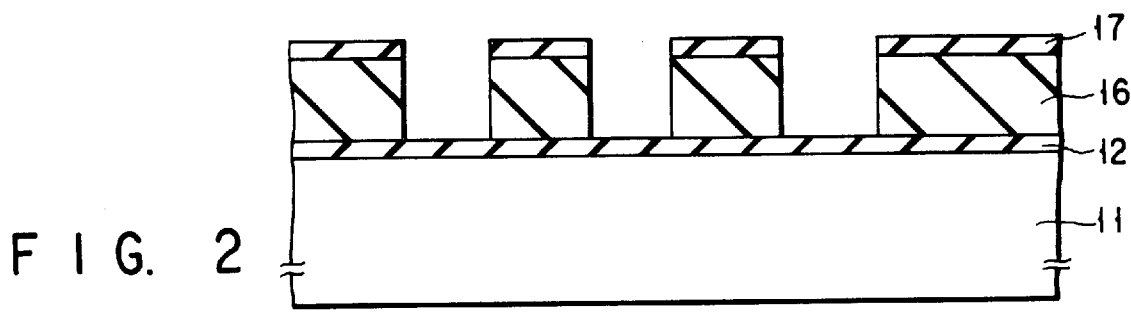

First, the insulating layer 12 is formed on the semiconductor substrate 11 as shown in FIG. 2. A carbon layer 16 is formed on the insulating layer 12 by means of sputtering or the like. The carbon layer 16 is as thick as wires to be formed in an LSI, for example about 0.2 to 0.7 $\mu$m.

Next, a mask layer 17 (e.g., a silicon oxide layer or a silicon nitride layer) is formed on the carbon layer 16. If made of oxide, the mask layer 17 should better be formed by means of sputtering. Were it formed by CVD, the oxygen in the reaction gas used might erode the carbon layer 16.

Then, a resist is coated on the mask layer 17 and patterned by PEP (Photo Engraving Process). Using the patterned resist as the mask, the mask layer 17 is patterned. The resist is removed from the mask layer 17 patterned. The carbon layer 16 is subjected to anisotropic etching, which is accomplished by using the patterned layer 17 as the mask. Parts of the carbon layer 16 are thereby etched away, whereby slits are made in the carbon layer 16. The carbon layer 16 may be etched by using the patterned resist, not the mask layer 17. The resist is removed by applying a solution of $H_2SO4$ and $H_2O_2$ to it. It is not etched with oxygen plasma, which would erode the carbon layer 16.

Figure 3:
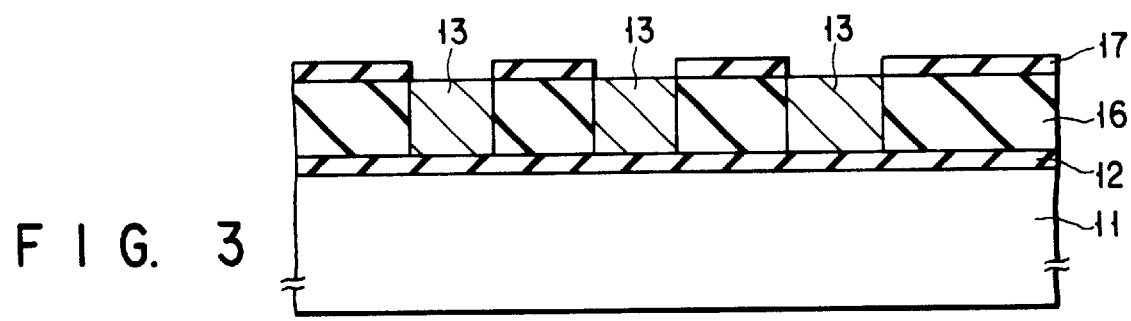

Thereafter, an electrically conductive layer, e.g., a copper layer, is formed on the substrate 11 by CVD or sputtering, filling the slits of the carbon layer 16 and covering the mask layer 17. CMP (Chemical Mechanical Polishing) is performed on the carbon on the conductive layer until the mask layer 17 is exposed in its entirety as shown in FIG. 3. Wires 13 are thereby formed in the slits of the carbon layer 16. Either anisotropic etching or isotropic etching may be carried out, instead of CMP, to form the wires 13.

Figure 4:
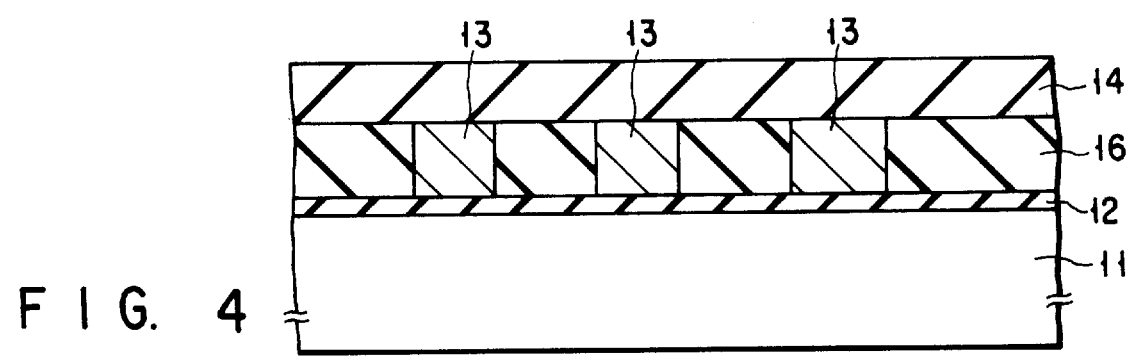

After the wires 13 are formed, the mask layer 17 is removed from the carbon layer 16. Then, as shown in FIG. 4, an insulating layer 14 (e.g., a silicon oxide layer) is formed on the wires 13 and the carbon layer 16 by means of sputtering. CVD should not be employed if the layer 14 is made of oxide such as silicon oxide. The carbon layer 16 would be eroded by the oxygen $O_2$ contained in the reaction gas applied in CVD to form the insulating layer 14.

Next, as depicted in FIGS. 5 and 6, the carbon layer 16 is ashed,. forming cavities 15 which are filled with a mixture gas of oxygen ($O_2$) and carbon dioxide ($CO_2$). The ashing of the layer 16 can be accomplished by either of two alternative methods.

The first method is to heat the carbon layer 16 in an oxygen atmosphere (i.e., atmosphere containing oxygen, such as the atmosphere) at 400 to 450° C. for about two hours. In the first method, the carbon layer 16 slowly changes into carbon dioxide ($CO_2$), not expanding to break the insulating layer 14. However, it takes a long time to ashes the carbon layer 16. The second method is oxygen-plasma process. In the second method, the carbon layer 16 changes into carbon dioxide ($CO_2$) at high speed, but may expand, possibly breaking the insulating layer 14. Nonetheless, breakage of the layer 14 can be prevented by modifying the insulating layer 14 or by decreasing the oxygen-plasma process temperature.

The cavities 15 may be filled with air. This can be easily accomplished by opening the cavities 15 to the atmosphere or by making holes in the device package.

As indicated above, the carbon layer 16 having slits is ashed after the wires 13 have been formed the slits, thereby forming cavities 15 among the wires 13 and filled with gas. Thus, the semiconductor device shown in FIG. 1 can be easily manufactured.

FIG. 7 shows a semiconductor device according to the second embodiment of the invention.

As seen from FIG. 7, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), or phosphor silicate glass (PSG), or the like. The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. Each wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is mounted an insulating layer 29, on which an insulating layer 30 is provided. Hence, the wires W1 support both insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W1; it is made of silicon oxide, silicon nitride or the like. The insulating layer 30 is an important component, defining the cavities 32 and serving as a base on which some layers will be mounted. The layer 30 is made of silicon oxide or the like.

On the insulating layer 30 an insulating layer 32 provided, which is made of, for example, silicon oxide. The insulating layer 32 has contact holes which reach the wires W1. The contact holes are filled with conductors 33a and 33b made of high-melting metal such as tungsten. The conductors 33a and 33b can be made of other electrically conductive material.

Wires W2 are arranged on the insulating layer 32 and connected to the conductors 33a and 33b. One wire W2 is composed of a trough-shaped barrier layer 34a and a conductor 35a fitted in the barrier layer 34a. The other wire W2 is composed of a trough-shaped barrier layer 34b and a conductor 35b fitted in the barrier layer 34b. The barrier layers 34a and 34b are two-layered members, each consisting of, for example, a titanium layer and a titanium nitride layer. The conductors 35a and 35b are made of metal such as copper or aluminum alloy. The conductors 35a and 35b can be made of material other than copper and aluminum alloy, for example, semiconductor such as polysilicon containing an impurity, or high-melting metal such as tungsten.

On the wires W2 there is mounted an insulating layer 36, on which an insulating layer 37 is provided. Thus, the wires W2 support both insulating layers 36 and 37. Cavities 38 are provided among the wires W2. They are filled with a mixture gas of mainly oxygen ($O_2$) and carbon dioxide ($CO_2$). The insulating layer 36 determines the pattern of wires W2; it is made of silicon oxide, silicon nitride or the like.

The insulating layer 37 is an important component, defining the cavities 38 and functioning as a base on which some layers will be mounted. The layer 37 is made of silicon oxide or the like.

The cavities 31 and 38 may be filled with air, not the mixture gas. This can be accomplished by opening the cavities 31 and 38 to the atmosphere or by supplying air into the cavities 31 and 38 through holes made in the device package.

As shown in FIG. 7, the cavities 31 provided among the wires W1 and the cavities 38 provided among the wires W2 are filled with the mixture gas of mainly oxygen ($O_2$) and carbon dioxide ($CO_2$). Alternatively, the cavities 31 and 38 may be filled with air. The mixture gas and air have a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

How the device shown in FIG. 7 is manufactured will be explained, with reference to FIGS. 8 to 22.

Figure 8:
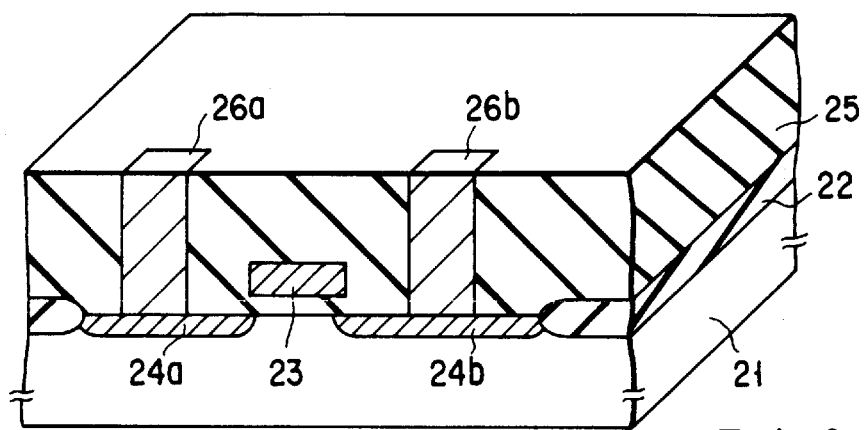

At first, the field oxide layer 22 is formed on the semiconductor substrate 21 by LOCOS method, as is shown in FIG. 8. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. The contact holes may be filled with other electrically conductive material other than high-melting metal.

Figure 9:
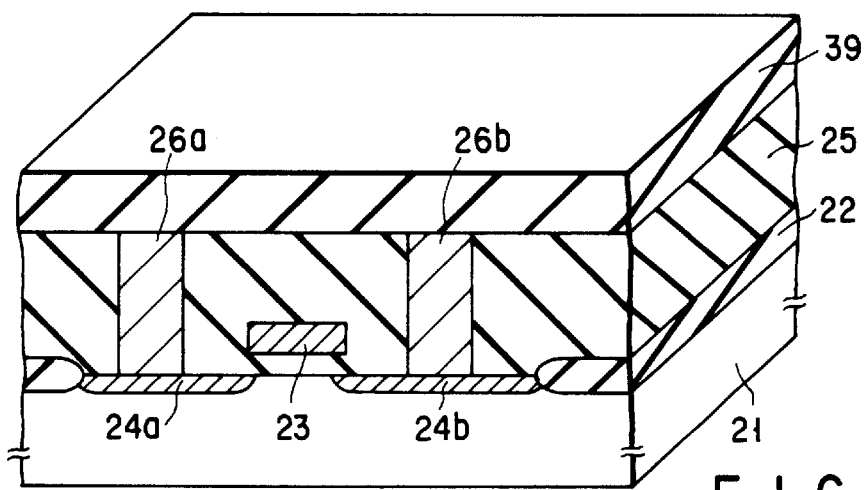

Next, as shown in FIG. 9, a carbon layer 39 is formed on the insulating layer 25. The carbon layer 39 is as thick as wires to be formed in an LSI, for example about 0.2 to 0.7 $\mu$m.

Figure 10:
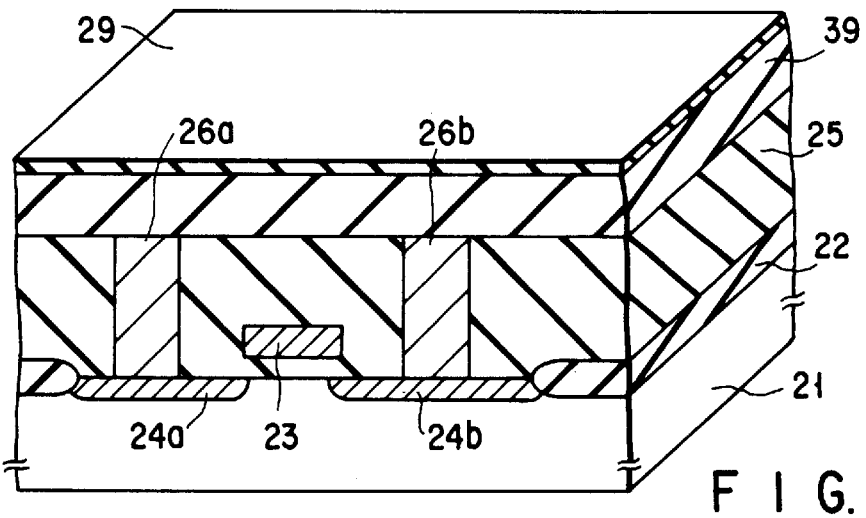

Then, as depicted in FIG. 10, a mask layer 29 (e.g., a silicon oxide layer or a silicon nitride layer) is formed on the carbon layer 39. If made of oxide, the mask layer 29 should better be formed by means of sputtering, not by CVD, in order to prevent erosion of the carbon layer 39.

Figure 11:
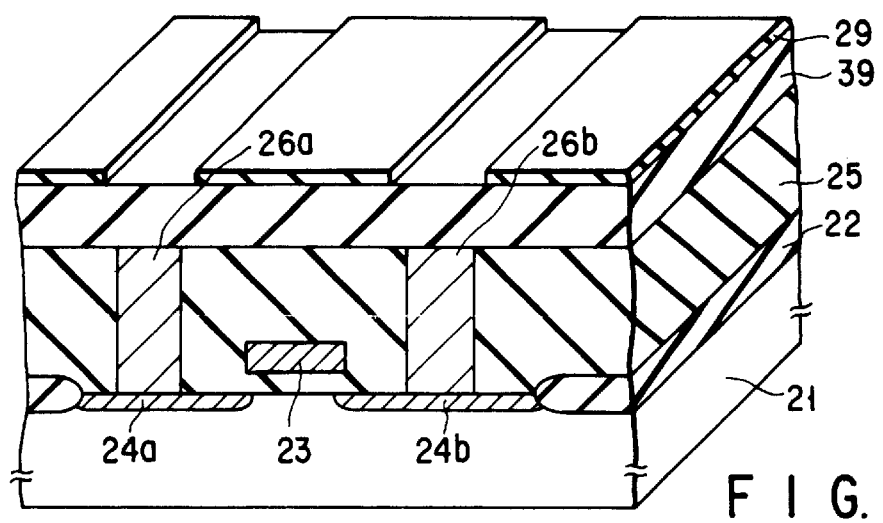

As shown in FIG. 11, a resist is coated on the mask layer 29 and patterned by PEP (Photo Engraving Process). Using the patterned resist as the mask, the mask layer 29 is patterned. That is, some strip-shaped parts of it are removed, which define the same pattern as wires to be formed later. The resist is removed from the mask layer 29 patterned.

Figure 12:
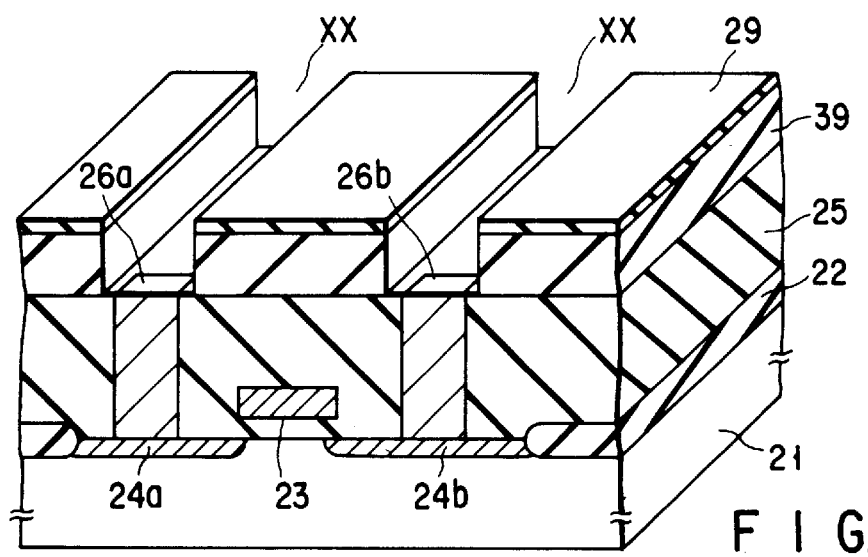

As shown in FIG. 12, the carbon layer 39 is subjected to anisotropic etching, which is accomplished by using the patterned layer 29 as the mask. Parts of the carbon layer 39 are thereby etched away, whereby slits are made in the carbon layer 39. It should be noted that the carbon layer 39 is not etched by PEP, but etched by using the PEP-patterned mask layer 29, for the following reason.

The resist used in the PEP is removed by applying oxygen plasma or a solution of $H_2SO4$ and $H_2O_2$ to it. When the resist is removed by oxygen plasma process, the carbon layer 39 patterned is simultaneously removed. When the resist is removed by applying $H_2SO4$ and $H_2O_2$, the conductors 26a and 26b are simultaneously removed if they are made of high-melting metal. This is why the PEP-patterned mask layer 29 must be used as the mask to etch the carbon layer 39.

Figure 13:
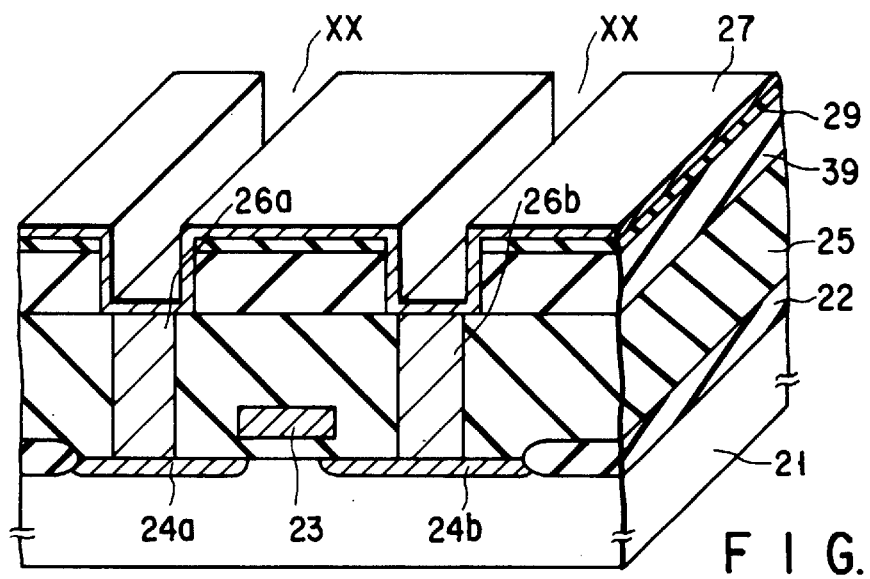

Thereafter, as illustrated in FIG. 13, a barrier layer 27 composed of, for example, a titanium layer and a titanium nitride layer is formed on the exposed parts of the insulating layer 25, on the inner surfaces of the slits made in the carbon layer 39 and on the pattern mask 29.

Figure 14:
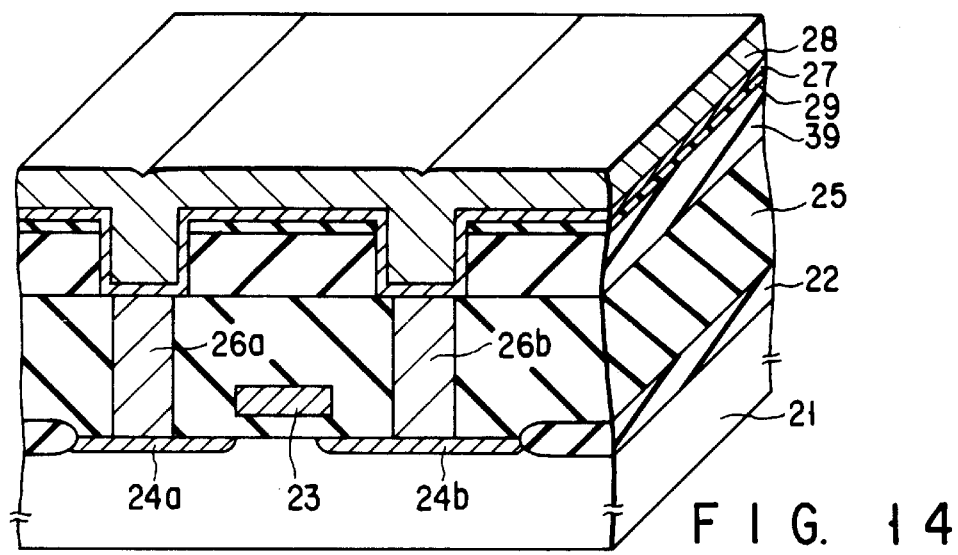

Next, as shown in FIG. 14, a metal layer 28 such as a copper layer, an aluminum alloy layer is formed on the barrier layer 27 by means of sputtering or CVD. The metal layer 28 may be replaced by, for example, a semiconductor layer such as a polysilicon layer or high-melting metal layer such as a tungsten layer.

Figure 15:
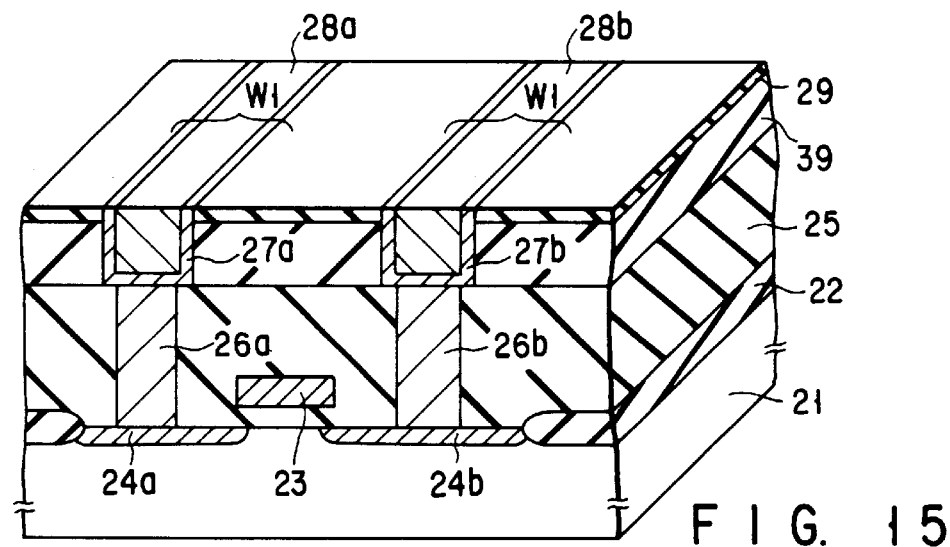

As shown in FIG. 15, those parts of the barrier layer 27 and those parts of the metal layer 28, which are deposited on the pattern mask 29, are removed by means of chemical mechanical polishing (CMP). The parts of the barrier layer 27 and metal layer 28 may be removed by anisotropic etching or isotropic etching. As a result, the trough-shaped barrier layers 27a and 27b are formed in the slits of the carbon layer 39, and the conductors 28a and 28b are formed in the trough-shaped barrier layers 27a and 27b. The wires W1 are thereby formed.

Figure 16:
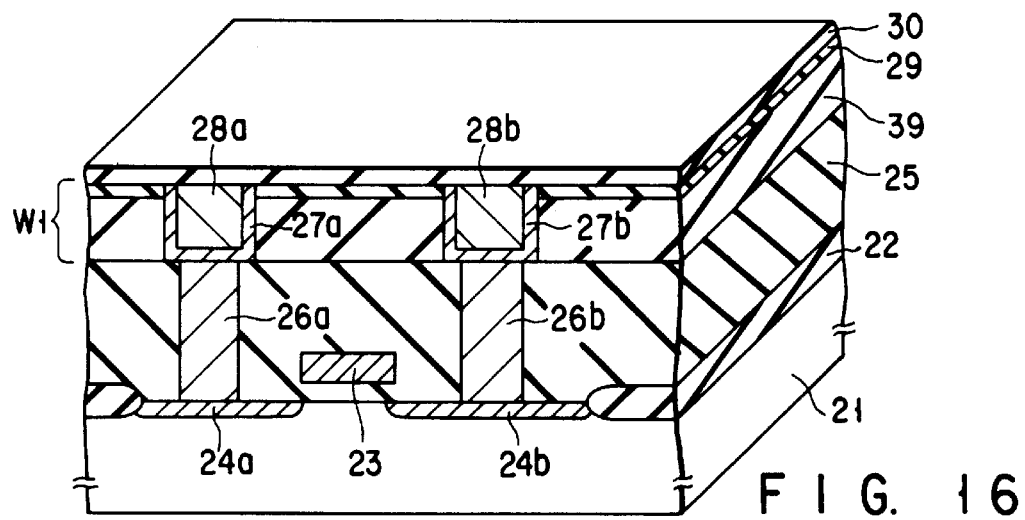

As illustrated in FIG. 16, the insulating layer 30 (e.g., a silicon oxide layer) is formed on the mask layer 29 and the wires W1 by means of sputtering.

If the insulating layer 30 is made of oxide, it should better be formed by means of sputtering, not by CVD. This is because the carbon layer 39 would be eroded by the oxygen $O_2$ contained in the reaction gas applied in CVD to form the insulating layer 30. It is desired that the insulating layer 30 be 0.01 to 0.1 $\mu$m thick if it is made of silicon oxide. So long as its thickness remains within this range, the layer 30 is not broken when the carbon layer 39 is subjected to ashing. The most preferable thickness for the insulating layer 30 depends on the material of the layer 30.

Figure 17:
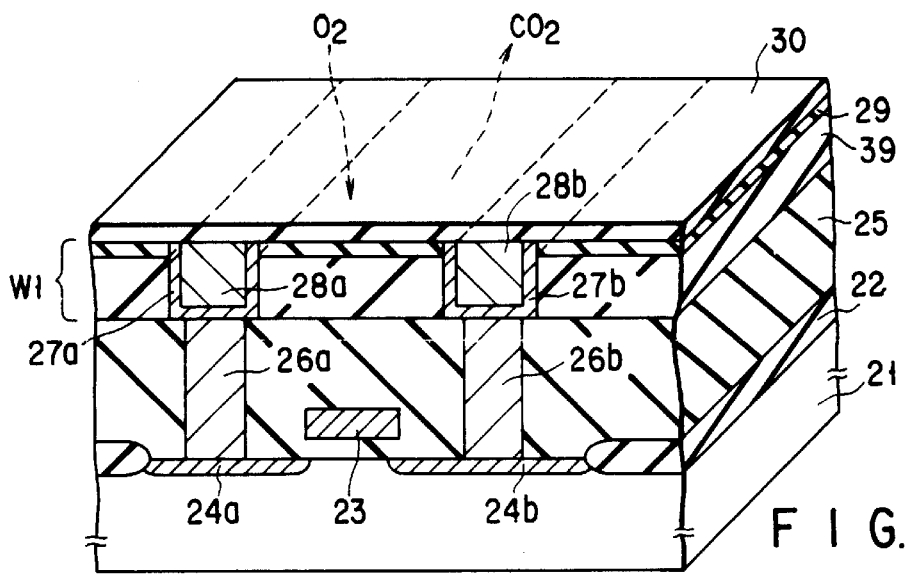
Figure 18:
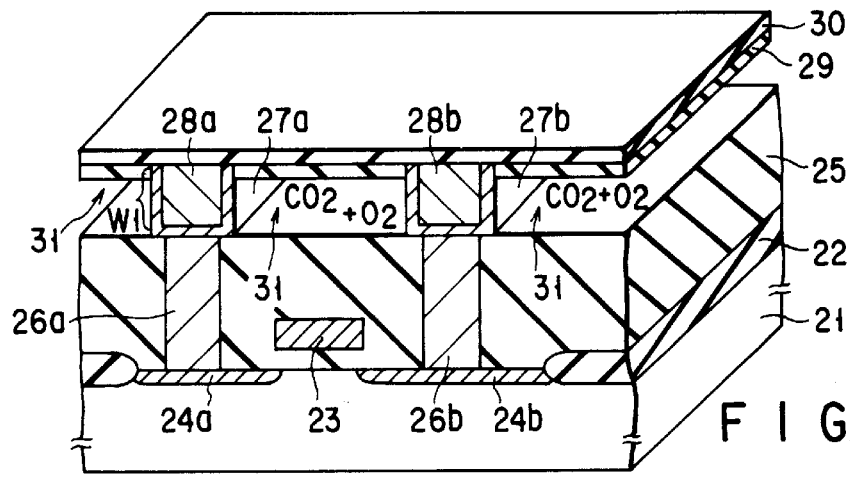

Then, as shown in FIGS. 17 and 18, the carbon layer 39 is ashed, thereby forming cavities 31 which are filled with a mixture gas of mainly oxygen ($O_2$) and carbon dioxide ($CO_2$). The ashing of the layer 39 can be accomplished by either of two alternative methods.

The first method is to heat the carbon layer 39 in an oxygen atmosphere at 400 to 450° C. for about two hours. In the first method, the carbon layer 39 slowly changes into carbon dioxide ($CO_2$), not expanding to break the insulating layer 29 or 30. However, it takes a long time to ash the carbon layer 39. The second method is oxygen-plasma process. In the second method, the carbon layer 39 changes into carbon dioxide ($CO_2$) at high speed, but may expand, possibly breaking the insulating layers 29 and 30. Nonetheless, breakage of the layers 29 and 30 can be prevented by modifying the layers 29 and 30 or by decreasing the oxygen-plasma process temperature.

Figure 19:
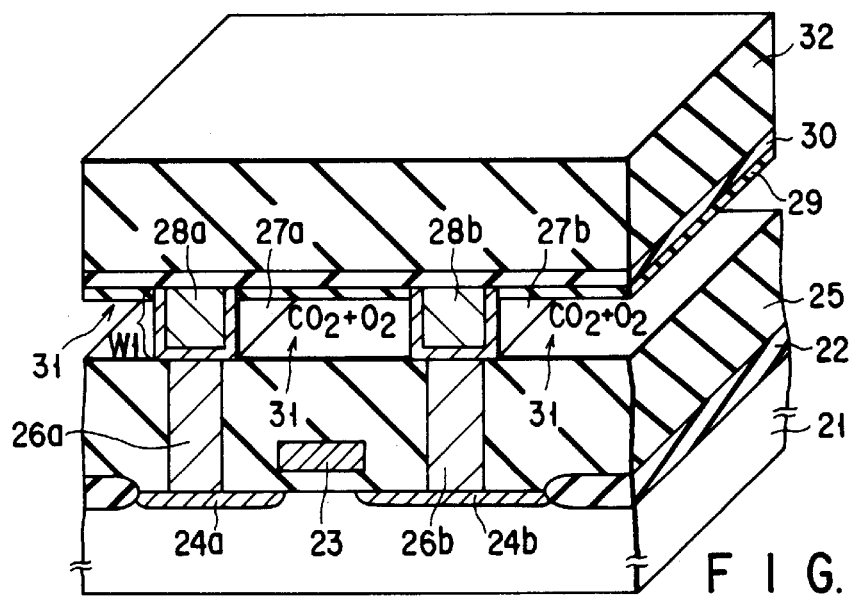

Next, an insulating layer 32 made of, for example TEOS containing fluorine is formed on the insulating layer 30 as is illustrated in FIG. 19. Further, as shown in FIG. 20, PEP (Photo Engraving Process) or RIE (Reactive Ion Etching) is conducted on the insulating layers 30 and 32, making via holes which reach the wires W1. Still further, conductors 33a and 33b made of high-melting metal such as tungsten are formed in the via holes by selective growth, as shown in FIG. 21. The conductors 33a and 33b can be made of material other than high-melting metal.

Thereafter, wires W2 are formed as shown in FIG. 22, in the same method as the wires W1. To be more precise, a carbon layer is formed on the insulating layer 32 by sputtering. This carbon layer is as thick as the wires W2 to be formed. Then, a mask layer 36 (e.g., a silicon oxide layer, a silicon nitride layer, or the like) is formed on the carbon layer, also by means of sputtering, to a thickness of about 0.05 μm. This done, PEP (Photo Engraving Process) and anisotropic etching are performed, patterning the mask layer 36. Using the layer 36 thus patterned as the mask, anisotropic etching is applied to the carbon layer. Parts of the carbon layer are thereby etched away, whereby slits are made in the carbon layer. Either sputtering or CVD is carried out, thereby forming trough-shaped barrier layers 34a and 34b each consisting of a titanium layer and a titanium nitride layer. The conductors 35a and 35b, made of copper, aluminum alloy or the like, are formed in the trough-shaped barrier layers 34a and 34b, by means of sputtering or CVD. The conductors 35a and 35b are subjected to chemical mechanical polishing (CMP), whereby the barrier layers 34a and 34b and the conductors 35a and 35b are formed exclusively in the slits of the carbon layer. Thus, the wires W2 are formed. The chemical mechanical polishing may be replaced by anisotropic etching or isotropic etching.

An insulating layer 37 (e.g., a silicon oxide layer) is formed on the mask layer 36 and the wires W2 by means of sputtering. The carbon layer is ashed, forming cavities 38 which are filled with a mixture gas of mainly oxygen ($O_2$) and carbon dioxide ($CO_2$). The cavities 31 and 38 may be filled with air, not the mixture gas. This can be achieved by opening the cavities 31 and 38 to the atmosphere or by supplying air into the cavities 31 and 38 through holes made in the device package.

In the method described above, two carbon layers having slits are used to form wires W1 and W2 and are ashed after the wires W1 and W2 are formed in the slits, thereby forming cavities 31 and 38 filled with gas. Thus, the semiconductor device shown in FIG. 7 can be easily manufactured.

FIG. 23 shows a semiconductor device according to the third embodiment of the present invention.

As seen from FIG. 23, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), or phosphor silicate glass (PSG), or the like. The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. Each wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is mounted an insulating layer 30. Hence, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 32 and serving as a base on which some layers will be mounted. The layer 30 is made of silicon oxide or the like.

On the insulating layer 30 an insulating layer 32 is provided, which is made of, for example, silicon oxide. The insulating layer 32 has contact holes which reach the wires W1. The contact holes are filled with conductors 33a and 33b made of high-melting metal such as tungsten. The conductors 33a and 33b can be made of other electrically conductive material.

Wires W2 are arranged on the insulating layer 32 and connected to the conductors 33a and 33b. One wire W2 is composed of a trough-shaped barrier layer 34a and a conductor 35a fitted in the barrier layer 34a. The other wire W2 is composed of a trough-shaped barrier layer 34b and a conductor 35b fitted in the barrier layer 34b. The barrier layers 34a and 34b are two-layered members, each consisting of, for example, a titanium layer and a titanium nitride layer. The conductors 35a and 35b are made of metal such as copper or aluminum alloy. The conductors 35a and 35b can be made of material other than copper and aluminum alloy, for example, semiconductor such as polysilicon containing an impurity, or high-melting metal such as tungsten.

On the wires W2 there is mounted an insulating layer 37. Thus, the wires W2 support the insulating layer 37. Cavities 38 are provided among the wires W2. They are filled with a mixture gas of mainly oxygen ($O_2$) and carbon dioxide ($CO_2$). The insulating layer 37 is an important component, defining the cavities 38 and functioning as a base on which some layers will be mounted. The layer 37 is made of silicon oxide or the like.

The cavities 31 and 38 may be filled with air, not the mixture gas. This can be accomplished by opening the cavities 31 and 38 to the atmosphere or by supplying air into the cavities 31 and 38 through holes made in the device package.

As FIG. 23 shows, the cavities 31 provided among the wires W1 and the cavities 38 provided among the wires W2 are filled with the mixture gas of oxygen ($O_2$) and carbon dioxide ($CO_2$). Alternatively, the cavities 31 and 38 may be filled with air. The mixture gas and air have a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

It will be explained how the device shown in FIG. 23 is manufactured, with reference to FIGS. 24 to 33.

First, the structure shown in FIG. 23 is prepared by performing the same steps as carried out until the the carbon layer 39 is formed on the insulating layer 25 in the manufacture of the second embodiment.

Figure 24:
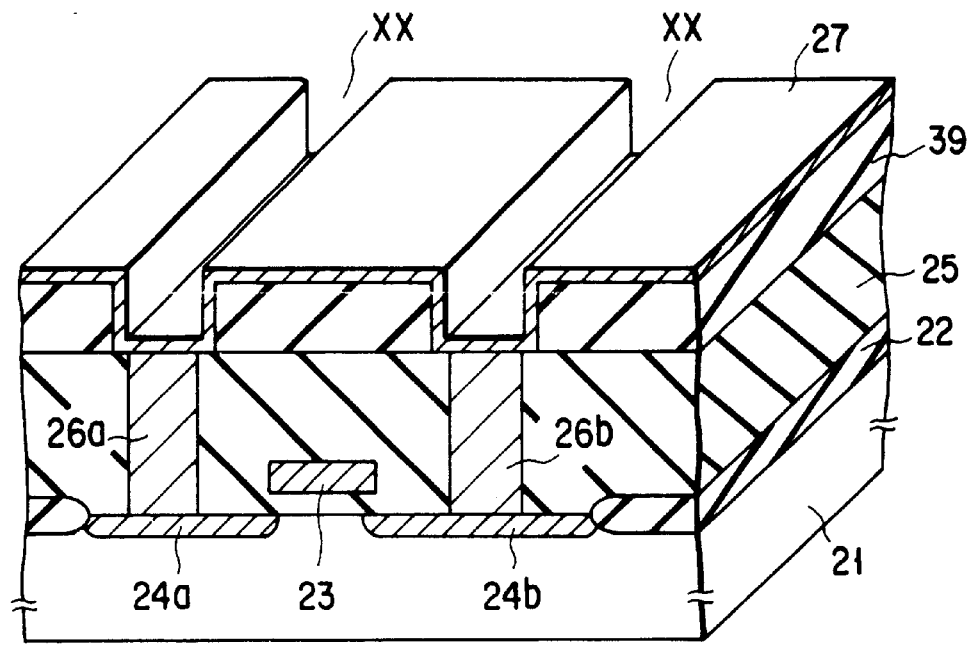

More precisely, the field oxide layer 22 is formed on the semiconductor substrate 21 by LOCOS method, as is illustrated in FIG. 24. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. The contact holes may be filled with other electrically conductive material other than high-melting metal.

Next, a carbon layer 39 is formed on the insulating layer 25 by sputtering. The carbon layer 39 is as thick as wires to be formed in an LSI, for example about 0.2 to 0.7 $\mu$m. Further, a mask layer (e.g., a silicon oxide layer or a silicon nitride layer) is formed on the carbon layer 39 by sputtering to a thickness of about 0.05 $\mu$m.

A resist is coated on the mask layer 29 and patterned by PEP (Photo Engraving Process). Using the patterned resist as the mask, the mask layer 29 is patterned. Then, the resist is removed, and the carbon layer 39 is subjected to anisotropic etching, which is accomplished by using the patterned mask layer as the mask. Parts of the carbon layer 39 are thereby etched away, whereby slits are made in the carbon layer 39. It should be noted that the carbon layer 39 is not etched by PEP, but etched by using the PEP-patterned mask layer, for the same reason stated in the explanation of the method of manufacturing the second embodiment.

If the conductors 26a and 26b are made of high-melting metal, it is desirable to use a mask polished by PEP to etch the carbon layer 39. If the conductors 26a and 26b are made of material which is resistant to $H_2SO4$ and $H_2O_2$, it is advisable to use a resist as the mask to etch the carbon layer 39.

Thereafter, the mask layer is removed, and a barrier layer 27 is formed by sputtering or CVD on the carbon layer 29 and on the bottom and inner surfaces of each slit made in the carbon layer 29.

Figure 25:
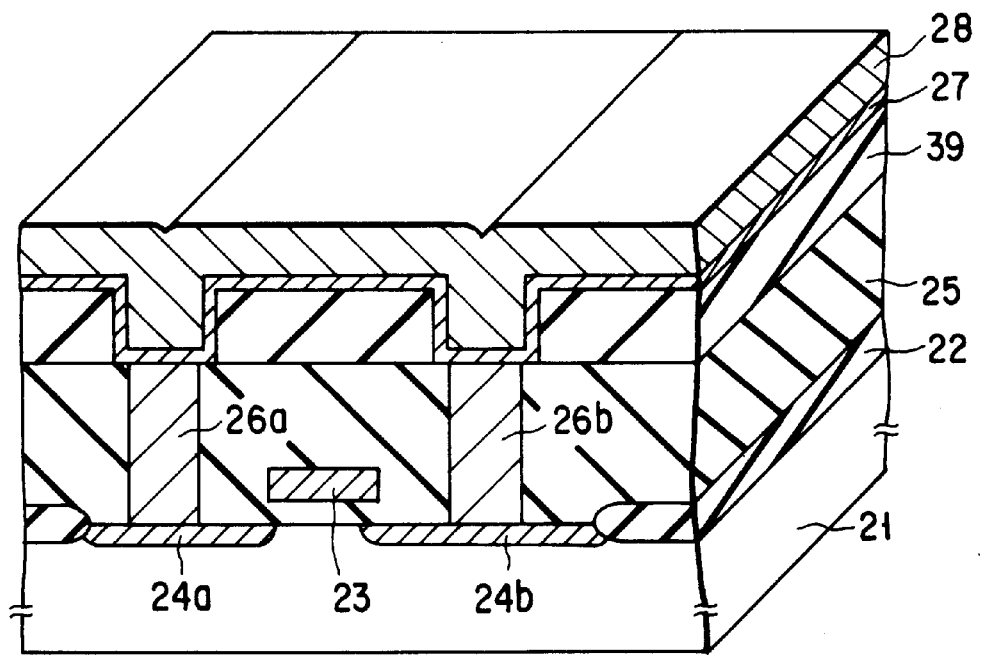

Next, as shown in FIG. 25, a metal layer 28 such as a copper layer, an aluminum alloy layer is formed on the barrier layer 27 by means of sputtering or CVD. The metal layer 28 may be replaced by, for example, a semiconductor layer such as a polysilicon layer or high-melting metal layer such as a tungsten layer.

As shown in FIG. 26, those parts of the barrier layer 27 and those parts of the metal layer 28, which are deposited on the pattern mask 29, are removed by means of chemical mechanical polishing (CMP). The parts of the barrier layer 27 and metal layer 28 may be removed by anisotropic etching or isotropic etching. As a result, the trough-shaped barrier layers 27a and 27b are formed in the slits of the carbon layer 39, and the conductors 28a and 28b are formed in the trough-shaped barrier layers 27a and 27b. The wires W1 is thereby formed.

As illustrated in FIG. 27, the insulating layer 30 (e.g., a silicon oxide layer) is formed on the mask carbon layer 39 and the wires W1 by means of sputtering. If the mask layer 30 is made of oxide, it should better he formed by means of sputtering, not by CVD. This is because the carbon layer 39 would be eroded by the oxygen $O_2$ contained in the reaction gas applied in CVD to form the insulating layer 30. It is desired that the insulating layer 30 be 0.01 to 0.1 $\mu$m thick if it is made of silicon oxide. So long as its thickness remains within this range, the layer 30 is not broken when the carbon layer 39 is subjected to ashing. The optimal thickness for the insulating layer 30 depends upon the material of the layer 30.

Figure 28:
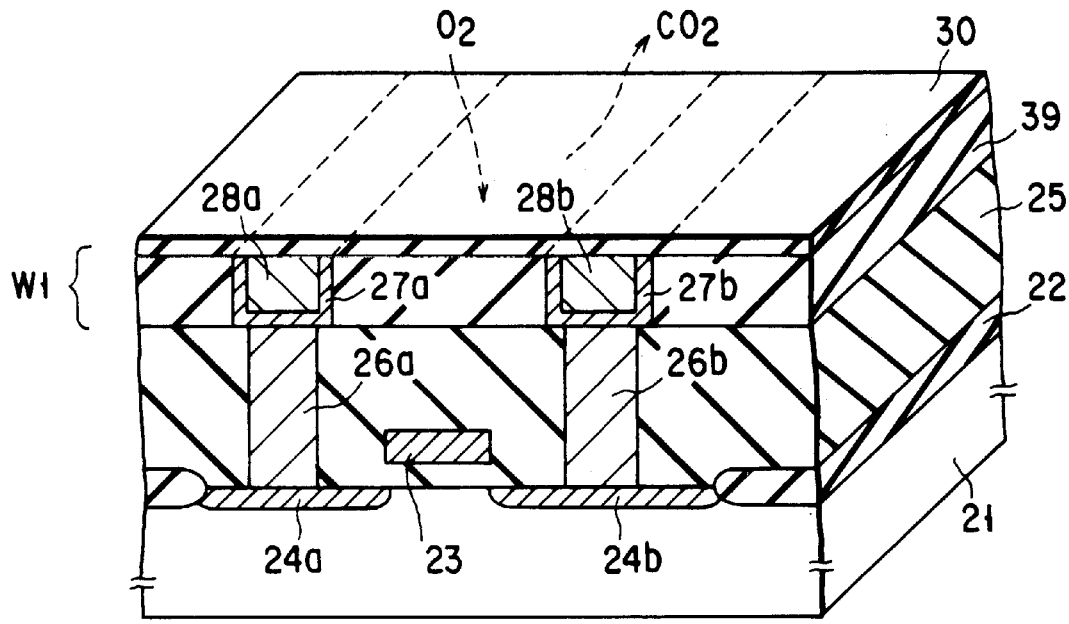
Figure 29:
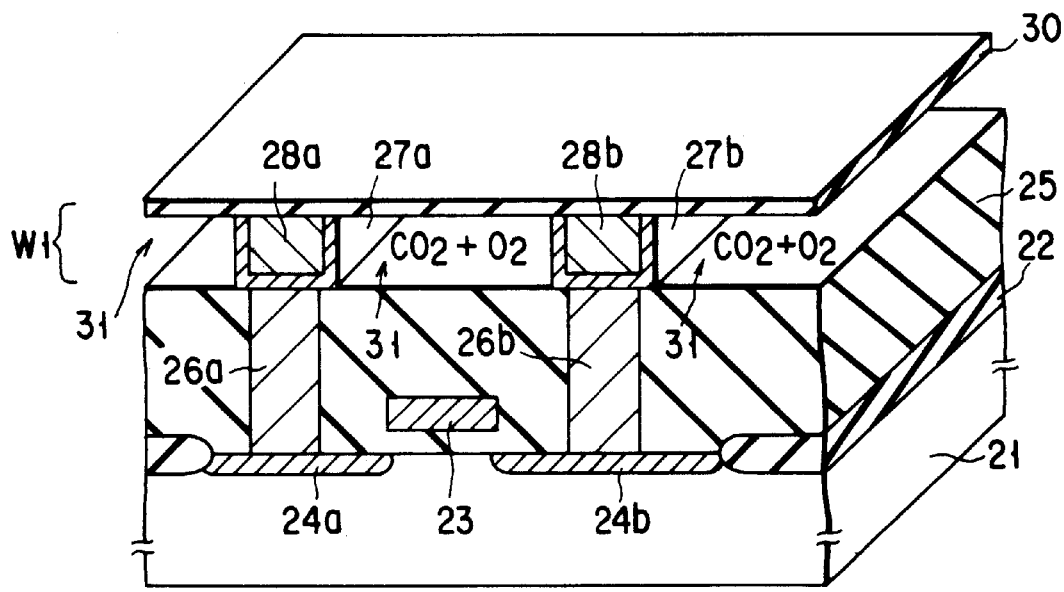

Then, as shown in FIGS. 28 and 29, the carbon layer 39 is ashed, thereby forming cavities 31 which are filled with a mixture gas of mainly oxygen ($O_2$) and carbon dioxide ($CO_2$). The ashing of the layer 39 can be accomplished by either of two alternative methods.

The first method is to heat the carbon layer 39 in an oxygen atmosphere at 400 to 450° C. for about two hours. In the first method, the carbon layer 39 slowly changes into carbon dioxide ($CO_2$), not expanding to break the insulating layer 30. However, it takes a long time to ashes the carbon layer 39. The second method is oxygen-plasma process. In the second method, the carbon layer 39 changes into carbon dioxide ($CO_2$) at high speed, but may expand, possibly breaking the insulating layer 30. Nonetheless, breakage of the layer 30 can be prevented by modifying the layer 30 or by decreasing the oxygen-plasma process temperature.

Figure 30:
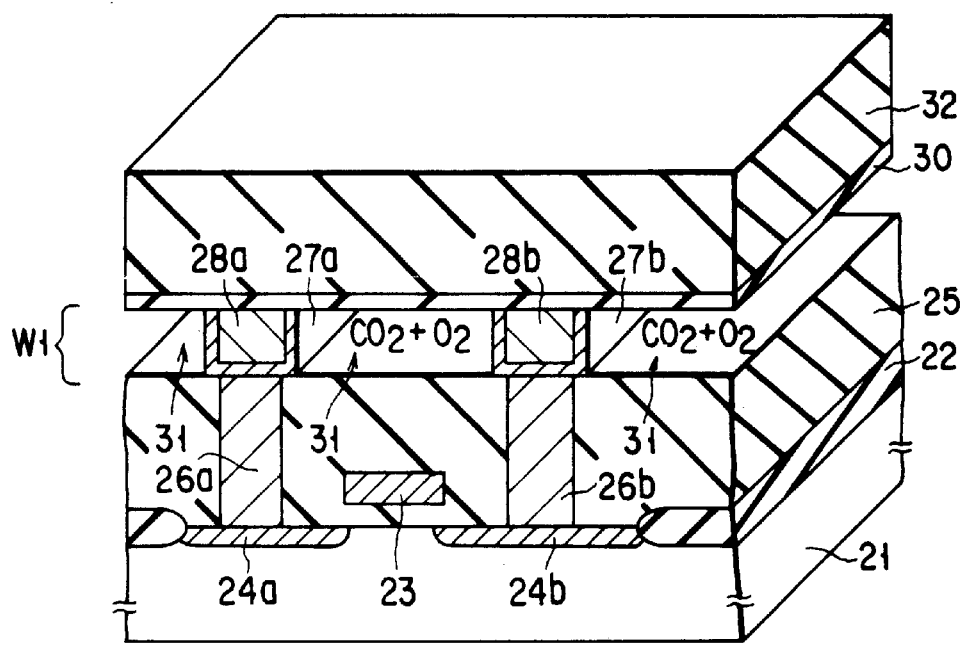
Figure 31:
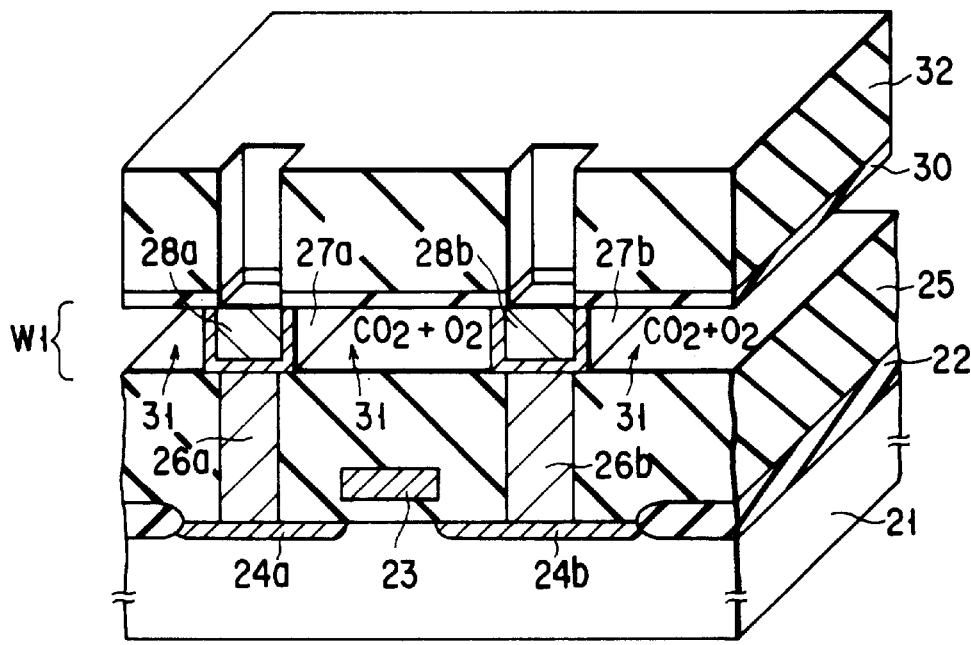

Next, an insulating layer 32 of made of, for example TEOS containing fluorine is formed on the insulating layer 30 as is illustrated in FIG. 30. Further, as shown in FIG. 31, PEP (Photo Engraving Process) or RIE (Reactive Ion Etching) is conducted on the insulating layers 30 and 32, making via holes which reach the wires W1. Still further, conductors 33a and 33b made of high-melting metal such as tungsten are formed in the via holes by selective growth, as shown in FIG. 32. The conductors 33a and 33b can be made of material other than high-melting metal.

Thereafter, wires W2 are formed as shown in FIG. 33, in the same method as the wires W1. More specifically, a carbon layer is formed on the insulating layer 32 by sputtering. This carbon layer is as thick as the wires W2 to be formed. Then, a mask layer (e.g., a silicon oxide layer, a silicon nitride layer, or the like) is formed on the carbon layer, also by means of sputtering, to a thickness of about 0.05 $\mu$m. This done, a resist is coated on the mask layer. The resist is patterned by PEP (Photo Engraving Process). Using the patterned resist, anisotropic etching are performed, patterning the mask layer. Using the layer thus patterned as the mask, anisotropic etching is applied to the carbon layer. The resist is removed, and either sputtering or CVD is carried out, thereby forming trough-shaped barrier layers 34a and 34b, each consisting of a titanium layer and a titanium nitride layer. The conductors 35a and 35b, made of copper, aluminum alloy or the like, are formed in the trough-shaped barrier layers 34a and 34b, by means of sputtering or CVD. The conductors 35a and 35b are subjected to chemical mechanical polishing (CMP), whereby the barrier layers 34a and 34b and the conductors 35a and 35b are formed exclusively in the slits of the carbon layer. Thus, the wires W2 are formed. The chemical mechanical polishing may be replaced by anisotropic etching or isotropic etching.

An insulating layer 37 (e.g., a silicon oxide layer) is formed on the mask layer 36 and the wires W2 by means of sputtering. The carbon layer is ashed, forming cavities 38 which are filled with a mixture gas of mainly oxygen ($O_2$) and carbon dioxide ($CO_2$). The cavities 31 and 38 may be filled with air, not the mixture gas. This can be achieved by opening the cavities 31 and 38 to the atmosphere or by supplying air into the cavities 31 and 38 through holes made in the device package.

As explained above, two carbon layers having slits are used to form wires W1 and W2 and are ashed after the wires W1 and W2 are formed in the slits, thereby forming cavities 31 and 38 filled with gas. Thus, the semiconductor device shown in FIG. 23 can be easily manufactured.

Furthermore, each carbon layer can be ashed feast and precisely since the mask layer is removed after the carbon carbon layer is patterned and before the carbon layer is ashed.

FIG. 34 shows a semiconductor device according to the fourth embodiment of the invention.

As seen from FIG. 34, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), or phosphor silicate glass (PSG), or the like. The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. Each wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is mounted an insulating layer 29, on which an insulating layer 30 is provided. Hence, the wires W1 support both insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W1; it is made of silicon oxide, silicon nitride or the like. The insulating layer 30 is an important component, defining the cavities 31 and serving as a base on which some layers will be mounted. The layer 30 is made of silicon oxide or the like.

The insulating layer 30 has contact holes which reach the wires W1. Columnar conductors 33a and 33b made of high-melting metal such as tungsten are provided, extending vertically, each having its lower end fitted in the contact holes of the insulating layer 30. The conductors 33a and 33b can be made of other electrically conductive material.

On the conductors 33a and 33b there is mounted an insulating layer 36, on which an insulating layer 37 is provided. Thus, the conductors 33a and 33b support both insulating layers 36 and 37. Cavities 40 are provided among the conductors 33a and 33b. They are filled with a mixture gas of mainly oxygen ($O_2$) and carbon dioxide ($CO_2$). The insulating layer 36 determines the positions and cross-sectional areas of the conductors 33a and 33b; it is made of silicon oxide or silicon nitride. The insulating layer 37 is an important component, defining the cavities 40 and functioning as a base on which some layers will be mounted. The layer 37 is made of silicon oxide or the like.

The cavities 31 and 40 may be filled with air, not the mixture gas. This can be accomplished by opening the cavities 31 and 40 to the atmosphere or by supplying air into the cavities 31 and 40 through holes made in the device package.

As FIG. 34 shows, the cavities 31 provided among the wires W1 and the cavities 40 provided among the conductors 33a and 33b are filled with the mixture gas of oxygen ($O_2$) and carbon dioxide ($CO_2$). Alternatively, the cavities 31 and 40 may be filled with air. The mixture gas and air have a dielectric constant $\in$ of about 1.0, which is far less than dielectric constant $\in$ of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

It will be explained how the device shown in FIG. 34 is manufactured, with reference to FIGS. 35 to 39.

At first, the structure shown in FIG. 35 is prepared by performing the same steps as carried cut until the wires W1 are formed on the insulating layer 25 in the manufacture of the second embodiment.

More precisely, the field oxide layer 22 is formed on the semiconductor substrate 21 by LOCOS method, as is illustrated in FIG. 35. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is made flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. The contact holes may be filled with other electrically conductive material other than high-melting metal.

Next, a carbon layer is formed on the insulating layer 25 by sputtering. The carbon layer is as thick as wires to be formed in an LSI, for example about 0.2 to 0.7 $\mu$m. Further, a mask layer 29 (e.g., a silicon oxide layer or a silicon nitride layer) is formed on the carbon layer by sputtering to a thickness of about 0.05 $\mu$m.

A resist is formed on the mask layer 29 and is patterned by means of PEP (Photo Engraving Process). Using the resist as the mask, the mask layer 29 is patterned. After removing the resist, the carbon layer is subjected to anisotropic etching by using the mask layer 29 as the mask. It should be noted that the carbon layer 29 is not etched by PEP, but etched by using the PEP-patterned mask layer, for the same reason stated in the explanation of the method of manufacturing the second embodiment.

Hence, if the conductors 26a and 26b are made of high-melting metal, it is desirable to use a mask polished by PEP to etch the carbon layer. If the conductors 26a and 26b are made of material which is resistant to $H_2SO4$ and $H_2O_2$, it is advisable to use a resist as the mask to etch the carbon layer.

Thereafter, the mask layer is removed, and barrier layers 27 and 27b, each comprised of, for example, a titanium layer and a titanium nitride layer, are formed by means of sputtering or CVD. Conductors 28a and 28b made of copper or aluminum alloy are formed by sputtering or CVD on the barrier layers 27a nd 27b. The conductors 28a and 28b may be replaced by, for example, those made of polysilicon or high-melting metal such as tungsten.

Chemical mechanical polishing (CMP) is performed, leaving the barrier layers 27a and 27b and the conductors 28a and 28b in the slits made in the carbon layer. As a result, the wires W1 are formed. The CMP may be replaced by anisotropic etching or isotropic etching, to form the wires W1.

The insulating layer 30 (e.g., a silicon oxide layer) is formed on the mask layer 29 and the wires W1 by means of sputtering. The insulating layer 30 should better be formed by means of sputtering, not by CVD. This is because the carbon layer would be eroded by the oxygen $O_2$ contained in the reaction gas applied in CVD to form the insulating layer 30. It is desired that the insulating layer 30 be 0.01 to 0.1 $\mu$m thick if it is made of silicon oxide. So long as its thickness remains within this range, the layer 30 is not broken when the carbon layer 39 is subjected to ashing. The most preferable thickness for the insulating layer 30 depends on the material of the layer 30.

Then, the carbon layer is ashed, thereby forming cavities 31 which are filled with a mixture gas of mainly oxygen ($O_2$) and carbon dioxide ($CO_2$).

A carbon layer 41 is formed on the insulating layer 30 by sputtering. Further, a mask layer 36 (e.g., a silicon oxide layer or a silicon nitride layer) is formed on the carbon layer 41 by sputtering to a thickness of about 0.05 $\mu$m. A resist is coated on the mask layer 36 and patterned by PEP (Photo Engraving Process). Using the patterned resist as the mask, the mask layer 36 is patterned. The resist is removed from the mask layer 36 patterned. The carbon layer 41 and the insulating layer 30 are subjected to anisotropic etching, which is accomplished by using the patterned mask layer as the mask. Via holes reaching the wires W1 are thereby made in the carbon layer 41 and the insulating layer 30.

As shown in FIG. 36, conductors 33a and 33b made of high-melting metal such as tungsten are formed in the via holes by selective growth. The conductors 33a and 33b can be made of material other than high-melting metal.

Next, as shown in FIG. 37, an insulating film 37 (e.g., a silicon oxide film) is formed by sputtering on the mask layer 36 and the conductors 33a and 33b. The insulating layer 37 should better be formed by means of sputtering, not by CVD, in order to prevent the carbon layer 41 from being eroded. It is desired that the insulating layer 37 be 0.01 to 0.1 $\mu$m thick if it is made of silicon oxide. So long as its thickness remains within this range, the layer 37 is not broken when the carbon layer 41 is subjected to ashing. The most suitable thickness for the insulating layer 37 depends on the material of the layer 37.

Then, as shown in FIGS. 38 and 39, the carbon layer 41 is ashed, thereby forming cavities 40 which are filled with a mixture gas of mainly oxygen ($O_2$) and carbon dioxide ($CO_2$). The ashing of the layer 41 can be accomplished by either of two alternative methods.

The first method is to heat the carbon layer 41 in an oxygen atmosphere at 400 to 450° C. for about two hours. In the first method, the carbon layer 41 slowly changes into carbon dioxide ($CO_2$), not expanding to break the insulating layers 36 and 37. However, it takes a long time to ash the carbon layer 41. The second method is oxygen-plasma process. In the second method, the carbon layer 41 changes into carbon dioxide ($CO_2$) at high speed, but may expand, possibly breaking the insulating layers 36 and 37. Nonetheless, breakage of the layers 36 and 37 can be prevented by modifying the layers 36 and 37 or by decreasing the oxygen-plasma process temperature.

The cavities 31 and 40 may be filled with air, not the mixture gas. This can be accomplished by opening the cavities 31 and 40 to the atmosphere or by supplying air into the cavities 31 and 40 through holes made in the device package.

In the method explained above, a carbon layer having slits is used to form wires W1, and this carbon layer is ashed after the wires W1 are formed in the slits, thereby forming cavities 31 and 40 filled with gas. Further, a carbon layer having via holes is used to form conductors 33a and 33b (i.e. contact plugs), and this carbon layer is ashed after the conductors 33a and 33b are formed in the via holes, thereby forming cavities filled with gas. Hence, the spaces among the wires located at a lower level are filled with air or a mixture gas of oxygen ($O_2$) and carbon dioxide ($CO_2$), and spaces among the wires located at different levels are also filled with air or a mixture gas of oxygen ($O_2$) and carbon dioxide ($CO_2$).

FIG. 40 illustrates a semiconductor device according to the fifth embodiment of the invention.

As seen from FIG. 40, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), or phosphor silicate glass (PSG), or the like. The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. Each wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is mounted an insulating layer 30. Hence, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted. The layer 30 is made of silicon oxide or the like.

The insulating layer 30 has contact holes which reach the wires W1. Columnar conductors 33a and 33b made of high-melting metal such as tungsten are provided, extending vertically, each having its lower end fitted in the contact holes of the insulating layer 30. The conductors 33a and 33b can be made of other electrically conductive material.

On the conductors 33a and 33b there is mounted an insulating layer 37. Thus, the conductors 33a and 33b support the insulating layer 37. Cavities 40 are provided among the conductors 33a and 33b. They are filled with a mixture gas of mainly oxygen ($O_2$) and carbon dioxide ($CO_2$). The insulating layer 37 is an important component, defining the cavities 40 and functioning as a base on which some layers will be mounted. The layer 37 is made of silicon oxide or the like.

The cavities 31 and 40 may be filled with air, not the mixture gas. This can be accomplished by opening the cavities 31 and 40 to the atmosphere or by supplying air into the cavities 31 and 40 through holes made in the device package.

As FIG. 40 shows, the cavities 31 provided among the wires W1 and the cavities 40 provided among the conductors 33a and 33b are filled with the mixture gas of oxygen ($O_2$) and carbon dioxide ($CO_2$). Alternatively, the cavities 31 and 40 may be filled with air. The mixture gas and air have a dielectric constant $\in$ of about 1.0, which is far less than dielectric constant $\in$ of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

How the device shown in FIG. 34 is manufactured will be explained, with reference to FIGS. 41 to 45.

First, the structure shown in FIG. 41 is prepared by performing the same steps as carried out until the wires W1 are formed in the manufacture of the third embodiment.

More precisely, the field oxide layer 22 is formed on the semiconductor substrate 21 by LOCOS method, as is illustrated. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is made flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. The contact holes may be filled with other electrically conductive material other than high-melting metal.

Further, a carbon layer is formed on the insulating layer 25 by sputtering. The carbon layer is as thick as wires to be formed in an LSI, for example about 0.2 to 0.7 $\mu$m. Further, a mask layer (e.g., a silicon oxide layer or a silicon nitride layer) is formed on the carbon layer by sputtering to a thickness of about 0.05 $\mu$m. The mask layer is patterned by means of PEP (Photo Engraving Process) and anisotropic etching. Using the mask layer as the mask, the carbon layer is subjected to anisotropic etching. It should be noted that the carbon layer is not etched by PEP, but etched by using the PEP-patterned mask layer, for the same reason stated in the explanation of the method of manufacturing the second embodiment. Therefore, if the conductors 26a and 26b are made of high-melting metal, it is desirable to use a mask polished by PEP to etch the carbon layer. If the conductors 26a and 26b are made of material which is resistant to $H_2SO4$ and $H_2O_2$, it is advisable to use a resist as the mask to etch the carbon layer.

The mask layer is removed, and barrier layers 27 and 27b, each comprised of, for example, a titanium layer and a titanium nitride layer, are formed by means of sputtering or CVD. Conductors 28a and 28b made of copper or aluminum alloy are formed by sputtering or CVD on the barrier layers 27a nd 27b. The conductors 28a and 28b may be replaced by, for example, those made of polysilicon layer or high-melting metal such as tungsten. Chemical mechanical polishing (CMP) is performed, leaving the barrier layers 27a and 27b and the conductors 28a and 28b in the slits made in the carbon layer. As a result, the wires W1 are formed. The CMP may be replaced by anisotropic etching or isotropic etching, to form the wires W1.

Next, the insulating layer 30 (e.g., a silicon oxide layer) is formed on the carbon layer and the wires W1 by means of sputtering. The mask layer 30 should better be formed by means of sputtering, not by CVD. This is because the carbon layer would be eroded by the oxygen $O_2$ contained in the reaction gas applied in CVD to form the insulating layer 30. It is desired that the insulating layer 30 be 0.01 to 0.1 $\mu$m thick if it is made of silicon oxide. So long as its thickness remains within this range, the layer 30 is not broken when the carbon layer is subjected to ashing. The most preferable thickness for the insulating layer 30 does depend on the material of the layer 30.

Thereafter, the carbon layer is ashed, thereby forming cavities 31 which are filled with a mixture gas of mainly oxygen ($O_2$) and carbon dioxide ($CO_2$). A carbon layer 41 is formed on the insulating layer 30 by sputtering. Further, a mask layer 36 (e.g., a silicon oxide layer or a silicon nitride layer) is formed on the carbon layer 41 by sputtering to a thickness of about 0.05 $\mu$m. A resist is coated on the mask layer 36 and patterned by PEP (Photo Engraving Process).

Using the patterned resist as the mask, the mask layer 36 is patterned. The resist is removed from the mask layer 36 patterned. The carbon layer 41 and the insulating layer 30 are subjected to anisotropic etching, which is accomplished by using the pattered mask layer as the mask. Via holes reaching the wires W1 are thereby made in the carbon layer 41 and the insulating layer 30.

As shown in FIG. 42, conductors 33a and 33b made of high-melting metal such as tungsten are formed in the via holes by selective growth. The conductors 33a and 33b can be made of material other than high-melting metal.

Next, as shown in FIG. 43, an insulating film 37 (e.g., a silicon oxide film) is formed by sputtering on the mask layer 36 and the conductors 33a and 33b. The insulating layer 37 should better be formed by means of sputtering, not by CVD, in order to prevent the carbon layer 41 from being eroded. It is desired that the insulating layer 37 be 0.01 to 0.1 $\mu$m thick if it is made of silicon oxide. So long as its thickness remains within this range, the layer 37 is not broken when the carbon layer 41 is subjected to ashing. The optimal thickness for the insulating layer 37 depends upon the material of the layer 37.

Then, as shown in FIGS. 44 and 45, the carbon layer 41 is ashed, thereby forming cavities 40 which are filled with a mixture gas of mainly oxygen ($O_2$) and carbon dioxide ($CO_2$). The ashing of the layer 41 can be accomplished by either of two alternative methods.

The first method is to heat the carbon layer 41 in an oxygen atmosphere at 400 to 450° C. for about two hours. In the first method, the carbon layer 41 slowly changes into carbon dioxide ($CO_2$), not expanding to break the insulating layers 36 and 37. However, it takes a long time to ash the carbon layer 41. The second method is oxygen-plasma process. In the second method, the carbon layer 41 changes into carbon dioxide ($CO_2$) at high speed, but may expand, possibly breaking the insulating layers 36 and 37. Nonetheless, breakage of the layers 36 and 37 can be prevented by modifying the layers 36 and 37 or by decreasing the oxygen-plasma process temperature.

The cavities 31 and 40 may be filled with air, not the mixture gas. This can be accomplished by opening the cavities 31 and 40 to the atmosphere or by supplying air into the cavities 31 and 40 through, holes made in the device package.

In the method described above, a carbon layer having slits is used to form wires W1, and this carbon layer is ashed after the wires W1 are formed in the slits, thereby forming cavities 31 and 40 filled with gas. Further, a carbon layer having via holes is used to form conductors 33a and 33b (i.e. contact plugs), and this carbon layer is ashed after the conductors 33a and 33b are formed in the via holes, thereby forming cavities filled with gas. Hence, the spaces among the wires located at the same level are filled with air or a mixture gas of oxygen ($O_2$) and oxide dioxide ($CO_2$), and the spaces among the wires located at different levels are also filled with air or a mixture gas of oxygen ($O_2$) and oxide dioxide ($CO_2$).

Moreover, each carbon layer can be ashed fast and precisely since the mask layer is removed after the carbon layer is patterned and before the carbon layer is ashed.

FIG. 46 illustrates a semiconductor device according to the sixth embodiment of the invention.

As seen from FIG. 46, a field oxide layer 22 (e.g., a silicon oxide layer) is provided on a semiconductor substrate 21 (e.g., a silicon wafer). The substrate 21 has an element region which is surrounded by the field oxide layer 22.

Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), or phosphor silicate glass (PSG), or the like. The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. Each wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is mounted an insulating layer 29, on which an insulating layer 30 is provided. Hence, the wires W1 support both insulating layers 29 and 30. Cavities 31 are provided among the wires 141. They are filled with a mixture gas of mainly oxygen ($O_2$) and carbon dioxide ($CO_2$). The insulating layer 29 determines the pattern of wires W1; it is made of silicon oxide, silicon nitride or the like. The insulating layer 30 is an important component, defining the cavities 31 and serving as a base on which some layers will be mounted. The layer 30 is made of silicon oxide or the like.

The insulating layer 30 has contact holes which reach the wires W1. Columnar conductors 33a and 33b made of high-melting metal such as tungsten are provided, extending vertically, each having its lower end fitted in the contact holes of the insulating layer 30. The conductors 33a and 33b can be made of other electrically conductive material.

On the conductors 33a and 33b there is mounted an insulating layer 42, on which an insulating layer 43 is provided. Thus, the conductors 33a and 33b support both insulating layers 42 and 43. Cavities 40 are provided among the conductors 33a and 33b. They are filled with a mixture gas of mainly oxygen ($O_2$) and carbon dioxide ($CO_2$). The insulating layer 42 determines the positions and cross-sectional areas of the conductors 33a and 33b; it is made of silicon oxide or silicon nitride. The insulating layer 43 is an important component, defining the cavities 40 and functioning as a base on which some layers will be mounted. The layer 43 is made of silicon oxide or the like.

Wires W2 are arranged on the insulating layer 43 and connected to the conductors 33a and 33b. One wire W2 is composed of a trough-shaped barrier layer 34a and a conductor 35a fitted in the barrier layer 34a. The other wire W2 is composed of a trough-shaped barrier layer 34b and a conductor 35b fitted in the barrier layer 34b. The barrier layers 34a and 34b are two-layered members, each consisting of, for example, a titanium layer and a titanium nitride layer. The conductors 35a and 35b are made of metal such as copper or aluminum alloy. The conductors 35a and 35b can be made of material other than copper and aluminum alloy, for example, semiconductor such as polysilicon containing an impurity, or high-melting metal such as tungsten.

On the wires W2 there is mounted an insulating layer 36, on which an insulating layer 37 is mounted. Thus, the wires W2 support the insulating layers 36 and 37. Cavities 38 are provided among the wires W2. They are filled with a mixture gas of mainly oxygen ($O_2$) and carbon dioxide ($CO_2$). The insulating layer 36 defines the pattern of the wires W2; it is made of, for example, silicon oxide or silicon nitride. The insulating layer 37 is an important component, defining the cavities 38 and functioning as a base on which some layers will be mounted. The layer 37 is made of silicon oxide or the like.

The cavities 31, 38 and 40 may be filled with air, not the mixture gas. This can be accomplished by opening the cavities 31, 38 and 40 to the atmosphere or by supplying air into the cavities 31, 38 and 40 through holes made in the device package.

As seen from FIG. 46, the cavities 31 provided among the wires W1, the cavities 38 provided among the wires W2 are filled with the mixture gas of oxygen ($O_2$) and carbon dioxide ($CO_2$). Alternatively, the cavities 31 and 38 may be filled with air. In addition, the cavities 40 filled with air or the mixture gas are provided among the conductors 33a and 33b, that is, between the wires W1 on the one hand and the wire W2 on the other. The mixture gas and air have a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

How the device shown in FIG. 46 is manufactured will be explained, with reference to FIGS. 47 to 52.

At first, the structure shown in FIG. 47 is prepared by performing the same steps as carried out until the wires W1 are formed in the manufacture of the second embodiment.

To be more specific, the field oxide layer 22 is formed on the semiconductor substrate 21 by LOCOS method, as is illustrated in FIG. 47. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. The contact holes may be filled with other electrically conductive material other than high-melting metal.

Next, a carbon layer is formed on the insulating layer 25 by sputtering. The carbon layer is as thick as wires to be formed in an LSI, for example about 0.2 to 0.7 μm. Further, a mask layer 29 (e.g., a silicon oxide layer or a silicon nitride layer) is formed on the carbon layer by sputtering to a thickness of about 0.05 μm.

A resist is formed on the mask layer 29 and patterned by PEP (Photo Engraving Process). Using the resist as the mask, the mask layer 29 is patterned. After removing the resist, the carbon layer is subjected to anisotropic etching, in which the mask layer 29 is used as the mask. Slits are thereby made in the carbon layer. It should be noted that the carbon layer is not etched by PEP, but etched by using the PEP-patterned mask layer, for the same reason stated in the explanation of the method of manufacturing the second embodiment.

If the conductors 26a and 26b are made of high-melting metal, it is desirable to use a mask polished by PEP to etch the carbon layer 39. If the conductors 26a and 26b are made of material which is resistant to $H_2SO4$ and $H_2O_2$, it is advisable to use a resist as the mask to etch the carbon layer.

Thereafter, the mask layer is removed, and the trough-shaped barrier layers 27a and 27b are formed by sputtering or CVD on the carbon layer and on the bottom and inner surfaces 6f each slit made in the carbon layer. Each barrier layer is composed of a titanium layer and a titanium nitride layer provided on the titanium layer. Further, conductors 28a and 28b made of copper, aluminum alloy or the like are formed by sputtering or CVD in the barrier layers 27a and 27b, respectively. The conductors 28a and 28b may be replaced by, for example, those made of semiconductor such as polysilicon layer or high-melting metal such as tungsten.

Chemical mechanical polishing (CMP) is performed, leaving the barrier layers 27a and 27b and the conductors 28a and 28b in the slits made in the carbon layer. As a result, the wires W1 are formed. The CMP may be replaced by anisotropic etching or isotropic etching, to form the wires W1.

The insulating layer 30 (e.g., a silicon oxide layer) is then formed by sputtering on the mask layer 29 and the wires W1. The insulating layer 30 should better be formed by means of sputtering, not by CVD. This is because the carbon layer would be be eroded by the oxygen $O_2$ contained in the reaction gas applied in CVD to form the insulating layer 30. It is desired that the insulating layer 30 be 0.01 to 0.1 μm thick if it is made of silicon oxide. So long as its thickness remains within this range, the layer 30 is not broken when the carbon layer is ashed. The most preferable thickness for the insulating layer 30 depends on the material of the layer 30.

Thereafter, the carbon layer is ashed, thereby forming cavities 31 which are filled with a mixture gas of mainly oxygen ($O_2$) and carbon dioxide ($CO_2$). A carbon layer 41 is formed on the insulating layer 30 by sputtering, after the wires W1 have been formed. Further, a mask layer 42 (e.g., a silicon oxide layer or a silicon nitride layer) is formed on the carbon layer 41 by sputtering to a thickness of about 0.05 μm. The mask layer 42 is patterned by PEP (Photo Engraving Process) and anisotropic etching. The carbon layer 41 and the insulating layer 30 are subjected to anisotropic etching, which is accomplished by using the patterned mask layer 42 as the mask. Via holes reaching the wires W1 are thereby made in the carbon layer 41 and the insulating layer 30.

As shown in FIG. 48, conductors 33a and 33b made of high-melting metal such as tungsten are formed in the via holes by selective growth. The conductors 33a and 33b can be made of material other than high-melting metal.

Next, as shown in FIG. 49, an insulating film 43 (e.g., a silicon oxide film) is formed by sputtering on the mask layer 42 and the conductors 33a and 33b. The insulating layer 43 should better be formed by means of sputtering, not by CVD, in order to prevent the carbon layer 41 from being eroded by the oxygen ($O_2$) contained in the reaction gas used to form the insulating layer 43. It is desired that the insulating layer 43 be 0.01 to 0.1 μm thick if it is made of silicon oxide. So long as its thickness remains within this range, the layer 43 is not broken when the carbon layer 41 is subjected to ashing. The optimal thickness for the insulating layer 43 depends on the material of the layer 43.

Then, the wires W2 are formed in the same way as the wires W1 are formed. To be more specific, as shown in FIG. 50, a carbon layer 44 is formed by sputtering on the insulating layer 43. The carbon layer 44 is as thick as wires W2 to be formed. Further, a mask layer 36 (e.g., a silicon oxide layer or a silicon nitride layer) is formed on the carbon layer 44 by sputtering to a thickness of about 0.05 μm.

A resist is coated on the mask layer 36 and patterned by PEP (Photo Engraving Process). Using the resist as the mask, the mask layer 36 is patterned. After removing the resist, the carbon layer 44 is subjected to anisotropic etching, which is accomplished by using the patterned mask layer 36 as the mask. Slits are thereby made in the carbon layer 44.

Thereafter, the trough-shaped barrier layers 34a and 34b are formed by sputtering or CVD on the insulating layer 36, on the insulating layer 43 and on the inner surfaces of each slit made in the carbon layer 44. Each barrier layer is composed of a titanium layer and a titanium nitride layer provided on the titanium layer. Further, conductors 35a and 35b made of copper, aluminum alloy or the like are formed by sputtering or CVD on the barrier layers 34a and 34b, respectively. Chemical mechanical polishing (CMP) is performed, leaving the barrier layers 34a and 34b and the conductors 35a and 35b in the slits made in the carbon layer 44. As a result, the wires W2 are formed. An insulating layer 37 (e.g., a silicon oxide layer) is formed by sputtering on the mask layer 36 and the wires W2. It is desired that the insulating layer 37 be 0.01 to 0.1 μm thick if it is made of silicon oxide. So long as its thickness remains within this range, the layer 37 is not broken when the carbon layer 44 is subjected to ashing. The most preferable thickness for the insulating layer 37 depends on the material of the layer 73.

Then, as illustrated in FIGS. 51 and 52, the carbon layers 41 and 44 are simultaneously ashed by heat treatment in an oxygen atmosphere or by oxygen plasma process. The carbon layer 41 is thereby changed into cavities 40, and the carbon layer 44 changed into cavities 38. The cavities 38 and 40 are filled with a mixture gas of mainly oxygen ($O_2$) and carbon dioxide ($CO_2$).

The cavities 31, 38 and 40 may be filled with air, not the mixture gas. This can be accomplished by opening the cavities 31, 38 and 40 to the atmosphere or by supplying air into the cavities 31, 38 and 40 through holes made in the device package.

In this method, carbon layers are used as insulating layers having slits, for forming the wires W1 and the wires W2. The carbon layers are ashed after the wires W1 and W2 are formed, and are thereby changed into gas-filled cavities. Further, a carbon layer having via holes is used an insulating layer to form conductors 33a and 33b (i.e. contact plugs), and is ashed after the conductors 33a and 33b are formed in the via holes, thereby forming gas-filled cavities.

Hence, a semiconductor device can be manufactured, in which the spaces among the wires located at the same level are filled with air or a mixture gas of oxygen ($O_2$) and carbon dioxide ($CO_2$), and the spaces among the wires located at different levels are also filled with air or a mixture gas of oxygen ($O_2$) and carbon dioxide ($CO_2$).

FIG. 53 shows a semiconductor device according to the seventh embodiment of the present invention.

As is illustrated in FIG. 53, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The insulating layer 25 is made of, for example, borophospho silicate glass (BPSG), or phosphor silicate glass (PSG), or the like. The upper surface of the layer 25 can be made flat chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. Each wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductors such as polysilicon containing an impurity, or high-melting metal such as tungsten.

On the wires W1 there is mounted an insulating layer 30. Hence, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted. The layer 30 is made of silicon oxide or the like.

The insulating layer 30 has contact holes which reach the wires W1. Columnar conductors 33a and 33b made of high-melting metal such as tungsten are provided, extending vertically, each having its lower end fitted in the contact holes of the insulating layer 30. The conductors 33a and 33b can be made of other electrically conductive material.

On the conductors 33a and 33b there is mounted an insulating layer 43. Thus, the conductors 33a and 33b support the insulating layer 43. Cavities 40 are provided among the conductors 33a and 33b. The cavities 40 are filled with a mixture gas of mainly oxygen ($O_2$) and carbon dioxide ($CO_2$). The insulating layer 43 is an important component, defining the cavities 40 and functioning as a base on which some layers will be mounted. The layer 43 is made of silicon oxide or the like.

Wires W2 are arranged on the insulating layer 43 and connected to the conductors 33a and 33b. One wire W2 is composed of a trough-shaped barrier layer 34a and a conductor 35a fitted in the barrier layer 34a. The other wire W2 is composed of a trough-shaped barrier layer 34b and a conductor 35b fitted in the barrier layer 34b. The barrier layers 34a and 34b are two-layered members, each consisting of, for example, a titanium layer and a titanium nitride layer. The conductors 35a and 35b are made of metal such as copper or aluminum alloy. They can be made of material other than copper and aluminum alloy, for example, semiconductor such as polysilicon containing an impurity, or high-melting metal such as tungsten.

On the wires W2 there is mounted an insulating layer 37. Thus, the wires W2 support the insulating layer 37. Cavities 38 are provided among the wires W2. They are filled with a mixture gas of mainly oxygen ($O_2$) and carbon dioxide ($CO_2$). The insulating layer 37 is an important component, defining the cavities 38 and functioning as a base on which some layers will be mounted. The layer 37 is made of silicon oxide or the like.

The cavities 31, 38 and 40 may be filled with air, not the mixture gas. This can be accomplished by opening the cavities 31, 38 and 40 to the atmosphere or by supplying air into the cavities 31, 38 and 40 through holes made in the device package.

As seen from FIG. 53, the cavities 31 provided among the wires W1, and the cavities 38 provided among the wires W2 are filled with the mixture gas of oxygen ($O_2$) and carbon dioxide ($CO_2$). Alternatively, the cavities 31 and 38 may be filled with air. Further, the cavities 40 filled with air or the mixture gas are provided among the conductors 33a and 33b, that is, between the wires W1 on the one hand and the wire W2 on the other. The mixture gas and air have a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

It will be explained how the device shown in FIG. 53 is manufactured, with reference to FIGS. 54 to 59.

Figure 54:
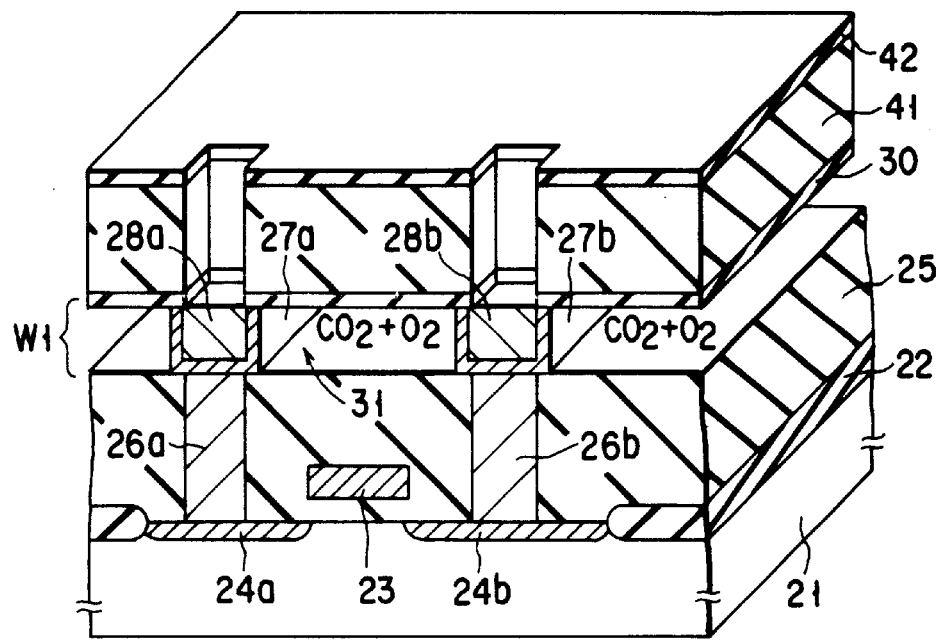

At first, the structure shown in FIG. 54 is prepared by performing the same steps as carried out until the wires W1 are formed in the manufacture of the third embodiment.

To state more correctly, the field oxide layer 22 is formed on the semiconductor substrate 21 by LOCOS method, as is illustrated in FIG. 54. A MOS transistor having a gate electrode 23, a source region 24a and, a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. Alternatively, the contact holes may be filled with other electrically conductive material other than high-melting metal.

Then, a carbon layer is formed on the insulating layer 25 by sputtering. The carbon layer is as thick as wires to be formed in an LSI, for example about 0.2 to 0.7 μm. Further, a mask layer 29 (e.g., a silicon oxide layer or a silicon nitride layer) is formed on the carbon layer by sputtering to a thickness of about 0.05 μm.

The mask layer 29 is patterned by PEP (Photo Engraving Process) and anisotropic etching. The carbon layer is subjected to anisotropic etching, which is accomplished by using the patterned mask layer 29 as the mask, whereby slits are made in the carbon layer. It should be noted that the carbon layer is not etched by PEP, but etched by using the PEP-patterned mask layer, for the same reason stated in the explanation of the method of manufacturing the second embodiment.

If the conductors 26a and 26b are made of high-melting metal, it is desirable to use a mask polished by PEP to etch the carbon layer. If the conductors 26a and 26b are made of material which is resistant to $H_2SO4$ and $H_2O_2$, it is advisable to use a resist as the mask to etch the carbon layer.

Thereafter, the mask layer 29 is removed, and the trough-shaped barrier layers 27a and 27b are formed by sputtering or CVD on the carbon layer and on the bottom and inner surfaces of each slit made in the carbon layer. Each barrier layer is composed of a titanium layer and a titanium nitride layer provided on the titanium layer. Further, conductors 28a and 28b made of copper, aluminum alloy or the like are formed by sputtering or CVD in the barrier layers 27a and 27b, respectively. The conductors 28a and 28b may be replaced by, for example, those made of semiconductor such as polysilicon layer or high-melting metal such as tungsten.

Chemical mechanical polishing (CMP) is performed, leaving the barrier layers 27a and 27b and the conductors 28a and 28b in the slits made in the carbon layer. As a result, the wires W1 are formed. The CMP may be replaced by anisotropic etching or isotropic etching, to form the wires W1.

The insulating layer 30 (e.g., a silicon oxide layer) is then formed by sputtering on the carbon layer and the wires W1. The insulating layer 30 should better be formed by means of sputtering, not by CVD. This is because the carbon layer would be eroded by the oxygen $O_2$ contained in the reaction gas applied in CVD to form the insulating layer 30. It is desired that the insulating layer 30 be 0.01 to 0.1 μm thick if it is made of silicon oxide. So long as its thickness remains within this range, the layer 30 is not broken when the carbon layer is ashed. The most preferable thickness for the insulating layer 30 depends upon the material of the layer 30.

Thereafter, the carbon layer is ashed, thereby forming cavities 31 which are filled with a mixture gas of mainly oxygen ($O_2$) and carbon dioxide ($CO_2$). A carbon layer 41 is formed on the insulating layer 30 by sputtering, after the wires W1 have been formed Further, a mask layer 42 (e.g., a silicon oxide layer or a silicon nitride layer) is formed on the carbon layer 41 by sputtering to a thickness of about 0.05 μm. A resist is coated on the mask layer 42 and patterned by PEP (Photo Engraving Process). Using the patterned resist as the mask, the mask layer 42 is patterned. The resist is removed from the mask layer 42 patterned. The carbon layer 41 and the insulating layer 30 are subjected to anisotropic etching, which is accomplished by using the patterned mask layer 42 as the mask. Via holes reaching the wires W1 are thereby made in the carbon layer 41 and the insulating layer 30.

Figure 55:
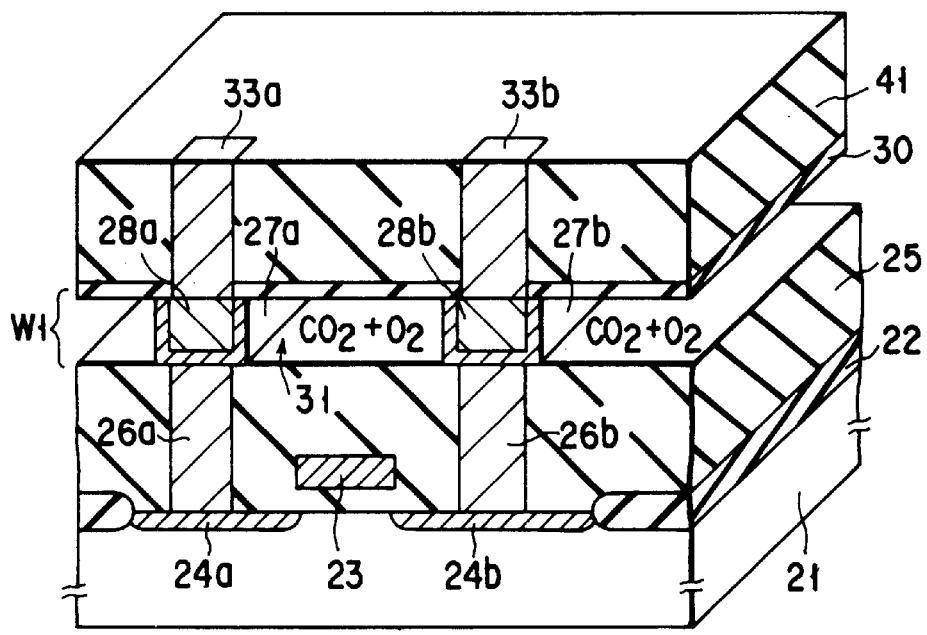

As shown in FIG. 55, conductors 33a and 33b made of high-melting metal such as tungsten are formed in the via holes by selective growth. The conductors 33a and 33b can be made of material other than high-melting metal.

Next, as shown in FIG. 56, an insulating film 43 (e.g., a silicon oxide film) is formed by sputtering on the carbon layer 41 and the conductors 33a and 33b. The insulating layer 43 should better be formed by means of sputtering, not by CVD, in order to prevent the carbon layer 41 from being eroded by the oxygen ($O_2$) contained in the reaction gas used to form the insulating layer 43. It is desired that the insulating layer 43 be 0.01 to 0.1 μm thick if it is made of silicon oxide. So long as its thickness remains within this range, the layer 43 is not broken when the carbon layer 41 is subjected to ashing. The most preferable thickness for the insulating layer 43 depends on the material of the insulating layer 43.

Then, the wires W2 are formed in the same way as the wires W1 are formed. To be more specific, as shown in FIG. 57, a carbon layer 44 is formed by sputtering on the insulating layer 43. The carbon layer 44 is as thick as wires W2. Further, a mask layer (e.g., a silicon oxide layer or a silicon nitride layer) is formed on the carbon layer 44 by sputtering to a thickness of about 0.05 $\mu$m.

The mask layer is patterned by PEP (Photo Engraving Process) and anisotropic etching. The carbon layer 44 and the insulating layer 43 are subjected to anisotropic etching, which is accomplished by using the patterned mask layer as the mask, whereby slits are made in the carbon layer. The mask layer is removed, and the trough-shaped barrier layers 34a and 34b are formed by sputtering or CVD on the carbon layer 44 and on the bottom and inner surfaces of each slit made in the carbon layer 44. Each barrier layer is composed of a titanium layer and a titanium nitride layer provided on the titanium layer. Further, conductors 35a and 35b made of copper, aluminum alloy or the like are formed by sputtering or CVD in the barrier layers 34a and 34b, respectively.

Chemical mechanical polishing (CMP) is performed, leaving the barrier layers 34a and 34b and the conductors 35a and 35b in the slits made in the carbon layer 44. As a result, the wires W2 are formed. The CMP may be replaced by anisotropic etching or isotropic etching, to form the wires W2.

The insulating layer 37 (e.g., a silicon oxide layer) is formed by sputtering on the carbon layer 44 and the wires W2. It is desired that the insulating layer 37 be 0.01 to 0.1 $\mu$m thick if it is made of silicon oxide. So long as its thickness remains within this range, the layer 37 is not broken when the carbon layer 44 is subjected to ashing. The optimal thickness for the insulating layer 37 depends on the material of the layer 73.

Then, as illustrated in FIGS. 58 and 59, the carbon layers 41 and 44 are simultaneously ashed by heat treatment in an oxygen atmosphere or by oxygen plasma process. The carbon layer 41 is thereby changed into cavities 40, and the carbon layer 44 changed into cavities 38. The cavities 38 and 40 are filled with a mixture gas of mainly oxygen ($O_2$) and carbon dioxide ($CO_2$).

The cavities 31, 38 and 40 may be filled with air, not the mixture gas. This can be accomplished by opening the cavities 31, 38 and 40 to the atmosphere or by supplying air into the cavities 31, 38 and 40 through holes made in the device package.

In the method explained, carbon layers are used as insulating layers having slits, for forming the wires W1 and the wires W2. The carbon layers are ashed after the wires W1 and W2 are formed, and are thereby changed into gas-filled cavities. Further, a carbon layer having via holes is used an insulating layer to form conductors 33a and 33b (i.e. contact plugs), and is ashed after the conductors 33a and 33b are formed in the via holes, thereby forming gas-filled cavities.

Thus, a semiconductor device can be manufactured, in which the spaces among the wires located at the same level are filled with air or a mixture gas of oxygen ($O_2$) and carbon dioxide ($CO_2$), and the spaces among the wires located at different levels are also filled with air or a mixture gas of oxygen ($O_2$) and carbon dioxide ($CO_2$).

Furthermore, each carbon layer can be ashed fast and precisely since the mask layer is removed after the carbon layer is patterned and before the carbon layer is ashed.

Figure 60:
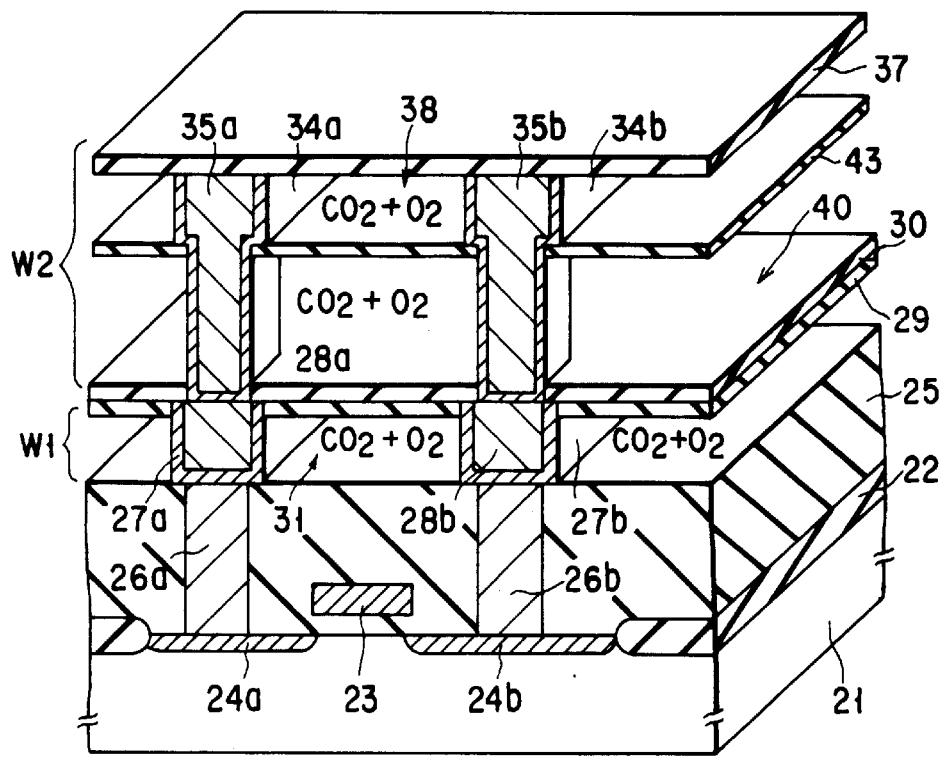
FIG. 60 is a perspective, sectional view of a semiconductor device according to an eighth embodiment of the present invention.

FIG. 60 illustrates a semiconductor device according to the eighth embodiment of the invention.

As shown in FIG. 60, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), or phosphor silicate glass (PSG), or the like. The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. Each wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is mounted an insulating layer 29, on which provided is an insulating layer 30. Hence, the wires W1 support the insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W1; it is made of silicon oxide, silicon nitride or the like. The insulating layer 30 is an important component, defining the cavities 31 and serving as a base on which some layers will be mounted. The layer 30 is made of silicon oxide or the like.

The insulating layer 30 has contact holes which reach the wires W1. Wires W2 are provided, each having its lower end fitted in the contact holes of the insulating layer 30. Each wire W2 is comprised of a conductor and a barrier layer covering the bottom and sides of the conductor. More specifically, one wire W2 is made of a conductor 35a and a barrier layer 34a, and another wire W2 is made of a conductor 35b and a barrier layer 34b. The barrier layers 34a and 34b are two-layered members, each consisting of, for example, a titanium layer and a titanium nitride layer. The conductors 35a and 35b are made of copper, aluminum alloy or the like. They can be made of other material, for example, semiconductor such as polysilicon containing an impurity, or high-melting metal such as tungsten.

As seen from FIG. 60, each wire W2 consists of a columnar lower portion and a strip-shaped upper portion. The wires W2 support an insulating layer 43 (e.g., a silicon oxide layer), each at the junction between the lower and upper portions.

On the wires W2 there is mounted an insulating layer 37. Cavities 40 are provided among the lower portions of the wires W2 and between the insulating layers 30 and 43. The cavities 40 are filled with a mixture gas of mainly oxygen ($O_2$) and carbon dioxide ($CO_2$). Further, cavities 38 are provided among the upper portions of the wires W2 and between the insulating layers 37 and 43. The cavities 38 are filled with a mixture gas of mainly oxygen ($O_2$) and carbon dioxide ($CO_2$).

The cavities 31, 38 and 40 may be filled with air, not the mixture gas. This can be accomplished by opening the cavities 31, 38 and 40 to the atmosphere or by supplying air into the cavities 31, 38 and 40 through holes made in the device package.

As shown in FIG. 60, the cavities 31 provided among the wires W1, and the cavities 38 provided among the upper portions of the wires W2 are filled with the mixture gas of oxygen ($O_2$) and carbon dioxide ($CO_2$). Alternatively, the cavities 31 and 38 may be filled with air. Further, the cavities 40 provided among the lower portions of the wires W2 are filled with air or the mixture gas. The mixture gas and air have a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

It will be explained how the device illustrated in FIG. 60 is manufactured, with reference to FIGS. 61 to 66.

Figure 61:
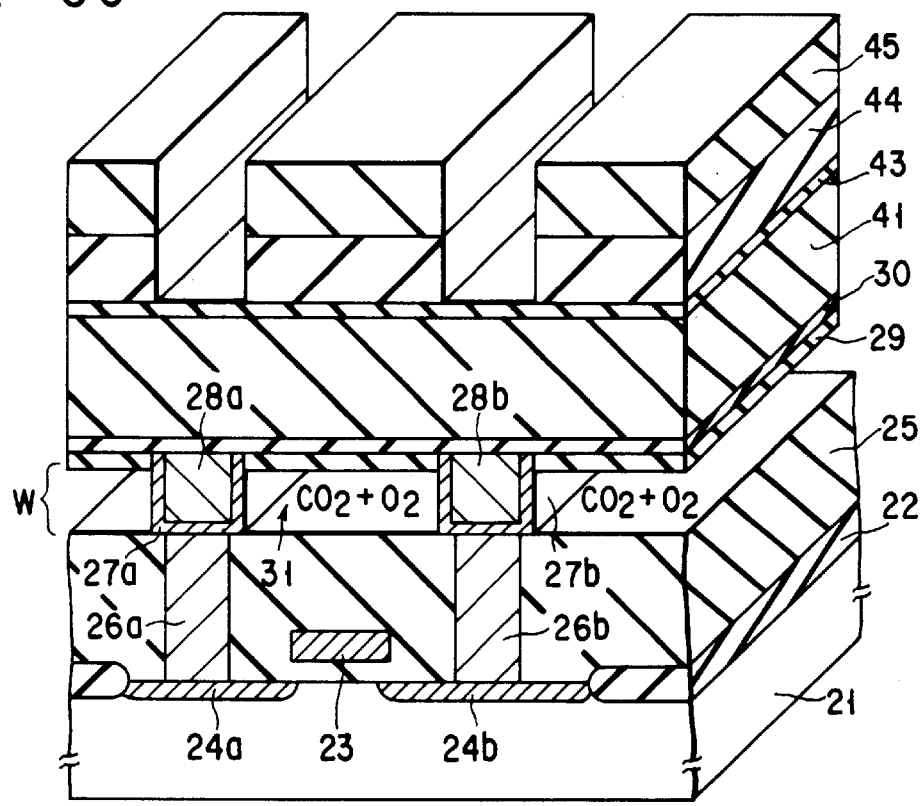

First, the structure shown in FIG. 61 is prepared by performing the same steps as carried out until the wires W1 are formed in the manufacture of the second embodiment.

That is, the field oxide layer 22 is formed on the semiconductor substrate 21 by LOCOS method, as is illustrated in FIG. 54. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. Alternatively, the contact holes may be filled with other electrically conductive material other than high-melting metal.

Then, a carbon layer is formed on the insulating layer 25 by sputtering. The carbon layer is as thick as wires to be formed to be formed in an LSI, for example about 0.2 to 0.7 μm. Further, a mask layer 29 (e.g., a silicon oxide layer or a silicon nitride layer) is formed on the carbon layer by sputtering to a thickness of about 0.05 μm.

A resist is coated on the mask layer 29 and patterned by PEP (Photo Engraving Process). Using the patterned resist as the mask, the mask layer 29 is patterned. The resist is removed from the mask layer 42 patterned. The carbon layer is subjected to anisotropic etching, which is accomplished by using the patterned mask layer 29 as the mask. As a result, slits are made in the carbon layer. It should be noted that the carbon layer is not etched by PEP, but etched by using the PEP-patterned mask layer, for the same reason stated in the explanation of the method of manufacturing the second embodiment.

If the conductors 26a and 26b are made of high-melting metal, it is desirable to use a mask polished by PEP to etch the carbon layer. If the conductors 26a and 26b are made of material which is resistant to $H_2SO_4$ and $H_2O_2$, it is advisable to use a resist as the mask to etch the carbon layer.

Thereafter, the mask layer 29 is removed, and the trough-shaped barrier layers 27a and 27b are formed by sputtering or CVD on the carbon layer and on the bottom and inner surfaces of each slit made in the carbon layer. Each barrier layer is composed of a titanium layer and a titanium nitride layer provided on the titanium layer. Further, conductors 28a and 28b made of copper, aluminum alloy or the like are formed by sputtering or CVD in the barrier layers 27a and 27b, respectively. The conductors 28a and 28b may be replaced by, for example, those made of semiconductor such as polysilicon layer or high-melting metal such as tungsten.

Chemical mechanical polishing (CMP) is performed, leaving the barrier layers 27a and 27b and the conductors 28a and 28b in the slits made in the carbon layer. As a result, the wires W1 are formed. The CMP may be replaced by anisotropic etching or isotropic etching, to form the wires W1.

The insulating layer 30 (e.g., a silicon oxide layer) is then formed by sputtering on the mask layer 30 and the wires W1. The insulating layer 30 should better be formed by means of sputtering, not by CVD,, because the carbon layer would be eroded by the oxygen $O_2$ contained in the reaction gas applied in CVD to form the insulating layer 30. It is desired that the layer 30 be 0.01 to 0.1 μm thick if it is made of silicon oxide. So long as its thickness remains within this range, the layer 30 is not broken when the carbon layer is ashed. The thickness best for the insulating layer 30 depends on the material of the layer 30.

Then, the carbon layer is ashed, forming cavities 31 which are filled with a mixture gas of mainly oxygen ($O_2$) and carbon dioxide ($CO_2$). A carbon layer 41 is formed by sputtering on the insulating layer 30, after the wires W1 have been formed. Further, an insulating layer 43 (e.g., a silicon oxide layer or a silicon nitride layer) is formed on the carbon layer 41 by sputtering to a thickness of about 0.05 μm. The insulating layer 43 should better be formed by means of sputtering, not by CVD, because the carbon layer would be eroded by the oxygen $O_2$ contained in the reaction gas applied in CVD to form the insulating layer 43. The layer 43 should be 0.01 to 0.1 μm thick if it is made of silicon oxide. So long as its thickness remains within this range, the layer 43 is not broken when the carbon layer is ashed. The thickness most desirable for the insulating layer 43 depends on the material of the layer 43.

Next, a carbon layer 44 is formed on the insulating layer 43 by sputtering. The carbon layer 44 is patterned, forming slits in the layer 44. The carbon layer 44 may be patterned by one of two alternative methods. The first is to perform PEP (Photo Engraving Process) and RIE. The second is to perform PEP and use a mask prepared by RIE.

In the present embodiment, the carbon layer 44 is patterned by means of PEP and RIE. More specifically, a resist 45 is formed on the carbon layer 44 and is patterned, anisotropic etching is carried out on the carbon layer 44, by using the resist 45 as the mask, thereby forming slits in the layer 44. Next, $H_2SO_4$ and $H_2O_2$ are applied, removing the resist 45. It should be noted that the resist 45 is not removed by oxygen plasma process, which would erode the carbon layer 44.

Figure 62:
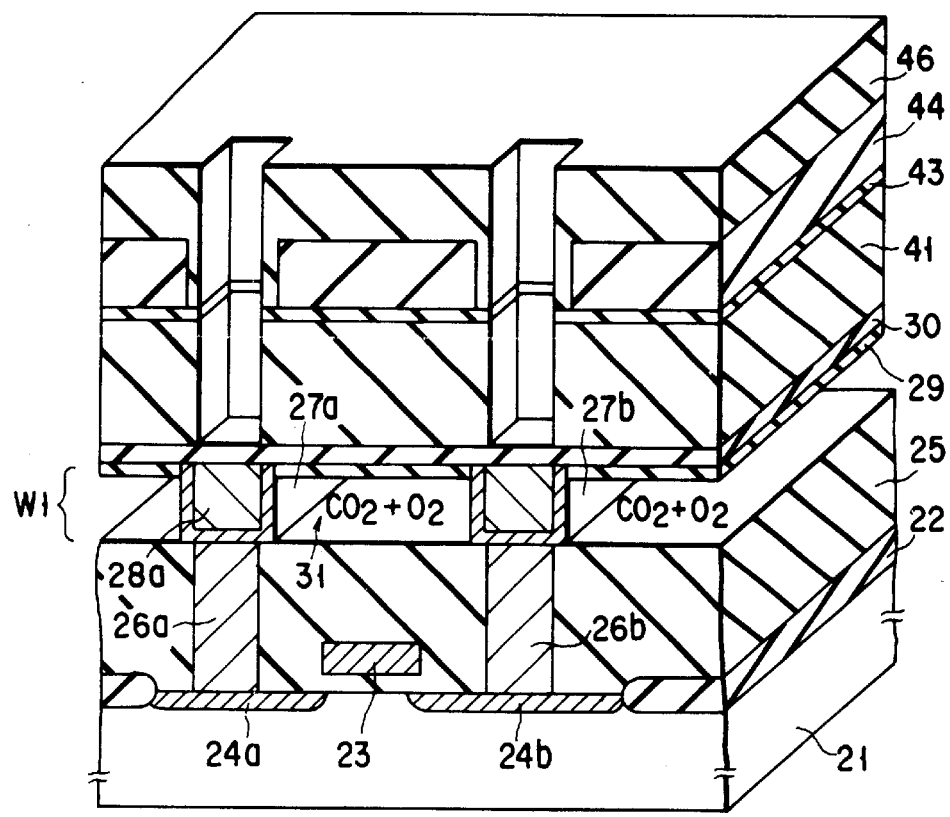

Thereafter, as shown in FIG. 62, a resist 46 is formed on the carbon layer 44 and patterned. Using the resist 46 as the mask, anisotropic etching is conducted on the insulating layer 43 and the carbon layer 41, thus forming via holes in these layers 43 and 41. This done, $H_2SO_4$ and $H_2O_2$ are applied, removing the resist 46. The resist 45 is not removed by oxygen plasma process, which would erode the carbon layer 44.

Figure 63:
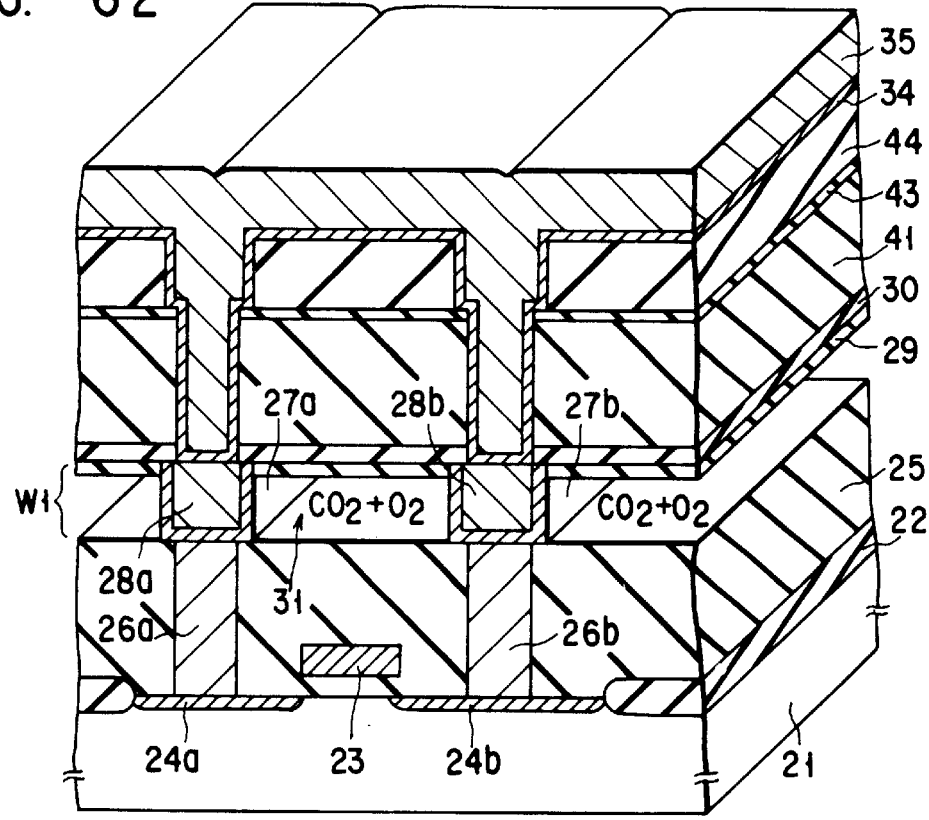

As shown in FIG. 63, the insulating layer 30 is subjected to anisotropic etching, thereby forming via holes in the layer 30, which reach the wires W1. A barrier layer 34 comprised of, for example, a titanium layer and a titanium nitride is formed by sputtering or CVD, in the via holes of the layer 30, the via holes of the carbon layer 41, the via holes of the insulating layer 43 and the slits of the carbon layer 44 and on the carbon layer 44. Further, a conductor 35 made of copper, aluminum alloy or the like is formed on the barrier layer 34 by either sputtering or CVD.

Next, as illustrated in FIG. 64, chemical mechanical polishing (CMP) or etching is performed on the barrier layer 34 and the conductor 35, thereby forming barrier layers 34a and 34b and conductors 35a and 35b—all in the via holes of the insulating layer 30, carbon layer 41 and insulating layer 43 and in the slits of the carbon layer 44. Thus, wires W2 are provided, each consisting of a barrier layer and a conductor.

Further, an insulating layer 37 (e.g., a silicon oxide layer) is formed on the carbon layer 44 by sputtering to a thickness of about 0.05 μm. The insulating layers 37 and 43 should be 0.01 to 0.1 μm thick if they are made of silicon oxide. So long as their thickness remains within this range, the layers 37 and 43 are not broken when the carbon layers 41 and 44 are ashed. The thickness most desirable for the insulating layers 37 and 43 depends on the materials of the layers 37 and 43.

Then, as shown in FIGS. 65 and 66, the carbon layers 41 and 44 are simultaneously ashed by heat treatment in an oxygen atmosphere or by oxygen plasma process. The carbon layer 41 is thereby changed into cavities 40, and the carbon layer 44 changed into cavities 38. The cavities 38 and 40 are filled with a mixture gas of mainly oxygen ($O_2$) and carbon dioxide ($CO_2$).

The cavities 31, 38 and 40 may be filled with air, not the mixture gas. This can be accomplished by opening the cavities 31, 38 and 40 to the atmosphere or by supplying air into the cavities 31, 38 and 40 through holes made in the device package.

In this method, carbon layers are used as insulating layers having slits or via holes, for forming the wires W1 and the wires W2. They are ashed after the wires W1 and W2 are formed in the slits and via holes, thereby forming gas-filled cavities. In addition, the method has far less steps than the methods according to the second to seventh embodiments since the wires W2 are directly connected to the wires W1, without using contact plugs.

Hence, a semiconductor device can be manufactured, in which the spaces among the wires located at the same level are filled with air or a mixture gas or oxygen ($O_2$) and carbon dioxide ($CO_2$), and the spaces among the wires located at different levels are also filled with air or a mixture gas of oxygen ($O_2$) and carbon dioxide ($CO_2$).

FIG. 67 depicts a semiconductor device according to the ninth embodiment of the present invention.

As FIG. 67 shows, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), or phosphor silicate glass (PSG), or the like. The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. Each wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is mounted an insulating layer 30. Thus, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted. The layer 30 is made of silicon oxide or the like.

The insulating layer 30 has contact holes which reach the wires W1. Wires W2 are provided, each having its lower end fitted in the contact holes of the insulating layer 30. Each wire W2 is comprised of a conductor and a barrier layer covering the bottom and sides of the conductor. More specifically, one wire W2 is made of a conductor 35a and a barrier layer 34a, and another wire W2 is made of a conductor 35b and a barrier layer 34b. The barrier layers 34a and 34b are two-layered members, each consisting of, for example, a titanium layer and a titanium nitride layer. The conductors 35a and 35b are made of copper, aluminum alloy or the like. They can be made of other material, for example, semiconductor such as polysilicon containing an impurity, or high-melting metal such as tungsten.

As seen from FIG. 67, each wire W2 consists of a columnar lower portion and a strip-shaped upper portion. The wires W2 support an insulating layer 43 (e.g., a silicon oxide layer), each at the junction between the lower and upper portions.

On the wires W2 there is mounted an insulating layer 37. Cavities 40 are provided among the lower portions of the wires W2 and between the insulating layers 30 and 43. The cavities 40 are filled with a mixture gas of mainly oxygen ($O_2$) and carbon dioxide ($CO_2$). Further, cavities 38 are provided among the upper portions of the wires W2 and between the insulating layers 37 and 43. The cavities 38 are filled with a mixture gas of mainly oxygen ($O_2$) and carbon dioxide ($CO_2$).

The cavities 31, 38 and 40 may be filled with air, not the mixture gas. This can be achieved by opening the cavities 31, 38 and 40 to the atmosphere or by supplying air into the cavities 31, 38 and 40 through holes made in the device package.

As shown in FIG. 67, the cavities 31 provided among the wires W1, and the cavities 38 provided among the upper portions of the wires W2 are filled with the mixture gas of oxygen ($O_2$) and carbon dioxide ($CO_2$). Alternatively, the cavities 31 and 38 may be filled with air. Further, the cavities 40 provided among the lower portions of the wires W2 are filled with air or the mixture gas. The mixture gas and air have a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

It will be explained how the device illustrated in FIG. 67 is manufactured, with reference to FIGS. 68 to 73.

First, the structure shown in FIG. 67 is prepared by performing the same steps as carried out until the wires W1 are formed on the insulating layer 25 in the manufacture of the third embodiment.

That is, the field oxide layer 22 is formed on the semiconductor substrate 21 by LOCOS method. A MOS transistor having a gate electrode 23, a source region 24*a* and a drain region 24*b* is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is made flat by chemical mechanical polishing (CMP). PEP (Photo Engraving Process) is conducted, forming in the layer 25 contact holes which reach the source region 24*a* and drain region 24*b* of the MOS transistor. The conductors 26*a* and 26*b* made of high-melting metal such as tungsten are formed by selective growth in the contact holes of the insulating layer 25. Alternatively, the contact holes may be filled with other electrically conductive material other than high-melting metal.

Then, a carbon layer is formed on the insulating layer 25 by sputtering. The carbon layer is as thick as wires to be formed to be formed in an LSI, for example about 0.2 to 0.7 $\mu$m. Further, a mask layer (e.g., a silicon oxide layer or a silicon nitride layer) is formed on the carbon layer by sputtering to a thickness of about 0.05 $\mu$m. The mask layer is patterned. The carbon layer is subjected to anisotropic etching, which is accomplished by using the patterned mask layer as the mask. As a result, slits are made in the carbon layer. The carbon layer is not etched by PEP, but etched by using the PEP-patterned mask layer, for the same reason stated in the explanation of the method of manufacturing the second embodiment.

Therefore, if the conductors 26*a* and 26*b* are made of high-melting metal, it is desirable to use a mask polished by PEP to etch the carbon layer. If the conductors 26*a* and 26*b* are made of material which is resistant to H2SO4 and $H_2O_2$, it is advisable to use a resist as the mask to etch the carbon layer.

Thereafter, the mask layer is removed, and the trough-shaped barrier layers 27*a* and 27*b* are formed by sputtering or CVD on the carbon layer and on the bottom and inner surfaces of each slit made in the carbon layer. Each barrier layer is composed of a titanium layer and a titanium nitride layer provided on the titanium layer. Further, conductors 28*a* and 28*b* made of copper, aluminum alloy or the like are formed by sputtering or CVD in the barrier layers 27*a* and 27*b*, respectively. The conductors 28*a* and 28*b* may be replaced by, for example, those made of semiconductor such as polysilicon layer or high-melting metal such as tungsten.

Chemical mechanical polishing (CMP) is performed, leaving the barrier layers 27*a* and 27*b* and the conductors 28*a* and 28*b* in the slits made in the carbon layer. As a result, the wires W1 are formed. The CMP may be replaced by anisotropic etching or isotropic etching, to form the wires W1.

The insulating layer 30 (e.g., a silicon oxide layer) is then formed by sputtering on the carbon layer and the wires W1. The insulating layer 30 should better be formed by means of sputtering, not by CVD, because the carbon layer would be eroded by the oxygen $O_2$ contained in the reaction gas applied in CVD to form the insulating layer 30. It is desired that the layer 30 be 0.01 to 0.1 $\mu$m thick if it is made of silicon oxide. So long as its thickness remains within this range, the layer 30 is not broken when the carbon layer is ashed. The thickness best for the insulating layer 30 depends on the material of the layer 30.

Thereafter, the carbon layer is ashed, forming cavities 31 which are filled with a mixture gas of mainly oxygen ($O_2$) and carbon dioxide ($CO_2$) as is illustrated in FIG. 68. A carbon layer 41 is formed by sputtering on the insulating layer 30, after the wires W1 have been formed. Further, an insulating layer 43 (e.g., a silicon oxide layer or a silicon nitride layer) is formed on the carbon layer 41 by sputtering to a thickness of about 0.05 $\mu$m. The insulating layer 43 should better be formed by means of sputtering, not by CVD, because the carbon layer would be eroded by the oxygen ($O_2$) contained in the reaction gas applied in CVD to form the insulating layer 43. The insulating layer 43 should be 0.01 to 0.1 $\mu$m thick if it is made of silicon oxide. So long as its thickness remains within this range, the layer 43 is not broken when the carbon layer is ashed. The thickness most desirable for the insulating layer 43 depends on the material of the layer 43.

Next, a carbon layer 44 is formed on the insulating layer 43 by sputtering. The carbon layer 44 is patterned, forming slits in the layer 44. The carbon layer 44 may be patterned by one of two alternative methods. The first is to perform PEP (Photo Engraving Process) and RIE. The second is to perform PEP and use a mask prepared by RIE.

In the present embodiment, the carbon layer 44 is patterned by means of PEP and RIE. More specifically, a resist 45 is formed on the carbon layer 44 and is patterned, anisotropic etching is carried out on the carbon layer 44, by using the resist 45 as the mask, thereby forming slits in the layer 44. $H_2SO_4$ and $H_2O_2$ are applied, removing the resist 45. It should be noted that the resist 45 is not removed by oxygen plasma process, which would erode the carbon layer 44.

Then, as shown in FIG. 69, a resist 46 is formed on the carbon layer 44 and patterned. Using the resist 46 as the mask, anisotropic etching is conducted on the insulating layer 43 and the carbon layer 41, thus forming via holes in these layers 43 and 41. This done, $H_2SO_4$ and $H_2O_2$ are applied, removing the resist 46. The resist 45 is not removed by oxygen plasma process, which would erode the carbon layer 44.

As shown in FIG. 70, the insulating layer 30 is subjected to anisotropic etching, thereby forming via holes in the layer 30, which reach the wires W1. A barrier layer 34 comprised of, for example, a titanium layer and a titanium nitride is formed by sputtering or CVD, in the via holes of the layer 30, the via holes of the carbon layer 41, the via holes of the insulating layer 43 and the slits of the carbon layer 44 and on the carbon layer 44. Further, a conductor 35 made of copper, aluminum alloy or the like is formed on the barrier layer 34 by either sputtering or CVD.

Next, as seen from FIG. 71, chemical mechanical polishing (CMP) or etching is performed on the barrier layer 34 and the conductor 35, thereby forming barrier layers 34*a* and 34*b* and conductors 35*a* and 35*b*—all in the via holes of the insulating layer 30, carbon layer 41 and insulating layer 43 and in the slits of the carbon layer 44. Thus, wires W2 are provided, each consisting of a barrier layer and a conductor.

Further, an insulating layer 37 (e.g., a silicon oxide layer) is formed on the carbon layer 44 by sputtering to a thickness of about 0.05 μm. The insulating layers 37 and 43 should be 0.01 to 0.1 μm thick if they are made of silicon oxide. So long as their thickness remains within this range, the insulating layers 37 and 43 are not broken when the carbon layers 41 and 44 are ashed. The thickness most desirable for the insulating layer 37 and the thickness optimal for the insulating layer 43 depend on the materials of the layers 37 and 43.

Figure 72:
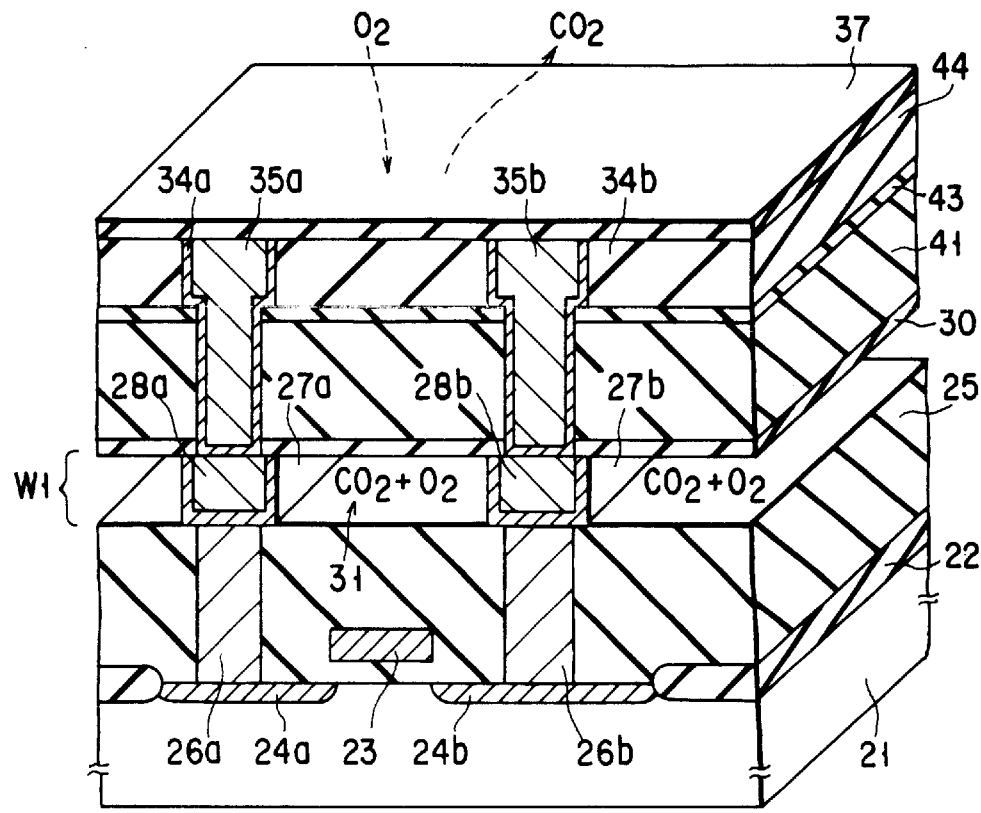
Figure 73:
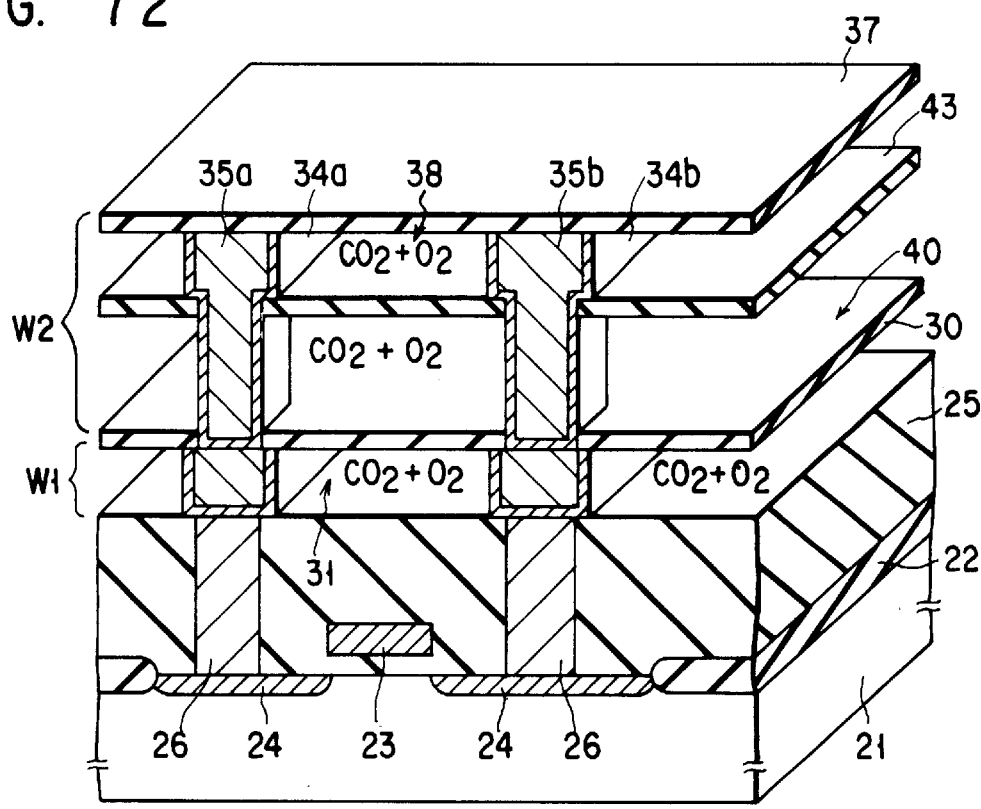

Then, as shown in FIGS. 72 and 73, the carbon layers 41 and 44 are simultaneously ashed by heat treatment in an oxygen atmosphere or by oxygen plasma process. The carbon layer 41 is thereby changed into cavities 40, and the carbon layer 44 changed into cavities 38. The cavities 38 and 40 are filled with a mixture gas of mainly oxygen ($O_2$) and carbon dioxide ($CO_2$).

The cavities 31, 38 and 40 may be filled with air, not the mixture gas. This can be accomplished by opening the cavities 31, 38 and 40 to the atmosphere or by supplying air into the cavities 31, 38 and 40 through holes made in the device package.

In the method described above, carbon layers are used as insulating layers having slits or via holes, for forming the wires W1 and the wires W2. They are ashed after the wires W1 and W2 are formed in the slits and the via holes, thereby forming gas-filled cavities. In addition, the method has far less steps than the methods according to the second to seventh embodiments since the wires W2 are directly connected to the wires W1, without using contact plugs.

Hence, a semiconductor device can be manufactured, in which the spaces among the wires located at the same level are filled with air or a mixture gas of oxygen ($O_2$) and carbon dioxide ($CO_2$), and the spaces among the wires located at different levels are also filled with air or a mixture gas of oxygen ($O_2$) and carbon dioxide ($CO_2$).

Furthermore, each carbon layer can be ashed fast and precisely since the mask layer is removed after the carbon carbon layer is patterned and before the carbon layer is ashed.

FIGS. 74 to 76 illustrate a semiconductor device according to the tenth embodiment of the invention. As shown in FIGS. 74 and 75, the device is provided in the form of a chip 48 which is formed in a wafer 47, along with other identical semiconductor devices.

The semiconductor device will be described in detail, with reference to FIG. 76.

As seen from FIG. 76, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. Each wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is mounted an insulating layer 29, on which an insulating layer 30 is mounted. Thus, the wires W1 support the insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W1; it is made of silicon oxide, silicon nitride or the like. The insulating layer 30 is an important component, defining the cavities 31 and serving as a base on which some layers will be mounted. The layer 30 is made of silicon oxide or the like and has contact holes.

An insulating layer 32 is provided on the insulating layer 30. The insulating layer 32 has contact holes which reach the wires W1. Conductors 33a and 33b are provided in the contact holes of the insulating layers 30 and 32. The conductors 33a and 33b are made of high-melting metal such as tungsten. Nonetheless, they may be made of other material.

Wires W2 are provided on the insulating layer 32 and connected to the conductors 33a and 33b. Each wire W2 is comprised of a conductor and a barrier layer covering the bottom and sides of the conductor. More specifically, one wire W2 is made of a conductor 35a and a trough-shaped barrier layer 34a, and another wire W2 is made of a conductor 35b and a trough-shaped barrier layer 34b. The barrier layers 34a and 34b are two-layered members, each consisting of, for example, a titanium layer and a titanium nitride layer. The conductors 35a and 35b are made of copper, aluminum alloy or the like. They can be made of other material, for example, semiconductor such as polysilicon containing an impurity, or high-melting metal such as tungsten.

An insulating layer 37 is provided on the wires W2. An insulating layer 36 is provided on the lower surface of the insulating layer 37, with its upper surface located in flush with the tops of the wires W2. Thus, the wires W2 support both insulating layers 36 and 37. Cavities 38 are provided among the wires W2. They are filled with a mixture gas of mainly oxygen ($O_2$) and carbon dioxide ($CO_2$). The insulating layer 36 determines the pattern of wires W2; it is made of silicon oxide, silicon nitride or the like. The insulating layer 37 is an important component, defining the cavities 31 and serving as a base on which some layers will be mounted. The layer 30 is made of silicon oxide or the like.

As shown in FIG. 75, guard rings G are provided, each surrounding one chip 48. As illustrated in FIG. 76, each guard ring G is composed of a barrier layer 27c and a conductor 28c which are provided in a cavity 31, a barrier layer 34c and a conductor 35c which are provided in a cavity 38, and a conductor 33c which is provided in the insulating layers 30 and 32. The conductor 33c provided in the layers 30 and 32 may be dispensed with, as is illustrated in FIG. 77.

The cavities 31 among the wires W1 and the cavities 38 among the wires W2 are filled with a mixture gas of mainly oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces are filled with insulating layers made of silicon oxide or the like.

In addition, water will not flow through the cavities 31 or 38 to reach the wires W1 or W2 after the chip 48 is cut from the wafer 47. This is because the chip 48 is protected by the guard ring G which surrounds the chip 48.

The semiconductor device shown in FIG. 76 can easily be manufactured by the same method as the device according to the second embodiment.

Figure 79:
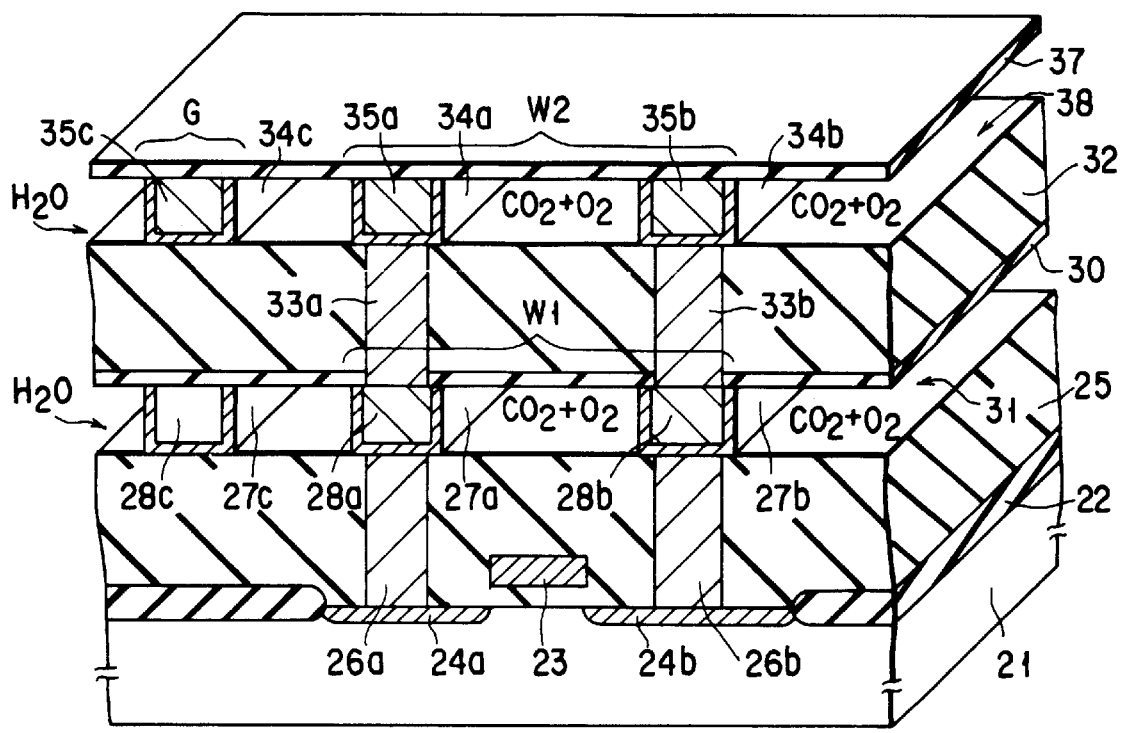
FIG. 79 is another perspective, sectional view of a semiconductor device according to the eleventh embodiment of the invention.

FIGS. 78 and 79 show a semiconductor device according to the eleventh embodiment of the present invention.

As illustrated in FIG. 74, the device is provided in the form of a chip 48 which is formed in a wafer 47, along with other identical semiconductor devices.

The semiconductor device according to the eleventh embodiment will be described in detail, with reference to FIG. 78.

As seen from FIG. 78, a field oxide layer 22 (e.g., a silicon oxide layer) is provided on a semiconductor substrate 21 (e.g., a silicon wafer).The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer.25 is made of, for example, borophospho silicate glass (BPSG), phosphor silicate glass (PSG), or the like. The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten or tantalum.

On the wires W1 there is mounted an insulating layer 30. Thus, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted. The layer 30 is made of silicon oxide or the like and has contact holes.

An insulating layer 32 is provided on the insulating layer 30. The insulating layer 32 has contact holes which reach the wires W1. Conductors 33a and 33b are provided in the contact holes of the insulating layers 30 and 32. The conductors 33a and 33b are made of high-melting metal such as tungsten. Nonetheless, they may be made of other material.

Wires W2 are provided on the insulating layer 32 and connected to the conductors 33a and 33b. Each wire W2 is comprised of a conductor and a barrier layer covering the bottom and sides of the conductor. More specifically, one wire W2 is made of a conductor 35a and a trough-shaped barrier layer 34a, and another wire W2 is made of a conductor 35b and a trough-shaped barrier layer 34b. The barrier layers 34a and 34b are two-layered members, each consisting of, for example, a titanium layer and a titanium nitride layer. The conductors 35a and 35b are made of copper, aluminum alloy or the like. They can be made of other material, for example, semiconductor such as polysilicon containing an impurity, or high-melting metal such as tungsten or tantalum.

An insulating layer 37 is provided on the wires W2. Thus, the wires W2 support insulating layer 37. Cavities 38 are provided among the wires W2. They are filled with a mixture gas of mainly oxygen ($O_2$) and carbon dioxide ($CO_2$). The insulating layer 37 is an important component, defining the cavities 38 and serving as a base on which some layers will be mounted. The layer 37 is made of silicon oxide or the like.

As shown in FIG. 75, guard rings G are provided, each surrounding one chip 48. As illustrated in FIG. 78, each guard ring G is composed of a barrier layer 27c and a conductor 28c which are provided in a cavity 31, a barrier layer 34c and a conductor 35c which are provided in a cavity 38, and a conductor 33c which is provided in the insulating layers 30 and 32. The barrier layer 27c and the conductor 28c, both provided in the cavity 31, constitute the same structure as the wires W1. Similarly, the barrier layer 34c and the conductor 35c, both provided in the cavity 38, constitute the same structure as the wires W2. Further, the barrier layer 33c provided in the insulating layers 30 and 32 has the same structure as the conductors 33a and 33c (i.e., contact plugs). The conductor 33c provided in the layers 30 and 32 may be dispensed with, as is illustrated in FIG. 79.

In the semiconductor device shown in FIG. 78, the cavities 31 among the wires W1 and the cavities 38 among the wires W2 are filled with a mixture gas of mainly oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces are filled with insulating layers made of silicon oxide or the like.

Moreover, no water will flow from the edges of the chip 48 through the cavities 31 or 38 to reach the wires W1 or W2 after the chip 48 is cut from the wafer 47. This is because the guard ring G surrounds and protects the wires W1 and W2.

The semiconductor device shown in FIG. 78 can be easily manufactured by the same method as the device according to the third embodiment.

Figure 80:
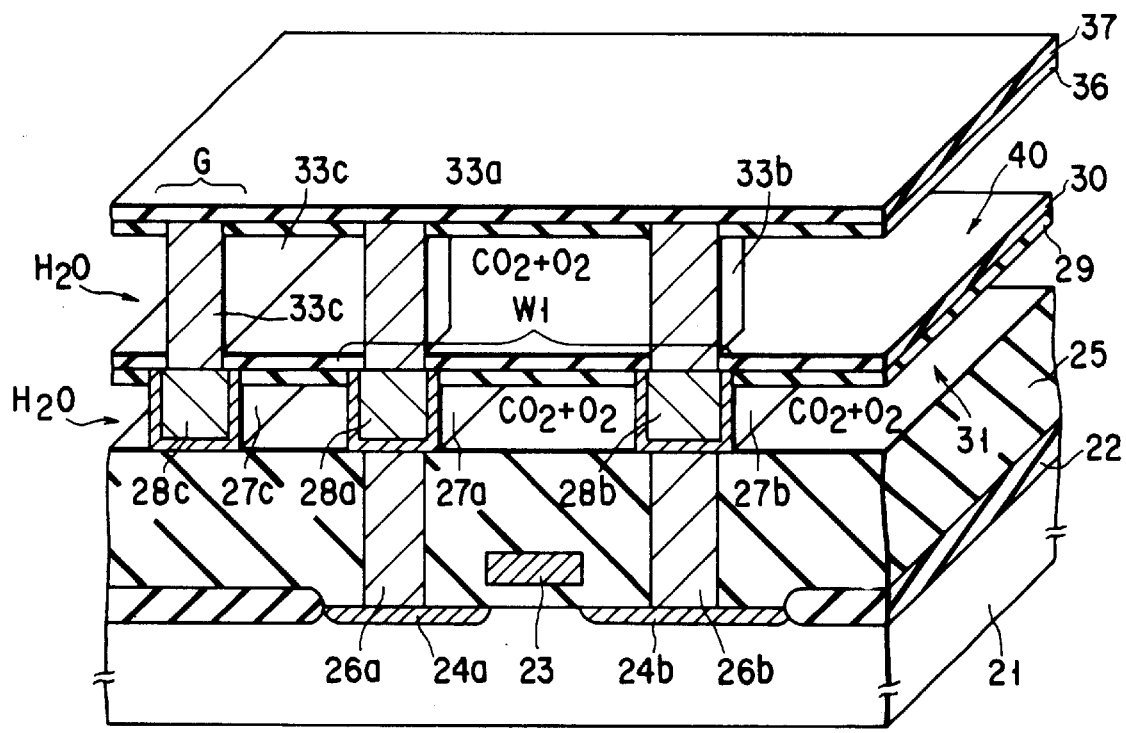
FIG. 80 is a perspective, sectional view of a semiconductor device according to the twelfth embodiment of the invention.

FIG. 80 illustrates a semiconductor device according to the twelfth embodiment of the invention. As seen from FIG. 74, the device is provided in the form of a chip 48 which is formed in a wafer 47, along with other identical semiconductor devices.

The semiconductor device according to the twelfth embodiment will be described in detail, with reference to FIG. 80.

As shown in FIG. 80, a field oxide layer 22 (e.g., a silicon oxide layer) is provided on a semiconductor substrate 21

(e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is mounted an insulating layer 29, on which an insulating layer 30 is mounted. Thus, the wires W1 support the insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W1; it is made of silicon oxide, silicon nitride or the like. The insulating layer 30 is an important component, defining the cavities 31 and serving as a base on which some layers will be mounted. The layer 30 is made of silicon oxide or the like.

The insulating layer 30 has contact holes which reach the wires W1. Columnar conductors 33a and 33b made of high-melting metal such as tungsten are provided, extending vertically, each having its lower end fitted in the contact holes of the insulating layer 30. The conductors 33a and 33b can be made of other electrically conductive material.

On the conductors 33a and 33b there is provided an insulating layer 36, on which an insulating layer 37 is mounted. Hence, the conductors 33a and 33b support the insulating layers 36 and 37. Cavities 40 are provided among the columnar conductors 33a and 33b. The cavities 40 are filled with a mixture gas of mainly oxygen ($O_2$) and carbon dioxide ($CO_2$). The insulating layer 36 determines the positions and cross-sectional areas of the conductors 33a and 33b; it is made of silicon oxide or silicon nitride. The insulating layer 37 is an important component, defining the cavities 40 and functioning as a base on which some layers will be mounted. The layer 37 is made of silicon oxide or the like.

As shown in FIG. 75, guard rings G are provided, each surrounding one chip 48. As illustrated in FIG. 80, each guard ring G is composed of a barrier layer 27c and a conductor 28c which are provided in a cavity 31 and a conductor 33c which is provided in the cavity 40. The barrier layer 27c and the conductor 28c, both provided in the cavity 31, constitute the same structure as the wires W1. The barrier layer 33c provided in the cavity 40 has the same structure as the conductors 33a and 33c (i.e., contact plugs).

In the semiconductor device shown in FIG. 80, the cavities 31 among the wires W1 and the cavities 40 among the columnar conductors 33a and 33b (i.e., contact plugs) are filled with a mixture gas of mainly oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces are filled with insulating layers made of silicon oxide or the like.

Additionally, no water will flow from the edges of the chip 48 through the cavities 31 or 40 to reach the wires W1 or the columnar conductors 33a and 33b after the chip 48 is cut from the wafer 47. This is because the guard ring G surrounds and protects the wires W1 and the conductors 33a and 33b.

The semiconductor device shown in FIG. 80 can be easily manufactured by the same method as the device according to the fourth embodiment.

FIG. 81 illustrates a semiconductor device according to the thirteenth embodiment of the invention.

As seen from FIG. 74, the device is provided in the form of a chip 48 which is formed in a wafer 47, along with other identical semiconductor devices.

The semiconductor device according to the thirteenth embodiment will be described in detail, with reference to FIG. 81.

As shown in FIG. 81, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example; a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is mounted an insulating layer 30. Thus, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted. The layer 30 is made of silicon oxide or the like.

The insulating layer 30 has contact holes which reach the wires W1. Columnar conductors 33a and 33b made of high-melting metal such as tungsten are provided, extending vertically, each having its lower end fitted in the contact holes of the insulating layer 30. The conductors 33a and 33b can be made of other electrically conductive material.

On the conductors 33a and 33b there is provided an insulating layer layer 37. Hence, the conductors 33a and 33b support the insulating layer 37. Cavities 40 are provided among the columnar conductors 33a and 33b. The cavities 40 are filled with a mixture gas of mainly oxygen ($O_2$) and carbon dioxide ($CO_2$). The insulating layer 37 is an important component, defining the cavities 40 and functioning as a base on which some layers will be mounted. The layer 37 is made of silicon oxide or the like.

As shown in FIG. 75, guard rings G are provided, each surrounding one chip 48. As depicted in FIG. 81, each guard ring G is composed of a barrier layer 27c and a conductor 28c which are provided in a cavity 31 and a conductor 33c which is provided in the cavity 40. The barrier layer 27c and the conductor 28c, both provided in the cavity 31, constitute the same structure as the wires W1. The barrier layer 33c provided in the cavity 40 has the same structure as the conductors 33a and 33c (i.e., contact plugs).

In the semiconductor device shown in FIG. 81, the cavities 31 among the wires W1 and the cavities 40 among the conductors 33a and 33b (i.e., contact plugs) are filled with a mixture gas of mainly oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces are filled with insulating layers made of silicon oxide or the like.

Further, no water will flow from the edges of the chip 48 through the cavities 31 or 40 to reach the wires W1 or the columnar conductors 33a and 33b after the chip 48 is cut from the wafer 47. This is because the guard ring G surrounds and protects the wires W1 and the conductors 33a and 33b.

The semiconductor device shown in FIG. 81 can be easily manufactured by the same method as the device according to the fifth embodiment.

FIG. 82 illustrates a semiconductor device according to the fourteenth embodiment of this invention.

As seen from FIG. 74, the device is provided in the form of a chip 48 which is formed in a wafer 47, along with other identical semiconductor devices.

The semiconductor device according to the fourteenth embodiment will be described in detail, with reference to FIG. 82.

As shown in FIG. 82, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is provided an insulating layer 29, on which an insulating layer 30 is mounted. Thus, the wires W1 support the insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W1; it is made of silicon oxide, silicon nitride or the like. The insulating layer 30 is an important component, defining the cavities 31 and serving as a base on which some layers will be mounted. The layer 30 is made of silicon oxide or the like.

The insulating layer 30 has contact holes which reach the wires W1. Columnar conductors 33a and 33b made of high-melting metal such as tungsten are provided, extending vertically, each having its lower end fitted in the contact holes of the insulating layer 30. The conductors 33a and 33b can be made of other electrically conductive material.

On the conductors 33a and 33b there is provided an insulating layer layer 42, on which an insulating layer 43 is mounted. Thus, the conductors 33a and 33b support the insulating layers 42 and 43. Cavities 40 are provided among the columnar conductors 33a and 33b. The cavities 40 are filled with a mixture gas of mainly oxygen ($O_2$) and carbon dioxide ($CO_2$). The insulating layer 42 determines the positions and cross-sectional areas of the conductors 33a and 33b; it is made of silicon oxide or silicon nitride. The insulating layer 43 is an important component, defining the cavities 40 and functioning as a base on which some layers will be mounted. The layer 43 is made of silicon oxide or the like.

Wires W2 are provided on the insulating layer 43 and connected to the conductors 33a and 33b. Each wire W2 is comprised of a conductor and a barrier layer covering the bottom and sides of the conductor. More specifically, one wire W2 is made of a conductor 35a and a trough-shaped barrier layer 34a, and another wire W2 is made of a conductor 35b and a trough-shaped barrier layer 34b. The barrier layers 34a and 34b are two-layered members, each consisting of, for example, a titanium layer and a titanium nitride layer. The conductors 35a and 35b are made of copper, aluminum alloy or the like. They can be made of other material, for example, semiconductor such as polysilicon containing an impurity, or high-melting metal such as tungsten.

An insulating layer 36 is provided on the wires W2, on which an insulating film 37 is mounted. Thus, the wires W2 support both insulating layers 36 and 37. Cavities 38 are provided among the wires W2. They are filled with a mixture gas of mainly oxygen ($O_2$) and carbon dioxide ($CO_2$). The insulating layer 36 determines the pattern of wires W2; it is made of silicon oxide, silicon nitride or the like. The insulating layer 37 is an important component, defining the cavities 38 and serving as a base on which some layers will be mounted. The layer 37 is made of silicon oxide or the like.

As shown in FIG. 75, guard rings G are provided, each surrounding one chip 48. As seen from FIG. 82, each guard ring G is composed of a barrier layer 27c and a conductor 28c which are provided in a cavity 31, a barrier layer 34c and a conductor 35c which are provided in a cavity 38, and a conductor 33c which is provided in the cavity 40. The barrier layer 27c and the conductor 28c, both provided in the cavity 31, constitute the same structure as the wires W1. The barrier layer 34c and the conductor 35c, both provided in the cavity 38, constitute the same structure as the wires W2. The barrier layer 33c provided in the cavity 40 has the same structure as the conductors 33a and 33c (i.e., contact plugs).

In the semiconductor device shown in FIG. 82, the cavities 31 provided among the wires W1, and the cavities 38 provided among the upper portions of the wires W2 are filled with the mixture gas of oxygen ($O_2$) and carbon dioxide ($CO_2$). Further, the cavities 40 provided among the conductors 33a and 33b which connect the wires W1 to the wires W2 ate filled with the mixture gas of oxygen ($O_2$) and carbon dioxide ($CO_2$).

The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

Further, no water will flow from the edges of the chip 48 through the cavities 31, 38 or 40 to reach the wires W1, the wires W2 or the columnar conductors 33a and 33b after the chip 48 is cut from the wafer 47. This is because the guard ring G surrounds and protects the wires W1 and W2 and the conductors 33a and 33b.

The semiconductor device shown in FIG. 82 can be easily manufactured by the same method as the device according to the sixth embodiment.

FIG. 83 depicts a semiconductor device according to the fifteenth embodiment of the present invention.

As seen from FIG. 74, the device is provided in the form of a chip 48 which is formed in a wafer 47, along with other identical semiconductor devices.

The semiconductor device according to the fifteenth embodiment will be described in detail, with reference to FIG. 83.

As shown in FIG. 83, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is provided an insulating layer 30. Thus, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted. The layer 30 is made of silicon oxide or the like.

The insulating layer 30 has contact holes which reach the wires W1. Columnar conductors 33a and 33b made of high-melting metal such as tungsten are provided, extending vertically, each having its lower end fitted in the contact holes of the insulating layer 30. The conductors 33a and 33b can be made of other electrically conductive material.

On the conductors 33a and 33b there is provided an insulating layer layer 43. Thus, the conductors 33a and 33b support the insulating layer 43. Cavities 40 are provided among the columnar conductors 33a and 33b. The cavities 40 are filled with a mixture gas of mainly oxygen ($O_2$) and carbon dioxide ($CO_2$). The insulating layer 43 is an important component, defining the cavities 40 and functioning as a base on which some layers will be mounted. The layer 43 is made of silicon oxide or the like.

Wires W2 are provided on the insulating layer 43 and connected to the conductors 33a and 33b. Each wire W2 is comprised of a conductor and a barrier layer covering the bottom and sides of the conductor. More specifically, one wire W2 is made of a conductor 35a and a trough-shaped barrier layer 34a, and another wire W2 is made of a conductor 35b and a trough-shaped barrier layer 34b. The barrier layers 34a and 34b are two-layered members, each consisting of, for example, a titanium layer and a titanium nitride layer. The conductors 35a and 35b are made of copper, aluminum alloy or the like. They can be made of other material, for example, semiconductor such as polysilicon containing an impurity, or high-melting metal such as tungsten.

An insulating layer 37 is provided on the wires W2. Thus, the wires W2 support the insulating layer 37. Cavities 38 are provided among the wires W2. They are filled with a mixture gas of mainly oxygen ($O_2$) and carbon dioxide ($CO_2$). The insulating layer 37 is an important component, defining the cavities 38 and serving as a base on which some layers will be mounted. The layer 37 is made of silicon oxide or the like.

As shown in FIG. 75, guard rings G are provided, each surrounding one chip 48. As seen from FIG. 83, each guard ring G is composed of a barrier layer 27c and a conductor 28c which are provided in a cavity 31, a barrier layer 34c and a conductor 35c which are provided in a cavity 38, and a conductor 33c which is provided in the cavity 40. The barrier layer 27c and the conductor 28c, both provided in the cavity 31, constitute the same structure as the wires W1. The barrier layer 34c and the conductor 35c, both provided in the cavity 38, constitute the same structure as the wires W2. The barrier layer 33c provided in the cavity 40 has the same structure as the conductors 33a and 33c (i.e., contact plugs).

In the device shown in FIG. 83, the cavities 31 provided among the wires W1, and the cavities 38 provided among the upper portions of the wires W2 are filled with the mixture gas of oxygen ($O_2$) and carbon dioxide ($CO_2$). Further, the cavities 40 provided among the conductors 33a and 33b which connect the wires W1 to the wires W2 are filled with the mixture gas of oxygen ($O_2$) and carbon dioxide ($CO_2$).

The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

In addition, no water will flow from the edges of the chip 48 through the cavities 31, 38 or 40 to reach the wires W1, the wires W2 or the columnar conductors 33a and 33b after the chip 48 is cut from the wafer 47. This is because the guard ring G surrounds and protects the wires W1 and W2 and the conductors 33a and 33b.

The semiconductor device shown in FIG. 83 can be easily manufactured by the same method as the device according to the seventh embodiment.

FIG. 84 depicts a semiconductor device according to the sixteenth embodiment of the invention.

As seen from FIG. 74, the device is provided in the form of a chip 48 which is formed in a wafer 47, along with other identical semiconductor devices.

The semiconductor device according to the sixteenth embodiment will be described in detail, with reference to FIG. 84.

As shown in FIG. 84, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is provided an insulating layer 30. An insulating layer 29 is provided on the lower surface of the layer 30. Thus, the wires W1 support the insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W1; it is made of silicon oxide, silicon nitride or the like. The insulating layer 30 is an important component, defining the cavities 31 and serving as a base on which some layers will be mounted. The layer 30 is made of silicon oxide or the like.

The insulating layer 30 has contact holes which reach the wires W1. Wires W2 are provided, extending vertically, each having its lower end fitted in the contact holes of the insulating layer 30. Each wire W2 is comprised of a conductor and a barrier layer covering the bottom and sides of the conductor. More specifically, one wire W2 is made of a conductor 35a and a barrier layer 34a, and another wire W2 is made of a conductor 35b and a barrier layer 34b. The barrier layers 34a and 34b are two-layered members, each consisting of, for example, a titanium layer and a titanium nitride layer. The conductors 35a and 35b are made of copper, aluminum alloy or the like. They can be made of other material, for example, semiconductor such as polysilicon containing an impurity, or high-melting metal such as tungsten.

As seen from FIG. 84, each wire W2 consists of a columnar lower portion and a strip-shaped upper portion. The wires W2 support an insulating layer 43 (e.g., a silicon oxide layer), each at the junction between the lower and upper portions.

On the wires W2 there is mounted an insulating layer 37. Cavities 40 are provided among the lower portions of the wires W2 and between the insulating layers 30 and 43. The cavities 40 are filled with a mixture gas of mainly oxygen ($O_2$) and carbon dioxide ($CO_2$). Further, cavities 38 are provided among the upper portions of the wires W2 and between the insulating layers 37 and 43. The cavities 38 are filled with a mixture gas of mainly oxygen ($O_2$) and carbon dioxide ($CO_2$).

As shown in FIG. 75, guard rings G are provided, each surrounding one chip 48. As seen from FIG. 84, each guard ring G is composed of a barrier layer 27c and a conductor 28c which are provided in a cavity 31, a barrier layer 34c which is provided in a cavity 38, and a conductor 35c which is provided in a cavity 40. The barrier layer 27c and the conductor 28c, both provided in the cavity 31, constitute the same structure as the wires W1. The barrier layer 34c and the conductor 35c, provided in the cavities 38 and 40, respectively, constitute the same structure as the wires W2.

In the semiconductor device shown in FIG. 84, the cavities 31 provided among the wires W1, and the cavities 38 provided among the upper portions of the wires W2 are filled with the mixture gas of oxygen ($O_2$) and carbon dioxide ($CO_2$). Further, the cavities 40 provided among the columnar lower portions of the wires W2 are filled with the mixture gas of oxygen ($O_2$) and carbon dioxide ($CO_2$).

The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the spaces between wires located at the same level and the spaces between wires located at different levels) are filled with insulating layers made of silicon oxide or the like.

In addition, no water will flow from the edges of the chip 48 through the cavities 31, 38 or 40 to reach the wires W1 or the wires W2 after the chip 48 is cut from the wafer 47. This is because the guard ring G surrounds and protects the wires W1 and W2.

The semiconductor device shown in FIG. 84 can be easily manufactured by the same method as the device according to the eighth embodiment.

FIG. 85 illustrates a semiconductor device according to the seventeenth embodiment of the invention.

As seen from FIG. 74, the device is provided in the form of a chip 48 which is formed in a wafer 47, along with other identical semiconductor devices.

The semiconductor device according to the seventeenth embodiment will be described in detail, with reference to FIG. 85.

As shown in FIG. 85, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a trough-shaped barrier layer 27a and a conductor 28a fitted in the barrier layer 27a. Similarly, the other wire W1 is composed of a trough-shaped barrier layer 27b and a conductor 28b fitted in the barrier layer 27b. The barrier layers 27a and 27b are two-layered members, each consisting of, for example, a titanium layer and a titanium nitride layer. The conductors 28a and 28b are made of metal such as copper or aluminum alloy. The conductors 28a and 28b can be made of material other than copper and aluminum alloy, for example, semiconductor such as polysilicon containing an impurity, or high-melting metal such as tungsten.

On the wires W1 there is provided an insulating layer 30. Thus, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted. The layer 30 is made of silicon oxide or the like.

The insulating layer 30 has contact holes which reach the wires W1. Wires W2 are provided, extending vertically, each having its lower end fitted in the contact holes of the insulating layer 30. Each wire W2 is comprised of a conductor and a barrier layer covering the bottom and sides of the conductor. More specifically, one wire W2 is made of a conductor 35a and a barrier layer 34a, and another wire W2 is made of a conductor 35b and a barrier layer 34b. The barrier layers 34a and 34b are two-layered members, each consisting of, for example, a titanium layer and a titanium nitride layer. The conductors 35a and 35b are made of copper, aluminum alloy or the like. They can be made of other material, for example, semiconductor such as polysilicon containing an impurity, or high-melting metal such as tungsten.

As seen from FIG. 85, each wire W2 consists of a columnar lower portion and a strip-shaped upper portion. The wires W2 support an insulating layer 43 (e.g., a silicon oxide layer), each at the junction between the lower and upper portions.

On the wires W2 there is mounted an insulating layer 37. Cavities 40 are provided among the lower portions of the wires W2 and between the insulating layers 30 and 43. The cavities 40 are filled with a mixture gas of mainly oxygen ($O_2$) and carbon dioxide ($CO_2$). Further, cavities 38 are provided among the upper portions of the wires W2 and between the insulating layers 37 and 43. The cavities 38 are filled with a mixture gas of mainly oxygen ($O_2$) and carbon dioxide ($CO_2$).

As shown in FIG. 75, guard rings G are provided, each surrounding one chip 48. As seen from FIG. 85, each guard ring G is composed of a barrier layer 27c and a conductor 28c which are provided in a cavity 31, a barrier layer 34c which is provided in a cavity 38, and a conductor 35c which is provided in a cavity 40. The barrier layer 27c and the conductor 28c, both provided in the cavity 31, constitute the same structure as the wires W1. The barrier layer 34c and the conductor 35c, provided in the cavities 38 and 40, respectively, constitute the same structure as the wires W2.

In the semiconductor device shown in FIG. 85, the cavities 31 provided among the wires W1, and the cavities 38 provided among the upper portions of the wires W2 are filled with the mixture gas of oxygen ($O_2$) and carbon dioxide ($CO_2$). Further, the cavities 40 provided among the columnar lower portions of the wires W2 are filled with the mixture gas of oxygen ($O_2$) and carbon dioxide ($CO_2$).

The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the spaces between wires located at the same level and the-spaces between wires located at different levels) are filled with insulating layers made of silicon oxide or the like.

In addition, no water will flow from the edges of the chip 48 through the cavities 31, 38 or 40 to reach the wires W1 or the wires W2 after the chip 48 is cut from the wafer 47. This is because the guard ring G surrounds and protect the wires W1 and W2.

The semiconductor device shown in FIG. 85 can be easily manufactured by the same method as the device according to the ninth embodiment.

FIG. 86 shows a semiconductor device according to the eighteenth embodiment of the present invention.

As FIG. 86 shows, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The insulating layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a conductor 28a and a trough-shaped wire-protecting layer 50a. Similarly, the other wire W1 is composed of a conductor 28a and a trough-shaped wire-protecting layer 50b. The conductors 28a and 28b are fitted in the wire-protecting layers 50a and 50b, respectively. They are made of metal such as copper or aluminum alloy. The conductors 28a and 28b can be made of material other than copper and aluminum alloy, for example, semiconductor such as polysilicon containing an impurity, or high-melting metal such as tungsten. The wire-protecting layers 50a and 50b are made of, for example, titanium oxide, titanium-tungsten alloy, transition metal such as platinum, alloy of transition metal or molybdenum. They may be made of any other material that is electrically conductive and resistant to chemicals and that can hardly be oxidized.

On the wires W1 there is provided an insulating layer 30. An insulating layer 29 is provided on the lower surface of the insulating layer 30. Thus, the wires W1 support both insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W1; it is made of silicon oxide, silicon nitride or the like. The insulating layer 30 is an important component, defining the cavities 31 and serving as a base on which some layers will be mounted. The layer 30 is made of silicon oxide or the like.

Mounted on the insulating layer 30 is an insulating layer 32, which is made of, for example, silicon oxide. The insulating layers 30 and 32 have contact holes which reach the wires W1. The contact holes are filled with columnar conductors 33a and 33b made of high-melting metal such as tungsten. The conductors 33a and 33b may be made of material other than high-melting metal.

Wires W2 are provided on the insulating layer 32 and connected to the columnar conductors 33a and 33b. Each wire W2 is comprised of a conductor and a wire-protecting layer covering the bottom and sides of the conductor. More precisely, one wire W2 is made of a conductor 35a and a trough-shaped wire-protecting layer 51a, and another wire W2 is made of a conductor 35b and a trough-shaped wire-protecting layer 51b. The conductors 35a and 35b are fitted in the wire-protecting layers 51a and 51b, respectively. They are made of copper, aluminum alloy or the like. They can be made of other material, for example, semiconductor such as polysilicon containing an impurity, or high-melting metal such as tungsten. The wire-protecting layers 51a and 51b are made of, for example, titanium oxide, titanium-tungsten alloy, transition metal such as platinum, alloy of transition metal or molybdenum. The wire-protecting layers 51a and 51b can be made of any other material that is electrically conductive and resistant to chemicals and that can hardly be oxidized.

On the wires W2 there is mounted an insulating layer 37. On the lower surface of the layer 37 an insulting layer 36 is provided. The wires W2 support the insulating layers 36 and 37. Cavities 38 are provided among the wires W2. The cavities 38 are filled with a mixture gas of mainly oxygen ($O_2$) and carbon dioxide ($CO_2$). The insulating layer 36 determines the pattern of wires W2; it is made of silicon oxide, silicon nitride or the like. The insulating layer 37 is an important component, defining the cavities 38 and serving as a base on which some layers will be mounted. The layer 37 is made of silicon oxide or the like.

In the device shown in FIG. 86, the cavities 31 provided among the wires W1, and the cavities 38 provided among the wires W2 are filled with the mixture gas of oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces are filled with insulating layers made of silicon oxide or the like.

Furthermore, no water will flow from the edges of the device chip through the cavities 31 or 38 to reach the wires W1 or the wire W2. This is because the wire-protecting layers 50a and 50b cover and protect the sides of at least the wires W1, and the wire-protecting layers 51a and 51b cover and protect the sides of at least the wires W2.

The cavities 31 and 38 may be filled with air, not the mixture gas. This can be accomplished by making, in the package encapsulating the device, holes which connect the cavities 31 and 38 to the atmosphere. The air can circulate in each cavity and can efficiently dissipate heat from the device chip. The semiconductor device scarcely makes errors due to the heat generated in the chip.

In addition, hillocks will hardly be formed on the wires W1 or the wires W2. This is because the wires W1 and W2 are covered with the wire-protecting layers 50a and 50b and the wire-protecting layers 51a and 51b.

How the device shown in FIG. 86 is manufactured will be explained, with reference to FIGS. 87 to 101.

Figure 87:
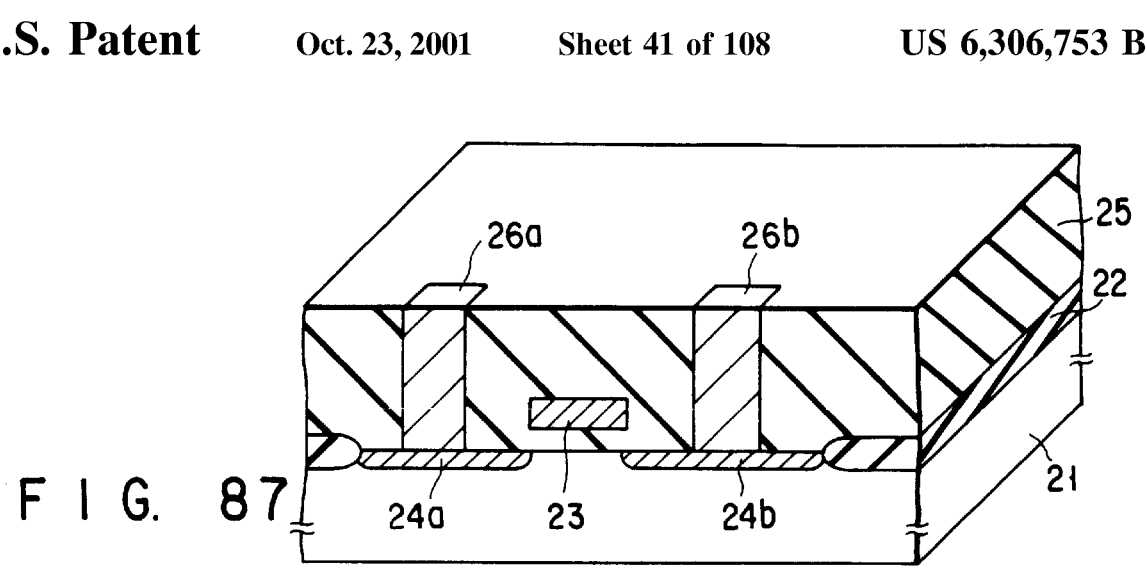

First, the field oxide layer 22 is formed on the semiconductor substrate 21 by LOCOS method, as is illustrated in FIG. 87. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. The contact holes may be filled with other electrically conductive material other than high-melting metal.

Figure 88:
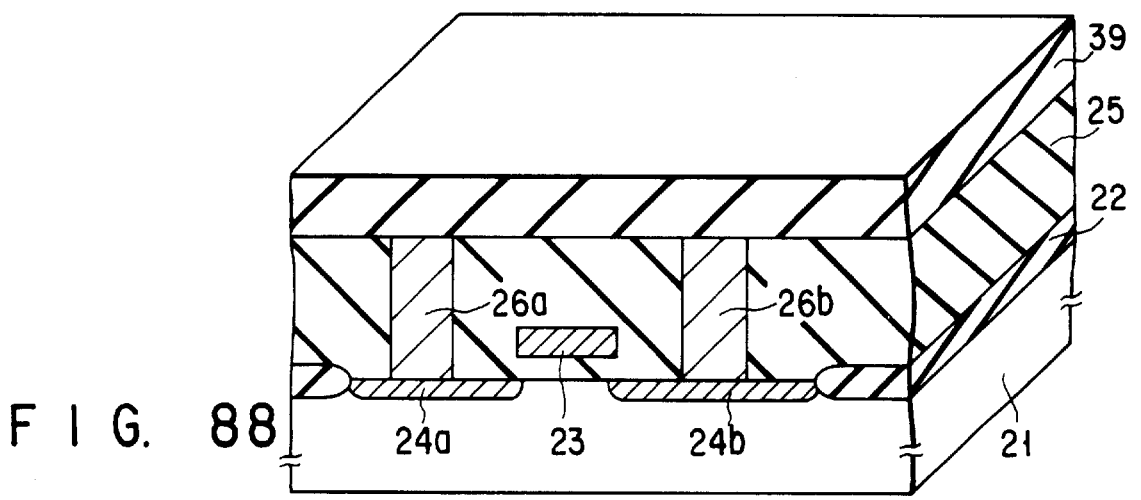
Figure 89:
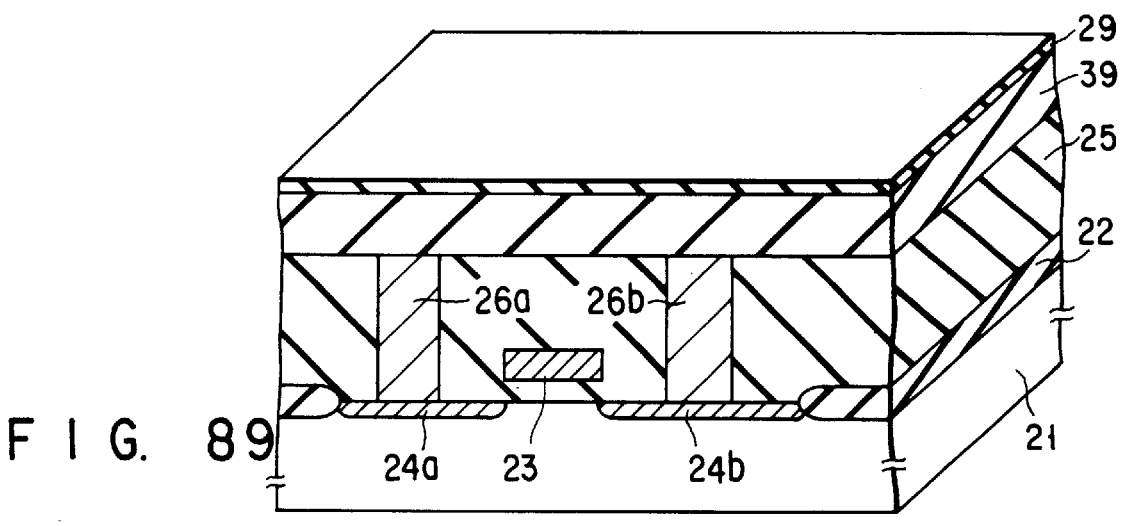

Next, as shown in FIG. 88, a carbon layer 39 is formed on the insulating layer 25 by sputtering. The carbon layer 39 is as thick as wires to be formed in an LSI, for example about 0.2 to 0.7 $\mu$m. Further, as depicted in FIG. 89, a mask layer 29 (e.g., a silicon oxide layer or a silicon nitride layer) is formed on the carbon layer by sputtering to a thickness of about 0.05 $\mu$m. The mask layer 29 is formed not by CVD, because the carbon layer would be eroded if it is formed by CVD.

Then, a resist is coated on the mask layer 29 and patterned by PEP (Photo Engraving Process). Using the patterned resist as the mask, the mask layer 29 is patterned. The resist is removed from the mask layer 42 patterned as shown in FIG. 90. The mask layer 29 thus patterned has the same pattern as the wires to be formed. As shown in FIG. 91, the carbon layer 39 is subjected to anisotropic etching, which is accomplished by using the patterned mask layer 29 as the mask. As a result, slits are made in the carbon layer 39.

It should be noted that the carbon layer 39 is not etched by PEP, but etched by using the mask layer 29 patterned by means of PEP. This is because the carbon layer 39 patterned will be removed if the resist used in the PEP is removed by the oxygen plasma process, and the conductors 26a and 26b (if made of high-melting metal) will be removed if the resist is removed by applying the solution of $H_2SO_4$ and $H_2O_2$. Hence, if the conductors 26a and 26b are made of high-melting metal, it is desired that the carbon layer 39 be etched by using the mask layer 29 processed by PEP.

Figure 93:
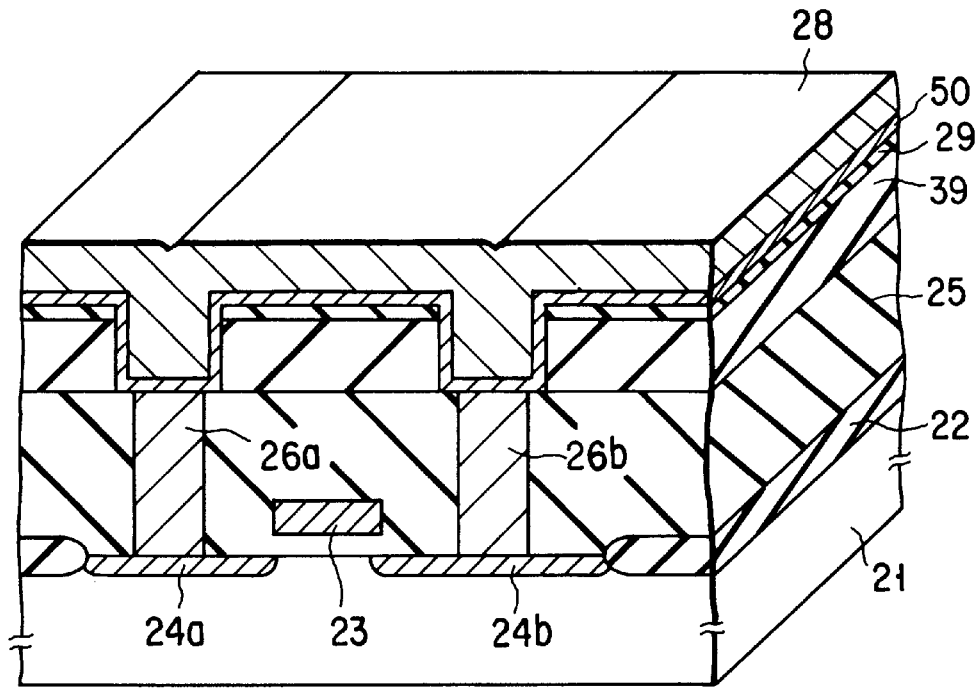

Thereafter, as shown in FIG. 92, a wire-protecting layer 50 made of, for example, molybdenum, is formed on the insulating layer 25 and the mask layer 29 by means of sputtering or CVD. Further, as shown in FIG. 93, a metal layer 28, such as a copper layer or an aluminum alloy layer, is formed on the wire-protecting layer 50 by sputtering or CVD. The layer 50 can be made of other material, for example, semiconductor such as polysilicon containing an impurity, or high-melting metal such as tungsten.

Figure 94:
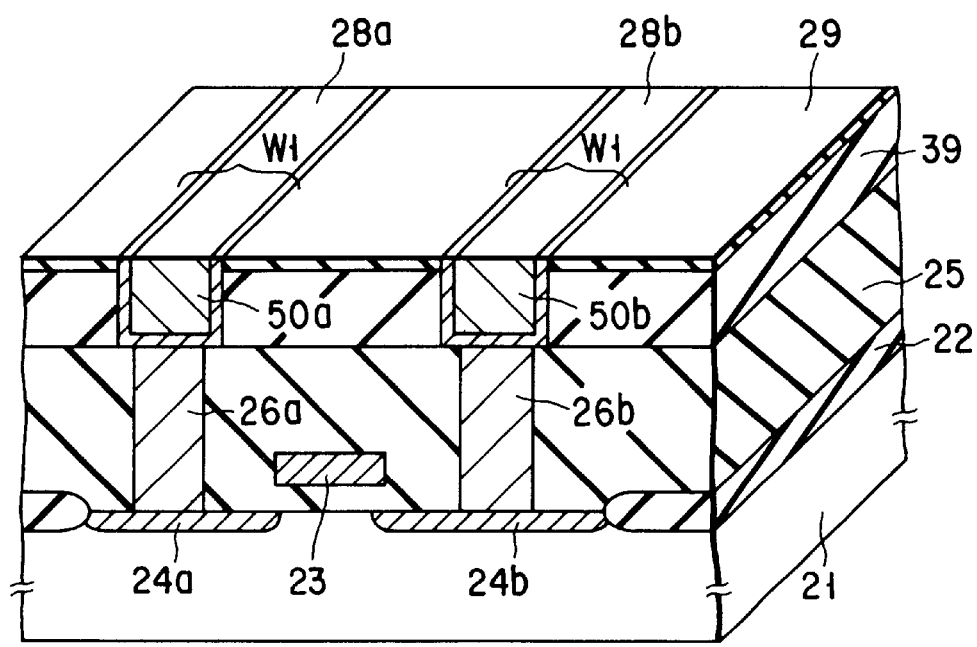

Further, chemical mechanical polishing (CMP) is performed, leaving wire-protecting layers 50a and 50b and conductors 28a and 28b in the slits of the carbon layer 39 as is illustrated in FIG. 94. Wires W1 are thereby formed. The CMP may be replaced by anisotropic etching or isotropic etching, to form the wires W1.

Next, as shown in FIG. 95, the insulating layer 30 (e.g., a silicon oxide layer) is then formed by sputtering on the mask layer 29 and the wires W1. The insulating layer 30 should better be formed by means of sputtering, not by CVD, because the carbon layer would be eroded by the oxygen $O_2$ contained in the reaction gas applied in CVD to form the insulating layer 30. It is desired that the layer 30 be 0.01 to 0.1 $\mu$m thick if it is made of silicon oxide. So long as its thickness remains within this range, the layer 30 is not broken when the carbon layer is ashed. The thickness best for the insulating layer 30 depends on the material of the layer 30.

Then, as shown in FIGS. 96 and 97, the carbon layer 39 is ashed, thereby forming cavities 31 which are filled with a mixture gas of mainly oxygen ($O_2$) and carbon dioxide ($CO_2$). The ashing of the layer 39 can be accomplished by either of two alternative methods.

The first method is to heat the carbon layer 39 in an oxygen atmosphere at 400 to 450° C. for about two hours. In the first method, the carbon layer 39 slowly changes into carbon dioxide ($CO_2$), not expanding to break the insulating layer 29 or 30. However, it takes a long time to ashes the carbon layer 39. The second method is oxygen-plasma process. In the second method, the carbon layer 39 changes into carbon dioxide ($CO_2$) at high speed, but may expand, possibly breaking the insulating layers 29 and 30. Nonetheless, breakage of the layers 29 and 30 can be prevented by modifying the insulating layers 29 and 30 or by decreasing the oxygen-plasma process temperature.

Figure 99:
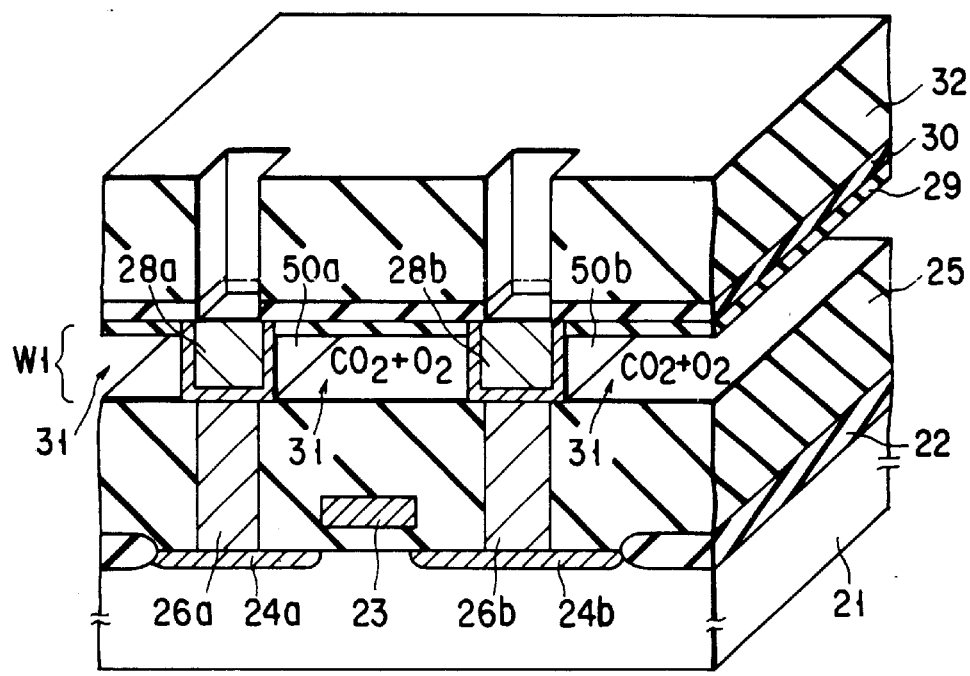
Figure 100:
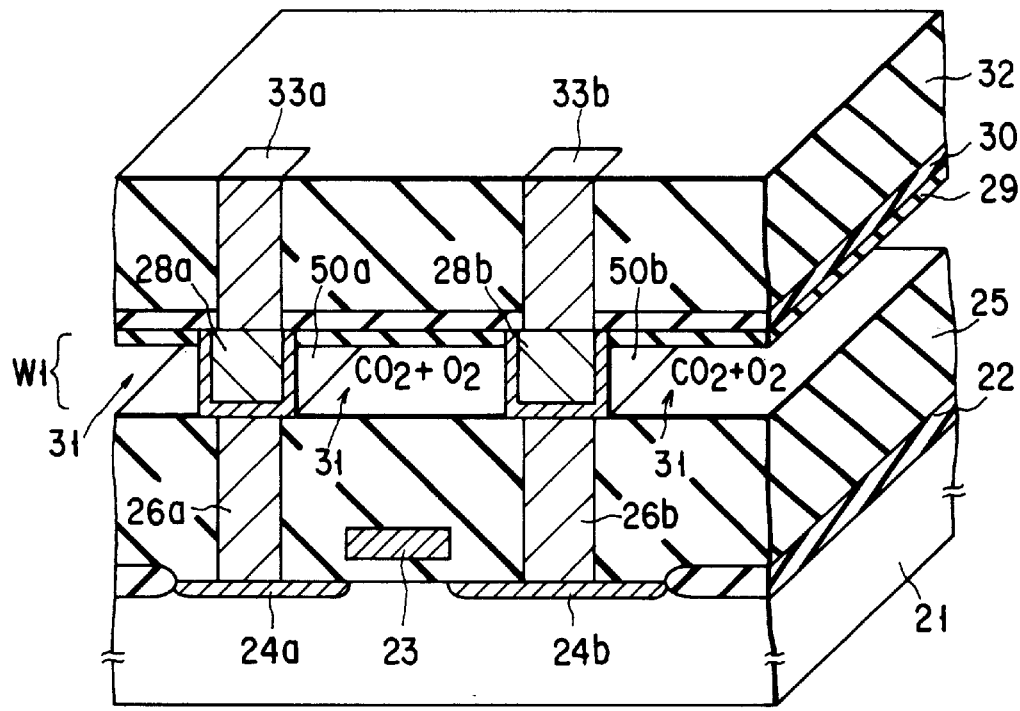

Next, as shown in FIG. 98, an insulating layer 32 (e.g., a TEOS layer containing fluorine) is formed on the insulating layer 30 by means of CVD. This insulating layer 32 has a small dielectric constant. Further, as shown in FIG. 99, PEP (Photo Engraving Process) and RIE (Reactive Ion Etching) are conducted on the insulating layers 30 and 32, forming therein via holes which reach the wires W1. As shown in FIG. 100, conductors 33a and 33b are formed only in the via holes of the layers 30 and 32. The conductors 33a and 33b are made of high-melting metal such as tungsten are formed in the via holes by selective growth. Instead, they can be made of material other than high-melting metal.

Then, as shown in FIG. 101, the wires W2 are formed in the same way as the wires W1 are formed. To be more specific, a carbon layer is formed by sputtering on the insulating layer 32. This carbon layer is as thick as wires W2. Further, a mask layer 36 (e.g., a silicon oxide layer or a silicon nitride layer) is formed on the carbon layer by sputtering to a thickness of about 0.05 $\mu$m.

The mask layer 36 is patterned by PEP (Photo Engraving Process) and anisotropic etching. The carbon layer is subjected to anisotropic etching, which is accomplished by using the patterned mask layer 36 as the mask, whereby slits are made in the carbon layer. The wire-protecting layers 51a and 51b are formed on the insulating layer 32 and the mask layer 36 by means of sputtering or CVD. The wire-protecting layers 51a and 51b are made of, for example, molybdenum.

The conductors 35a and 35b, both made of copper, aluminum alloy or the like, are formed on the wire-protecting layers 51a and 51b, respectively, by means of sputtering or CVD.

Chemical mechanical polishing (CMP) is carried 15 out, leaving the wire-protecting layers 51a and 51b and the conductors 35a and 35b in the slits made in the carbon layer. As a result, the wires W2 are formed. The CMP may be replaced by anisotropic etching or isotropic etching, to form the wires W2.

This done, an insulating layer 37 (e.g., a silicon oxide layer) is formed on the mask layer 36 and the wires W2 by sputtering. Thereafter, the carbon layer is ashed, thereby forming cavities 38 which are filled with a mixture gas of mainly oxygen ($O_2$) and carbon dioxide ($CO_2$).

In this method, carbon layers are used as insulating layers to form the wires W1 and the wires W2 and are ashed after the wires W1 and W2 have been formed in the slits made in the carbon layers, thereby providing cavities filled with gas. The semiconductor device shown in FIG. 86 can, therefore, be manufactured easily.

Figure 102:
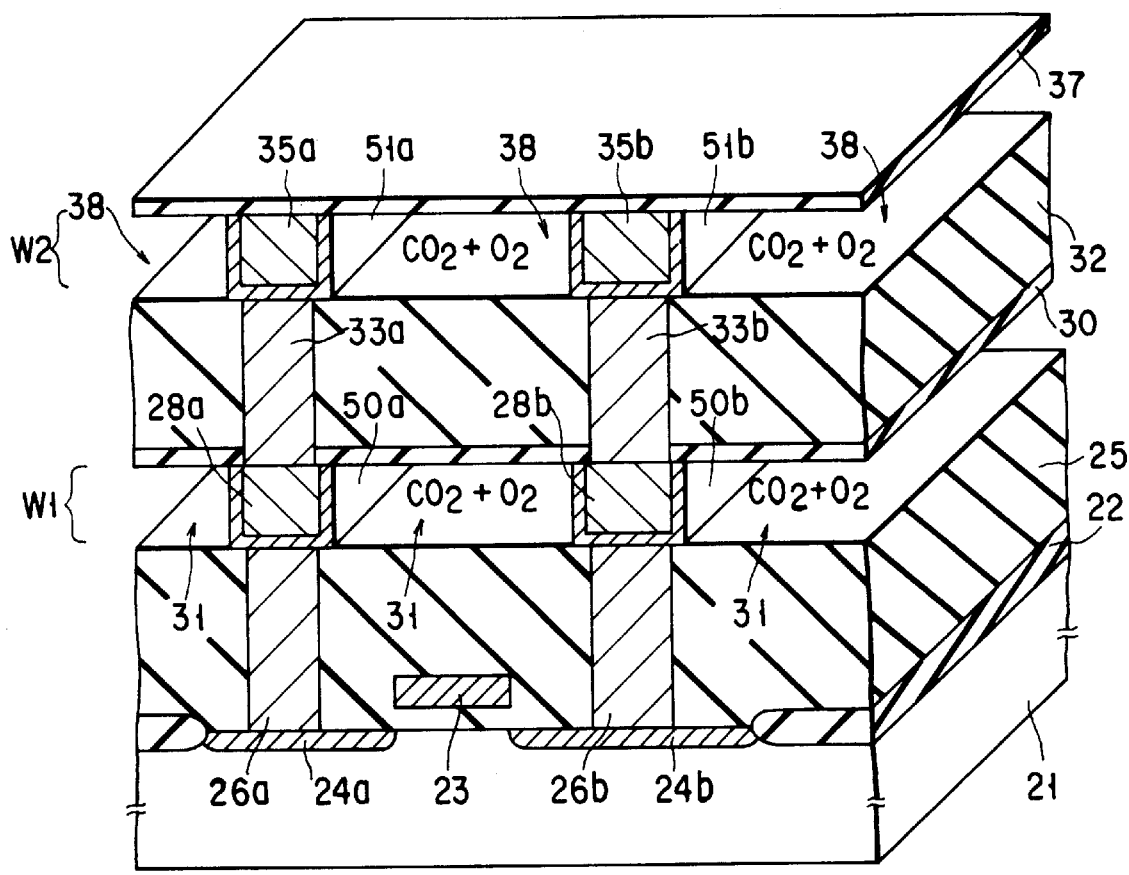
FIG. 102 is a perspective, sectional view of a semiconductor device according to a nineteenth embodiment of the invention.

FIG. 102 shows a semiconductor device according to the nineteenth embodiment of the invention.

As FIG. 102 depicts, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The insulating layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a conductor 28a and a trough-shaped wire-protecting layer 50a. Similarly, the other wire W1 is composed of a conductor 28a and a trough-shaped wire-protecting layer 50b. The conductors 28a and 28b are fitted in the wire-protecting layers 50a and 50b, respectively. They are made of metal such as copper or aluminum alloy. The conductors 28a and 28b can be made of material other than copper and aluminum alloy, for example, semiconductor such as polysilicon containing an impurity, or high-melting metal such as tungsten. The wire-protecting layers 50a and 50b are made of, for example, titanium oxide, titanium-tungsten alloy, transition metal such as platinum, alloy of transition metal or molybdenum. They may be made of any other material that is electrically conductive and resistant to chemicals and that can hardly be oxidized.

On the wires W1 there is provided an insulating layer 30. Thus, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted. The layer 30 is made of silicon oxide or the like.

Mounted on the insulating layer 30 is an insulating layer 32, which is made of, for example, silicon oxide. The insulating layers 30 and 32 have contact holes which reach the wires W1. The contact holes are filled with columnar conductors 33a and 33b made of high-melting metal such as tungsten. The conductors 33a and 33b may be made of material other than high-melting metal.

Wires W2 are provided on the insulating layer 32 and connected to the columnar conductors 33a and 33b. Each wire W2 is comprised of a conductor and a wire-protecting layer covering the bottom and sides of the conductor. More precisely, one wire W2 is made of a conductor 35a and a trough-shaped wire-protecting layer 51a, and another wire W2 is made of a conductor 35b and a trough-shaped wire-protecting layer 51b. The wire-protecting layers 51a and 51b. The conductors 35a and 35b are fitted in the wire-protecting layers 51a and 51b, respectively. They are made of copper, aluminum alloy or the like. They can be made of other material, for example, semiconductor such as polysilicon containing an impurity, or high-melting metal such as tungsten. The wire-protecting layers 51a and 51b are made of, for example, titanium oxide, titanium-tungsten alloy, transition metal such as platinum, alloy of transition metal or molybdenum. The wire-protecting layers 51a and 51b can be made of any other material that is electrically conductive and resistant to chemicals and that can hardly be oxidized.

On the wires W2 there is mounted an insulating layer 37. The wires W2 support the insulating layer 37. Cavities 38 are provided among the wires W2. The cavities 38 are filled with a mixture gas of mainly oxygen ($O_2$) and carbon dioxide ($CO_2$). The insulating layer 37 is an important component, defining the cavities 38 and serving as a base on which some layers will be mounted. The layer 37 is made of silicon oxide or the like.

In the semiconductor device shown in FIG. 102, the cavities 31 provided among the wires W1, and the cavities 38 provided among the wires W2 are filled with the mixture gas of oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces are filled with insulating layers made of silicon oxide or the like.

Furthermore, no water will flow from the edges of the device chip through the cavities 31 or 38 to reach the wires W1 or the wire W2. This is because the wire-protecting layers 50a and 50b cover and protect the sides of at least the wires W1, and the wire-protecting layers 51a and 51b cover and protect the sides of at least the wires W2.

The cavities 31 and 38 may be filled with air, not the mixture gas. This can be accomplished by making, in the package encapsulating the device, holes which connect the cavities 31 and 38 to the atmosphere. The air can circulate in each cavity and can efficiently dissipate heat from the device chip. The semiconductor device scarcely makes errors due to the heat generated in the chip.

In addition, hillocks will hardly be formed on the wires W1 or the wires W2. This is because the wires W1 and W2 are covered with the wire-protecting layers 50a and 50b and the wire-protecting layers 51a and 51b.

How the device shown in FIG. 102 is manufactured will be explained, with reference to FIGS. 103 to 112.

First, the same steps as carried out as in the manufacture of the eighteenth embodiment, until the insulating layer 25 is formed on the carbon layer 39. That is, the field oxide layer 22 is formed on the semiconductor substrate 21 by LOCOS method, as is illustrated in FIG. 103. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. The contact holes may be filled with other electrically conductive material other than high-melting metal.

Then, as shown in FIG. 103, a carbon layer 39 is formed on the insulating layer 25 by sputtering. The carbon layer 39 is as thick as wires to be formed in an LSI, for example about 0.2 to 0.7 $\mu$m. Further, a mask layer (e.g., a silicon oxide layer or a silicon nitride layer) is formed on the carbon layer by sputtering to a thickness of about 0.05 $\mu$m. The mask layer is patterned by PEP (Photo Engraving Process) and anisotropic etching. Using the mask layer as the mask, the carbon layer 39 is subjected to anisotropic etching.

The carbon layer 39 is etched not by PEP, but by using the PEP-patterned mask layer, for the same reason stated in the explanation of the method of manufacturing the second embodiment. Hence, it is desirable to etch the carbon layer 39 by using a PEP-processed mask if the conductors 26a and 26b are made of high-melting metal, and to etch the carbon layer 39 by using a resist as the mask if the conductors 26a and 26b are made of material resistant to the solution of $H_2SO_4$ and $H_2O_2$.

Thereafter, the mask layer is removed, and a wire-protecting layer 50 made of, for example, molybdenum, is formed on the insulating layer 25 and the mask layer 29 by means of sputtering or CVD. Further, as shown in FIG. 104, a metal layer 28, such as a copper layer or an aluminum alloy layer, is formed on the wire-protecting layer 50 by sputtering or CVD. The layer 50 can be made of other material, for example, semiconductor such as polysilicon containing an impurity, or high-melting metal such as tungsten.

Next, chemical mechanical polishing (CMP) is performed, leaving wire-protecting layers 50a and 50b and conductors 28a and 28b in the slits of the carbon layer 39 as is illustrated in FIG. 105. Wires W1 are thereby formed. The CMP may be replaced by anisotropic etching or isotropic etching, to form the wires W1.

Next, as shown in FIG. 106, the insulating layer 30 (e.g., a silicon oxide layer) is then formed by sputtering on the mask layer 29 and the wires W1. The insulating layer 30 should better be formed by means of sputtering, not by CVD, because the carbon layer 39 would be eroded by the oxygen $O_2$ contained in the reaction gas applied in CVD to form the insulating layer 30. It is desired that the layer 30 be 0.01 to 0.1 μm thick if it is made of silicon oxide. So long as its thickness remains within this range, the layer 30 is not broken when the carbon layer is ashed. The thickness best for the insulating layer 30 depends on the material of the layer 30.

Then, as shown in FIGS. 107 and 108, the carbon layer 39 is ashed, thereby forming cavities 31 which are filled with a mixture gas of mainly oxygen ($O_2$) and carbon dioxide ($CO_2$). The ashing of the layer 39 can be accomplished by either of two alternative methods.

The first method is to heat the carbon layer 39 in an oxygen atmosphere at 400 to 450° C. for about two hours. In the first method, the carbon layer 39 slowly changes into carbon dioxide ($CO_2$), not expanding to break the insulating layer 30. However, it takes a long time to ash the carbon layer 39. The second method is oxygen-plasma process. In the second method, the carbon layer 39 changes into carbon dioxide ($CO_2$) at high speed, but may expand, possibly breaking the insulating layer 30. Nonetheless, breakage of the layer 30 can be prevented by modifying the insulating layer 30 or by decreasing the oxygen-plasma process temperature.

Next, as shown in FIG. 109, an insulating layer 32 (e.g., a TEOS layer containing fluorine) is formed on the insulating layer 30 by means of CVD. This insulating layer 32 has a small dielectric constant. Further, as shown in FIG. 110, PEP (Photo Engraving Process) and RIE (Reactive Ion Etching) are conducted on the insulating layers 30 and 32, forming therein via holes which reach the wires W1. As shown in FIG. 111, conductors 33a and 33b are formed only in the via holes of the layers 30 and 32. The conductors 33a and 33b are made of high-melting metal such as tungsten are formed in the via holes by selective growth. Instead, they can be made of material other than high-melting metal.

Then, as shown in FIG. 112, the wires W2 are formed in the same way as the wires W1 are formed. To be more specific, a carbon layer is formed by sputtering on the insulating layer 32. This carbon layer is as thick as wires W2. Further, a mask layer (e.g., a silicon oxide layer or a silicon nitride layer) is formed on the carbon layer by sputtering to a thickness of about 0.05 μm.

The mask layer is patterned by PEP (Photo Engraving Process) and anisotropic etching. The carbon layer are subjected to anisotropic etching, which is accomplished by using the patterned mask layer as the mask, whereby slits are made in the carbon layer. The mask layer is removed. Then, the wire-protecting layers 51a and 51b are formed on the insulating layer 32 and the carbon layer by means of sputtering or CVD. The wire-protecting layers 51a and 51b are made of, for example, molybdenum.

The conductors 35a and 35b, both made of copper, aluminum alloy or the like, are formed on the wire-protecting layers 51a and 51b, respectively, by means of sputtering or CVD. Chemical mechanical polishing (CMP) is carried out, leaving the wire-protecting layers 51a and 51b and the conductors 35a and 35b in the slits made in the carbon layer. As a result, the wires W2 are formed. The CMP may be replaced by anisotropic etching or isotropic etching, to form the wires W2.

This done, an insulating layer 37 (e.g., a silicon oxide layer) is formed on the carbon layer and the wires W2 by sputtering. Thereafter, the carbon layer is ashed, thereby forming cavities 38 which are filled with a mixture gas of mainly oxygen ($O_2$) and carbon dioxide ($CO_2$).

In this method, carbon layers are used as insulating layers to form the wires W1 and the wires W2 and are ashed after the wires W1 and W2 have been formed in the slits made in the carbon layers, thereby providing cavities filled with gas. The semiconductor device shown in FIG. 102 can, therefore, be manufactured easily.

In addition, each carbon layer can be ashed fast and precisely since the mask layer is removed after the carbon layer is patterned and before the carbon layer is ashed.

FIG. 113 shows a semiconductor device according to the twentieth embodiment of the present invention.

As FIG. 113 illustrates, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a conductor 28a and a trough-shaped wire-protecting layer 50a. Similarly, the other wire W1 is composed of a conductor 28b and a trough-shaped wire-protecting layer 50b. The conductors 28a and 28b are fitted in the wire-protecting layers 50a and 50b, respectively. They are made of metal such as copper or aluminum alloy. The conductors 28a and 28b can be made of material other than copper and aluminum alloy, for example, semiconductor such as polysilicon containing an impurity, or high-melting metal such as tungsten. The wire-protecting layers 50a and 50b are made of, for example, titanium oxide, titanium-tungsten alloy, transition metal such as platinum, alloy of transition metal or molybdenum. They may be made of any other material that is electrically conductive and resistant to chemicals and that can hardly be oxidized.

On the wires W1 there is provided an insulating layer 30. An insulating layer 29 is mounted on the lower surface of the insulating layer 30. Thus, the wires W1 support the insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W2; it is made of silicon oxide, silicon nitride or the like. The insulating layer 30 is an important component, defining the cavities 31 and serving as a base on which some layers will be mounted. The layer 30 is made of silicon oxide or the like.

The insulating layer 30 has contact holes which reach the wires W1. Wires W2 are provided which have lower ends fitted in the contact holes of the insulating layer 30. The wires W2 are connected to the wires W1. Each wire W2 is comprised of a conductor and a wire-protecting layer covering the bottom and sides of the conductor. More precisely, one wire W2 is made of a conductor 35a and a trough-shaped wire-protecting layer 51a, and another wire W1 is made of a conductor 35b and a trough-shaped wire-protecting layer 51b. The wire-protecting layers 51a and 51b. The conductors 35a and 35b are fitted in the wire-protecting layers 51a and 51b, respectively. They are made of copper, aluminum alloy or the like. They can be made of other material, for example, semiconductor such as polysilicon containing an impurity, or high-melting metal such as tungsten. The wire-protecting layers 51a and 51b are made of, for example, titanium oxide, titanium-tungsten alloy, transition metal such as platinum, alloy of transition metal or molybdenum. The wire-protecting layers 51a and 51b can be made of any other material that is electrically conductive and resistant to chemicals and that can hardly be oxidized.

As seen from FIG. 113, each wire W2 consists of a columnar lower portion and a strip-shaped upper portion. The wires W2 support an insulating layer 43 (e.g., a silicon oxide layer), each at the junction between the lower and upper portions.

On the wires W2 there is mounted an insulating layer 37. Cavities 40 are provided among the lower portions of the wires W2 and between the insulating layers 30 and 43. The cavities 40 are filled with a mixture gas of mainly oxygen ($O_2$) and carbon dioxide ($CO_2$). Further, cavities 38 are provided among the upper portions of the wires W2 and between the insulating layers 37 and 43. The cavities 38 are filled with a mixture gas of mainly oxygen ($O_2$) and carbon dioxide ($CO_2$).

The cavities 31, 38 and 40 may be filled with air, not the mixture gas. This can be accomplished by making, in the package encapsulating the device, holes which connect the cavities 31 and 38 to the atmosphere.

In the semiconductor device shown in FIG. 113, the cavities 31 provided among the wires W1, the cavities 40 provided among the lower portions of the wires W2 and the cavities 38 provided among the upper portions of the wires W2 are filled with the mixture gas of oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the cavities among the wires located at the same level and those located at different levels) are filled with insulating layers made of silicon oxide or the like.

Further, no water will flow from the edges of the device chip through the cavities 31, 38 or 40 to reach the wires W1 or the wire W2. This is because the wire-protecting layers 50a and 50b cover and protect the sides of at least the wires W1, and the wire-protecting layers 51a and 51b cover and protect the sides of at least the wires W2.

The cavities 31 and 38 may be filled with air, not the mixture gas. This can be accomplished by making, in the package encapsulating the device, holes which connect the cavities 31 and 38 to the atmosphere. The air can circulate in each cavity and can efficiently dissipate heat from the device chip. The semiconductor device scarcely makes errors due to the heat generated in the chip.

Moreover, hillocks will hardly be formed on the wires W1 or the wires W2. This is because the wires W1 and W2 are covered with the wire-protecting layers 50a and 50b and the wire-protecting layers 51a and 51b.

How the device shown in FIG. 102 is manufactured will be explained, with reference to FIGS. 114 to 119.

First, the same steps as carried out as in the manufacture of the eighteenth embodiment, until the insulating layer 25 is formed on the carbon layer 39. That is, the field oxide layer 22 is formed on the semiconductor substrate 21 by LOCOS method, as is illustrated in FIG. 103. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact- holes of the insulating layer 25. The contact holes may be filled with other electrically conductive material other than high-melting metal.

Then, a carbon layer is formed on the insulating layer 25 by sputtering. The carbon layer is as thick as wires to be formed in an LSI, for example about 0.2 to 0.7 $\mu$m. Further, a mask layer 29 (e.g., a silicon oxide layer or a silicon nitride layer) is formed on the carbon layer by sputtering to a thickness of about 0.05 $\mu$m. The mask layer 29 is patterned by PEP (Photo Engraving Process) and anisotropic etching. Using the mask layer 29 as the mask, the carbon layer is subjected to anisotropic etching.

The carbon layer is etched not by PEP, but by using the PEP-patterned mask layer 29, for the same reason stated in the explanation of the method of manufacturing the second embodiment. Hence, it is desirable to etch the carbon layer by using the PEP-processed mask 29 if the conductors 26a and 26b are made of high-melting metal, and to etch the carbon layer by using a resist as the mask if the conductors 26a and 26b are made of material resistant to the solution of $H_2SO_4$ and $H_2O_2$.

Thereafter, the wire-protecting layers 50a and 50b, both made of, for example, molybdenum, are formed on the mask layer 29 and in the slits formed in the carbon layer by means of sputtering or CVD. Further, the conductors 28a and 28b, made of copper aluminum alloy layer, are formed on the wire-protecting layers 50a and 50b by sputtering or CVD. The conductors 28a and 28b can be made of other material, for example, semiconductor such as polysilicon containing an impurity, or high-melting metal such as tungsten or tantalum.

Next, chemical mechanical polishing (CMP) is performed, leaving the wire-protecting layers 50a and 50b and the conductors 28a and 28b in the slits of the carbon layer. Wires W1 are thereby formed. The CMP may be replaced by anisotropic etching or isotropic etching, to form the wires W1.

Next, the insulating layer 30 (e.g., a silicon oxide layer) is then formed by sputtering on the mask layer 29 and the wires W1. The insulating layer 30 should better be formed by means of sputtering, not by CVD, because the carbon layer 39 would be eroded by the oxygen 02 contained in the reaction gas applied in CVD to form the insulating layer 30.

It is desired that the layer 30 be 0.01 to 0.1 μm thick if it is made of silicon oxide. So long as its thickness remains within this range, the layer 30 is not broken when the carbon layer is ashed. The thickness best for the insulating layer 30 depends on the material of the layer 30.

Then, the carbon layer is ashed, thereby forming cavities 31 which are filled with a mixture gas of mainly oxygen ($O_2$) and carbon dioxide ($CO_2$).

After the wires W1 have been thus formed, a carbon layer 41 is formed by sputtering on the insulating layer 30. Further, an insulating layer 43 (e.g., a silicon oxide layer or a silicon nitride layer) is formed on the carbon layer 41 by sputtering to a thickness of about 0.05 μm. The insulating layer 43 should better be formed by means of sputtering, not by CVD, because the carbon layer 41 would be eroded by the oxygen $O_2$ contained in the reaction gas applied in CVD to form the insulating layer 43. The layer 43 should be 0.01 to 0.1 μm thick if it is made of silicon oxide. So long as its thickness remains within this range, the layer 43 is not broken when the carbon layer is ashed. The thickness most desirable for the insulating layer 43 depends on the material of the layer 43.

Next, a carbon layer 44 is formed on the insulating layer 43 by sputtering. The carbon layer 44 is patterned, forming slits in the layer 44. The carbon layer 44 may be patterned by one of two alternative methods. The first is to perform PEP (Photo Engraving Process) and RIE. The second is to perform PEP and use a mask prepared by RIE;

In the present embodiment, the carbon layer 44 is patterned by means of PEP and RIE. More specifically, a resist 45 is formed on the carbon layer 44 and is patterned, anisotropic etching is carried out on the carbon layer 44, by using the resist 45 as the mask, thereby forming slits in the layer 44. A solution of $H_2SO_4$ and $H_2O_2$ is applied, removing the resist 45. It should be noted that the resist 45 is not removed by oxygen plasma process, which would erode the carbon layer 44.

Then, as shown in FIG. 115, a resist 46 is formed on the carbon layer 44 and patterned. Using the resist 46 as the mask, anisotropic etching is conducted on the insulating layer 43 and the carbon layer 41, thus forming via holes in these layers 43 and 41. This done, $H_2SO_4$ and $H_2O_2$ are applied, removing the resist 46. The resist 46 is removed not by oxygen plasma process, which would erode the carbon layer 44.

As shown in FIG. 116, the insulating layer 30 is subjected to anisotropic etching, thereby forming via holes in the layer 30, which reach the wires W1. A wire-protecting layer 51 made of, for example, molybdenum is formed by sputtering or CVD, in the via holes of the layer 30, the via holes of the carbon layer 41, the via holes of the insulating layer 43 and the slits of the carbon layer 44 and on the carbon layer 44. Further, a metal layer 35 made of copper, aluminum alloy or the like is formed on the wire-protecting layer 51 by either sputtering or CVD.

Next, as seen from FIG. 117, chemical mechanical polishing (CMP) is performed on the metal layer 35 and the wire-protecting layer 51, thereby forming wire-protecting layers 51a and 51b and conductors 35a and 35b—all in the via holes of the insulating layer 30, carbon layer 41 and insulating layer 43 and in the slits of the carbon layer 44. Thus, wires W2 are provided, each consisting of a wire-protecting layer and a conductor.

Further, an insulating layer 37 (e.g., a silicon oxide layer) is formed on the carbon layer 44 by sputtering to a thickness of about 0.05 μm. The insulating layers 37 and 43 should be 0.01 to 0.1 μm thick if they are made of silicon oxide. So long as their thickness remains within this range, the insulating layers 37 and 43 are not broken when the carbon layers 41 and 44 are ashed. The thickness most desirable for the insulating layer 37 and the thickness optimal for the insulating layer 43 depend on the materials of the layers 37 and 43.

Then, as shown in FIGS. 118 and 119, the carbon layers 41 and 44 are simultaneously ashed by heat treatment in an oxygen atmosphere or by oxygen plasma process. The carbon layer 41 is thereby changed into cavities 40, and the carbon layer 44 changed into cavities 38. The cavities 38 and 40 are filled with a mixture gas of mainly oxygen ($O_2$) and carbon dioxide ($CO_2$).

In the method described above, carbon layers are used as insulating layers having slits or via holes, for forming the wires W1 and the wires W2. They are ashed after the wires W1 and W2 are formed in the slits and via holes, thereby forming gas-filled cavities. In addition, the method has far less steps than the methods according to the second to seventh embodiments since the wires W2 are directly connected to the wires W1, without using contact plugs.

Hence, a semiconductor device can be manufactured, in which the spaces among the wires located at the same level are filled with air or a mixture gas of oxygen ($O_2$) and carbon dioxide ($CO_2$), and the spaces among the wires located at different levels are also filled with air or a mixture gas of oxygen ($O_2$) and carbon dioxide ($CO_2$).

FIG. 120 shows a semiconductor device according to the twenty-first embodiment of the invention.

As seen from FIG. 120, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a conductor 28a and a trough-shaped wire-protecting layer 50a. Similarly, the other wire W1 is composed of a conductor 28b and a trough-shaped wire-protecting layer 50b. The conductors 28a and 28b are fitted in the wire-protecting layers 50a and 50b, respectively. They are made of metal such as copper or aluminum alloy. The conductors 28a and 28b can be made of material other than copper and aluminum alloy, for example semiconductor such as polysilicon containing an impurity, or high-melting metal such as tungsten. The wire-protecting layers 50a and 50b are made of, for example, titanium oxide, titanium-tungsten alloy, transition metal such as platinum, alloy of transition metal or molybdenum. They may be made of any other material that is electrically conductive and resistant to chemicals and that can hardly be oxidized.

On the wires W1 there is provided an insulating layer 30. Thus, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted The layer 30 is made of silicon oxide or the like.

The insulating layer 30 has contact holes which reach the wires W1. Wires W2 are provided which have lower ends fitted in the contact holes of the insulating layer 30. The wires W2 are connected to the wires W1. Each wire W2 is comprised of a conductor and a wire-protecting layer covering the bottom and sides of the conductor. More precisely, one wire W2 is made of a conductor 35a and a trough-shaped wire-protecting layer 51a, and another wire W1 is made of a conductor 35b and a trough-shaped wire-protecting layer 51b. The conductors 35a and 35b are fitted in the wire-protecting layers 51a and 51b, respectively. They are made of copper, aluminum alloy or the like. They can be made of other material, for example, semiconductor such as polysilicon containing an impurity, or high-melting metal such as tungsten or tantalum. The wire-protecting layers 51a and 51b are made of, for example, titanium oxide, titanium-tungsten alloy, transition metal such as platinum, alloy of transition metal or molybdenum. The wire-protecting layers 51a and 51b can be made of any other material that is electrically conductive and resistant to chemicals and that can hardly be oxidized.

As seen from FIG. 120, each wire W2 consists of a columnar lower portion and a strip-shaped upper portion. The wires W2 support an insulating layer 43 (e.g., a silicon oxide layer), each at the junction between the lower and upper portions.

On the wires W2 there is mounted an insulating layer 37. Cavities 40 are provided among the lower portions of the wires W2 and between the insulating layers 30 and 43. The cavities 40 are filled with a mixture gas of mainly oxygen ($O_2$) and carbon dioxide ($CO_2$). Further, cavities 38 are provided among the upper portions of the wires W2 and between the insulating layers 37 and 43. The cavities 38 are filled with a mixture gas of mainly oxygen ($O_2$) and carbon dioxide ($CO_2$).

In the semiconductor device shown in FIG. 120, the cavities 31 provided among the wires W1, the cavities 40 provided among the lower portions of the wires W2 and the cavities 38 provided among the upper portions of the wires W2 are filled with the mixture gas of oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the cavities among the wires located at the same level and those located at different levels) are filled with insulating layers made of silicon oxide or the like.

Further, no water will flow from the edges of the device chip through the cavities 31, 38 or 40 to reach the wires W1 or the wire W2. This is because the wire-protecting layers 50a and 50b cover and protect the sides of at least the wires W1, and the wire-protecting layers 51a and 51b cover and protect the sides of at least the wires W2.

The cavities 31 and 38 may be filled with air, not the mixture gas. This can be accomplished by making,in the package encapsulating the device, holes which connects the cavities 31 and 38 to the atmosphere. The air can circulate in each cavity and can efficiently dissipate heat from the device chip. The semiconductor device scarcely makes errors due to the heat generated in the chip.

Moreover, hillocks will hardly be formed on the wires W1 or the wires W2. This is because the wires W1 and W2 are covered with the wire-protecting layers 50a and 50b and the wire-protecting layers 51a and 51b.

It will be explained how the device shown in FIG. 120 is manufactured, with reference to FIGS. 121 to 126.

First, the same steps as carried out as in the manufacture of the nineteenth embodiment, until the wires W1 are formed on the insulating layer 25. That is, the field oxide layer 22 is formed on the semiconductor substrate 21 by LOCOS method, as is illustrated in FIG. 121. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. The contact holes may be filled with other electrically conductive material other than high-melting metal.

Then, a carbon layer is formed on the insulating layer 25 by sputtering. The carbon layer is as thick as wires to be formed in an LSI, for example about 0.2 to 0.7 $\mu$m. Further, a mask layer (e.g., a silicon oxide layer or a silicon nitride layer) is formed on the carbon layer by sputtering to a thickness of about 0.05 $\mu$m. The mask layer is patterned by PEP (Photo Engraving Process) and anisotropic etching. Using the mask layer as the mask, the carbon layer is subjected to anisotropic etching.

The carbon layer is etched not by PEP, but by using the PEP-patterned mask layer, for the same reason stated in the explanation of the method of manufacturing the second embodiment. Hence, it is desirable to etch the carbon layer by using the PEP-processed mask if the conductors 26a and 26b are made of high-melting metal, and to etch the carbon layer by using a resist as the mask if the conductors 26a and 26b are made of material resistant to the solution of $H_2SO_4$ and $H_2O_2$.

Thereafter, the mask layer is removed, and the wire-protecting layers 50a and 50b, both made of, for example, molybdenum, are formed on the insulating layer 25 and in the slits formed in the carbon layer, by means of sputtering or CVD. Further, the conductors 28a and 28b, made of copper aluminum alloy layer, are formed on the wire-protecting layers 50a and 50b by sputtering or CVD. The conductors 28a and 28b can be made of other material, for example, semiconductor such as polysilicon containing an impurity, or high-melting metal such as tungsten or tantalum.

Next, chemical mechanical polishing (CMP) is performed, leaving the wire-protecting layers 50a and 50b and the conductors 28a and 28b in the slits of the carbon layer. Wires W1 are thereby formed. The CMP may be replaced by anisotropic etching or isotropic etching, to form the wires W1.

Next, the insulating layer 30 (e.g., a silicon oxide layer) is then formed by sputtering on the mask layer and the wires W1. The insulating layer 30 should better be formed by means of sputtering, not by CVD, because the carbon layer would be eroded by the oxygen $O_2$ contained in the reaction gas applied in CVD to form the insulating layer 30. It is desired that the layer 30 be 0.01 to 0.1 μm thick if it is made of silicon oxide. So long as its thickness remains within this range, the layer 30 is not broken when the carbon layer is ashed. The thickness best for the insulating layer 30 depends on the material of the layer 30.

Then, the carbon layer is ashed, thereby forming cavities 31 which are filled with a mixture gas of mainly oxygen ($O_2$) and carbon dioxide ($CO_2$).

After the wires W1 have been thus formed, a carbon layer 41 is formed by sputtering on the insulating layer 30. Further, an insulating layer 43 (e.g., a silicon oxide layer or a silicon nitride layer) is formed on the carbon layer 41 by sputtering to a thickness of about 0.05 μm. The insulating layer 43 should better be formed by means of sputtering, not by CVD, because the carbon layer 41 would be eroded by the oxygen $O_2$ contained in the reaction gas applied in CVD to form the insulating layer 43. The layer 43 should be 0.01 to 0.1 μm thick if it is made of silicon oxide. So long as its thickness remains within this range, the layer 43 is not broken when the carbon layer is ashed. The thickness most desirable for the insulating layer 43 depends on the material of the layer 43.

Next, a carbon layer 44 is formed on the insulating layer 43 by sputtering. The carbon layer 44 is patterned, forming slits in the layer 44. The carbon layer 44 may be patterned by one of two alternative methods. The first is to perform PEP (Photo Engraving Process) and RIE. The second is to perform PEP and use a mask prepared by RIE.

In the present embodiment, the carbon layer 44 is patterned by means of PEP and RIE. To state more specifically, a resist 45 is formed on the carbon layer 44 and is patterned as shown in FIG. 121. Anisotropic etching is carried out on the carbon layer 44, by using the resist 45 as the mask, thereby forming slits in the layer 44. A solution of $H_2SO_4$ and $H_2O_2$ is applied, removing the resist 45. It should be noted that the resist 45 is not removed by oxygen plasma process, which would erode the carbon layer 44.

Then, as shown in FIG. 122, a resist 46 is formed on the carbon layer 44 and patterned. Using the resist 46 as the mask, anisotropic etching is conducted on the insulating layer 43 and the carbon layer 41, thus forming via holes in these layers 43 and 41. This done, $H_2SO_4$ and $H_2O_2$ are applied, removing the resist 46. The resist 46 is removed not by oxygen plasma process, which would erode the carbon layer 44.

As shown in FIG. 123, the insulating layer 30 is subjected to anisotropic etching, thereby forming via holes in the layer 30, which reach the wires W1. A wire-protecting layer 51 made of, for example, molybdenum is formed by sputtering or CVD, in the via holes of the layer 30, the via holes of the carbon layer 41, the via holes of the insulating layer 43 and the slits of the carbon layer 44 and on the carbon layer 44. Further, a metal layer 35 made of copper, aluminum alloy or the like is formed on the wire-protecting layer 51 by either sputtering or CVD.

Next, as seen from FIG. 124, chemical mechanical polishing (CMP) is performed on the metal layer 35 and the wire-protecting layer 51, thereby forming wire-protecting layers 51a and 51b and conductors 35a and 35b—all in the via holes of the insulating layer 30, carbon layer 41 and insulating layer 43 and in the slits of the carbon layer 44. Thus, wires W2 are provided, each consisting of a wire-protecting layer and a conductor.

Further, an insulating layer 37 (e.g., a silicon oxide layer) is formed on the carbon layer 44 by sputtering to a thickness of about 0.05 μm. The insulating layers 37 and 43 should be 0.01 to 0.1 μm thick if they are made of silicon oxide. So long as their thickness remains within this range, the insulating layers 37 and 43 are not broken when the carbon layers 41 and 44 are ashed. The thickness most desirable for the insulating layer 37 and the thickness optimal for the insulating layer 43 depend on the materials of the layers 37 and 43.

Then, as shown in FIGS. 125 and 126, the carbon layers 41 and 44 are simultaneously ashed by heat treatment in an oxygen atmosphere or by oxygen plasma process. The carbon layer 41 is thereby changed into cavities 40, and the carbon layer 44 changed into cavities 38. The cavities 38 and 40 are filled with a mixture gas of mainly oxygen ($O_2$) and carbon dioxide ($CO_2$).

In the method described above, carbon layers are used as insulating layers having slits or via holes, for forming the wires W1 and the wires W2. They are ashed after the wires W1 and W2 are formed in the slits and via holes, thereby forming gas-filled cavities. In addition, the method has far less steps than the methods according to the second to seventh embodiments since the wires W2 are directly connected to the wires W1, without using contact plugs.

Hence, a semiconductor device can be manufactured, in which the spaces among the wires located at the same level are filled with air or a mixture gas of oxygen ($O_2$) and carbon dioxide ($CO_2$), and the spaces among the wires located at different levels are also filled with air or a mixture gas of oxygen ($O_2$) and carbon dioxide ($CO_2$).

In addition, each carbon layer can be ashed fast and precisely since the mask layer is removed after the carbon layer is patterned and before the carbon layer is ashed.

FIG. 127 shows a semiconductor device according to the twenty-second embodiment of the invention.

As seen from FIG. 127, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a conductor 28a and a wire-protecting layer 50a covering the sides of the conductor 28a. Similarly, the other wire W1 is composed of a conductor 28b and a wire-protecting layer 50b covering the sides of the conductor 28b. The conductors 28a nd 28b are made of metal such as copper or aluminum alloy. They can be made of material other than copper and aluminum alloy, for example semiconductor such as polysilicon containing an impurity, or high-melting metal such as tungsten. The wire-protecting layers 50a and 50b are made of, for example, titanium oxide, titanium-tungsten alloy, transition metal such as platinum, alloy of transition metal or molybdenum. They may be made of any other material that is electrically conductive and resistant to chemicals and that can hardly be oxidized.

On the wires W1 there is provided an insulating layer 30. An insulating layer 29 is provided on the lower surface of the insulating layer 30. Thus, the wires W1 support the insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W2; it is made of silicon oxide, silicon nitride or the like. The insulating layer 30 is an important component, defining the cavities 31 and serving as a base on which some layers will be mounted. The layer 30 is made of silicon oxide or the like.

Mounted on the insulating layer. 30 is an insulating layer 32, which is made of, for example, silicon oxide. The insulating layers 30 and 32 have contact holes which reach the wires W1. The contact holes are filled with conductors 33a and 33b made of high-melting metal such as tungsten. The conductors 33a and 33b may be made of material other than high-melting metal.

Wires W2 are provided on the insulating layer 32 and connected to the conductors 33a and 33b. Each wire W2 is comprised of a conductor and a wire-protecting layer covering the and sides of the conductor. More precisely, one wire W2 is made of a conductor 35a and a wire-protecting layer 51a covering the sides of the conductor 35a, and another wire W2 is made of a conductor 35b and a wire-protecting layer 51b covering the sides of the conductor 35b. The conductors 35a and 35b are made of copper, aluminum alloy or the like. They can be made of other material, for example, semiconductor such as polysilicon containing an impurity, or high-melting metal such as tungsten. The wire-protecting layers 51a and 51b are made of, for example, insulating material such as silicon oxide or silicon nitride, titanium oxide, titanium-tungsten alloy, transition metal such as platinum, alloy of transition metal, or molybdenum. The wire-protecting layers 51a and 51b can be made of any other material that is electrically conductive and resistant to chemicals and that can hardly be oxidized.

On the wires W2 there is mounted an insulating layer 37. On the lower surface of the layer 37 an insulting layer 36 is provided. The wires W2 support the insulating layers 36 and 37. Cavities 38 are provided among the wires W2. The cavities 38 are filled with a mixture gas of mainly oxygen ($O_2$) and carbon dioxide ($CO_2$). The insulating layer 36 determines the pattern of wires W2; it is made of silicon oxide, silicon nitride or the like. The insulating layer 37 is an important component, defining the cavities 38 and serving as a base on which some layers will be mounted. The layer 37 is made of silicon oxide or the like.

In the semiconductor device shown in FIG. 127, the cavities 31 provided among the wires W1 and the cavities 38 provided among the upper portions of the wires W2 are filled with the mixture gas of oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces are filled with insulating layers made of silicon oxide or the like.

In addition, no water will flow from the edges of the device chip through the cavities 31 or 38 to reach the wires W1 or the wire W2. This is because the wire-protecting layers 50a and 50b cover and protect the sides of at least the wires W1, and the wire-protecting layers 51a and 51b cover and protect the sides of at least the wires W2.

The cavities 31 and 38 may be filled with air, not the mixture gas. This can be accomplished by making, in the package encapsulating the device, holes which connects the cavities 31 and 38 to the atmosphere. The air can circulate in each cavity and can efficiently dissipate heat from the device chip. The semiconductor device scarcely makes errors due to the heat generated in the chip.

Moreover, hillocks will hardly be formed on the sides of the wires W1 or the wires W2. This is because the wires W1 and W2 are covered with the wire-protecting layers 50a and 50b and the wire-protecting layers 51a and 51b.

It will be explained how the device shown in FIG. 127 is manufactured, with reference to FIGS. 128 to 142.

At first, the field oxide layer 22 is formed on the semiconductor substrate 21 by LOCOS method, as is shown in FIG. 128. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b. of the MOS transistor. The conductors 26a and 26b made of high-melting metal such as tungsten are formed by selective growth in the contact holes of the insulating layer 25. The contact holes may be filled with other electrically conductive material other than high-melting metal.

Then, a carbon layer 39 is formed on the insulating layer 25 by sputtering as is shown in FIG. 129. The carbon layer 39 is as thick as wires to be formed in an LSI, for example about 0.2 to 0.7 $\mu$m. Further, as shown in FIG. 130, a mask layer 29 (e.g., a silicon oxide layer or a silicon nitride layer) is formed on the carbon layer by sputtering to a thickness of about 0.05 $\mu$m. The mask layer 29 is formed not by CVD, in order to prevent the erosion of the the carbon layer 39.

As shown in FIG. 131, the mask layer 29 is patterned by PEP (Photo Engraving Process) and anisotropic etching. Thus patterned, the mask layer 29 defines the pattern of the wires to be formed. Using the mask layer 29 as the mask, the carbon layer 39 is subjected to anisotropic etching, as illustrated in FIG. 132.

The carbon layer 39 is etched not by PEP, but by using the PEP-patterned mask layer. This is because the carbon layer 39 patterned will be removed if the resist used in the PEP is removed by the oxygen plasma process, and the conductors 26a and 26b (if made of high-melting metal) will be removed if the resist is removed by applying the solution of $H_2SO_4$ and $H_2O_2$. Hence, if the conductors 26a and 26b are made of high-melting metal, it is desired that the carbon layer 39 be etched by using the mask layer 29 processed by PEP.

Thereafter, a wire-protecting layer made of, for example, silicon oxide, is formed on the insulating layer 25 and the mask layer 29 and in the slits made in the carbon layer 39 by means of sputtering or CVD. The wire-protecting layer is etched, forming the wire-protecting layers 50a and 50b which are provided on the vertical surfaces of the slits formed in the carbon layer 39, as is illustrated in FIG. 133.

As shown in FIG. 134, a metal layer 28, such as a copper layer or an aluminum alloy layer, is formed by sputtering or CVD on the mask layer 29 and in the slits of the carbon layer 39, covering the exposed portion of the insulating layer 25 and the wire-protecting layers 50a and 50b. The metal layer 28 can be made of other material, for example, semiconductor such as polysilicon containing an impurity, or high-melting metal such as tungsten.

Next, chemical mechanical polishing (CMP) is performed, leaving wire-protecting layers 50a and 50b and conductors 28a and 28b in the slits of the carbon layer 39 as is illustrated in FIG. 135. Wires W1 are thereby formed. The CMP may be replaced by anisotropic etching or isotropic etching, to form the wires W1.

Figure 136:
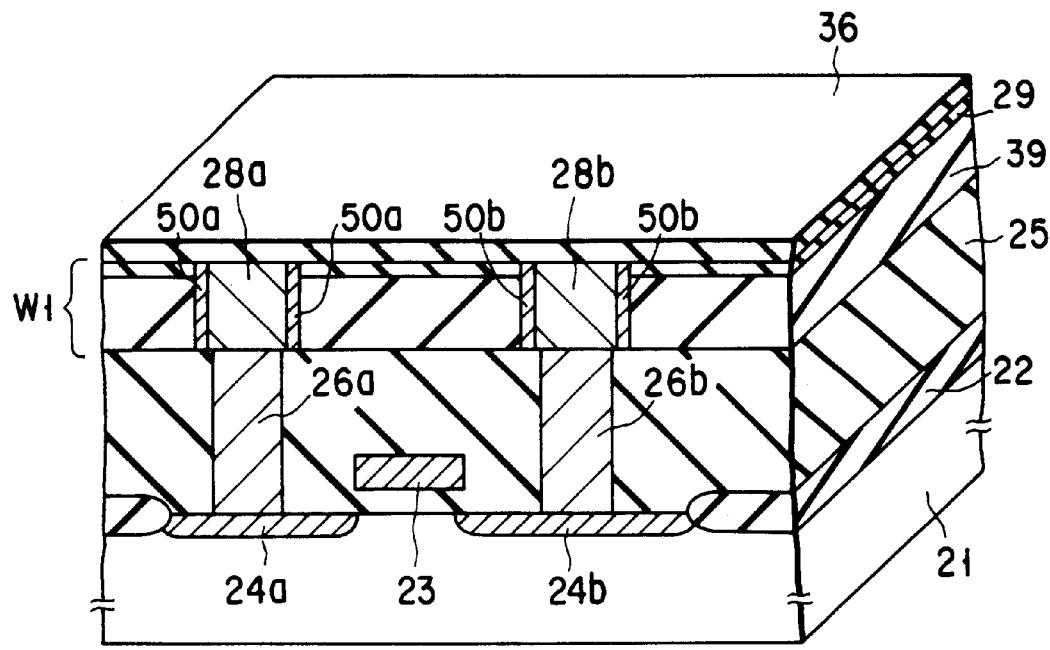

Next, as shown in FIG. 136, the insulating layer 30 (e.g., a silicon oxide layer) is then formed by sputtering on the mask layer 29 and the wires W1. The insulating layer 30 should better be formed by means of sputtering, not by CVD, because the carbon layer 39 would be eroded by the oxygen $O_2$ contained in the reaction gas applied in CVD to form the insulating layer 30. It is desired that the layer 30 be 0.01 to 0.1 μm thick if it is made of silicon oxide. So long as its thickness remains within this range, the layer 30 is not broken when the carbon layer is ashed. The thickness optimal for the insulating layer 30 depends on the material of the layer 30.

Figure 137:
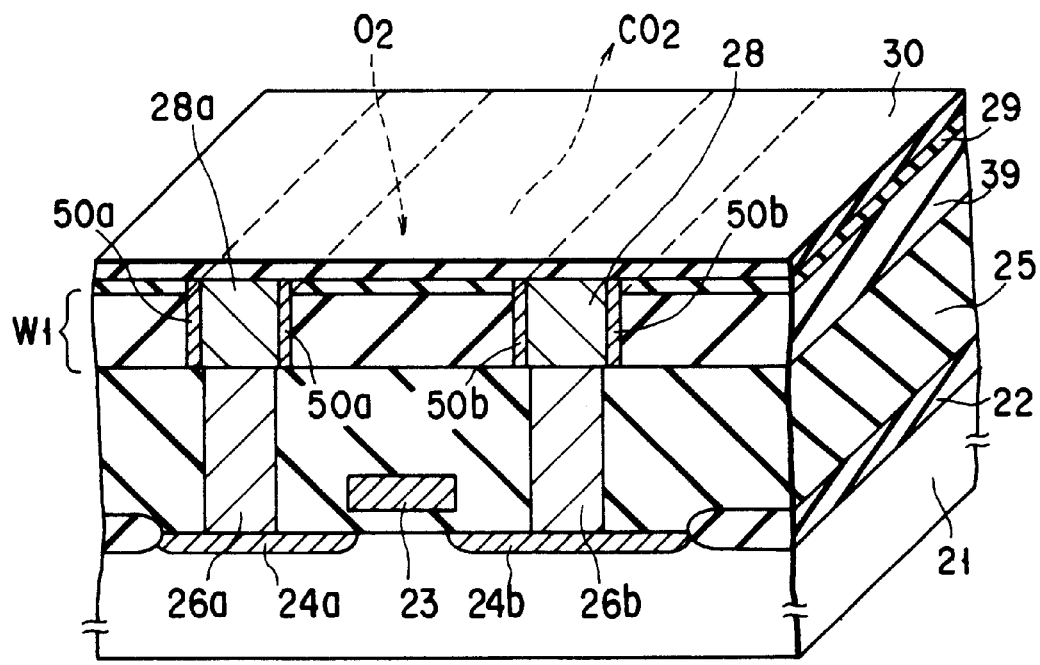
Figure 138:
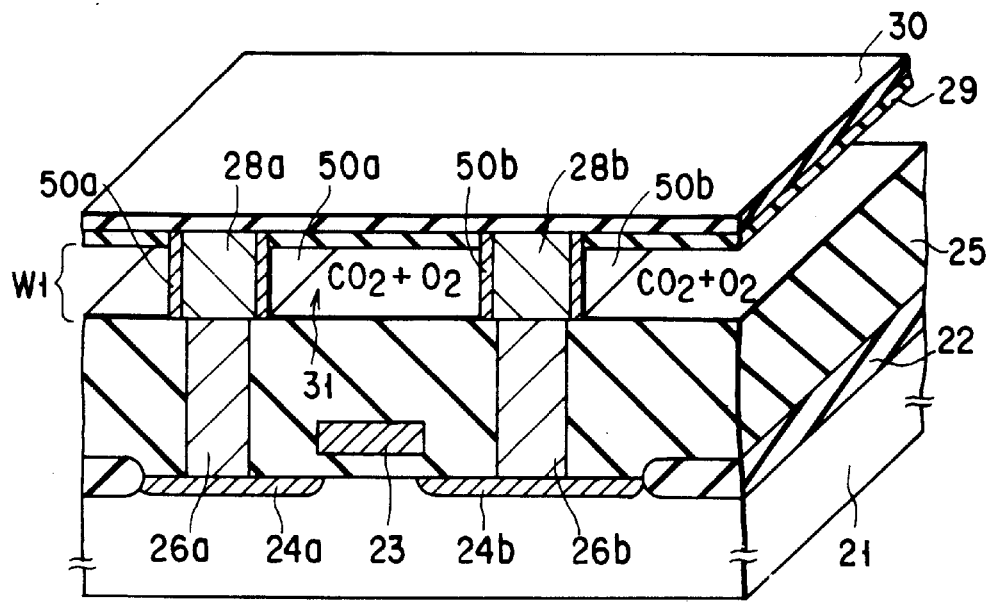

Then, as shown in FIGS. 137 and 138, the carbon layer 39 is ashed, thereby forming cavities 31 which are filled with a mixture gas of mainly oxygen ($O_2$) and carbon dioxide ($CO_2$). The ashing of the layer 39 can be accomplished by either of two alternative methods.

The first method is to heat the carbon layer 39 in an oxygen atmosphere at 400 to 450° C. for about two hours. In the first method, the carbon layer 39 slowly changes into carbon dioxide ($CO_2$), not expanding to break the insulating layer 29 or 30. However, it takes a long time to ashe the carbon layer 39. The second method is oxygen-plasma process. In the second method, the carbon layer 39 changes into carbon dioxide ($CO_2$) at high speed, but may expand, possibly breaking the insulating layer 29 and 30. Nonetheless, breakage of the layers 29 and 30 can be prevented by modifying the insulating layer 30 or by decreasing the oxygen-plasma process temperature.

Figure 139:
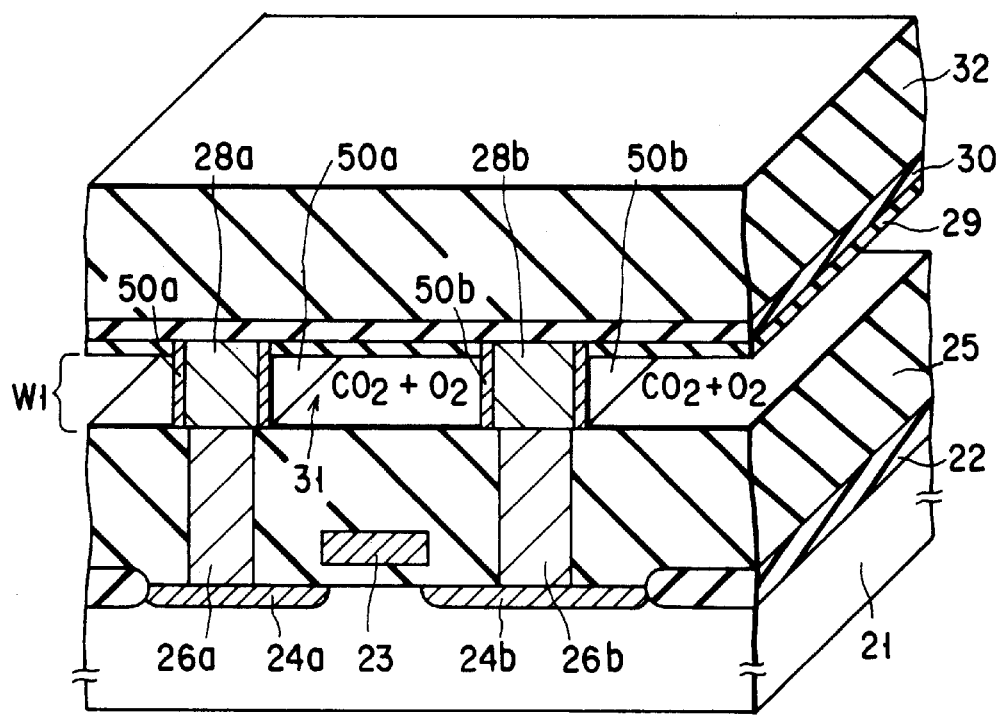
Figure 140:
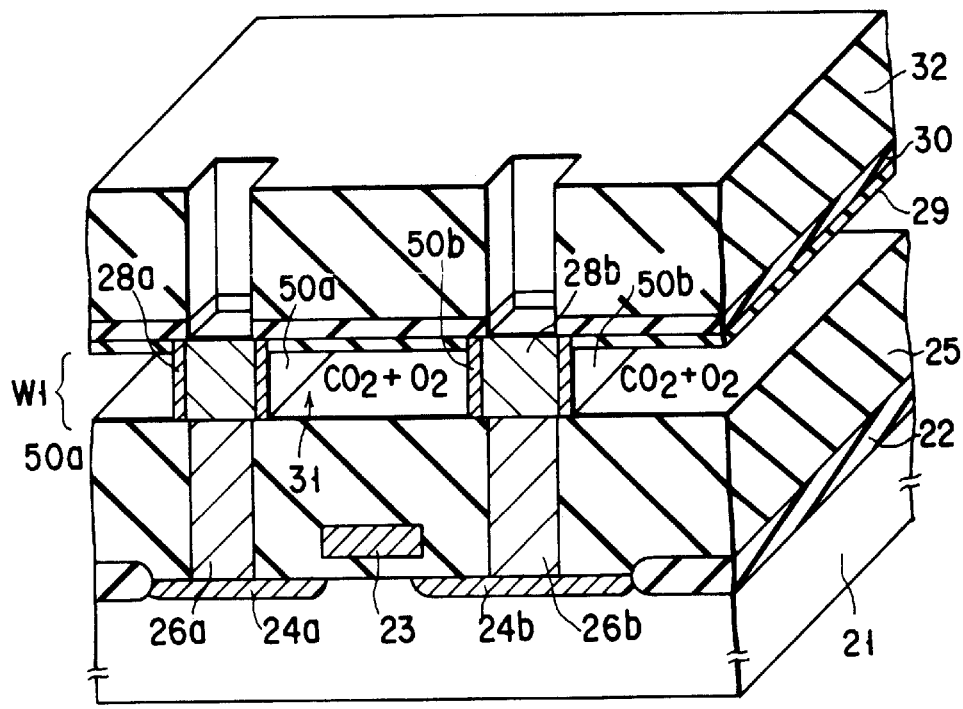
Figure 141:
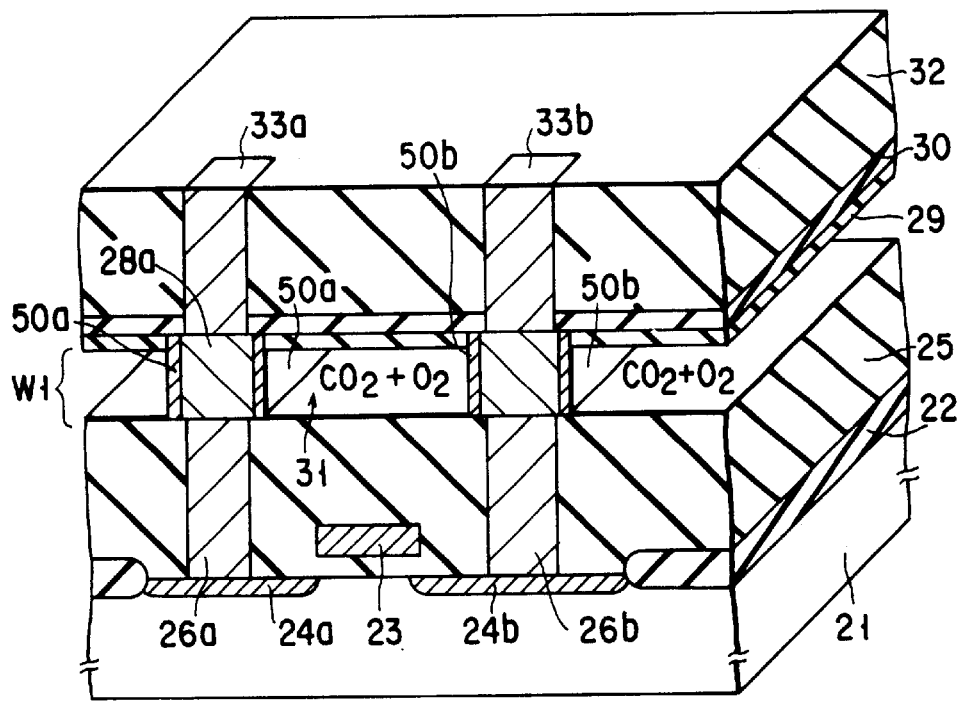

Next, as shown in FIG. 139, an insulating layer 32 (e.g., a TEOS layer containing fluorine) is formed on the insulating layer 30 by means of CVD. This insulating layer 32 has a small dielectric constant. Further, as shown in FIG. 140, PEP (Photo Engraving Process) and RIE (Reactive Ion Etching) are conducted on the insulating layers 30 and 32, forming therein via holes which reach the wires W1. As shown in FIG. 141, conductors 33a and 33b are formed only in the via holes of the layers 30 and 32. The conductors 33a and 33b are made of high-melting metal such as tungsten are formed in the via holes by selective growth. Instead, they can be made of material other than high-melting metal.

Then, as shown in FIG. 142, the wires W2 are formed in the same way as the wires W1 are formed. To be more specific, a carbon layer is formed by sputtering on the insulating layer 32. This carbon layer is as thick as wires W2. Further, a mask layer 36 (e.g., a silicon oxide layer or a silicon nitride layer) is formed on the carbon layer by sputtering to a thickness of about 0.05 μm.

The mask layer 36 is patterned by PEP (Photo Engraving Process) and anisotropic etching. The carbon layer are subjected to anisotropic etching, which is accomplished by using the patterned mask layer as the mask, whereby slits are made in the carbon layer. Then, the wire-protecting layers 51a and 51b, both made of silicon oxide, are formed on inner surfaces of the slits made in the carbon layer by sputtering or CVD and RIE.

The conductors 35a and 35b, both made of copper, aluminum alloy or the like, are formed by sputtering or CVD on the wire-protecting layers 51a and 51b, respectively, and also on the carbon layer. Chemical mechanical polishing (CMP) is performed, leaving the wire-protecting layers 51a and 51b and the conductors 35a and 35b in the slits made in the carbon layer. As a result, the wires W2 are formed. The CMP may be replaced by anisotropic etching or isotropic etching, to form the wires W2.

This done, an insulating layer 37 (e.g., a silicon oxide layer) is formed on the carbon layer and the wires W2 by sputtering. Thereafter, the carbon layer is ashed, thereby forming cavities 38 which are filled with a mixture gas of mainly oxygen ($O_2$) and carbon dioxide ($CO_2$).

In the method just described, carbon layers are used as insulating layers to form the wires W1 and the wires W2 and are ashed after the wires W1 and W2 have been formed in the slits made in the carbon layers, thereby providing cavities filled with gas. The semiconductor device shown in FIG. 127 can, therefore, be manufactured easily.

FIG. 143 illustrates a semiconductor device according to the twenty-third embodiment of the present invention.

As seen from FIG. 143, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a conductor 28a and a wire-protecting layer 50a covering the sides of the conductor 28a. The other wire W1 is composed of a conductor 28b and a wire-protecting layer 50b covering the sides of the conductor 28b. The conductors 28a and 28b are made of metal such as copper or aluminum alloy. They can be made of material other than copper and aluminum alloy, for example semiconductor such as polysilicon containing an impurity, or high-melting metal such as tungsten. The wire-protecting layers 50a and 50b are made of, for example, insulating material such as silicon oxide or silicon nitride, titanium oxide, titanium-tungsten alloy, transition metal such as platinum, alloy of transition metal, or molybdenum. They may be made of any other material that is electrically conductive and resistant to chemicals and that can hardly be oxidized.

On the wires W1 there is provided an insulating layer 30. Hence, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted. The layer 30 is made of silicon oxide or the like.

Mounted on the insulating layer 30 is an insulating layer 32, which is made of, for example, silicon oxide. The insulating layers 30 and 32 have contact holes which reach the wires W1. The contact holes are filled with conductors 33a and 33b made of high-melting metal such as tungsten. The conductors 33a and 33b may be made of material other than high-melting metal.

Wires W2 are provided on the insulating layer 32 and connected to the conductors 33a and 33b. Each wire W2 is comprised of a conductor and a wire-protecting layer covering the and sides of the conductor. More precisely, one wire W2 is made of a conductor 35a and a wire-protecting layer 51a covering the sides of the conductor 35a, and another wire W2 is made of a conductor 35b and a wire-protecting layer 51b covering the sides of the conductor 35b. The conductors 35a and 35b are made of copper, aluminum alloy or the like. They can be made of other material, for example, semiconductor such as polysilicon containing an impurity, or high-melting metal such as tungsten. The wire-protecting layers 51a and 51b are made of, for example, insulating material such as silicon oxide or silicon nitride, titanium oxide, titanium-tungsten alloy, transition metal such as platinum, alloy of transition metal, or molybdenum. The wire-protecting layers 51a and 51b can be made of any other material that is electrically conductive and resistant to chemicals and that can hardly be oxidized.

On the wires W2 there is mounted an insulating layer 37. Thus, the wires W2 support the insulating layer 37. Cavities 38 are provided among the wires W2. The cavities 38 are filled with a mixture gas of mainly oxygen ($O_2$) and carbon dioxide ($CO_2$). The insulating layer 37 is an important component, defining the cavities 38 and serving as a base on which some layers will be mounted. The layer 37 is made of silicon oxide or the like.

In the semiconductor device shown in FIG. 143, the cavities 31 provided among the wires W1 and the cavities 38 provided among the upper portions of the wires W2 are filled with the mixture gas of oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces are filled with insulating layers made of silicon oxide or the like.

Further, no water will flow from the edges of the device chip through the cavities 31 or 38 to reach the wires W1 or the wire W2. This is because the wire-protecting layers 50a and 50b cover and protect the sides of at least the wires W1, and the wire-protecting layers 51a and 51b cover and protect the sides of at least the wires W2.

The cavities 31 and 38 may be filled with air, not the mixture gas. This can be accomplished by making, in the package encapsulating the device, holes which connects the cavities 31 and 38 to the atmosphere. The air can circulate in each cavity and can efficiently dissipate heat from the device chip. The semiconductor device scarcely makes errors due to the heat generated in the chip.

Moreover, hillocks will hardly be formed on the wires W1 or the wires W2. This is because the sides of the wires W1 and W2 are covered with the wire-protecting layers 50a and 50b and the wire-protecting layers 51a and 51b.

It will be explained how the device shown in FIG. 143 is manufactured, with reference to FIGS. 144 to 153.

Figure 144:
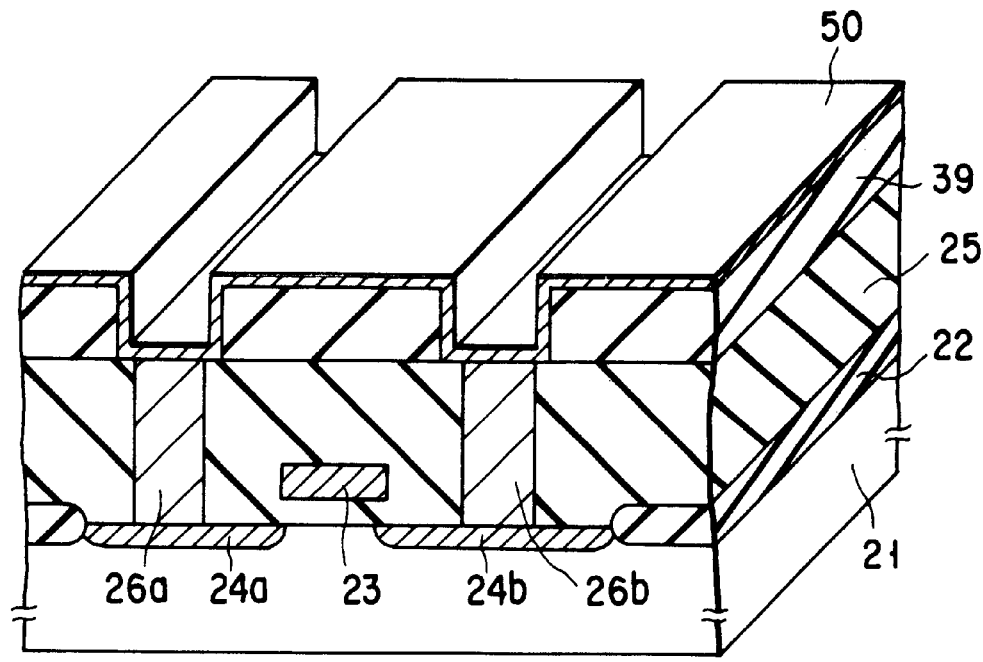

At first, the same steps as carried out as in the manufacture of the eighteenth embodiment, until the carbon layer 39 is formed on the insulating layer 25. That is, the field oxide layer 22 is formed on the semiconductor substrate 21 by LOCOS method, as is shown in FIG. 144. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. The contact holes may be filled with other electrically conductive material other than high-melting metal.

Then, a carbon layer 39 is formed on the insulating layer 25 by sputtering as is shown in FIG. 144. The carbon layer 39 is as thick as wires to be formed in an LSI, for example about 0.2 to 0.7 μm. Further, a mask layer (e.g., a silicon oxide layer or a silicon nitride layer) is formed on the carbon layer 39 by sputtering to a thickness of about 0.05 μm. The mask layer is patterned by PEP (Photo Engraving Process) and anisotropic etching. Using the mask layer as the mask, the carbon layer 39 is etched by anisotropic etching.

The carbon layer 39 is etched not by PEP, but by using the PEP-patterned mask layer, for the same reason stated in the explanation of the method of manufacturing the second embodiment. Hence, it is desirable to etch the carbon layer by using the PEP-processed mask if the conductors 26a and 26b are made of high-melting metal, and to etch the carbon layer by using a resist as the mask if the conductors 26a and 26b are made of material resistant to the solution of $H_2SO_4$ and $H_2O_2$.

Figure 145:
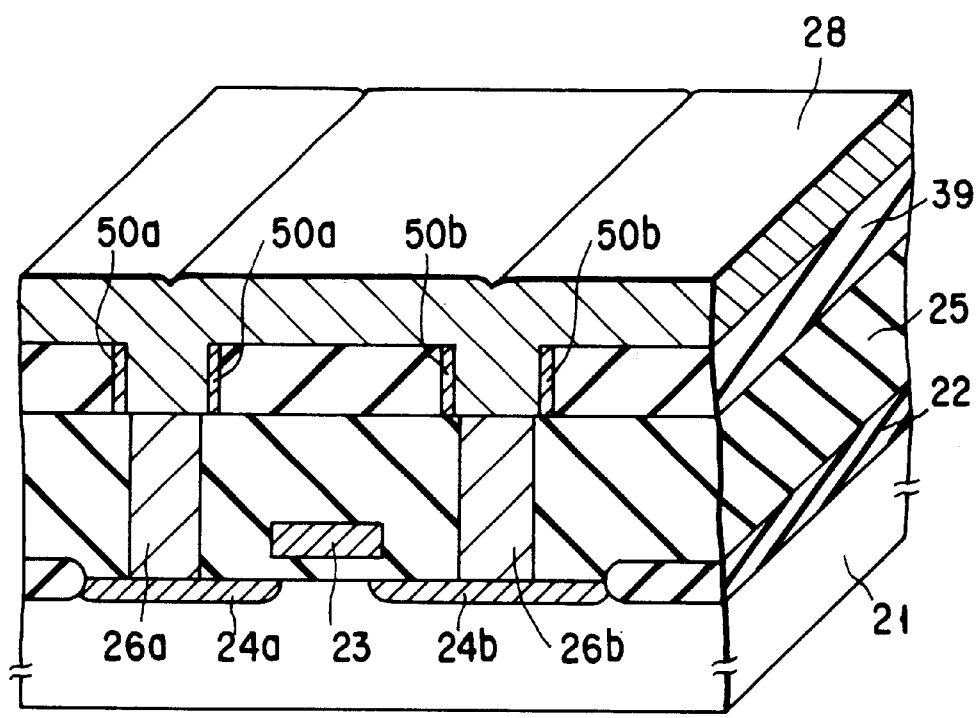

Thereafter, the mask layer is removed, and a wire-protecting layer 50 made of, for example, silicon oxide is formed on the insulating layer 25 and in the slits formed in the carbon layer 39, by means of sputtering or CVD. Then, as shown in FIG. 145, the layer 50 is etched by RIE, forming wire-protecting layers 50a and 50b on the inner sides of the slits made in the carbon layer 39. Further, a metal layer 28, such as a copper layer or an aluminum alloy layer, is formed by sputtering or CVD on the carbon layer 39 and in the slits thereof. The metal layer 28 can be made of other material, for example, semiconductor such as polysilicon containing an impurity, or high-melting metal such as tungsten or tantalum.

Next, chemical mechanical polishing (CMP) is performed, leaving wire-protecting layers 50a and 50b and conductors 28a and 28b in the slits of the carbon layer 39 as is illustrated in FIG. 146. Wires W1 are thereby formed. The CMP may be replaced by anisotropic etching or isotropic etching, to form the wires W1.

Then, as shown in FIG. 137, the insulating layer 30 (e.g., a silicon oxide layer) is then formed by sputtering on the carbon layer 39 and the wires W1. The insulating layer 30 should better be formed by means of sputtering, not by CVD, because the carbon layer 39 would be eroded by the oxygen $O_2$ contained in the reaction gas applied in CVD to form the insulating layer 30. It is desired that the layer 30 be 0.01 to 0.1 μm thick if it is made of silicon oxide. So long as its thickness remains within this range, the layer 30 is not broken when the carbon layer is ashed. The thickness best for the insulating layer 30 depends on the material of the layer 30.

Then, as shown in FIGS. 148 and 149, the carbon layer 39 is ashed, thereby forming cavities 31 which are filled with a mixture gas of mainly oxygen ($O_2$) and carbon dioxide ($CO_2$). The ashing of the layer 39 can be accomplished by either of two alternative methods.

The first method is to heat the carbon layer 39 in an oxygen atmosphere at 400 to 450° C. for about two hours. In the first method, the carbon layer 39 slowly changes into carbon dioxide ($CO_2$), not expanding to break the insulating layer 30. However, it takes a long time to ashes the carbon layer 39. The second method is oxygen-plasma process. In the second method, the carbon layer 39 changes into carbon dioxide ($CO_2$) at high speed, but may expand, possibly breaking the insulating layer 30. Nonetheless, breakage of the layer 30 can be prevented by modifying the insulating layer 30 or by decreasing the oxygen-plasma process temperature.

Next, as shown in FIG. 150, an insulating layer 32 (e.g., a TEOS layer containing fluorine) is formed on the insulating layer 30 by means of CVD. This insulating layer 32 has a small dielectric constant. Further, as shown in FIG. 151, PEP (Photo Engraving Process) and RIE (Reactive Ion Etching) are conducted on the insulating layers 30 and 32, forming therein via holes which reach the wires W1. As shown in FIG. 152, conductors 33a and 33b are formed only in the via holes of the layers 30 and 32. The conductors 33a and 33b are made of high-melting metal such as tungsten or tantalum are formed in the via holes by selective growth. Instead, they can be made of material other than high-melting metal.

Then, as shown in FIG. 153, the wires W2 are formed in the same way as the wires W1 are formed. To be more specific, a carbon layer is formed by sputtering on the insulating layer 32. This carbon layer is as thick as wires W2. Further, a mask layer (e.g., a silicon oxide layer or a silicon nitride layer) is formed on the carbon layer by sputtering to a thickness of about 0.05 $\mu$m.

The mask layer is patterned by PEP (Photo Engraving Process) and anisotropic etching. The carbon layer are subjected to anisotropic etching, which is accomplished by using the patterned mask layer as the mask, whereby slits are made in the carbon layer. Then, the wire-protecting layers 51a and 51b, both made of silicon oxide, for example, are formed on inner surfaces of the slits made in the carbon layer by sputtering or CVD and RIE.

The conductors 35a and 35b, both made of copper, aluminum alloy or the like, are formed by sputtering or CVD on the wire-protecting layers 51a and 51b, respectively, and also on the carbon layer. Chemical mechanical polishing (CMP) is performed, leaving the wire-protecting layers 51a and 51b and the conductors 35a and 35b in the slits made in the carbon layer. As a result, the wires W2 are formed.

This done, an insulating layer 37 (e.g., a silicon oxide layer) is formed on the carbon layer and the wires W2 by sputtering. Thereafter, the carbon layer is ashed, thereby forming cavities 38 which are filled with a mixture gas of mainly oxygen ($O_2$) and carbon dioxide ($CO_2$).

In this method, carbon layers are used as insulating layers to form the wires W1 and the wires W2 and are ashed after the wires W1 and W2 have been formed in the slits made in the carbon layers, thereby providing cavities filled with gas. The semiconductor device shown in FIG. 143 can, therefore, be manufactured easily.

Figure 154:
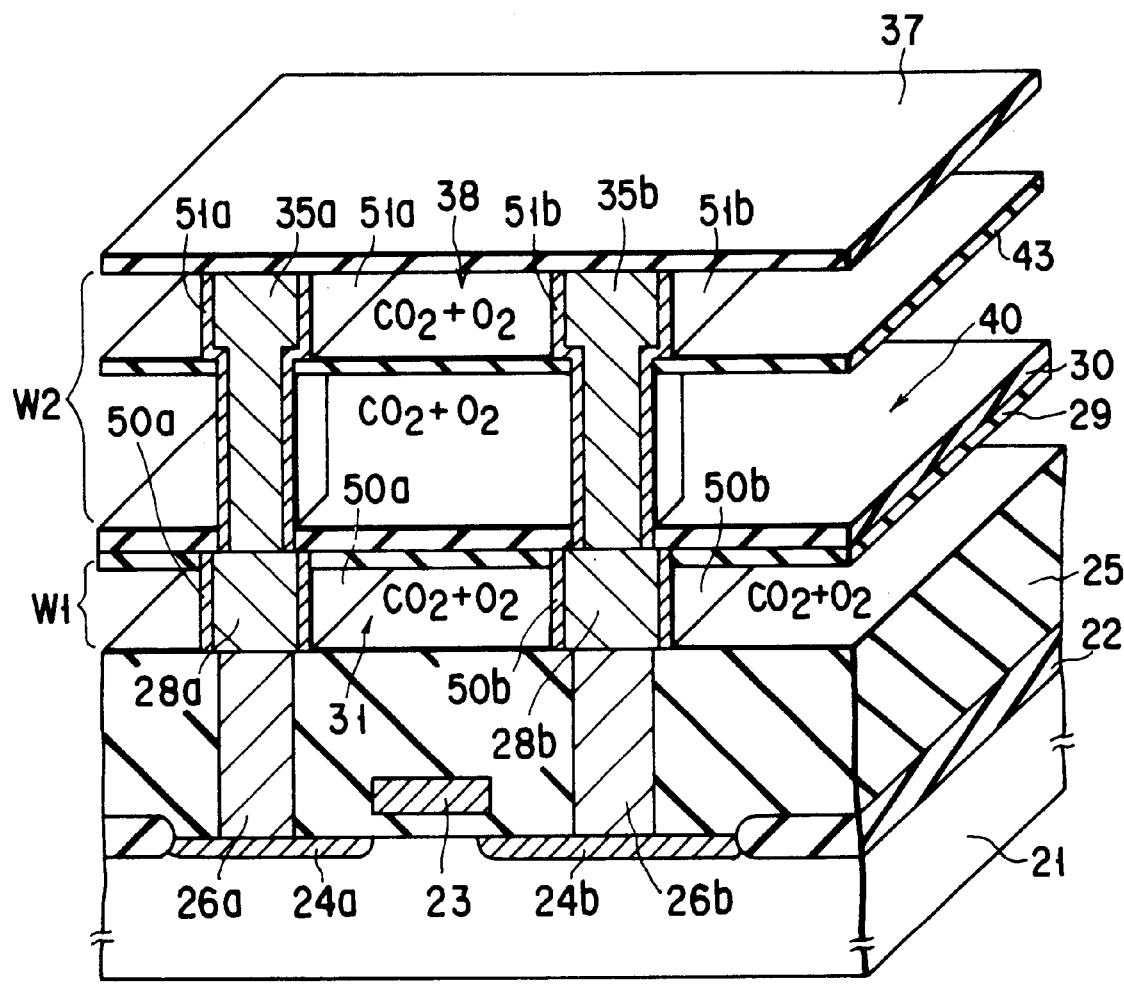
FIG. 154 is a perspective, sectional view of a semiconductor device according to a-twenty-fourth embodiment of the present invention.

FIG. 154 shows a semiconductor device according to the twenty-fourth embodiment of the invention.

As seen from FIG. 154, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by means of, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a conductor 28a and a wire-protecting layer 50a covering the sides of the conductor 28a. Similarly, the other wire W1 is composed of a conductor 28b and a wire-protecting layer 50b covering the sides of the conductor 28b. The conductors 28a and 28b are made of metal such as copper or aluminum alloy. They can be made of material other than copper and aluminum alloy, for example semiconductor such as polysilicon containing an impurity, or high-melting metal such as tungsten. The wire-protecting layers 50a and 50b are made of, for example, insulating material such as silicon oxide or silicon nitride, titanium oxide, titanium-tungsten alloy, transition metal such as platinum, alloy of transition metal, or molybdenum. They may be made of any other material that is electrically conductive and resistant to chemicals and that can hardly be oxidized.

On the wires W1 there is provided an insulating layer 30. An insulating layer 29 is mounted on the lower surface of the insulating layer 30. Thus, the wires W1 support the insulating layers 29 and 30. Cavities 31 are provided among the wires W1. They are filled with a mixture gas of mainly oxygen ($O_2$) and carbon dioxide ($CO_2$). The insulating layer 29 determines the pattern of wires W1; it is made of silicon oxide, silicon nitride or the like. The insulating layer 30 is an important component, defining the cavities 31 and serving as a base on which some layers will be mounted. The layer 30 is made of silicon oxide or the like.

The insulating layers 28 and 30 have contact holes which reach the wires W1. Wires W2 are provided which have lower ends fitted in the contact holes of the insulating layers 29 and 30. The wires W2 are connected to the wires W1. Each wire W2 is comprised of a conductor and a wire-protecting layer covering the sides of the conductor. More precisely, one wire W2 is made of a conductor 35a and a wire-protecting layer 51a, and another wire W1 is made of a conductor 35a and a wire-protecting layer 51b. The layer 51a covers the sides of the conductor 35a, and the layer 51b the sides of the conductor 35b. The conductors 35a and 35b are made of copper, aluminum alloy or the like. They can be made of other material, for example, semiconductor such as polysilicon containing an impurity, or high-melting metal such as tungsten or tantalum. The wire-protecting layers 51a and 51b are made of, for example, insulating material such as silicon oxide or silicon nitride, titanium oxide, titanium-tungsten alloy, transition metal such as platinum, alloy of transition metal, or molybdenum. The wire-protecting layers 51a and 51b can be made of any other material that is electrically conductive and resistant to chemicals and that can hardly be oxidized.

As seen from FIG. 154, each wire W2 consists of a columnar lower portion and a strip-shaped upper portion.

The wires W2 support an insulating layer 43 (e.g., a silicon oxide layer), each at the junction between the lower and upper portions.

On the wires W2 there is mounted an insulating layer 37. Cavities 40 are provided among the lower portions of the wires W2 and between the insulating layers 30 and 43. The cavities 40 are filled with a mixture gas of mainly oxygen ($O_2$) and carbon dioxide ($CO_2$). Further, cavities 38 are provided among the upper portions of the wires W2 and between the insulating layers 37 and 43. The cavities 38 are filled with a mixture gas of mainly oxygen ($O_2$) and carbon dioxide ($CO_2$).

In the semiconductor device shown in FIG. 154, the cavities 31 provided among the wires W1, and the cavities 38 provided among the upper portions of the wires W2 are filled with the mixture gas of oxygen ($O_2$) and carbon dioxide ($CO_2$). Further, the cavities 40 provided among the lower portions of the wires W2 are filled with the mixture gas of oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the cavities among the wires located at the same level and those located at different levels) are filled with insulating layers made of silicon oxide or the like.

Further, no water will flow from the edges of the device chip through the cavities 31, 38 or 40 to reach the wires W1 or the wire W2. This is because the wire-protecting layers 50a and 50b cover and protect the sides of at least the wires W1, and the wire-protecting layers 51a and 51b cover and protect the sides of at least the wires W2.

The cavities 31 and 38 may be filled with air, not the mixture gas. This can be accomplished by making, in the package encapsulating the device, holes which connects the cavities 31 and 38 to the atmosphere. The air can circulate in each cavity and can efficiently dissipate heat from the device chip. The semiconductor device scarcely makes errors due to the heat generated in the chip.

Moreover, hillocks will hardly be formed on the wires W1 or the wires W2. This is because the sides of the wires W1 and W2 are covered with the wire-protecting layers 50a and 50b and the wire-protecting layers 51a and 51b.

How the device shown in FIG. 154 is manufactured will be explained, with reference to FIGS. 155 to 160.

First, the same steps as carried out as in the manufacture of the twenty-second embodiment, until the wires W1 are formed on the insulating layer 25. That is, the field oxide layer 22 is formed on the semiconductor substrate 21 by LOCOS method, as is illustrated in FIG. 155. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24a and drain region 24b of the MOS transistor. The conductors 26a and 26b made of high-melting metal such as tungsten are formed by selective growth in the contact holes of the insulating layer 25. The contact holes may be filled with other electrically conductive material other than high-melting metal.

Then, a carbon layer is formed on the insulating layer 25 by sputtering. The carbon layer is as thick as wires to be formed in an LSI, for example about 0.2 to 0.7 $\mu$m. Further, a mask layer 29 (e.g., a silicon oxide layer or a silicon nitride layer) is formed on the carbon layer by sputtering to a thickness of about 0.05 $\mu$m. The mask layer 29 is patterned by PEP (Photo Engraving Process) and anisotropic etching. Using the mask layer 29 as the mask, the carbon layer is subjected to anisotropic etching.

The carbon layer is etched not by PEP, but by using the PEP-patterned mask layer, for the same reason stated in the explanation of the method of manufacturing the second embodiment. Hence, it is desirable to etch the carbon layer by using the PEP-processed mask if the conductors 26a and 26b are made of high-melting metal, and to etch the carbon layer by using a resist as the mask if the conductors 26a and 26b are made of material resistant to the solution of $H_2SO_4$ and $H_2O_2$.

Thereafter, a wire-protecting layer made of, for example, silicon oxide, is formed on the carbon layer and in the slits formed in the carbon layer, by means of sputtering or CVD. The wire-protecting layer is etched, forming wire-protecting layers 50a and 50b on the inner surfaces of the slits. Further, the conductors 28a and 28b, made of copper aluminum alloy layer, are formed on the wire-protecting layers 50a and 50b by sputtering or CVD. The conductors 28a and 28b can be made of other material, for example, semiconductor such as polysilicon containing an impurity, or high-melting metal such as tungsten or tantalum.

Next, chemical mechanical polishing (CMP) is performed, leaving the wire-protecting layers 50a and 50b and the conductors 28a and 28b in the slits of the carbon layer. Wires W1 are thereby formed. The CMP may be replaced by anisotropic etching or isotropic etching, to form the wires W1.

Next, the insulating layer 30 (e.g., a silicon oxide layer) is then formed by sputtering on the mask layer 29 and the wires W1. The insulating layer 30 should better be formed by means of sputtering, not by CVD, because the carbon layer would be eroded by the oxygen $O_2$ contained in the reaction gas applied in CVD to form the insulating layer 30. It is desired that the layer 30 be 0.01 to 0.1 $\mu$m thick if it is made of silicon oxide. So long as its thickness remains within this range, the layer 30 is not broken when the carbon layer is ashed. The thickness most desirable for the insulating layer 30 depends on the material of the layer 30.

Then, the carbon layer is ashed, thereby forming cavities 31 which are filled with a mixture gas of mainly oxygen ($O_2$) and carbon dioxide ($CO_2$).

After the wires W1 have been thus formed, a carbon layer 41 is formed by sputtering on the insulating layer 30. Further, an insulating layer 43 (e.g., a silicon oxide layer) is formed on the carbon layer 41 by sputtering to a thickness of about 0.05 $\mu$m. The insulating layer 43 should better be formed by means of sputtering, not by CVD, because the carbon layer 41 would be eroded by the oxygen $O_2$ contained in the reaction gas applied in CVD to form the insulating layer 43. The layer 43 should be 0.01 to 0.1 $\mu$m thick if it is made of silicon oxide. So long as its thickness remains within this range, the layer 43 is not broken when the carbon layer is ashed. The thickness best for the insulating layer 43 depends on the material of the layer 43.

Next, a carbon layer 44 is formed on the insulating layer 43 by sputtering. The carbon layer 44 is patterned, forming slits in the layer 44. The carbon layer 44 may be patterned by one of two alternative methods. The first is to perform PEP (Photo Engraving Process) and RIE. The second is to perform PEP and use a mask prepared by RIE.

In the present embodiment, the carbon layer 44 is patterned by means of PEP and RIE. More specifically, a resist 45 is formed on the carbon layer 44 and is patterned as shown in FIG. 155. Anisotropic etching is carried out on the carbon layer 44, by using the resist 45 as the mask, thereby forming slits in the layer 44. A solution of $H_2SO_4$ and $H_2O_2$ is applied, removing the resist 45. It should be noted that the resist 45 is not removed by oxygen plasma process, which would erode the carbon layer 44.

Then, as shown in FIG. 156, a resist 46 is formed on the carbon layer 44 and patterned. Using the resist 46 as the mask, anisotropic etching is conducted on the insulating layer 43 and the carbon layer 41, thus forming via holes in these layers 43 and 41. This done, $H_2SO_4$ and $H_2O_2$ are applied, removing the resist 46. The resist 46 is removed not by oxygen plasma process, which would erode the carbon layer 44.

As shown in FIG. 157, the insulating layer 30 is subjected to anisotropic etching, thereby forming via holes in the layer 30, which reach the wires W1. A wire-protecting layer made of, for example, silicon oxide, is formed by sputtering or CVD, in the via holes of the layer 30, the via holes of the carbon layer 41, the via holes of the insulating layer 43 and the slits of the carbon layer 44 and on the carbon layer 44. Further, a metal layer 35 made of copper, aluminum alloy or the like is formed on the wire-protecting layer by either sputtering or CVD.

Next, as seen from FIG. 158, chemical mechanical polishing (CMP) is performed on the metal layer 35 and the wire-protecting layer, thereby forming wire-protecting layers 51a and 51b and conductors 35a and 35b—all in the via holes of the insulating layer 30, carbon layer 41 and insulating layer 43 and in the slits of the carbon layer 44. Thus, wires W2 are provided, each consisting of a wire-protecting layer and a conductor.

Further, an insulating layer 37 (e.g., a silicon oxide layer) is formed on the carbon layer 44 by sputtering to a thickness of about 0.05 μm. The insulating layers 37 and 43 should be 0.01 to 0.1 μm thick if they are made of silicon oxide. So long as their thickness remains within this range, the insulating layers 37 and 43 are not broken when the carbon layers 41 and 44 are ashed. The thickness most desirable for the insulating layer 37 and the thickness optimal for the insulating layer 43 depend on the materials of the layers 37 and 43.

Then, as shown in FIGS. 159 and 160, the carbon layers 41 and 44 are simultaneously ashed by heat treatment in an oxygen atmosphere or by oxygen plasma process. The carbon layer 41 is thereby changed into cavities 40, and the carbon layer 44 changed into cavities 38. The cavities 38 and 40 are filled with a mixture gas of mainly oxygen ($O_2$) and carbon dioxide ($CO_2$).

In this method, carbon layers are used as insulating layers having slits or via holes, for forming the wires W1 and the wires W2. They are ashed after the wires W1 and W2 are formed in the slits and via holes, thereby forming gas-filled cavities. In addition, the method has a relatively small number of steps since the wires W2 are directly connected to the wires W1, without using contact plugs.

Hence, a semiconductor device can be manufactured, in which the spaces among the wires located at the same level are filled with air or a mixture gas of oxygen ($O_2$) and carbon dioxide ($CO_2$), and the spaces among the wires located at different levels are also filled with air or a mixture gas of oxygen ($O_2$) and carbon dioxide ($CO_2$).

FIG. 161 shows a semiconductor device according to the twenty-fifth embodiment of the present invention.

As seen from FIG. 161, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG), phosphor silicate glass (PSG), or the like. The upper surface of the layer 25 has been made flat by means of, for example, chemical mechanical polishing (CMP). The insulating layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the insulating layer 25 are wires W1, which are connected to the conductors 26a and 26b. One wire W1 is composed of a conductor 28a and a wire-protecting layer 50a covering the sides of the conductor 28a. Similarly, the other wire W1 is composed of a conductor 28b and a wire-protecting layer 50b covering the sides of the conductor 28b. The conductors 28a and 28b are made of metal such as copper or aluminum alloy. They can be made of material other than copper and aluminum alloy, for example semiconductor such as polysilicon containing an impurity, or high-melting metal such as tungsten or tantalum. The wire-protecting layers 50a and 50b are made of, for example, insulating material such as silicon oxide or silicon nitride, titanium oxide, titanium-tungsten alloy, transition metal such as platinum, alloy of transition metal, or molybdenum. They may be made of any other material that is electrically conductive and resistant to chemicals and that can hardly be oxidized.

On the wires W1 there is provided an insulating layer 30. Thus, the wires W1 support the insulating layer 30. Cavities 31 are provided among the wires W1. They are filled with a mixture gas of mainly oxygen ($O_2$) and carbon dioxide ($CO_2$). The insulating layer 30 is an important component, defining the cavities 31 and serving as a base on which some layers will be mounted. The layer 30 is made of silicon oxide or the like.

The insulating layer 30 has contact holes which reach the wires W1. Wires W2 are provided which have lower ends fitted in the contact holes of the insulating layer 30 and which are connected to the wires W1. Each wire W2 is comprised of a conductor and a wire-protecting layer covering the sides of the conductor. More precisely, one wire W2 is made of a conductor 35a and a wire-protecting layer 51a, and another wire W1 is made of a conductor 35a and a wire-protecting layer 51b. The layer 51a covers the sides of the conductor 35a, and the layer 51b the sides of the conductor 35b. The conductors 35a and 35b are made of copper, aluminum alloy or the like. They can be made of other material, for example, semiconductor such as polysilicon containing an impurity, or high-melting metal such as tungsten or tantalum. The wire-protecting layers 51a and 51b are made of, for example, insulating material such as silicon oxide or silicon nitride, titanium oxide, titanium-tungsten alloy, transition metal such as platinum, alloy of transition metal, or molybdenum. The wire-protecting layers 51a and 51b can be made of any other material that is electrically conductive and resistant to chemicals and that can hardly be oxidized.

As seen from FIG. 161, each wire W2 consists of a columnar lower portion and a strip-shaped upper portion. The wires W2 support an insulating layer 43 (e.g., a silicon oxide layer), each at the junction between the lower and upper portions.

On the wires W2 there is mounted an insulating layer 37 (e.g., a silicon oxide layer). Cavities 40 are provided among the lower portions of the wires W2 and between the insulating layers 30 and 43. The cavities 40 are filled with a mixture gas of mainly oxygen ($O_2$) and carbon dioxide ($CO_2$). Further, cavities 38 are provided among the upper portions of the wires W2 and between the insulating layers 37 and 43. The cavities 38 are filled with a mixture gas of mainly oxygen ($O_2$) and carbon dioxide ($CO_2$).

In the semiconductor device shown in FIG. 161, the cavities 31 provided among the wires W1, and the cavities 38 provided among the upper portions of the wires W2 are filled with the mixture gas of oxygen ($O_2$) and carbon dioxide ($CO_2$). Further, the cavities 40 provided among the lower portions of the wires W2 are filled with the mixture gas of oxygen ($O_2$) and carbon dioxide ($CO_2$). The mixture gas has a dielectric constant of about 1.0, which is far less than dielectric constant of silicon oxide or the like. The semiconductor device can, therefore, be an LSI which has a higher packing density of elements and a better performance than in the case where the inter-wire spaces (i.e., the cavities among the wires located at the same level and those located at different levels) are filled with insulating layers made of silicon oxide or the like.

Further, no water will flow from the edges of the device chip through the cavities 31, 38 or 40 to reach the wires W1 or the wire W2. This is because the wire-protecting layers 50*a* and 50*b* cover and protect the sides of at least the wires W1, and the wire-protecting layers 51*a* and 51*b* cover and protect the sides of at least the wires W2.

The cavities 31 and 38 may be filled with air, not the mixture gas. This can be accomplished by making, in the package encapsulating the device, holes which connect the cavities 31 and 38 to the atmosphere. The air can circulate in each cavity and can efficiently dissipate heat from the device chip. The semiconductor device scarcely makes errors due to the heat generated in the chip. Moreover, hillocks will hardly be formed on the wires W1 or the wires W2. This is because the sides of the wires W1 and W2 are covered with the wire-protecting layers 50*a* and 50*b* and the wire-protecting layers 51*a* and 51*b*.

How the device shown in FIG. 161 is manufactured will be explained, with reference to FIGS. 162 to 167.

First, the same steps as carried out as in the manufacture of the twenty-second embodiment, until the wires W1 are formed on the insulating layer 25. That is, the field oxide layer 22 is formed on the semiconductor substrate 21 by LOCOS method, as is illustrated in FIG. 162. A MOS transistor having a gate electrode 23, a source region 24*a* and a drain region 24*b* is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 contact holes which reach the source region 24*a* and drain region 24*b* of the MOS transistor. The conductors 26*a* and 26*b* made of high-melting metal such as tungsten are formed by selective growth in the contact holes of the insulating layer 25. The contact holes may be filled with other electrically conductive material other than high-melting metal.

Then, a carbon layer is formed on the insulating layer 25 by sputtering. The carbon layer is as thick as wires to be formed in an LSI, for example about 0.2 to 0.7 $\mu$m. Further, a mask layer (e.g., a silicon oxide layer or a silicon nitride layer) is formed on the carbon layer by sputtering to a thickness of about 0.05 $\mu$m. The mask layer is patterned by PEP (Photo Engraving Process) and anisotropic etching. Using the mask layer as the mask, the carbon layer is subjected to anisotropic etching.

The carbon layer is etched not by PEP, but by using the PEP-patterned mask layer, for the same reason stated in the explanation of the method of manufacturing the second embodiment. Therefore, it is desirable to etch the carbon layer by using the PEP-processed mask if the conductors 26*a* and 26*b* are made of high-melting metal, and to etch the carbon layer by using a resist as the mask if the conductors 26*a* and 26*b* are made of material resistant to the solution of $H_2SO_4$ and $H_2O_2$.

Thereafter, the mask layer is removed, and the wire-protecting layers 50*a* and 50*b*, both made of, for example, silicon oxide, are formed on the inner surfaces of the silts made in the carbon layer, by means of sputtering or CVD. Further, the conductors 28*a* and 28*b*, made of copper aluminum alloy layer, are formed on the carbon layer and on the wire-protecting layers 50*a* and 50*b* by sputtering or CVD. The conductors 28*a* and 28*b* can be made of other material, for example, semiconductor such as polysilicon containing an impurity, or high-melting metal such as tungsten or tantalum.

Next, chemical mechanical polishing (CMP) is performed, leaving the wire-protecting layers 50*a* and 50*b* and the conductors 28*a* and 28*b* in the slits of the carbon layer. Wires W1 are thereby formed. The CMP may be replaced by anisotropic etching or isotropic etching, to form the wires W1.

Next, the insulating layer 30 (e.g., a silicon oxide layer) is then formed by sputtering on the mask layer 29 and the wires W1. The insulating layer 30 should better be formed by means of sputtering, not by CVD, because the carbon layer would be eroded by the oxygen $O_2$ contained in the reaction gas applied in CVD to form the insulating layer 30. It is desired that the layer 30 be 0.01 to 0.1 $\mu$m thick if it is made of silicon oxide. So long as its thickness remains within this range, the layer 30 is not broken when the carbon layer is ashed. The thickness most desirable for the insulating layer 30 depends on the material of the layer 30.

Then, the carbon layer is ashed, thereby forming cavities 31 which are filled with a mixture gas of mainly oxygen ($O_2$) and carbon dioxide ($CO_2$).

After the wires W1 have been thus formed, a carbon layer 41 is formed by sputtering on the insulating layer 30. Further, an insulating layer 43 (e.g., a silicon oxide layer) is formed on the carbon layer 41 by sputtering to a thickness of about 0.05 $\mu$m. The insulating layer 43 should better be formed by means of sputtering, not by CVD, because the carbon layer 41 would be eroded by the oxygen $O_2$ contained in the reaction gas applied in CVD to form the insulating layer 43. The layer 43 should be 0.01 to 0.1 $\mu$m thick if it is made of silicon oxide. So long as its thickness remains within this range, the layer 43 is not broken when the carbon layer is ashed. The thickness best for the insulating layer 43 depends on the material of the layer 43.

Next, a carbon layer 44 is formed on the insulating layer 43 by sputtering. The carbon layer 44 is patterned, forming slits in the layer 44. The carbon layer 44 may be patterned by one of two alternative methods. The first is to perform PEP (Photo Engraving Process) and RIE. The second is to perform PEP and use a mask prepared by RIE.

In the present embodiment, the carbon layer 44 is patterned by means of PEP and RIE. More specifically, a resist 45 is formed on the carbon layer 44 and is patterned as shown in FIG. 162. Anisotropic etching is carried out on the carbon layer 44, by using the resist 45 as the mask,.thereby forming slits in the layer 44. A solution of $H_2SO_4$ and $H_2O_2$ is applied, removing the resist 45. It should be noted that the resist 45 is not removed by oxygen plasma process, which would erode the carbon layer 44.

Figure 163:
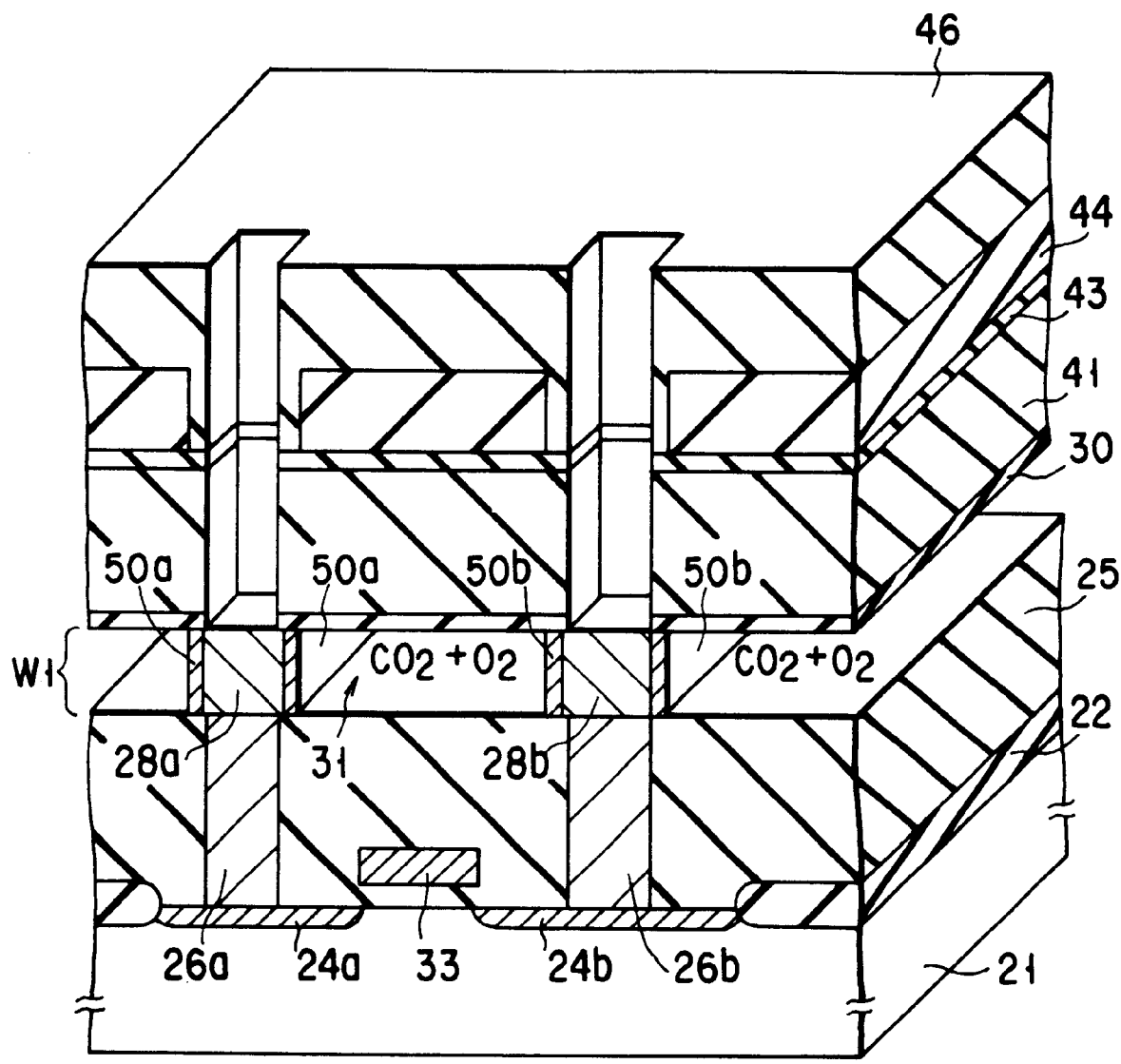

Then, as shown in FIG. 163, a resist 46 is formed on the carbon layer 44 and patterned. Using the resist 46 as the mask, anisotropic etching is conducted on the insulating layer 43 and the carbon layer 41, thus forming via holes in these layers 43 and 41. This done, $H_2SO_4$ and $H_2O_2$ are applied, removing the resist 46. The resist 46 is removed not by oxygen plasma process, which would erode the carbon layer 44.

Figure 164:
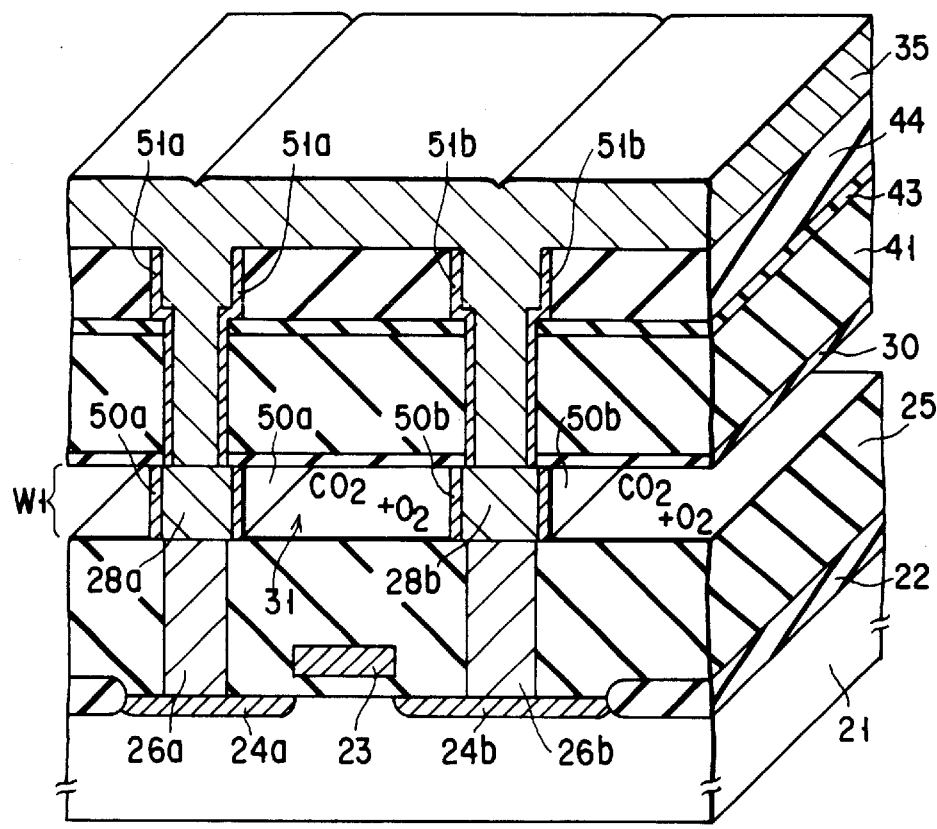
Figure 165:
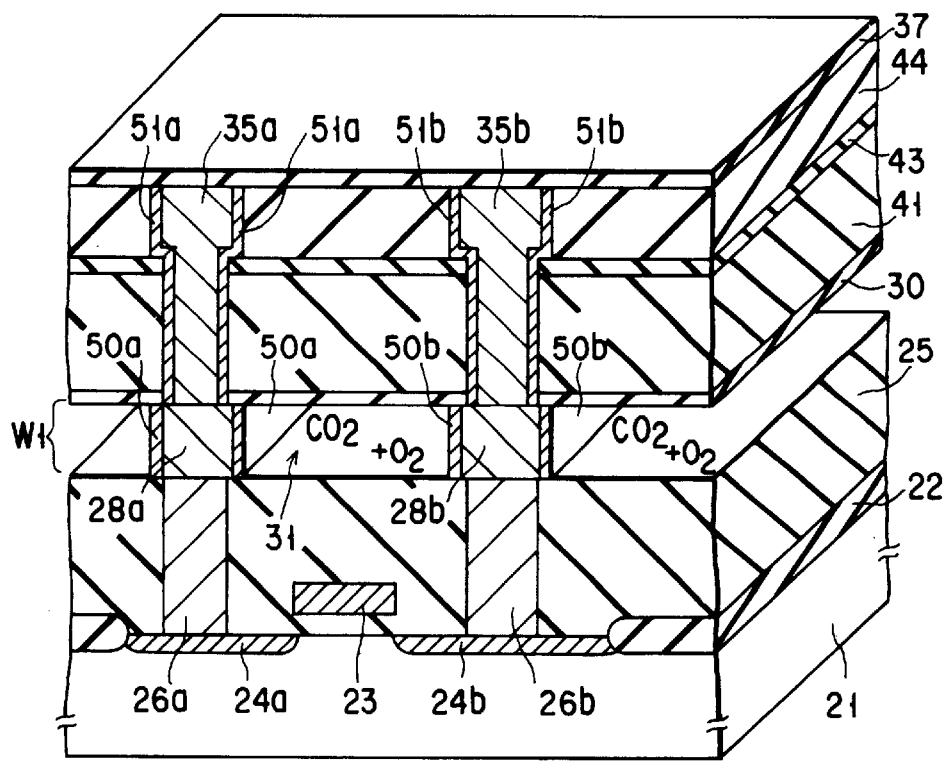

As shown in FIG. 164, the insulating layer 30 is subjected to anisotropic etching, thereby forming via holes in the layer 30, which reach the wires W1. The wire-protecting layers 51a and 51b, both made of, for example, silicon oxide, are formed by sputtering or CVD, on the inner surfaces of the the via holes of the layer 30, carbon layer 41 and insulating layer 43 and on the inner surfaces of the slits of the carbon layer 44. Further, a metal layer 35 made of copper, aluminum alloy or the like is formed in the the via holes of the layer 30, carbon layer 41 and insulating layer 43, in the slits of the carbon layer 44, and on the carbon layer 44.

Next, as seen from FIG. 65, chemical mechanical polishing (CMP) is performed, leaving the wire-protecting layers 51a and 51b and the conductors 35a and 35b in the via holes of the insulating layer 30, carbon layer 41 and insulating layer 43 and in the slits of the carbon layer 44. Thus, wires W2 are provided, each consisting of a wire-protecting layer and a conductor.

Further, an insulating layer 37 (e.g., a silicon oxide layer) is formed on the carbon layer 44 by sputtering to a thickness of about 0.05 $\mu$m. The insulating layers 37 and 43 should be 0.01 to 0.1 $\mu$m thick if they are made of silicon oxide. So long as their thickness remains within this range, the insulating layers 37 and 43 are not broken when the carbon layers 41 and 44 are ashed. The thickness most desirable for the insulating layer 37 and the thickness optimal for the insulating layer 43 depend on the materials of the layers 37 and 43.

Figure 166:
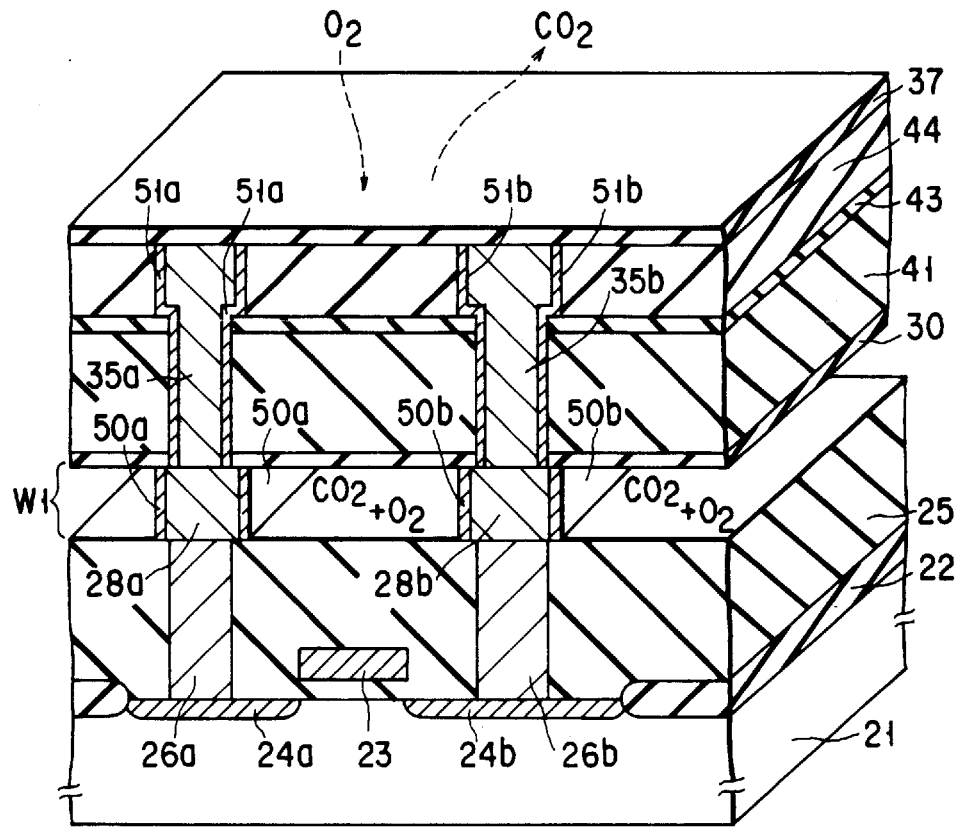
Figure 167:
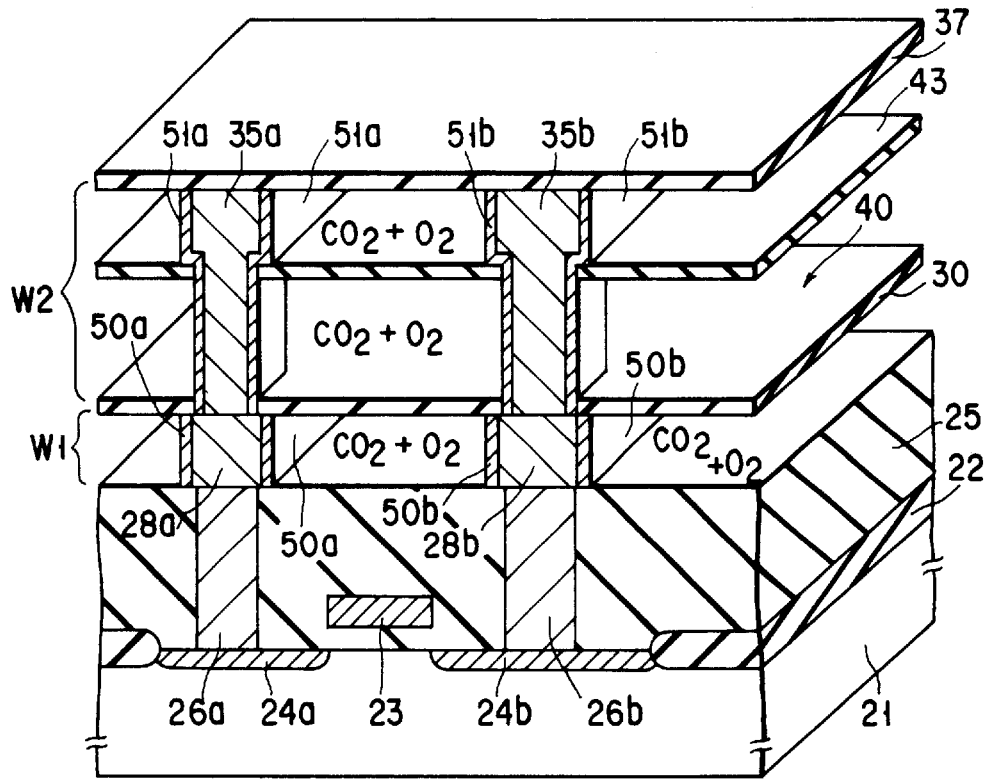

Then, as shown in FIGS. 166 and 167, the carbon layers 41 and 44 are simultaneously ashed by heat treatment in an oxygen atmosphere or by oxygen plasma process. The carbon layer 41 is thereby changed into cavities 40, and the carbon layer 44 changed into cavities 38. The cavities 38 and 40 are filled with a mixture gas of mainly oxygen ($O_2$) and carbon dioxide ($CO_2$).

In the method described above, carbon layers are used as insulating layers having slits or via holes, for forming the wires W1 and the wires W2. They are ashed after the wires W1 and W2 are formed in the slits and via holes, thereby forming gas-filled cavities. Further, the method has a relatively small number of steps since the wires W2 are directly connected to the wires W1, without using contact plugs.

Hence, a semiconductor device can be manufactured, in which the spaces among the wires located at the same level are filled with air or a mixture gas of oxygen ($O_2$) and carbon dioxide ($CO_2$), and the spaces among the wires located at different levels are also filled with air or a mixture gas of oxygen ($O_2$) and carbon dioxide ($CO_2$).

In addition, each carbon layer can be ashed fast and precisely since the mask layer is removed after the carbon carbon layer is patterned and before the carbon layer is ashed.

Figure 168:
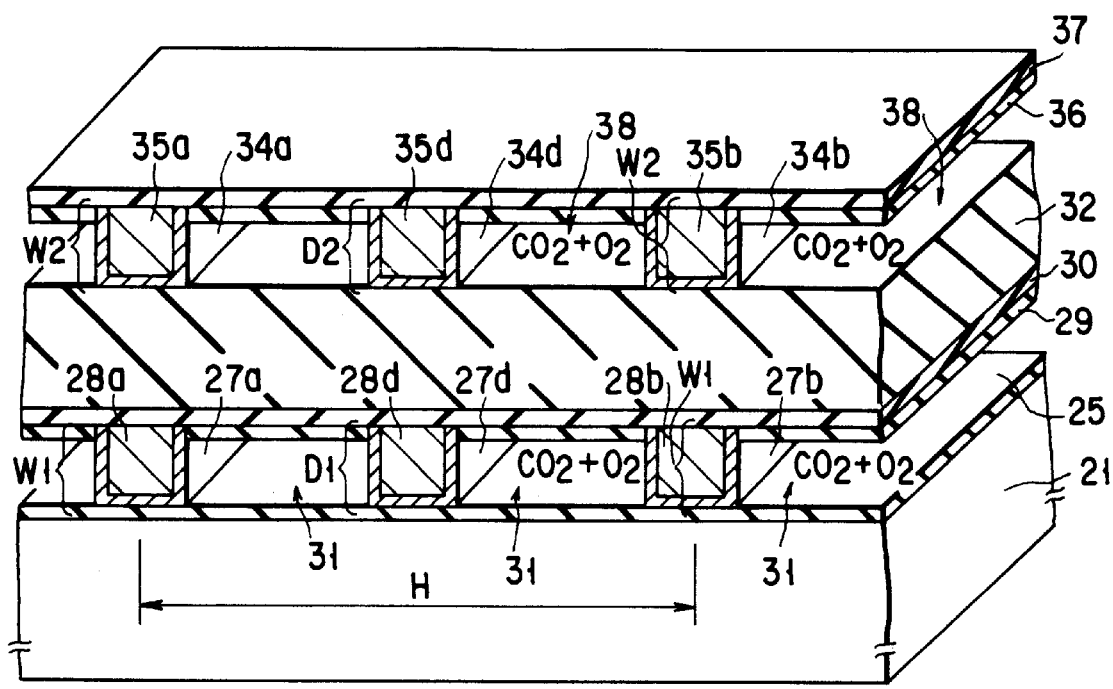
FIG. 168 is a perspective, sectional view of a semiconductor device according to a twenty-sixth embodiment of the present invention.

FIG. 168 shows a semiconductor device according to the twenty-sixth embodiment of the invention.

As FIG. 168 shows, an insulating layer 25 is provided on a semiconductor substrate 21 (e.g., a silicon wafer). Wires W1 are provided on the insulating layer 25. Each wire W1 is composed of a conductor and a trough-shaped barrier layer covering the sides and bottom of the conductor. To state more precisely, one wire W1 is formed of a barrier layer 27a and a conductor 28a, and another wire W1 a barrier layer 27b and a conductor 28b. The barrier layers 27a and 27b are made of composed of a titanium layer and a titanium nitride layer provided on the titanium layer. The conductors 28a and 28b are made of, for example, copper, aluminum alloy or the like. Instead, they may be made of semiconductor such as polysilicon layer or high-melting metal such as tungsten.

The wires W1 are spaced apart by a distance H. A dummy wire D1 is provided between the wires W1. The dummy line D1 is comprised of a conductor 28d and a trough-shaped barrier layer 27d covering the sides and bottom of the conductor 28d. The barrier layer 27d is composed of a titanium layer and a titanium nitride layer provided on the titanium layer. The conductor 28d is made of, for example, copper, aluminum alloy or the like. Alternatively, the conductor 28d may be made of semiconductor such as polysilicon layer or high-melting metal such as tungsten.

Mounted on the wires W1 and the dummy wire D1 is an insulating layer 30. An insulating layer 29 is provided on the lower surface of the insulating layer 30. The layers 29 and 30 are supported by the wires W1 and the dummy wire D1. Cavities 31 are provided among the wires W1 and the dummy wire D1. The cavities 31 are filled with a mixture gas of mainly oxygen ($O_2$) and carbon dioxide ($CO_2$).

The dummy wire D1 supports the insulating layers 29 and 30, preventing them from collapsing into the cavities 31, and does not perform the function of ordinary wires. The insulating layer 29 defines the pattern of the wires W1; it is made of, for example, silicon oxide or silicon nitride. The insulating layer 30 is an important component, defining the cavities 31 and functioning as a base on which some layers will be mounted. The layer 30 is made of silicon oxide or the like.

On the insulating layer 30 an insulating layer 32 is provided, which is made of, for example, silicon oxide. Wires W2 are provided on the insulating layer 32. Each wire W2 is composed of a conductor and a trough-shaped barrier layer covering the sides and bottom of the conductor. More specifically, one wire W2 is formed of a barrier layer 34a and a conductor 35a, and another wire W1 a barrier layer 34b and a conductor 35b. The barrier layers 34a and 34b are made of composed of a titanium layer and a titanium nitride layer provided on the titanium layer. The conductors 35a and 35b are made of, for example, copper, aluminum alloy or the like. Instead, they may be made of semiconductor such as polysilicon layer or high-melting metal such as tungsten.

The wires W2 are spaced apart by a distance H. A dummy wire D2 is provided between the wires W2. The dummy line D2 is comprised of a conductor 35d and a trough-shaped barrier layer 34d covering the sides and bottom of the conductor 35d. The barrier layer 34d is composed of a titanium layer and a titanium nitride layer provided on the titanium layer. The conductor 35d is made of, for example, copper, aluminum alloy or the like. Instead, the conductor 25d may be made of semiconductor such as polysilicon layer or high-melting metal such as tungsten.

Provided on the wires W2 and the dummy wire D2 is an insulating layer 37. An insulating layer 36 is mounted on the lower surface of the insulating layer 37. The layers 36 and 37 are supported by the wires W2 and the dummy wire D2. Cavities 38 are provided among the wires W2 and the dummy wire D2. The cavities 38 are filled with a mixture gas of mainly oxygen ($O_2$) and carbon dioxide ($CO_2$).

The dummy wire D2 supports the insulating layers 36 and 37, preventing them from collapsing into the cavities 38, and does not perform the function of ordinary wires. The insulating layer 36 defines the pattern of the wires W2; it is made of, for example, silicon oxide or silicon nitride. The insulating layer 37 is an important component, defining the cavities 38 and functioning as a base on which some layers will be mounted. The layer 37 is made of silicon oxide or the like.

As illustrated in FIG. 168, the cavities 31 provided among the wires W1 and dummy wire D1 and the cavities 38 provided among the wires W2 and dummy wire D2 are filled with the mixture gas of oxygen ($O_2$) and carbon dioxide ($CO_2$). The mixture gas has a dielectric constant of about 1.0, which is far less than that of silicon oxide or the like. The semiconductor device can, therefore, be an LSI which has a higher packing density of elements and a better performance than an LSI in which the inter-wire spaces are filled with insulating layers made of silicon oxide or the like.

Furthermore, the dummy wire D1 provided between the wires W1, and the dummy wire D2 between the wires W2. Hence, the dummy wires D1 and D2 prevent the wires W1 and W2 from collapsing down into the cavities 31 or 38 even if the distance H between the wires W1 and between the wires W2 is relatively long.

Figure 169:
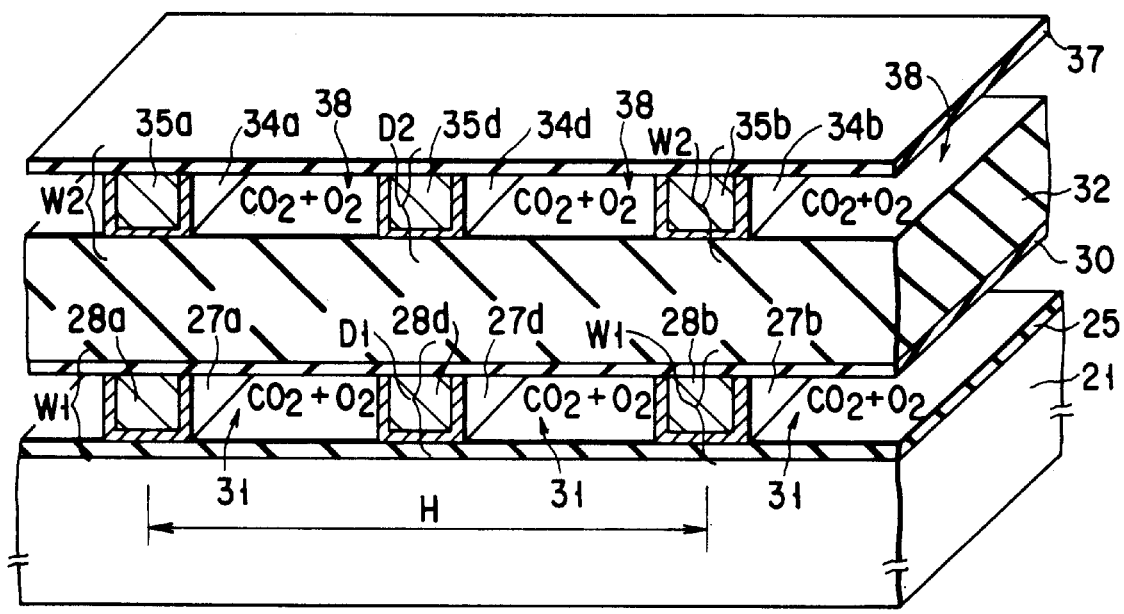
FIG. 169 is a perspective, sectional view of a semiconductor device according to a twenty-seventh embodiment of the invention.

FIG. 169 illustrates a semiconductor device according to the twenty-seventh embodiment of the present invention.

As FIG. 169 shows, an insulating layer 25 is provided on a semiconductor substrate 21 (e.g., a silicon wafer). Wires W1 are provided on the insulating layer 25. Each wire W1 is composed of a conductor and a trough-shaped barrier layer covering the sides and bottom of the conductor. To state more precisely, one wire W1 is formed of a barrier layer 27a and a conductor 28a, and another wire W1 a barrier layer 27b and a conductor 28b. The barrier layers 27a and 27b are made of composed of a titanium layer and a titanium nitride layer provided on the titanium layer. The conductors 28a and 28b are made of, for example, copper, aluminum alloy or the like. Instead, they may be made of semiconductor such as polysilicon layer or high-melting metal such as tungsten.

The wires W1 are spaced apart by a distance H. A dummy wire D1 is provided between the wires W1. The dummy line D1 is comprised of a conductor 28d and a trough-shaped barrier layer 27d covering the sides and bottom of the conductor 28d. The barrier layer 27d is composed of a titanium layer and a titanium nitride layer provided on the titanium layer. The conductor 28d is made of, for example, copper, aluminum alloy or the like. Alternatively, the conductor 28d may be made of semiconductor such as polysilicon layer or high-melting metal such as tungsten.

Mounted on the wires W1 and the dummy wire D1 is an insulating layer 30. The layer 30 is supported by the wires W1 and the dummy wire D1. Cavities 31 are provided among the wires W1 and the dummy wire D1. The cavities 31 are filled with a mixture gas of mainly oxygen ($O_2$) and carbon dioxide ($CO_2$).

The dummy wire D1 supports the insulating layer 30, preventing the layer 30 from collapsing into the cavities 31, and does not perform the function of ordinary wires. The insulating layer 30 is an important component, defining the cavities 31 and functioning as a base on which some layers will be mounted. The layer 30 is made of silicon oxide or the like.

On the insulating layer 30 an insulating layer 32 is provided, which is made of, for example, silicon oxide. Wires W2 are provided on the insulating layer 32. Each wire W2 is composed of a conductor and a trough-shaped barrier layer covering the sides and bottom of the conductor. More specifically, one wire W2 is formed of a barrier layer 34a and a conductor 35a, and another wire W1 a barrier layer 34b and a conductor 35b. The barrier layers 34a and 34b are made of composed of a titanium layer and a titanium nitride layer provided on the titanium layer. The conductors 35a and 35b are made of, for example, copper, aluminum alloy or the like. Instead, they may be made of semiconductor such as polysilicon layer or high-melting metal such as tungsten.

The wires W2 are spaced apart by a distance H. A dummy wire D2 is provided between the wires W2. The dummy line D2 is comprised of a conductor 35d and a trough-shaped barrier layer 34d covering the sides and bottom of the conductor 35d. The barrier layer 34d is composed of a titanium layer and a titanium nitride layer provided on the titanium layer. The conductor 35d is made of, for example, copper, aluminum alloy or the like. Instead, the conductor 25d may be made of semiconductor such as polysilicon layer or high-melting metal such as tungsten.

Provided on the wires W2 and the dummy wire D2 is an insulating layer 37. The layer 37 is supported by the wires W2 and the dummy wire D2. Cavities 38 are provided among the wires W2 and the dummy wire D2. The cavities 38 are filled with a mixture gas of mainly oxygen ($O_2$) and carbon dioxide ($CO_2$).

The dummy wire D2 supports the insulating layer 37, preventing the layer 37 from collapsing into the cavities 38, and does not perform the function of ordinary wires. The insulating layer 37 is an important component, defining the cavities 38 and functioning as a base on which some layers will be mounted. The layer 37 is made of silicon oxide or the like.

As seen from FIG. 169, the cavities 31 provided among the wires W1 and dummy wire D1 and the cavities 38 provided among the wires W2 and dummy wire D2 are filled with the mixture gas of oxygen ($O_2$) and carbon dioxide ($CO_2$). The mixture gas has a dielectric constant of about 1.0, which is far less than that of silicon oxide or the like. The semiconductor device can, therefore, be an LSI which has a higher packing density of elements and a better performance than an LSI in which the inter-wire spaces are filled with insulating layers made of silicon oxide or the like.

In addition, the dummy wire D1 provided between the wires W1, and the dummy wire D2 between the wires W2. Hence, the dummy wires D1 and D2 prevent the wires W1 and W2 from collapsing down into the cavities 31 or 38 even if the distance H between the wires W1 and between the wires W2 is relatively long.

Figure 170:
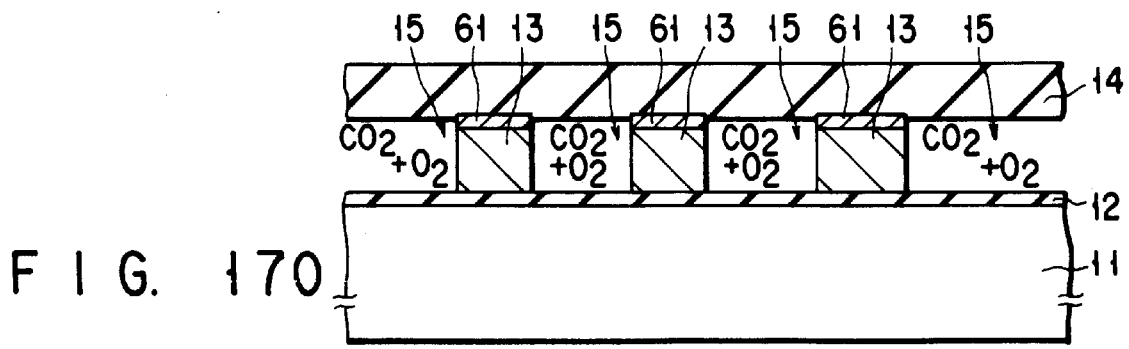
FIG. 170 is a perspective, sectional view of a semiconductor device according to a twenty-eighth embodiment of the invention.

FIG. 170 shows a semiconductor device according to the twenty-eighth embodiment of this invention.

As is shown in FIG. 170, an insulating layer 12 is provided on a semiconductor substrate 11 (e.g., a silicon wafer). Wires 13 are provided on the insulating layer 25, spaced apart from one another. The wires 13 are made of metal such as copper, aluminum alloy or the like, semiconductor such as polysilicon containing an impurity, or high-melting metal such as tungsten or the like.

Coupling layers 61 are provided on the wires 13, and an insulating layer 14 is mounted on the coupling layers 61. Thus, the coupling layers 61 firmly couple the wires 13 to the insulating layer 14. The coupling layers 61 are made of the same material as the wires 13 or metal such as silicon, zirconium, hafnium or chromium.

The insulating layer 14 is shaped like a plate and made of, for example, silicon oxide, zirconium oxide, hafnium oxide or chromium oxide. It is supported by the wires 13. Cavities 15 are provided among the wires 13 and between the insulating layers 12 and 14. The cavities 15 are filled with the mixture gas of oxygen ($O_2$) and carbon dioxide ($CO_2$), which has a dielectric constant of about 1.0.

The cavities 15 may be filled with air, not the mixture gas. This can be accomplished by opening the cavities 15 to the atmosphere or by supplying air into the cavities 15 through holes made in the device package.

As indicated above, the cavities 15 provided among the wires 13 are filled with the mixture gas of oxygen ($O_2$) and carbon dioxide ($CO_2$), and the gas has a dielectric constant of about 1.0, which is far less than that of silicon oxide or the like. The semiconductor device can, therefore, be an LSI which has a higher packing density of elements and a better performance than an LSI in which the inter-wire spaces are filled with insulating layers made of silicon oxide or the like.

Moreover, the coupling layers 61, which are interposed between the wires 13 on the one hand and the insulating layer 14 on the other, steadfastly couple the wires 13 to the insulating layer 14. The semiconductor device is firm and strong in spite of the cavities 15 provided among the wires 13.

How the device of FIG. 170 is manufactured will be explained, with respect to FIGS. 171 to 176.

Figure 171:
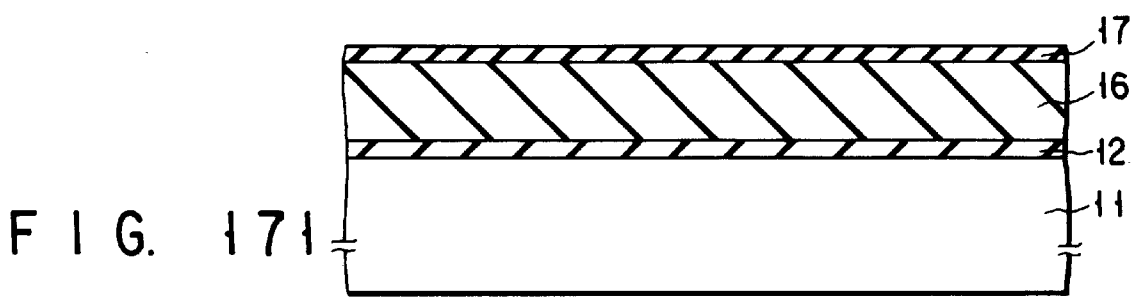
FIGS. 171 to 176 are perspective, sectional views for explaining a method of manufacturing the semiconductor device shown in FIG. 170.

First, the insulating layer 12 is formed on the semiconductor substrate 11 as is illustrated in FIG. 171. A carbon layer 16 is then formed on the insulating layer 12 by means of sputtering or the like. The carbon layer 16 is as thick as thick as wires to be formed in an LSI, for example about 0.2 to 0.7 μm.

Further, a mask layer 17 (e.g., a silicon oxide layer or a silicon nitride layer) is formed on the carbon layer 16 by sputtering or CVD. The mask layer 17 should better be formed by means of sputtering, not by CVD, if it is made of oxide. This is because the carbon layer 16 would be eroded by the oxygen $O_2$ contained in the reaction gas applied in CVD to form the mask layer 17.

Figure 172:
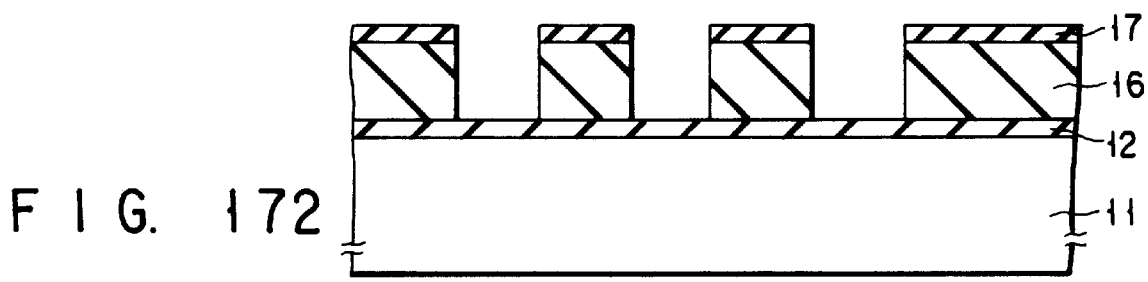

Next, a resist is coated on the mask layer 17 and patterned by PEP (Photo Engraving Process). Using the resist as the mask, the mask layer 17 is patterned. This done, the resist is removed. The carbon layer 16 is subjected to anisotropic etching, by using the mask layer 17. Slits are thereby formed in the carbon layer 16 as is shown in FIG. 172. A patterned resist may be used to etch the carbon layer 16.

The resist used in the PEP is removed by applying a solution of $H_2SO4$ and $H_2O_2$ to it, not by applying oxygen plasma. If the resist is removed by oxygen plasma process, the carbon layer 16 will be removed, along with the resist.

Figure 173:
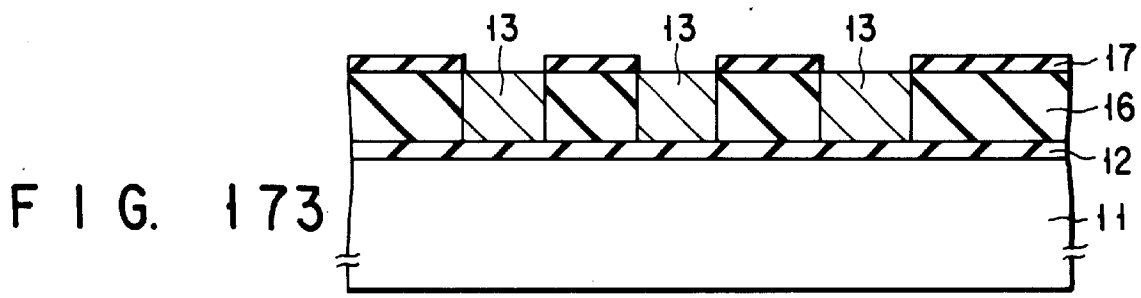

Then, as shown in FIG. 173, a conductive layer made of copper or the like is formed by CVD or sputtering in the slits of the carbon layer 16 and on the mask layer 17. Chemical mechanical polishing (CMP) is performed, leaving conductor layers in the slits of the carbon layer 16. The wires 13 are thereby formed. The CMP may be replaced by anisotropic etching or isotropic etching, to form the wires 13.

Figure 174:
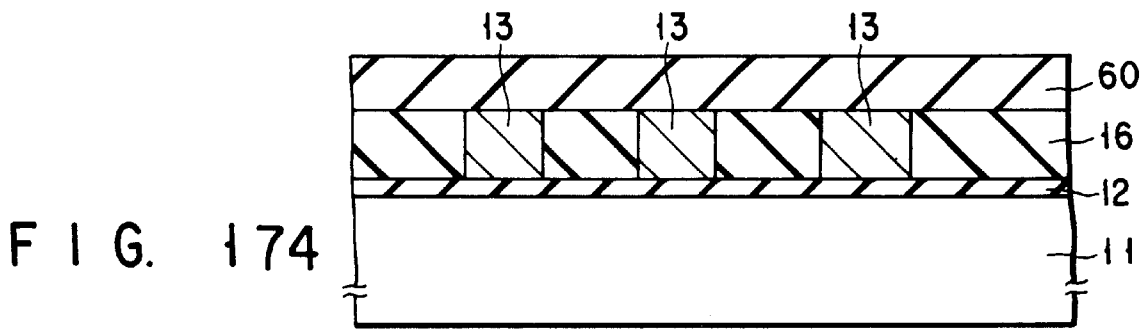
Figure 175:
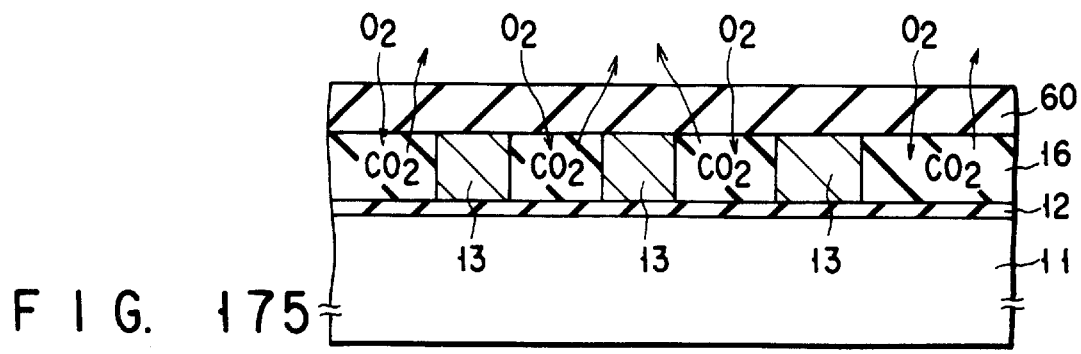
Figure 176:
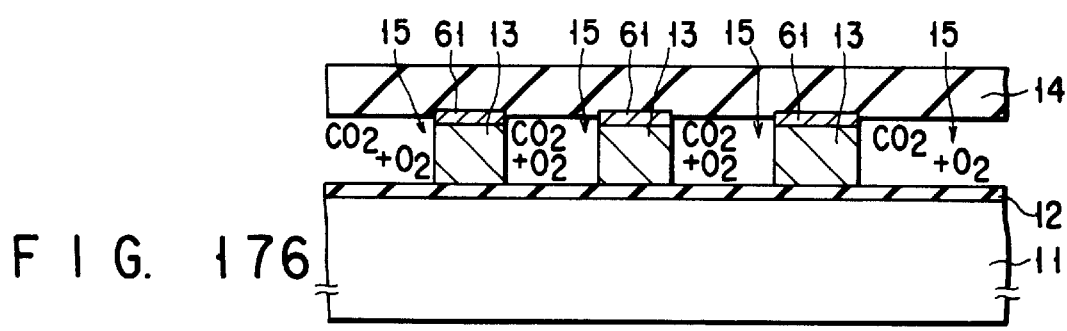

Thereafter, the makes layer 17 is removed. As shown in FIGS. 174, a silicon layer 60 (e.g., an amorphous silicon layer or a polycrystalline silicon layer) is formed by sputtering on the wires 13 and the carbon layer 16. Further, as shown in FIGS. 175 and 176, the carbon layer 16 is ashed, forming cavities 15 among the wires 13. The cavities 15 are filled with a mixture gas of mainly oxygen ($O_2$) and carbon dioxide ($CO_2$). The ashing of the layer 16 can be accomplished by either of two alternative methods.

The first method is to heat the carbon layer 16 in an oxygen atmosphere (i.e., an atmosphere containing oxygen, such as the atmosphere) at 400 to 450° C. for about two hours. In the first method, the carbon layer 16 slowly changes into carbon dioxide ($CO_2$), not expanding to break the insulating layer 14. However, it takes a long time to ash the carbon layer 16. The second method is oxygen-plasma process. In the second method, the carbon layer 16 changes into carbon dioxide ($CO_2$) at high speed, but may expand, possibly breaking the insulating layer 14. Nonetheless, breakage of the layer 14 can be prevented by modifying the layer 14 or by decreasing the oxygen-plasma process temperature.

As the carbon layer 16 is ashed, the silicon layer 60 changes into the insulating layer 14 (i.e., a silicon oxide layer). In other words, the oxygen used to ash the carbon layer 16 reacts with the silicon layer 60, forming the insulating layer 14.

At the same time a coupling layer 61 is formed between each wire 13 and the insulating layer 14. This is because the material of the wires 13, i.e., copper, aluminum alloy or the like, reacts with silicon while the carbon layer 16 is being ashed.

The silicon layer 60 used to ask the carbon layer 16 may be replaced of a layer of any other material that can change into an insulating one and react with the wires 13 to form the coupling layers 61. More specifically, the layer 60 may be made of hafnium, zirconium, chromium or the like.

In this method, a carbon layer is used as an insulating layer which has slits and which is used to form wires. The carbon layer is ashed after wires have been formed in the slits, thereby providing gas-filled cavities among the wires. The device shown in FIG. 170 can therefore be formed easily. Furthermore, the silicon layer changes into an insulating layer and the coupling layers are formed, as the carbon layer is ashed. The coupling layers, each between one wire and the silicon layer, firmly couple the silicon layer to the wires. The semiconductor device therefore has sufficient mechanical strength, despite the cavities provided among the wires.

Figure 177:
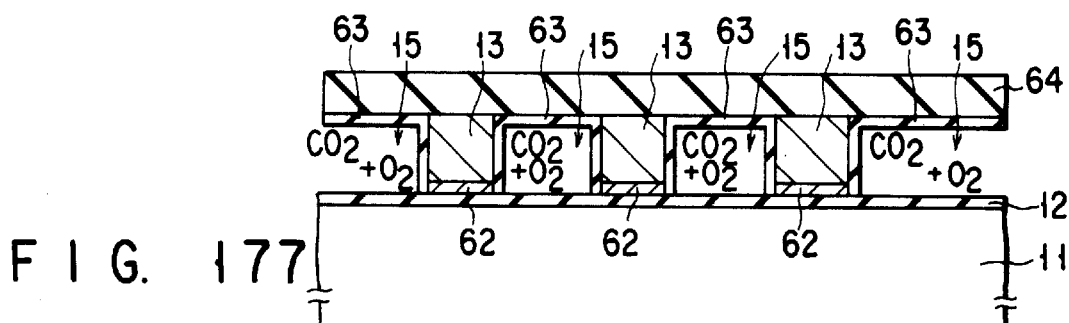
FIG. 177 is a perspective, sectional view of a semiconductor device according to a twenty-ninth embodiment of the invention.

FIG. 177 shows a semiconductor device according to the twenty-ninth embodiment of the invention.

As is shown in FIG. 177, an insulating layer 12 is provided on a semiconductor substrate 11 (e.g., a silicon wafer). Metal layers 62 are provided on the insulating layer 12, spaced apart from one another. The layers 62 are made of zirconium, hafnium, beryllium, magnesium, scandium, titanium, cobalt, nickel, yttrium, indium, barium, lanthanum, cerium, ruthenium, lead, bismuth, thorium, chromium, or the like. Wires 13 are provided on the metal layers 62, respectively, and are hence spaced apart from one another. They are made of metal such as copper, aluminum alloy or the like, semiconductor such as polysilicon containing an impurity, or high-melting metal such as tungsten or the like.

Cavities 15 are provided among the wires 13 and between the insulating layers 12 and 14. The cavities 15 are filled with the mixture gas of oxygen ($O_2$) and carbon dioxide ($CO_2$), which has a dielectric constant of about 1.0.

An insulating layer 64 is provided on the wires 13. The insulating layer 64 is made of, for example, silicon oxide, zirconium oxide, hafnium oxide, chromium oxide, or the like. Metal oxide layers 63 are provided on the sides of each wire 13 and on the exposed lower surface portions of the insulating layer 64.

Cavities 15 are provided among the wires 13 and between the insulating layers 12 and 64. The cavities 15 are filled with the mixture gas of oxygen ($O_2$) and carbon dioxide ($CO_2$), which has a dielectric constant of about 1.0. The cavities 31 may be filled with air, not the mixture gas. This can be accomplished by opening the cavities 31 to the atmosphere or by supplying air into the cavities 31 through holes made in the device package.

As described above, the cavities 15 provided among the wires 13 are filled with the mixture gas of oxygen ($O_2$) and carbon dioxide ($CO_2$), and the gas has a dielectric constant of about 1.0, which is far less than that of silicon oxide or the like. The semiconductor device can, therefore, be an LSI which has a higher packing density of elements and a better performance than an LSI in which the inter-wire spaces are filled with insulating layers made of silicon oxide or the like.

Moreover, the metal oxide layers 63 provided on the sides of each wire 13 and on the exposed lower surface portions of the insulating layer 64 excel in mechanical strength. Therefore, the semiconductor device is firm and strong in spite of the cavities 15 provided among the wires 13.

It will be explained how the device of FIG. 170 is manufactured, with respect to FIGS. 178 to 183.

Figure 178:
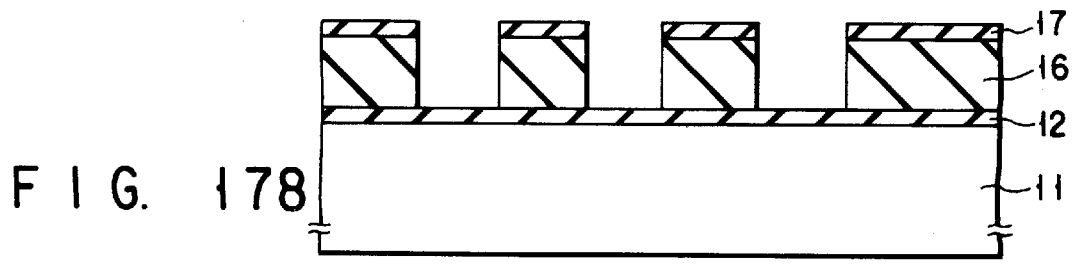
FIGS. 178 to 183 are perspective, sectional views for explaining a method of manufacturing the semiconductor device shown in FIG. 177.

First, the insulating layer 12 is formed on the semiconductor substrate 11 as is illustrated in FIG. 178. A carbon layer 16 is then formed on the insulating layer 12 by means of sputtering or the like. The carbon layer 16 is as thick as wires to be formed in an LSI, for example about 0.2 to :0.7 μm.

Further, a mask layer 17 (e.g., a silicon oxide layer or a silicon nitride layer) is formed on the carbon layer 16 by sputtering or CVD. If the mask layer 17 is made of oxide, it should better be formed by means of sputtering, not by CVD. This is because the carbon layer 16 would be eroded by the oxygen $O_2$ contained in the reaction gas applied in CVD to form the mask layer 17.

Then, a resist is coated on the mask layer 17 and patterned by PEP (Photo Engraving Process). Using the resist as the mask, the mask layer 17 is patterned. This done, the resist is removed. The carbon layer 16 is subjected to anisotropic etching, by using the mask layer 17. Slits are thereby formed in the carbon layer 16 as illustrated in FIG. 178. A patterned resist may be used to etch the carbon layer 16.

The resist used in the PEP is removed by applying a solution of $H_2SO4$ and $H_2O_2$ to it, not by applying oxygen plasma. If the resist is removed by oxygen plasma process, the carbon layer 16 will be removed, along with the resist.

Figure 179:
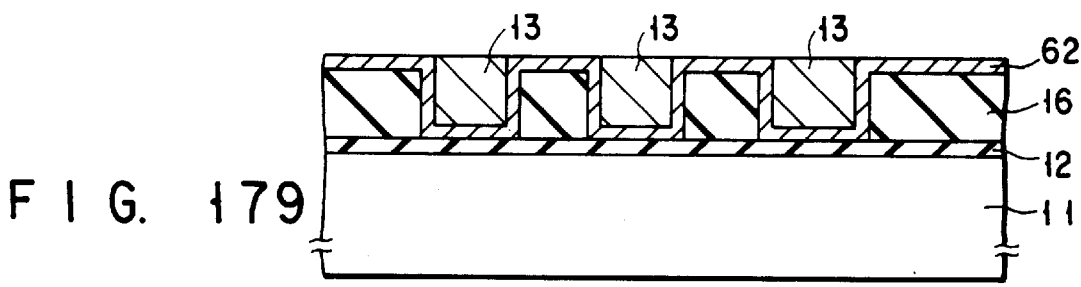

Next, the mask layer 17 is removed as shown in FIG. 179. A metal layer 62 is formed on the exposed portions of the insulating layer 12 and the carbon layer 16, including the inner surfaces of each slit made in the carbon layer 16. The layer 62 is made of zirconium, hafnium, beryllium, magnesium, scandium, titanium, cobalt, nickel, yttrium, indium, barium, lanthanum, cerium, ruthenium, lead, bismuth, thorium, chromium, or the like.

Further, a conductive layer made of copper or the like is formed by CVD or sputtering in the slits of the carbon layer 16 and on the mask layer 17. Chemical mechanical polishing (CMP) is performed, leaving conductor layers in the slits of the carbon layer 16. The wires 13 are thereby formed. The CMP may be replaced by anisotropic etching or isotropic etching, to form the wires 13.

Figure 180:
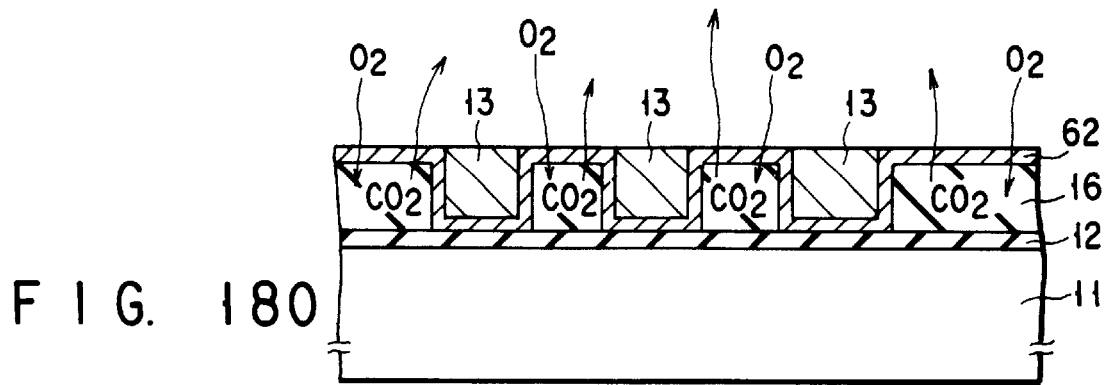
Figure 181:
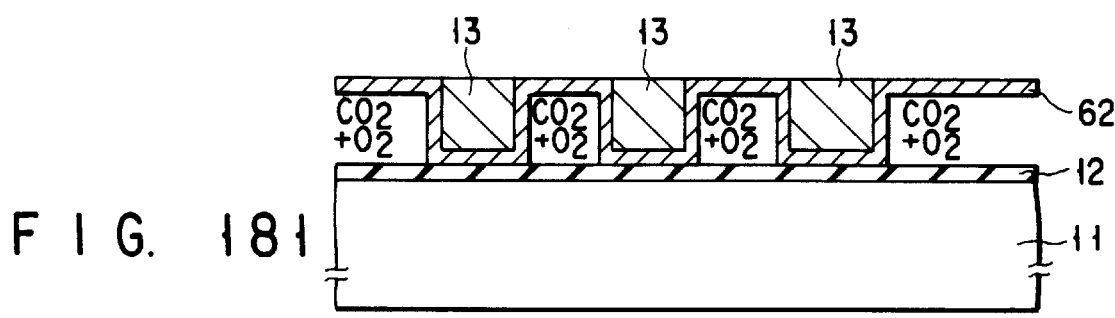

Next, as shown in FIGS. 180 and 181, the carbon layer 16 is ashed, forming cavities 15 among the wires 13. The cavities 15 are filled with a mixture gas of mainly oxygen ($O_2$) and carbon dioxide ($CO_2$). The ashing of the layer 16 can be accomplished by one of two alternative methods.

The first method is to heat the carbon layer 16 in an oxygen atmosphere (i.e., an atmosphere containing oxygen, such as the atmosphere) at 400 to 450° C. for about two hours. In the first method, the carbon layer 16 slowly changes into carbon dioxide ($CO_2$), not expanding to break the insulating layer 14. However, it takes a long time to ashes the carbon layer 16. The second method is oxygen-plasma process. In the second method, the carbon layer 16 changes into carbon dioxide ($CO_2$) at high speed, but may expand, possibly breaking the insulating layer 14. Nonetheless, breakage of the layer 14 can be prevented by modifying the layer 14 or by decreasing the oxygen-plasma process temperature.

Figure 182:
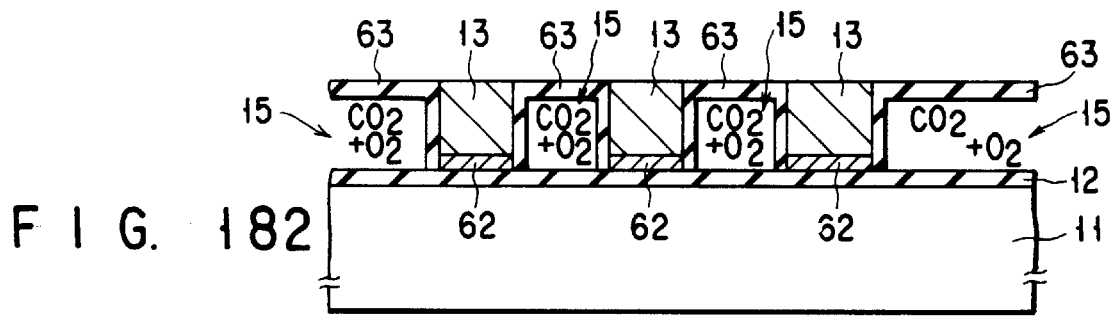

As shown in FIG. 182, the structure is subjected to selective oxidation in an oxygen atmosphere at about 450° C. for about 30 minutes. Those portions of the metal layer 62 which cover the sides of the wire 13 and those portions of the layer 62 which close the cavities 15 are oxidized into the metal oxide layers 63. The conditions of the selective oxidation, i.e., temperature, time and the like, are such that the metal layers 62 located beneath the wires 13 are not oxidized at all. The oxygen atmosphere may be replaced by an $H_2O_2$ atmosphere or an $H_2O$ atmosphere.

Moreover, the selective oxidation may be replaced by selective nitriding. If the structure is subjected to selective nitriding, said portions of the metal layer 62 will change to metal nitride layers.

In the present embodiment, the carbon layer 16 is ashed in one step, and the metal layer 62 is oxidized in another. Instead, the layers 16 and 62 may be respectively ashed and oxidized in the same step. In the case where the metal layer 62 is made of hafnium, it will be oxidized only at those portions which cover the sides of the wires 13 and close the cavities 15 at the same time the carbon layer 16 is ashed in an oxygen atmosphere, for example, at about 400° C. for about one hour.

Figure 183:
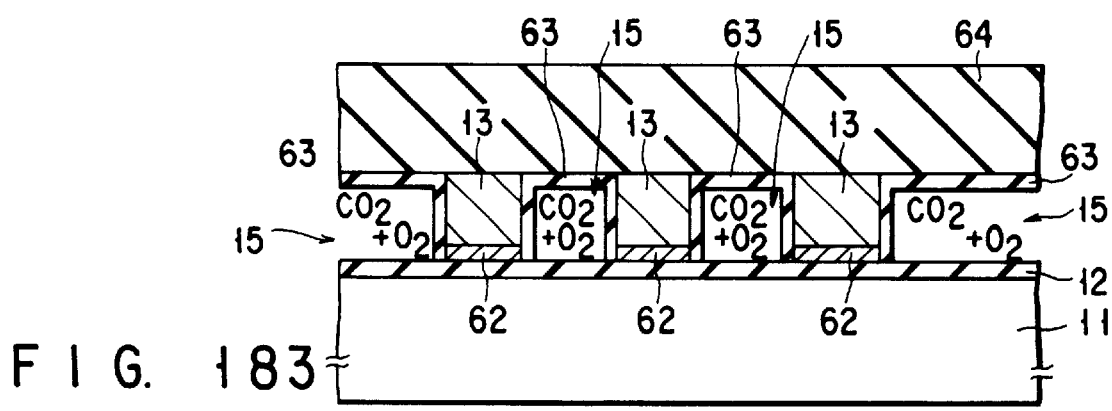

Thereafter, as shown in FIG. 183, the insulating layer 64 having a small dielectric constant is formed on the wires 13 and the metal oxide layers 63 by means of CVD or sputtering. The insulating layer 64 can be made of silicon oxide which contains fluorine.

In the method explained above, a carbon layer is used as an insulating layer which has slits and which is used to form wires. The carbon layer is ashed after wires 13 have been formed in the slits, thereby providing gas-filled cavities 15 among the wires. The device shown in FIG. 177 can therefore be formed easily. Moreover, those portions of the metal layer 62 which cover the sides of the wires 13 and those portions of the layer 62 which close the cavities 15 are converted to metal oxide layers 63 by selective oxidation. The metal oxide layers 63 thus formed excel in mechanical strength. The semiconductor device of FIG. 177 therefore has a sufficient mechanical strength, despite the cavities 15 are provided among the wires 13.

Figure 184:
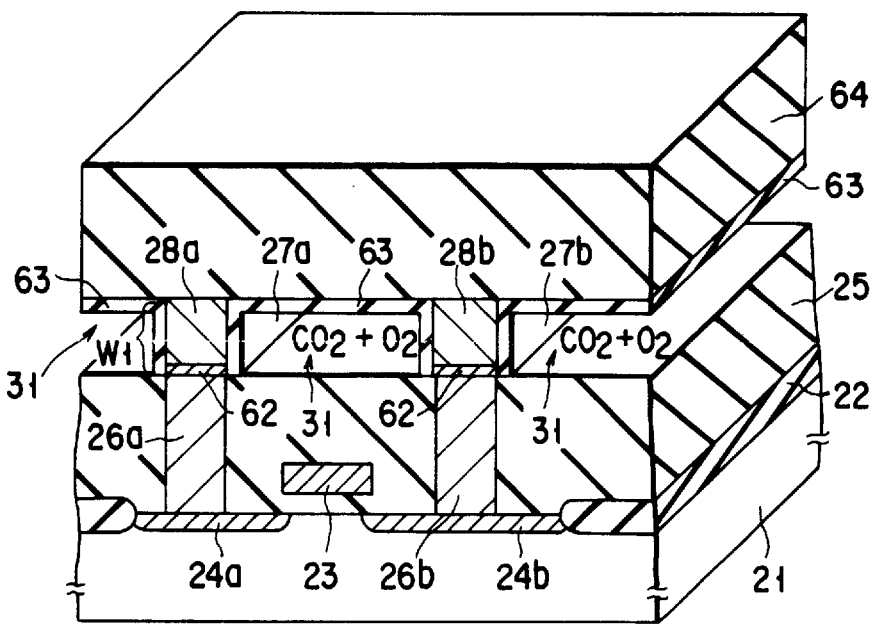
FIG. 184 is a perspective, sectional view of a semiconductor device according to a thirtieth embodiment of this invention.

FIG. 184 shows a semiconductor device according to the thirtieth embodiment of the present invention.

As is shown in FIG. 184, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG) or phosphor silicate glass (PSG). The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Arranged on the conductors 26a and 26b are metal layers 62. Wires W1 are provided on these metal layers 62. The metal layers 62 are made of zirconium, hafnium, beryllium, magnesium, scandium, titanium, cobalt, nickel, yttrium, indium, barium, lanthanum, cerium, ruthenium, lead, bismuth, thorium, chromium, or the like. The layers 62 electrically connect the wires W1 to the conductors 26a and 26b. The wires W1 are conductors 28a and 28b which are made of copper, aluminum alloy or the like. Instead, they can be made of semiconductor such as polysilicon containing an impurity, or high-melting metal such as tungsten or the like.

Barrier layers 27a and 27b are provided which cover the sides of the wires W1. They are two-layered members, each consisting of, for example, a titanium layer and a titanium nitride layer.

Cavities 31 are provided among the wires W1. The cavities 31 are filled with a mixture gas of mainly oxygen ($O_2$) and carbon dioxide ($CO_2$). Alternatively, the cavities 31 may be filled with air. Metal oxide layers 63 are provided, each extending between the upper ends of two adjacent barrier layers and, thus, covering one cavity 31. The metal oxide layers 63 have been formed by oxidizing layers of the same material as the metal layer 62. They metal oxide layers 63 may be replaced by metal nitride layers, which can be formed by nitriding layers of the same material as the metal layer 62.

On the metal oxide layers 63 there is provided an insulating layer 64 which has a small dielectric constant. The layer 64 is made of, for example, silicon oxide which contains fluorine.

In the device shown in FIG. 184, the cavities 31 provided among the wires W1 are filled with air or a mixture gas of mainly oxygen ($O_2$) and carbon dioxide ($CO_2$). Air and the mixture gas have a dielectric constant of about 1.0, which is far less than that of silicon oxide or the like. The semiconductor device can, therefore, be an LSI which has a higher packing density of elements and a better performance than an LSI in which the inter-wire spaces are filled with insulating layers made of silicon oxide or the like.

How the device of FIG. 184 is manufactured, with respect to FIGS. 185 to 196.

Figure 185:
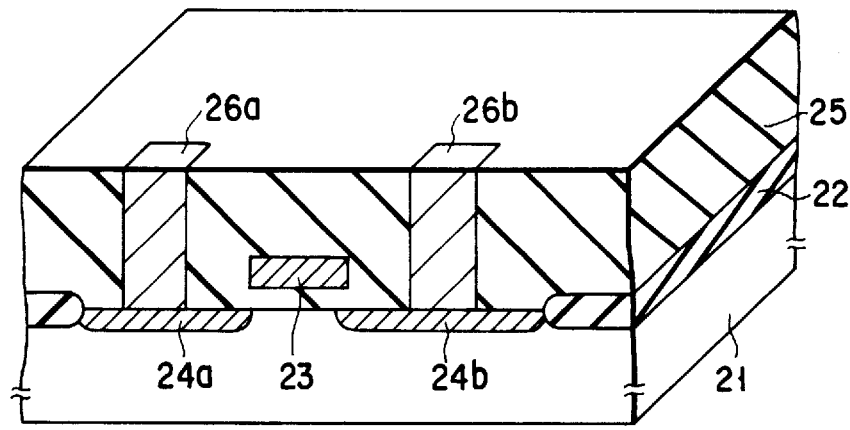

At first, the field oxide layer 22 is formed on the semiconductor substrate 21 by LOCOS method, as is illustrated in FIG. 185. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 through holes which reach the source region 24a and drain region 24b of the MOS transistor. The conductors 26a and 26b made of high-melting metal such as tungsten are formed by selective growth in the through holes of the insulating layer 25. The through holes may be filled with other electrically conductive material other than high-melting metal.

Figure 186:
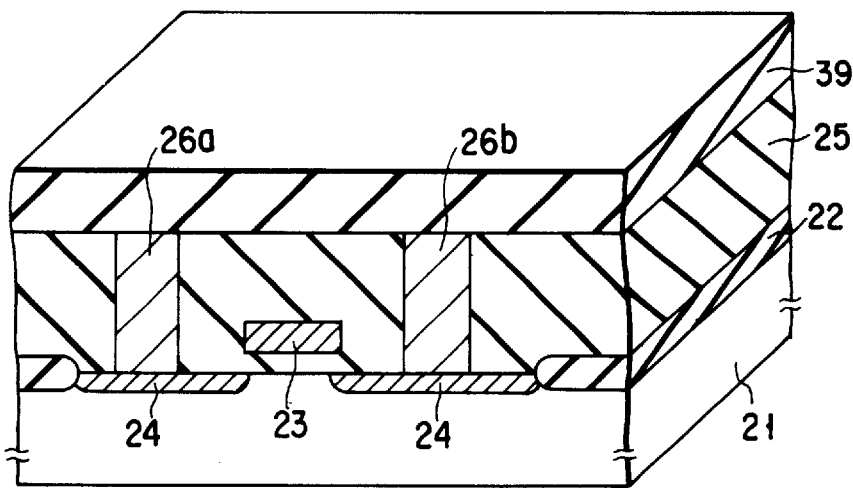

Next, a carbon layer 39 is formed on the insulating layer 25 by sputtering as illustrated in FIG. 186. The carbon layer 39 is as thick as wires to be formed in an LSI, for example about 0.2 to 0.7 $\mu$m. Further, as shown in FIG. 187, a mask layer 29 (e.g., a silicon oxide layer or a silicon nitride layer) is formed on the carbon layer 39 by sputtering to a thickness of about 0.05 $\mu$m. If made of oxide, the mask layer 29 should better be formed by means of sputtering, not by CVD, in order to prevent erosion of the carbon layer 39.

A resist is coated on the mask layer 29 and patterned by PEP (Photo Engraving Process). Using this resist as the mask, the mask layer 29 is patterned as shown in FIG. 188, to define the shape of wires to be formed. The resist is removed from the mask layer patterned. The carbon layer 39 is subjected to anisotropic etching, which is accomplished by using the patterned mask layer 29 as the mask, whereby slits are made in the carbon 39 layer as is shown in FIG. 189. It should be noted that the carbon layer 39 is not etched by PEP, but etched by using the PEP-patterned mask layer 29, for the following reason.

The resist used in the PEP is removed by applying oxygen plasma or either $H_2SO4$ or $H_2O_2$ to it. When the resist is removed by oxygen plasma process, the carbon layer 39 patterned is simultaneously removed. When the resist is removed by applying $H_2SO4$ or $H_2O_2$, the conductors 26a and 26b are simultaneously removed if they are made of high-melting metal. This is why the PEP-patterned mask layer 29 must be used as the mask to etch the carbon layer 39.

Thereafter, the mask layer 29 is removed. Then, as shown in FIG. 190, a metal layer 62 is formed on the carbon layer 39 and on the inner surfaces of each slit made in the carbon layer 39. The metal layer 62 is made of zirconium, hafnium, beryllium, magnesium, scandium, titanium, cobalt, nickel, yttrium, indium, barium, lanthanum, cerium, ruthenium, lead, bismuth, thorium, chromium, or the like.

Next, a metal layer 28 made of copper, aluminum alloy or the like is formed on the metal layer 62 as is illustrated in FIG. 191. Alternatively, the layer 28 may be made of semiconductor such as polysilicon containing an impurity or high-melting metal such as tungsten.

Further, chemical mechanical polishing (CMP) is performed, leaving conductors 28a and 28b in the slits of the carbon layer 39 as shown in FIG. 192. The wires W1 are thereby formed. The CMP may be replaced by anisotropic etching or isotropic etching, to form the wires W1.

Then, as shown in FIGS. 193 and 181, the carbon layer 39 is ashed, forming cavities 31 among the wires W1. The cavities 31 are filled with a mixture gas of mainly oxygen ($O_2$) and carbon dioxide ($CO_2$). The ashing of the layer 39 can be performed by one of two alternative methods.

The first method is to heat the carbon layer 39 in an oxygen atmosphere at 400 to 450° C. for about two hours. In the first method, the carbon layer 39 slowly changes into carbon dioxide ($CO_2$), not expanding to break the insulating layer 29 or 30. However, it takes a long time to ashe the carbon layer 39. The second method is oxygen-plasma process. In the second method, the carbon layer 39 changes into carbon dioxide ($CO_2$) at high speed, but may expand, possibly breaking the insulating layers 29 and 30. Nonetheless, breakage of the layers 29 and 30 can be prevented by modifying the layers 29 and 30 or by decreasing the oxygen-plasma process temperature.

As shown in FIG. 195, the structure is subjected to selective oxidation in an oxygen atmosphere at about 450° C. for about 30 minutes. Those portions of the metal layer 62 which cover the sides of the wire W1 and those portions of the layer 62 which close the cavities 31 are oxidized into the metal oxide layers 63. The conditions of the selective oxidation, i.e., temperature, time and the like, are such that the metal layers 62 located beneath the wires 13 are not oxidized at all. The oxygen atmosphere may be replaced by an $H_2O_2$ atmosphere or an $H_2O$ atmosphere.

The selective oxidation may be replaced by selective nitriding. If the structure is subjected to selective nitriding, said portions of the metal layer 62 will change to metal nitride layers.

In this embodiment, the carbon layer 39 is ashed in one step, and the metal layer 62 is oxidized in another. Instead, the layers 39 and 62 may be respectively ashed and oxidized in the same step. In the case where the metal layer 62 is made of hafnium, it will be oxidized only at those portions which cover the sides of the wires W1 and close the cavities 31 at the same time the carbon layer 39 is ashed in an oxygen atmosphere, for example, at about 400° C. for about one hour.

Next, as shown in FIG. 196, the insulating layer 64 having a small dielectric constant is formed on the wires W1 and the metal oxide layers 63 by means of CVD or sputtering. The insulating layer 64 can be made of silicon oxide which contains fluorine.

In the method explained above, a carbon layer 39 is used as an insulating layer which has slits and which is used to the conductors 28a and 28b. The carbon layer 39 is ashed after the conductors 28a and 28b have been formed in the slits, thereby providing gas-filled cavities 31 among the wires W1. The device shown in FIG. 184 can therefore be formed easily. In addition, those portions of the metal layer 62 which cover the sides of the conductors 28a and 28b and those portions of the layer 62 which close the cavities 32 are converted to metal oxide layers 63 by selective oxidation. The metal oxide layers 63 thus formed excel in mechanical strength, hardly collapsing down into the cavities 31. The semiconductor device of FIG. 177 therefore has sufficient mechanical strength, despite the cavities 31 provided among the wires W1.

In all methods described above, a carbon layer or carbon layers are ashed in an oxygen atmosphere.

With reference to FIGS. 197 and 198, it will be explained how a carbon layer 16 is ashed in the case where wires 13 are made of metal such as copper, which is readily oxidized.

As shown in FIG. 197, trough-shaped protective metal layers 65 are formed in the slits of the carbon layer 16, and the wire 13 are formed in the protective metal layers 65. Thus, the bottom and sides of each wire 13 are covered with the protective metal layer 65. The metal layers 65 are, for example, two-layered members each of which consists of, for example, a titanium layer and a titanium nitride layer.

An insulating layer 14 is formed on the wires 13 and the carbon layer 16. The layer 14 is made of material which allows passage of oxygen (O2), so that the carbon layer 16 may be ashed. This material is, for example, silicon oxide. The upper surface of each wire 13 is oxidized when the carbon layer 16 is ashed. A metal oxide layer 66 is inevitably formed in the surface region of each wire 13. The oxide layer 66 increases the resistance of the wire 13 and reduces the reliability thereof.

Semiconductor devices and methods of manufacturing a semiconductor device will be described below, in which the wires are not oxidized as the carbon layer or layers are ashed to provide cavities.

FIG. 199 illustrates a semiconductor device according to the thirty-first embodiment of the present invention.

As is shown in FIG. 199, a field oxide layer 22 (e.g., a silicon oxide layer) is provided on a semiconductor substrate 21 (e.g., a silicon wafer). The substrate 21 has an element region which is surrounded by the field oxide layer 22. Formed in the element region is a MOS transistor which has a gate electrode 23, a source region 24a and a drain region 24b.

The MOS transistor is covered with an insulating layer 25. The layer 25 is made of, for example, borophospho silicate glass (BPSG) or phosphor silicate glass (PSG). The upper surface of the layer 25 has been made flat by, for example, chemical mechanical polishing (CMP). The layer 25 has contact holes which reach the source region 24a and the drain region 24b. The contact holes are filled with conductors 26a and 26b. The conductors 26a and 26b are made of high-melting metal such as tungsten. Alternatively, they may be made of other material.

Trough-shaped protective metal layers 65 are provided on the insulating layer 25 and the conductors 26a and 26b, respectively. Wires 28a and 28b are formed in the protective metal layers 65. Therefore, the bottom and sides of each wire are covered with the protective metal layer 65. The metal layers 65 are, for example, two-layered members each of which consists of, for example, a titanium layer and a titanium nitride layer.

Protective layers 67 are provided on the upper surfaces of the wires 28a and 28b. The layers 67 are made of material which does not allow passage of oxygen (O2). They can be two-layered members each consisting of, for example, a titanium layer and a titanium nitride layer, a metal layer of titanium silicon nitride, or an insulating layer of silicon nitride. That is, the protective layers 67 which cover the upper surfaces of the wires 28a and 28b can be made of either metal or insulating material, while the layers covering the bottoms of the wires 28a and 28b must be made of metal to electrically connect the wires 28a and 28b to the conductors 26a and 26b. The wires 28a and 28b are made of metal which can readily be oxidized, such as copper or the like.

Cavities 31 are provided between the wires 28a and 28b. The cavities 31 are filled with a mixture gas of mainly oxygen ($O_2$) and carbon dioxide ($CO_2$). Alternatively, the cavities 31 may be filled with air. On the protective layers 67 there is provided an insulating layer 68 which is made of, for example, silicon oxide which contains fluorine.

In the device shown in FIG. 199, the cavities 31 provided between the wires 28a and 28b are filled with air or a mixture gas of oxygen ($O_2$) and carbon dioxide ($CO_2$). Air and the mixture gas have a dielectric constant of about 1.0, which is far less than that of silicon oxide or the like. The semiconductor device can, therefore, be an LSI which has a higher packing density of elements and a better performance than an LSI in which the inter-wire spaces are filled with insulating layers made of silicon oxide or the like.

Furthermore, the wires 28a and 28b are completely covered with the protective layers 67 which do not allow passage of oxygen, at least while a carbon layer is ashed to provide the cavities 31. Hence, no metal oxide layer is formed in the surface region of each wire. The wires 28a and 28b do not have their resistance increased or their reliability decreased.

How the device of FIG. 199 is manufactured, with respect to FIGS. 200 to 211.

First, the field oxide layer 22 is formed on the semiconductor substrate 21 by LOCOS method, as is illustrated in FIG. 200. A MOS transistor having a gate electrode 23, a source region 24a and a drain region 24b is formed in the element region of the substrate 21, which is surrounded by the field oxide layer 22.

The insulating layer 25 made of BPSG, PSG or the like is formed on the entire surface of the substrate 21, completely covering the MOS transistor. The upper surface of the layer 25 is rendered flat by means of chemical mechanical polishing (CMP). PEP (Photo Engraving Process) is conducted, making in the layer 25 through holes which reach the source region 24a and drain region 24b of the MOS transistor. The conductors 26a and 26b made of high-melting metal such as tungsten are formed by selective growth in the through holes of the insulating layer 25. The through holes may be filled with other electrically conductive material other than high-melting metal.

Next, a carbon layer 39 is formed on the insulating layer 25 by sputtering as illustrated in FIG. 201. The carbon layer 39 is as thick as wires to be formed in an LSI, for example about 0.2 to 0.7 $\mu$m. Further, as shown in FIG. 202, a mask layer 29 (e.g., a silicon oxide layer or a silicon nitride layer) is formed on the carbon layer 39 by sputtering to a thickness of about 0.05 $\mu$m. If made of oxide, the mask layer 29 should better be formed by means of sputtering, not by CVD, in order to prevent erosion of the carbon layer 39.

A resist is coated on the mask layer 29 and patterned by PEP (Photo Engraving Process). Using this resist as the mask, the mask layer 29 is patterned as shown in FIG. 203, to define the shape of wires to be formed. The resist is removed from the mask layer patterned. The carbon layer 39 is subjected to anisotropic etching, which is accomplished by using the patterned mask layer 29 as the mask, whereby slits are made in the carbon 39 layer as is shown in FIG. 204. It should be noted that the carbon layer 39 is not etched by PEP, but etched by using the PEP-patterned mask layer 29, for the following reason.

The resist used in the PEP is removed by applying oxygen plasma or either $H_2SO4$ or $H_2O_2$ to it. When the resist is removed by oxygen plasma process, the carbon layer 39 patterned is simultaneously removed. When the resist is removed by applying $H_2SO4$ or $H_2O_2$, the conductors 26a and 26b are simultaneously removed if they are made of high-melting metal. This is why the PEP-patterned mask layer 29 must be used as the mask to etch the carbon layer 39.

Thereafter, the mask layer 29 is removed. Then, as shown in FIG. 205, a protective metal layer 65 is formed on the carbon layer 39 and on the inner surfaces of each slit made in the carbon layer 39. The protective metal layer 62 is a two-layered member consisting of a titanium layer and a titanium nitride layer, or a layer made of titanium silicon nitride or the like.

Next, a layer 28 made of metal which can readily be oxidized, such as copper, is formed on the protectively metal layer 65 as shown in FIG. 206, by means of sputtering or CVD. Further, as shown in FIG. 207, chemical mechanical polishing (CMP) is carried out, leaving conductors 28a and 28b in the slits of the carbon layer 39. CMP may be replaced by anisotropic etching or isotropic etching, to form the wires 28a and 28b. The wires 28a and 28 are located, with their upper surfaces set at a level slightly lower than the upper surface of the carbon layer 39.

Then, as shown in FIG. 208, the protective layer 67 is formed on the wires 28a and 28b and also on the carbon layer 39. The layer 67 does not allow passage of oxygen (O2) at a temperature ranging from 300° C. to 600° C. This is because the carbon layer 39 will be ashed at a temperature which falls within this range. It can be a two-layered member consisting of a titanium layer and a titanium oxide layer, a layer of titanium silicon nitride, or an insulating layer of silicon nitride.

CMP is carried out, leaving protective layers 67 on the wires 28a and 28b only as shown in FIG. 209. As a result of this, the protective layers 67 come to have their upper surfaces positioned flush with the upper surface of the carbon layer 39.

This done, the insulating layer 68 is formed by CVD or sputtering on the carbon layer 39 and the protective layers 67 to a thickness of about 0.05 $\mu$m, as is illustrated in FIGS. 210 and 211. If made of oxide, the insulating layer 68 should better be formed by means of sputtering, not by CVD, in order to prevent erosion of the carbon layer 39.

Thereafter, the carbon layer 39 is ashed, forming cavities 31 between the wires 28a and 28b. The cavities 31 are filled with a mixture gas of mainly oxygen ($O_2$) and carbon dioxide ($CO_2$). The ashing of the layer 39 can be performed by one of two alternative methods.

The first method is to heat the carbon layer 39 in an oxygen atmosphere at 400 to 450° C. for about two hours. In the first method, the carbon layer 39 slowly changes into carbon dioxide ($CO_2$), not expanding to break the insulating layer 68. However, it takes a long time to ash the carbon layer 39. The second method is oxygen-plasma process. In the second method, the carbon layer 39 changes into carbon dioxide ($CO_2$) at high speed, but may expand, possibly breaking the insulating layer 68. Nonetheless, breakage of the layer 68 can be prevented by modifying the layer 68 or by decreasing the oxygen-plasma process temperature.

In this method, the carbon layer 39 is used as an insulating layer which has slits and which is used, to the conductors 28a and 28b. The carbon layer 39 is ashed after the conductors 28a and 28b have been formed in the slits, thereby providing gas-filled cavities 31 between the wires 28a and 28b. The semiconductor device shown in FIG. 199 can therefore be formed easily. The wires 28a and 28b do not have their resistance increased or their reliability decreased.

FIG. 212 shows a semiconductor device according to a thirty-second embodiment of the present invention.

As seen from FIG. 212, an insulating layer 72 (e.g., a silicon oxide layer) is provided on a semiconductor substrate 71 (e.g., a silicon wafer). Wires 73 are provided on the insulating layer 72, spaced apart from one another. The wires 73 are made of metal such as copper, aluminum alloy or the like, semiconductor such as polysilicon containing an impurity, or high-melting metal such as tungsten.

The wires 73 are completely covered with an insulating layer 74 but do not contact the insulating layer 74. Cavities 75 are provided, each between one wire 73 and the insulating layer 74. The cavities 75 are filled with a gas having a dielectric constant of about 1.0, i.e., a mixture gas of mainly oxygen ($O_2$) and carbon dioxide ($CO_2$). The insulating layer 74 is made of, for example, silicon oxide, zirconium oxide, hafnium oxide, chromium oxide, or the like. On the insulating layer 74 there is provided an insulating layer 76 which has a small dielectric constant. The insulating layer 76 is made of, for example, silicon oxide containing fluorine. Remaining on the lower surface of the insulating layer 74 and located right above the wires 73 are mask layers 77, which have been used in patterning the wires 73.

The cavities 75 may be filled with air, not the mixture gas. This can be accomplished by opening the cavities 75 to the atmosphere or by supplying air into the cavities 75 through holes made in the device package.

In the device shown in FIG. 212, the wires 73 are covered with the insulating layer 74, the cavities 75 are provided, each between one wire 73 and the insulating layer 74, and each cavity 75 is filled with either air or the mixture gas of mainly oxygen ($O_2$) and carbon dioxide ($CO_2$). Air and the mixture gas have a dielectric constant of about 1.0. Since at least the edges of each wire 73, where electric charge is likely to concentrate, exist in one cavity 75, the dielectric constant of the wire 73 is far less than in the case where the inter-wire spaces are filled with insulating material such as silicon oxide or the like. The semiconductor device can, therefore, be an LSI which has a higher packing density of elements and a better performance.

How the device of FIG. 212 is manufactured will be explained, with reference to FIGS. 213 to 218.

As shown in FIG. 213, the insulating layer 72 is formed on the semiconductor substrate 71. Further, a metal layer 73a is formed on the insulating layer 72, to a thickness of 0.7 to 0.2 m, by sputtering or the like. The metal layer 73a is made aluminum, copper, titanium, titanium oxide or the like.

Then, a carbon layer 80a is formed on the metal layer 73a by sputtering or the like. A mask layer 77 (e.g., a silicon oxide layer or a silicon nitride layer) is formed on the carbon layer 80a by sputtering or CVD. If the mask layer 77 is made of oxide, it should better be formed by means of sputtering, not by CVD. This is because the carbon layer 80a would be eroded by the oxygen contained in the reaction gas applied in CVD to form the mask layer 77.

Then, a resist is coated on the mask layer 77 and patterned by PEP (Photo Engraving Process). Using the resist as the mask, the mask layer 77 is patterned. This done, the resist is removed. The carbon layer and the metal layer are subjected to anisotropic etching, by using the mask layer 77. Slits are thereby formed in the carbon layer and the metal layer as is shown in FIG. 214. As a result, the wires 73 are formed.

The resist used in the PEP is removed by applying a solution of $H_2SO4$ and $H_2O_2$ to it, not by applying oxygen plasma. If the resist is removed by oxygen plasma process, the carbon layer 80a will be removed, along with the resist.

Next, carbon layers 80b are formed by sputtering or the like, on the sides of the wires 73, carbon layers 80a and mask layers 77. The carbon layers 80b are subjected to anisotropic etching, whereby those portions of the carbon layers 80b which lie on the mask layers 77 are removed, as is illustrated in FIG. 215.

Further, the insulating layer 74 is formed by sputtering or CVD to a thickness of 0.05 μm, on the insulating layer 72, carbon layers 80b and mask layers 77. If the insulating layer 74 is made of oxide, it should better be formed by sputtering, not CVD, because the carbon layers 80a and 80b would be eroded by the oxygen $O_2$ contained in the reaction gas applied in CVD to form the insulating layer 74.

Thereafter, the carbon layers 80a and 80b are ashed, thereby providing cavities 75 filled with a mixture gas of mainly oxygen ($O_2$) and carbon dioxide ($CO_2$). The ashing of the layers 80a and 80b can be performed by one of two alternative methods.

The first method is to heat the carbon layers 80a and 80b in an oxygen atmosphere (i.e., an atmosphere containing oxygen, such as the atmosphere) at 400 to 450° C. for about two hours. In the first method, the carbon layers 80a and 80b slowly change into carbon dioxide ($CO_2$), not expanding to break the insulating layer 74. However, it takes a long time to ash the carbon layers 80a and 80b. The second method is oxygen-plasma process. In the second method, the carbon layers 80a and 80b change into carbon dioxide ($CO_2$) at high speed, but may expand, possibly breaking the insulating layer 74. Nonetheless, breakage of the layer 74 can be prevented by modifying the layer 74 or by decreasing the oxygen-plasma process temperature.

The cavities 75 may be filled with air, not the mixture gas. This can be accomplished by opening the cavities 75. to the atmosphere or by supplying air into the cavities 75 through holes made in the device package.

Finally, as shown in FIG. 218, an insulating layer 76 having a small dielectric constant, e.g., a silicon oxide layer containing fluorine, is formed on the insulating layer 74. The upper surface of the insulating layer 76 is made flat by means of CMP or the like.

In the method described above, the carbon layers 80a formed on the wires 73 and the carbon layers 80b formed on the sides of the carbon layers 73 are ashed, thereby providing cavities. The top and sides of each wire 73 are thereby exposed to the mixture gas. The semiconductor device shown in FIG. 212 can therefore be formed easily. In addition, the parasitic capacitance among the wires 73 is effectively reduced since the edges of each wire 73, where electric charge is likely to concentrate, exist in one cavity 75.

FIG. 219 illustrates a semiconductor device according to a thirty-third embodiment of the invention.

As shown in FIG. 219, an insulating layer 72 (e.g., a silicon oxide layer) is provided on a semiconductor substrate 71 (e.g., a silicon wafer). Wires 73 are provided on the insulating layer 72, spaced apart from one anther. The wires 73 are made of metal such as copper, aluminum alloy or the like, semiconductor such as polysilicon containing an impurity, or high-melting metal such as tungsten.

The wires 73 are completely covered with an insulating layer 74 but do not contact the insulating layer 74. Cavities 75 are provided, each between one wire 73 and the insulating layer 74. The cavities 75 are filled with a gas having a dielectric constant of about 1.0, i.e., a mixture gas of mainly oxygen ($O_2$) and carbon dioxide ($CO_2$). The insulating layer 74 is made of, for example, silicon oxide, zirconium oxide, hafnium oxide, chromium oxide, or the like. On the insulating layer 74 there is provided an insulating layer 76 which has a small dielectric constant. The insulating layer 76 is made of, for example, silicon oxide containing fluorine.

The cavities 75 may be filled with air, not the mixture gas. This can be accomplished by opening the cavities 75 to the atmosphere or by supplying air into the cavities 75 through holes made in the device package.

In the device of FIG. 219, the wires 73 are covered with the insulating layer 74, the cavities 75 are provided, each between one wire 73 and the insulating layer 74, and each cavity 75 is filled with either air or the mixture gas of mainly oxygen ($O_2$) and carbon dioxide ($CO_2$). Air and the mixture gas have a dielectric constant of about 1.0. Since at least the edges of each wire 73, where electric charge is likely to concentrate, exist in one cavity 75, the dielectric constant of the wire 73 is far less than in the case where the inter-wire spaces are filled with insulating material such as silicon oxide or the like. The semiconductor device can, therefore, be an LSI which has a higher packing density of elements and a better performance.

How the device of FIG. 219 is manufactured will be explained, with reference to FIGS. 220 to 225.

As shown in FIG. 220, the insulating layer 72 is formed on the semiconductor substrate 71. Further, a metal layer 73a is formed on the insulating layer 72, to a thickness of 0.7 to 0.2 m, by sputtering or the like. The metal layer 73a is made aluminum, copper, titanium, titanium oxide or the like.

Further, a carbon layer 80a is formed on the metal layer 73a by sputtering or the like. A mask layer 77 (e.g., a silicon oxide layer or a silicon nitride layer) is formed on the carbon layer 80a by sputtering or CVD. If the mask layer 77 is made of oxide, it should better be formed by means of sputtering, not by CVD. This is because the carbon layer 80a would be eroded by the oxygen contained in the reaction gas applied in CVD to form the mask layer 77.

Then, a resist is coated on the mask layer 77 and patterned by PEP (Photo Engraving Process). Using the resist as the mask, the mask layer 77 is patterned. This done, the resist is removed. The carbon layer and the metal layer are subjected to anisotropic etching, by using the mask layer 77. Slits are thereby formed in the carbon layer and the metal layer as is shown in FIG. 221. As a result, the wires 73 are formed. If the mask layers 77 remain even after the anisotropic etching, they are removed from the carbon layers 80a.

The resist used in the PEP is removed by applying a solution of $H_2SO4$ and $H_2O_2$ to it, not by applying oxygen plasma. If the resist is removed by oxygen plasma process, the carbon layer 80a will be removed, along with the resist.

Next, carbon layers 80b are formed by sputtering or the like, on the sides of the wires 73 and the carbon layers 80a. The carbon layers 80b are subjected to anisotropic etching, whereby those portions of the carbon layers 80b which lie on the carbon layers 80a are removed, as is illustrated in FIG. 222.

Further, as shown in FIG. 223, the insulating layer 74 is formed by sputtering or CVD to a thickness of 0.05 $\mu$m, on the insulating layer 72, carbon layers 80a and carbon layers 80b. If the insulating layer 74 is made of oxide, it should better be formed by sputtering, not CVD, because the carbon layers 80a and 80b would be eroded by the oxygen $O_2$ contained in the reaction gas applied in CVD to form the insulating layer 74.

Thereafter, the carbon layers 80a and 80b are ashed, thereby providing cavities 75 filled with a mixture gas of mainly oxygen ($O_2$) and carbon dioxide ($CO_2$), as is shown in FIG. 224. The ashing of the layers 80a and 80b can be performed by one of two alternative methods.

The first method is to heat the carbon layers 80a and 80b in an oxygen atmosphere (i.e., an atmosphere containing oxygen, such as the atmosphere) at 400 to 450° C. for about two hours. In the first method, the carbon layers 80a and 80b slowly change into carbon dioxide ($CO_2$), not expanding to break the insulating layer 74. However, it takes a long time to ash the carbon layers 80a and 80b. The second method is oxygen-plasma process. In the second method, the carbon layers 80a and 80b change into carbon dioxide ($CO_2$) at high speed, but may expand, possibly breaking the insulating layer 74. Nonetheless, breakage of the layer 74 can be prevented by modifying the layer 74 or by decreasing the oxygen-plasma process temperature.

The cavities 75 may be filled with air, not the mixture gas. This can be accomplished by opening the cavities 75 to the atmosphere or by supplying air into the cavities 75 through holes made in the device package.

Finally, as shown in FIG. 225, an insulating layer 76 having a small dielectric constant, e.g., a silicon oxide layer containing fluorine, is formed on the insulating layer 74. The upper surface of the insulating layer 76 is made flat by means of CMP or the like.

In the method described above, the carbon layers 80a formed on the wires 73 and the carbon layers 80b formed on the sides of the carbon layers 73 are ashed, thereby providing cavities. The top and sides of each wire 73 are thereby exposed to the mixture gas. The semiconductor device shown in FIG. 212 can therefore be formed easily. In addition, the parasitic capacitance among the wires 73 is effectively reduced since the edges of each wire 73, where electric charge is likely to concentrate, exist in one cavity 75.

FIG. 226 illustrates a semiconductor device according to a thirty-fourth embodiment of the invention.

As shown in FIG. 226, an insulating layer 72 (e.g., a silicon oxide layer) is provided on a semiconductor substrate 71 (e.g., a silicon wafer). Wires 73 are provided on the insulating layer 72, spaced apart from one another. The wires 73 are made of metal such as copper, aluminum alloy or the like, semiconductor such as polysilicon containing an impurity, or high-melting metal such as tungsten.

The wires 73 are completely covered with an insulating layer 74, with their upper surfaces contacting the insulating layer 74. Cavities 75 are provided, each between one wire 73 and the insulating layer 74. The cavities 75 are filled with a gas having a dielectric constant of about 1.0, i.e., a mixture gas of mainly oxygen ($O_2$) and carbon dioxide ($CO_2$). The insulating layer 74 is made of, for example, silicon oxide, zirconium oxide, hafnium oxide, chromium oxide, or the like. On the insulating layer 74 there is provided an insulating layer 76 which has a small dielectric constant. The insulating layer 76 is made of, for example, silicon oxide containing fluorine.

The cavities 75 may be filled with air, not the mixture gas. This can be accomplished by opening the cavities 75 to the atmosphere or by supplying air into the cavities 75 through holes made in the device package.

In the semiconductor device of FIG. 226, the wires 73 are covered with the insulating layer 74, the cavities 75 are provided, each between one wire 73 and the insulating layer 74, and each cavity 75 is filled with either air or the mixture gas of mainly oxygen ($O_2$) and carbon dioxide ($CO_2$). Air and the mixture gas have a dielectric constant of about 1.0. Since at least the edges of each wire 73, where electric charge is likely to concentrate, exist in one cavity 75, the dielectric constant of the wire 73 is far less than in the case where the inter-wire spaces are filled with insulating material such as silicon oxide or the like. The semiconductor device can, therefore, be an LSI which has a higher packing density of elements and a better performance.

How the device of FIG. 226 is manufactured will be explained, with reference to FIGS. 227 to 232.

First, as shown in FIG. 227, the insulating layer 72 is formed on the semiconductor substrate 71. A metal layer 73a is then formed on the insulating layer 72, to a thickness of 0.7 to 0.2 m, by sputtering or the like. The metal layer 73a is made aluminum, copper, titanium, titanium oxide or the like. Further, a mask layer 77 (e.g., a silicon oxide layer or a silicon nitride layer) is formed on the metal layer 73 by sputtering or CVD.

Then, a resist is coated on the mask layer 77 and patterned by PEP (Photo Engraving Process). Using the resist as the mask, the mask layer 77 is patterned. This done, the resist is removed. The metal layer 73a is subjected to anisotropic etching, by using the mask layer 77. Slits are thereby formed in the carbon layer and the metal layer as is shown in FIG. 228. As a result, the wires 73 are formed. If the mask layers 77 remain even after the anisotropic etching, they are removed from the wires 73. The mask layers 77 may not be used to etch the metal layer 73a. The resist may be used instead, to etch the metal layer 73a.

Next, carbon layers 80b are formed by sputtering or the like, on the sides of the wires 73 and the upper surfaces thereof. The carbon layers 80b are subjected to anisotropic etching, whereby those portions of the carbon layers 80b which lie on the upper surfaces of the wires 73 are removed, as is illustrated in FIG. 229.

Further, as shown in FIG. 230, the insulating layer 74 is formed by sputtering or CVD to a thickness of 0.05 μm, on the insulating layer 72, the carbon layers 80a and the upper surfaces of the wires 73. If the insulating layer 74 is made of oxide, it should better be formed by sputtering, not CVD, because the carbon layers 80b would be eroded by the oxygen $O_2$ contained in the reaction gas applied in CVD to form the insulating layer 74.

Thereafter, the carbon layers 80b are ashed, thereby providing cavities 75 filled with a mixture gas of mainly oxygen ($O_2$) and carbon dioxide ($CO_2$), as is shown in FIG. 231. The ashing of the layer 80b can be performed by one of two alternative methods.

The first method is to heat the carbon layers and 80b in an oxygen atmosphere (i.e., an atmosphere containing oxygen, such as the atmosphere) at 400 to 450° C. for about two hours. In the first method, the carbon layers 80b slowly change into carbon dioxide ($CO_2$), not expanding to break the insulating layer 74. However, it takes a long time to ash the carbon layers 80b. The second method is oxygen-plasma process. In the second method, the carbon layers 80b change into carbon dioxide ($CO_2$) at high speed, but may expand, possibly breaking the insulating layer 74. Nonetheless, breakage of the layer 74 can be prevented by modifying the layer 74 or by decreasing the oxygen-plasma process temperature.

The cavities 75 may be filled with air, not the mixture gas. This can be accomplished by opening the cavities 75 to the atmosphere or by supplying air into the cavities 75 through holes made in the device package.

Finally, as shown in FIG. 232, an insulating layer 76 having a small dielectric constant, e.g., a silicon oxide layer containing fluorine, is formed on the insulating layer 74. The upper surface of the insulating layer 76 is made flat by means of CMP or the like.

In the method described above, the carbon layers 80b formed on the sides of the carbon layers 73 are ashed, thereby providing cavities. The sides of each wire 73 are thereby exposed to the mixture gas. The semiconductor device shown in FIG. 226 can therefore be formed easily. In addition, the parasitic capacitance among the wires 73 is effectively reduced since the edges of each wire 73, where electric charge is likely to concentrate, exist in one cavity 75.

As has been described, the semiconductor devices and the methods of manufacturing the same, all according to the present invention, are advantageous in the following respects.

The spaces among the wires located at the same level and the spaces among the wires located at different levels are filled with either air or a mixture gas of mainly oxygen ($O_2$) and carbon dioxide ($CO_2$). Air and the mixture gas have a dielectric constant of about 1.0, which is far less than that of silicon oxide or the like. The devices can, therefore, be LSIs which have a higher packing density of elements and a better performance than an LSI in which the inter-wire spaces are filled with insulating layers made of silicon oxide or the like.

Some other devices according to the invention have a guard ring each. The guard ring is provided in the edges of the device chip, sealing the cavities provided among the wires. It prevents water ($H_2O$) from flowing from the edges of the chip into the cavities.

In still some other devices of the present invention, at least the sides of each wire are covered with wire-protecting layers. Even if water ($H_2O$) flows the edges of the device chip into the cavities, the wire-protecting layers prevent the water from reaching the wires, thus protecting the wires against water.

The cavities provided among the wires may be filled with air, not the mixture gas. This can be accomplished by making, in the package encapsulating the device, holes which connect the cavities to the atmosphere. The air can circulate in each cavity and can efficiently dissipate heat from the device chip. The semiconductor devices scarcely make errors due to the heat generated in the chip.

In some semiconductor devices of the invention, each wire has its sides covered with wire-protecting layers. Hence, no hillocks will be formed on the sides of the wires.

In manufacturing the devices according to the present invention, a carbon layer or layers are ashed by performing annealing in an oxygen atmosphere or by carrying out oxygen plasma process. Thus, cavities can be easily provided among the wires.

To increase the mechanical strength of the devices, a layer of material (e.g., silicon) which reacts with wire may be formed on a carbon layer and the wires. Alternatively, a metal oxide layer may be provided which surrounds the wires, defining cavities.

In order to prevent the wires from being oxidized while the carbon layer or layers are being ashed, the wires may be protective layers which does not alloy passage of oxygen.

In some of the semiconductor devices according to this invention, each wire is located within a cavity. Hence, the capacitance among the wires is effectively reduced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a first insulating layer on a semiconductor substrate;

forming a solid layer on the first insulating layer;

forming slits in the solid layer;

forming conductors in the slits of the solid layer, thereby forming wires of a first set;

forming a second insulating layer on said solid layer and said wires; and oxidizing the solid layer, changing the same into gas layers, wherein said solid layer is a carbon layer, and the carbon layer is ashed, thereby providing complete cavities among said wires, which are filled with a mixture gas comprising at least oxygen and carbon dioxide.

2. The method according to claim 1, wherein said solid layer is made of material which remains solid at a temperature equal to or lower than a temperature at which the conductors are formed, and which can be processed to have slits, and which can easily change into gas when oxidized.

3. The method according to claim 1, wherein said slits are formed by a series of steps of: forming a mask layer on said solid layer; performing photo engraving process on the mask layer; performing anisotropic etching on said solid layer, while using the mask layer as a mask; and removing the mask layer.

4. The method according to claim 3, wherein said mask layer is formed by sputtering in the case where said mask layer is made of oxide.

5. The method according to claim 1, wherein said slits are formed by a series of steps of:
forming a resist on the solid layer;
patterning the resist;
performing anisotropic etching on said solid layer, while using the resist as a mask; and removing the resist.

6. The method according to claim 5, wherein said resist is removed by applying a solution of $H_2SO_4$ and $H_2O_2$.

7. The method according to claim 1, wherein said second insulating layer is formed by sputtering in the case said second insulating layer is made of oxide.

8. The method according to claim 1, wherein said solid layer is oxidized by heat treatment in an oxygen atmosphere or by treatment in $O_2$-plasma.

9. The method according to claim 1, further comprising a step of filling the gas layers after the step of oxidizing the solid layer.

10. A method of manufacturing a semiconductor device, comprising the steps of:
forming a semiconductor element in a surface region of a semiconductor substrate;
forming a first insulating layer on the semiconductor substrate, covering the semiconductor element;
forming contact holes in the first insulating layer, said contact holes reaching the semiconductor element;
forming conductors of a first type in the contact holes of the first insulating layer;
forming a first solid layer on the first insulating layer and the conductors of the first set;
forming slits of a first set in the first solid layer;
forming conductors in the slits of the first set, thereby forming wires of a first set;
forming a second insulating layer on the first solid layer and the wires of the first set; and
oxidizing the first solid layer, thereby changing the same into gas layers, wherein said first and second solid layers are carbon layers and the carbon layers are ashed, thereby providing complete cavities among said wires of the first set and among said wires of the second set, which are filled with a mixture gas comprising at least oxygen and carbon dioxide.

11. The method according to claim 10, further comprising the steps of:
forming a third insulating layer on said second insulating layer;
forming via holes in said first and second insulating layers, said via holes reaching said wires of the first set;
forming conductors of a second set in the via holes of said first and second insulating layers;
forming a second solid layer on said third insulating layer and said conductors of the second set;
forming slits of a second set in said second solid layer;
forming conductors in said slits of the second set, thereby forming wires of a second set;
forming a fourth insulating layer on said second solid layer and said wires of the second set; and oxidizing the second solid layer, thereby changing the same into gas layers.

12. The method according to claim 11, wherein said first and second solid layers are made of material which remain solid at a temperature equal to or lower than a temperature at which said conductors are formed in the slits of the first and second sets, and which can be processed to have slits, and which can easily change into gas when oxidized.

13. The method according to claim 10, wherein said slits of the first set are formed by the steps of:
forming a mask layer on said first solid layer;
subjecting the mask layer to photo engraving process; and
subjecting said first solid layer to anisotropic etching, while using said mask layer as a mask.

14. The method according to claim 1, wherein said slits of the first set are formed by the steps of:
forming a mask layer on said first solid layer;
subjecting the mask layer to photo engraving process;
subjecting said first solid layer to anisotropic etching, while using said mask layer as a mask; and
removing said mask layer.

15. The method according to claim 11, wherein said slits of the second set are formed by the steps of:
forming a mask layer on said second solid layer;
subjecting the mask layer to photo engraving process; and
subjecting said second solid layer to anisotropic etching, while using the mask layer as a mask.

16. The method according to claim 11, wherein said slits of the second set are formed by the steps of:
forming a mask layer on said second solid layer;
subjecting the mask layer to photo engraving process;
subjecting said second solid layer to anisotropic etching, while using said mask layer as a mask; and
removing said mask layer.

17. The method according to any one of claims 13 to 16, wherein said mask layer is formed by sputtering in the case where said mask layer is made of oxide.

18. The method according to claim 5, wherein said second insulating layer is formed by sputtering in the case said second insulating layer is made of oxide.

19. The method according to claim 11, wherein said fourth insulating layer is formed by sputtering in the case said fourth insulating layer is made of oxide.

20. The method according to claim 11, wherein said first and second solid layers are oxidized by heat treatment in an oxygen atmosphere or by treatment in $O_2$-plasma.

21. The method according claim 11, further comprising a step of filling the first and second gas layers with air after the step of oxidizing the solid layer.

22. A method of manufacturing a semiconductor device, comprising the steps of:
forming a first insulating layer on a semiconductor substrate;
forming a first solid layer on said first insulating layer;
forming slits of a first set in said first solid layer;
forming conductors of a first set in said slits of the first set, thereby forming wires of a first set;
forming a second insulating layer on the first solid layer and said wires of the first set;

oxidizing said first solid layer, changing the same into gas layers of a first set;

forming a second solid layer on said second insulating layer;

forming contact holes of a first set in said second solid layer and said second insulating layer, said contact holes of the first set reaching said wires of the first set;

forming columnar conductors in said contact holes of the first set;

forming a third insulating layer on said second solid layer and said columnar conductors;

forming a third solid layer on said third insulating layer;

forming slits of a second set in said third insulating layer;

forming contact holes of a second set in said third insulating layer, said contact holes of the second set reaching said columnar conductors;

forming conductors in said slits of the second set, thereby forming wires of a second set;

forming a fourth insulating layer on said third solid layer and said wires of the second set; and oxidizing said second and third solid layers, changing the same into gas layers of a second set and gas layers of a third set, wherein said first, second and third solid layers are carbon layers, said carbon layers are ashed, thereby providing complete cavities among said wires of the first set, among said wires of the second set and among said columnar conductors, which are filled with a mixture gas comprising at least oxygen and carbon dioxide.

23. The method according to claim 22, wherein said first, second and third solid layers are made of material which remains solid at a temperature equal to or lower than a temperature at which said conductors are formed in said slits of the first and second sets and in said contact holes of the first and second sets, and which can be processed to have said slits of the first set, said slits of the second set or said contact holes of the first set, and which can easily change into gas when oxidized.

24. The method according to claim 22, wherein said slits of the first set are formed the steps of:

forming a mask layer on said first solid layer; subjecting said mask layer to photo engraving process; and subjecting said first solid layer to anisotropic etching, while using said mask layer as a mask.

25. The method according to claim 22, wherein said slits of the first set are formed by the steps of:

forming a mask layer on the first solid layer;

subjecting the mask layer to photo engraving process;

subjecting the first solid layer to anisotropic etching, while using the mask layer as a mask; and removing the mask layer.

26. The method according to claim 22, wherein said contact holes of the first set are formed by forming a mask layer on said second solid layer, subjecting said mask layer to photo engraving process; and subjecting said second solid layer to anisotropic etching, while using said mask layer as a mask.

27. The method according to claim 22, wherein said contact holes of the first set are formed by forming a mask layer on said second solid layer, subjecting said mask layer to photo engraving process, subjecting said second solid layer to anisotropic etching, while using said mask layer as a mask, and removing said mask layer.

28. The method according to claim 22, wherein said slits of the second set are formed by forming a mask layer on said third solid layer, subjecting said mask layer to photo engraving process, and subjecting said third solid layer to anisotropic etching, while using said mask layer as a mask.

29. The method according to claim 22, wherein said slits of the second set are formed by forming a mask layer on said third solid layer, subjecting said mask layer to photo engraving process; subjecting said third solid layer to anisotropic etching, while using said mask layer as a mask, and removing said mask layer.

30. The method according to any one of claims 24 to 29, wherein said mask layer is formed by sputtering in the case where said mask layer is made of oxide.

31. The method according to claim 22, wherein said second, third and fourth insulating layers are formed by sputtering in the case where said second, third and fourth insulating layers are made of oxide.

32. The method according to claim 22, wherein said first, second and third solid layers are oxidized by heat treatment in an oxygen atmosphere or by treatment in $O_2$-plasma.

33. The method according to claim 22, further comprising a step of filling the first, second and third gas layers with air after the step of oxidizing the solid layer.

34. A method of manufacturing a semiconductor device, comprising the steps of:

forming a first insulating layer on a semiconductor substrate;

forming a first solid layer on said first insulating layer;

forming slits of a first set in said first insulating layer;

forming conductors of a first set in said slits of the first set, thereby forming wires of a first set;

forming a second insulating layer on said first solid layer and said wires of the first set;

oxidizing said first solid layer, changing the same into gas layers;

forming a second solid layer on said second insulating layer;

forming a third insulating layer on said second solid layer;

forming a third solid layer on said third insulating layer;

forming slits of a second set in said third solid layer;

forming contact holes in said third insulating layer, said second solid layer and said second insulating layer, said contact holes reaching said wires of the first set;

forming conductors of a second set in said slits of the second set and said contact holes of the second set, thereby forming wires of a second set;

forming a fourth insulating layer on said third solid layer and said wires of the second set;

oxidizing said second and third solid layers, changing the same into gas layers of a first set and gas layers of a second set, wherein said first, second and third solid layers are carbon layers, the carbon layers are ashed, thereby providing complete cavities among said wires of the first set, among said wires of the second set and among said columnar conductors, which are filled with a mixture gas comprising at least oxygen and carbon dioxide.

35. The method according to claim 34 wherein said first, second and third solid layers are made of materials which remain solid at a temperature equal to or lower than a temperature at which said conductors are formed in said slits of the first and second sets and in said contact holes of the first and second sets, and which can be processed to have slits and contact holes, and which can easily change into gas when oxidized.

36. The method according to claim 34, wherein said slits of the first set are formed by forming a mask layer on said-first solid layer, subjecting said mask layer to photo engraving process, and subjecting said first solid layer to anisotropic etching, while using said mask layer as a mask.

37. The method according to claim 34, wherein said slits of the first set are formed by forming a mask layer on said first solid layer, subjecting said mask layer to photo engraving process, subjecting said first solid layer to anisotropic etching, while using said mask layer as a mask, and removing said mask layer.

38. The method according to claims 36 or 37, wherein said mask layer is formed by sputtering in the case said mask layer is made of oxide.

39. The method according to claim 34, wherein said slits of the second set are formed by forming a resist on said third solid layer, patterning said resist, subjecting said third solid layer to anisotropic etching, while using said resist as a mask, and removing said resist.

40. The method according to claim 34, wherein said contact holes are formed by forming a resist on said second solid layer and said third insulating layer, patterning said resist, subjecting said third insulating layer and said second solid layer to anisotropic etching, while using said resist as a mask, removing said resist layer; and etching said second insulating layer.

41. The method according to claim 34, wherein said second, third and fourth insulating layers are formed by sputtering if said second, third and fourth insulating layers are made of oxide.

42. The method according to claim 34, wherein said first, second and third solid layers are oxidized by heat treatment in an oxygen atmosphere or by treatment in $O_2$-plasma.

43. The method according to claim 34, further comprising a step of filling the first, second and third gas layers with air after the step of oxidizing the solid layer.

44. A method of manufacturing a semiconductor device, comprising the steps of:
forming an insulating layer on a semiconductor substrate;
forming a solid layer on said insulating layer;
forming a plurality of slits in said solid layer;
forming conductors in said slits, thereby forming a plurality of wires;
forming a silicon layer on said solid layer and said wires;
oxidizing said solid layer, changing the same to gas layers and said silicon layer into a silicon oxide layer, thereby forming coupling layers which firmly couple said wires with said silicon layer, wherein said solid layer is a carbon layer, and the carbon layer is ashed, thereby providing complete cavities among said wires, which are filled with a mixture gas comprising at least oxygen and carbon dioxide.

45. A method of manufacturing a semiconductor device, comprising the steps of:
forming an insulating layer on a semiconductor substrate;
forming a solid layer on said insulating layer;
forming a plurality of slits in said solid layer;
forming conductors in said slits, thereby forming a plurality of wires;
forming a metal layer on said solid layer and said wires;
oxidizing said solid layer, changing the same to gas layers, and said metal layer to a metal oxide layer, thereby forming coupling layers which firmly couple said wires with said metal layer, wherein said solid layer is a carbon layer, and the carbon layer is ashed, thereby providing complete cavities among said wires, which are filled with a mixture gas comprising at least oxygen and carbon dioxide.

46. The method according to claim 44 or 45, wherein said solid layer is made of material which remain solid at a temperature equal to or lower than a temperature at which said conductors are formed, and which can be processed to have slits, and which can easily change into gas when oxidized.

47. The method according to claim 44 or 45, wherein said slits are formed by forming a mask layer on said solid layer, performing photo engraving process on said mask layer, performing anisotropic etching on said solid layer, while using said mask layer as a mask, and removing said mask layer.

48. The method according to claim 47, wherein said mask layer is formed by sputtering in the case where said mask layer is made of oxide.

49. The method according to claim 44 or 45, wherein said slits are formed by forming a resist on said solid layer, patterning said resist, performing anisotropic etching on said solid layer, while using said resist as a mask, and removing said resist.

50. The method according to claim 49, wherein said resist is removed by applying a solution of $H_2SO_4$ and $H_2O_2$.

51. The method according to claim 44 or 45, wherein said solid layer is oxidized by heat treatment in an oxygen atmosphere or by treatment in $O_2$-plasma.

52. The method according to claim 44 or 45, further comprising a step of filling the gas layers with air after the step of oxidizing the solid layer.

53. A method of manufacturing a semiconductor device, comprising the steps of:
forming a first insulating layer on a semiconductor substrate;
forming a solid layer on said first insulating layer;
forming a plurality of slits in said solid layer;
forming a metal layer on said solid layer and the inner surfaces of said slits;
forming conductors in said slits, thereby forming a plurality of wires;
oxidizing said solid layer, thereby changing the same into gas layers;
oxidizing or nitriding those parts of said metal layer which are provided above said cavities and sides of said wires, thereby forming second insulating layers; and
forming a third insulating layer on said wires and said second insulating layers, wherein said solid layer is a carbon layer, and the carbon layer is ashed, thereby providing complete cavities among said wires, which are filled with a mixture gas comprising at least oxygen and carbon dioxide.

54. A method of manufacturing a semiconductor device, comprising the steps of:
forming a first insulating layer on a semiconductor substrate;
forming a solid layer on said first insulating layer;
forming a plurality of slits in said solid layer;
forming a metal layer on said solid layer and the inner surfaces of said slits;
forming conductors in said slits, thereby forming a plurality of wires;
oxidizing said solid layer, thereby changing the same into gas layers, and simultaneously oxidizing those parts of said metal layer which are provided above said cavities and sides of said wires, thereby forming metal oxide layers; and forming a second insulating layer on said wires and said metal oxide layers, wherein said solid layer is a carbon layer, and the carbon layer is ashed, thereby providing complete cavities among said wires, which are filled with a mixture gas comprising at least oxygen and carbon dioxide.

55. The method according to claim 53 or 54, wherein said solid layer is made of material which remains solid at a temperature equal to or lower than a temperature at which said conductors are formed, and which can be processed to have slits, and which can easily change into gas when oxidized.

56. The method according to claim 53 or 54, wherein said slits are formed by forming a mask layer on said solid layer, performing photo engraving process on said mask layer, performing anisotropic etching on said solid layer, while using said mask layer as a mask, and removing said mask layer.

57. The method according to claim 56, therein said mask layer is formed by sputtering in the case where said mask layer is made of oxide.

58. The method according to claim 54, wherein said slits are formed by forming a resist on said solid layer, patterning said resist, performing anisotropic etching on said solid layer, while using said resist as a mask, and removing said resist.

59. The method according to claim 58, wherein said resist is removed by applying a solution of $H_2SO_4$ and $H_2O_2$.

60. The method according to claim 53 or 54, wherein said solid layer is oxidized by heat treatment in an oxygen atmosphere or by treatment in $O_2$-plasma.

61. The method according to claim 53 or 54, further comprising a step of filling the gas layers with air after the step of oxidizing the solid layer.

62. The method according to claim 53, wherein said metal layer is oxidized or nitrided in an oxygen atmosphere or nitrogen atmosphere.

63. A method of manufacturing a semiconductor device, comprising the steps of:
    forming a first insulating layer on a semiconductor substrate;
    forming a solid layer on said first insulating layer;
    forming a plurality of slits in said solid layer;
    forming a first wire-protecting metal layer on the inner surfaces of the slits and on the solid layer, said first wire-protecting metal layer prohibiting passage of oxygen;
    forming conductors on said wire-protecting metal layer;
    polishing or etching said wire-protecting metal layer and said conductors, leaving wire-protecting metal layers and conductors in said slits, thereby forming wires;
    forming wire-protecting layers on said wires, respectively, said wire-protecting layers prohibiting passage of oxygen;
    forming a second insulating layer on said solid layer an said wire-protecting layers; and
    oxidizing said solid layer, changing the same into gas layers, wherein said solid layer is a carbon layer, and the carbon layer is ashed, thereby providing complete cavities among said wires, which are filled with a mixture gas comprising at least oxygen and carbon dioxide.

64. The method according to claim 63, wherein said wire-protecting metal layer and said conductors are polished or etched until the surfaces of said wire-protecting metal layer and said conductors are located lower than the surface of said solid layer.

65. The method according to claim 63, wherein said solid layer is made of material which remains solid at a temperature equal to or lower than a temperature at which said conductors are formed, and which can be processed to have slits, and which can easily change into gas when oxidized.

66. The method according to claim 63, wherein said slits are formed by forming a mask layer on said solid layer, performing photo engraving process on said mask layer, performing anisotropic etching on said solid layer, while using said mask layer as a mask, and removing said mask layer.

67. The method according to claim 66, wherein said mask layer is formed by sputtering in the case where said mask layer is made of oxide.

68. The method according to claim 63, wherein said slits are formed by forming a resist on said solid layer, patterning said resist, performing anisotropic etching on said solid layer, while using said resist as a mask, and removing said resist.

69. The method according to claim 68, wherein said resist is removed by applying a solution of $H_2SO_4$ and $H_2O_2$.

70. The method according to claim 63, wherein said second insulating layer is formed by sputtering in the case said second insulating layer is made of oxide.

71. The method according to claim 63, wherein said solid layer is oxidized by heat treatment in an oxygen atmosphere or by treatment in $O_2$-plasma.

72. The method according to claim 63, further comprising a step of filling the gas layers with air after the step of, oxidizing the solid layer.

73. A method of manufacturing a semiconductor device, comprising the steps of:
    forming a first insulating layer on a semiconductor substrate;
    forming a conductive layer on said first insulating layer;
    forming a first solid layer on said conductive layer;
    etching said first solid layer and said conductive layer, thereby forming a plurality of wires;
    forming a second solid layers on sides of said wires;
    forming a second insulating layer on said first and second solid layers;
    oxidizing said first and second solid layers, changing the same into gas layers, whereby said wires are placed in the gas layers, wherein said first and second solid layers are carbon layers, the carbon layers are ashed, thereby providing complete cavities among said wires of the first set and among said wires of the second set, which are filled with a mixture gas comprising at least oxygen and carbon dioxide.

74. The method according to claim 73, wherein said first and second solid layers are made of material which can be processed to have slits and which can easily change into gas when oxidized.

75. The method according to claim 73, wherein said wires are formed by forming a mask layer on said first solid layer, performing photo engraving process on said mask layer, and performing anisotropic etching on said first solid layer and said conductive layer, while using said mask layer as a mask.

76. The method according to claim 75, wherein said mask layer is formed by sputtering in the case where said mask layer is made of oxide.

77. The method according to claim 75, wherein said mask layer is removed after the anisotropic etching is performed on said first solid layer and said conductive layer.

78. The method according to claim 73, wherein said wires are formed by forming a resist on said solid layer, patterning said resist, performing anisotropic etching on said solid layer, while using said resist as; a mask, and removing said resist.

79. The method according to claim 78, wherein said resist is removed by applying a solution of $H_2SO_4$ and $H_2O_2$.

80. The method according to claim 73, wherein said second insulating layer is formed by sputtering in the case said second insulating layer is made of oxide.

81. The method according to claim 73, wherein said first and second solid layers are oxidized by heat treatment in an oxygen atmosphere or by treatment in $O_2$-plasma.

82. The method according to claim 73, further comprising a step of filling the gas layers with air after the step of oxidizing the solid layer.

* * * * *